US012584951B2

(12) United States Patent
Dzierwa et al.

(10) Patent No.: US 12,584,951 B2
(45) Date of Patent: *Mar. 24, 2026

(54) SYSTEMS, METHODS, AND DEVICES FOR AUTOMATIC SIGNAL DETECTION BASED ON POWER DISTRIBUTION BY FREQUENCY OVER TIME WITHIN A SPECTRUM

(71) Applicant: Digital Global Systems, Inc., Tysons Corner, VA (US)

(72) Inventors: Ronald C. Dzierwa, Baltimore, MD (US); David William Kleinbeck, Lees Summit, MO (US)

(73) Assignee: Digital Global Systems, Inc., Tysons Corner, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/250,868

(22) Filed: Jun. 26, 2025

(65) Prior Publication Data

US 2025/0321259 A1      Oct. 16, 2025

Related U.S. Application Data

(63) Continuation of application No. 19/084,078, filed on Mar. 19, 2025, now Pat. No. 12,372,563, which is a
(Continued)

(51) Int. Cl.
| | |
|---|---|
| *G08B 21/18* | (2006.01) |
| *G01R 29/08* | (2006.01) |
| *G08B 29/18* | (2006.01) |

(52) U.S. Cl.
CPC ......... *G01R 29/0892* (2013.01); *G08B 21/18* (2013.01); *G08B 29/185* (2013.01)

(58) Field of Classification Search
CPC .. G01R 29/0892; H04W 24/08; H04W 24/10; H04W 64/006; H04W 16/14;
(Continued)

(56) References Cited

U.S. PATENT DOCUMENTS

| | | | |
|---|---|---|---|
| 4,215,345 A | 7/1980 | Robert et al. | |
| 4,400,700 A | 8/1983 | Rittenbach | |
| (Continued) | | | |

FOREIGN PATENT DOCUMENTS

| | | | | |
|---|---|---|---|---|
| CN | 110035440 A | 7/2019 | | |
| CN | 115482071 A | 12/2022 | | |
| CN | 117196617 A | 12/2023 | | |
| CN | 117998368 A | 5/2024 | | |
| EP | 2224262 A1 * | 9/2010 | .......... | G06Q 10/087 |
| GB | 2268857 A | 1/1994 | | |
| KR | 100248671 B1 | 4/2000 | | |
| (Continued) | | | | |

OTHER PUBLICATIONS

"A Hardware Design for Time Delay Estimation of TDOA"; Li et al.; 2013 IEEE International Conference on Signal Processing, Communication and Computing (ICSPCC 2013); Aug. 2013 (Year: 2013).
(Continued)

*Primary Examiner* — Charles N Appiah
(74) *Attorney, Agent, or Firm* — Neo IP

(57) ABSTRACT

Systems, methods and apparatus for automatic alarm management in a radio-frequency (RF) environment are disclosed. An apparatus calculates a power distribution by frequency of the RF environment in real time or near real time, including a first derivative and a second derivative of FFT data of the RF environment. The apparatus then creates a baseline based on the power distribution by frequency of the RF environment in a period of time, identifies at least one alarm situation based on a multiplicity of alarm triggering conditions by comparing the power distribution in real time or near real time to the baseline of the RF environment, identifies at least one signal based on the first derivative and the second derivative of FFT data in the at least one alarm
(Continued)

situation, and sends at least one alarm comprising details of the at least one signal identified in the at least one alarm situation.

7 Claims, 90 Drawing Sheets

Related U.S. Application Data continuation of application No. 18/620,352, filed on Mar. 28, 2024, now Pat. No. 12,298,337, which is a continuation of application No. 18/526,342, filed on Dec. 1, 2023, now Pat. No. 11,965,922, which is a continuation of application No. 18/205,242, filed on Jun. 2, 2023, now Pat. No. 11,860,209, which is a continuation of application No. 18/081,316, filed on Dec. 14, 2022, now Pat. No. 11,668,739, which is a continuation of application No. 17/570,005, filed on Jan. 6, 2022, now Pat. No. 11,549,976, which is a continuation of application No. 17/247,248, filed on Dec. 4, 2020, now Pat. No. 11,221,357, which is a continuation of application No. 16/657,190, filed on Oct. 18, 2019, now Pat. No. 10,859,619, which is a continuation of application No. 16/180,690, filed on Nov. 5, 2018, now Pat. No. 10,459,020, which is a continuation-in-part of application No. 15/412,982, filed on Jan. 23, 2017, now Pat. No. 10,122,479.

(60) Provisional application No. 62/722,420, filed on Aug. 24, 2018.

(58) Field of Classification Search
CPC ..... H04W 24/02; H04W 24/04; H04W 4/029; H04W 72/0453; H04W 64/00; H04W 76/11; H04W 16/18; H04W 52/0203; H04W 72/0473; H04B 17/27; H04B 17/23; H04B 17/309; H04B 17/318; H04B 17/20; H04B 17/26; H04B 17/29; H04B 17/24; H04B 17/3911; H04B 17/30; H04B 17/391; H04B 17/3912; G08B 29/185; G08B 25/08; G08B 25/10; G08B 5/36; G08B 21/18
See application file for complete search history.

(56) References Cited

U.S. PATENT DOCUMENTS

| | | | |
|---|---|---|---|
| 4,453,137 A | 6/1984 | Rittenbach | |
| 4,501,020 A | 2/1985 | Wakeman | |
| 4,581,769 A | 4/1986 | Grimsley et al. | |
| 4,638,493 A | 1/1987 | Bishop et al. | |
| 4,676,641 A | 6/1987 | Bott | |
| 4,781,460 A | 11/1988 | Bott | |
| 4,794,325 A | 12/1988 | Britton et al. | |
| 4,928,106 A | 5/1990 | Ashjaee et al. | |
| 5,103,402 A | 4/1992 | Morton et al. | |
| 5,126,654 A | 6/1992 | Murphy et al. | |
| 5,134,407 A | 7/1992 | Lorenz et al. | |
| 5,144,642 A | 9/1992 | Weinberg et al. | |
| 5,166,664 A | 11/1992 | Fish | |
| 5,230,087 A | 7/1993 | Meyer et al. | |
| 5,293,170 A | 3/1994 | Lorenz et al. | |
| 5,343,212 A | 8/1994 | Rose et al. | |
| 5,393,713 A | 2/1995 | Schwob | |
| 5,416,593 A | 5/1995 | Vercruysse | |
| 5,448,309 A | 9/1995 | Won | |
| 5,506,864 A | 4/1996 | Schilling | |
| 5,513,385 A | 4/1996 | Tanaka | |
| 5,548,809 A | 8/1996 | Lemson | |
| 5,570,099 A | 10/1996 | DesJardins | |
| 5,589,835 A | 12/1996 | Gildea et al. | |
| 5,612,703 A | 3/1997 | Mallinckrodt | |
| 5,642,732 A | 7/1997 | Wang | |
| 5,831,874 A | 11/1998 | Boone et al. | |
| 5,835,857 A | 11/1998 | Otten | |
| 5,838,906 A | 11/1998 | Doyle et al. | |
| 5,846,208 A | 12/1998 | Pichlmayr et al. | |
| 5,856,803 A | 1/1999 | Pevler | |
| 5,936,575 A | 8/1999 | Azzarelli et al. | |
| 6,018,312 A | 1/2000 | Haworth | |
| 6,039,692 A | 3/2000 | Kristoffersen | |
| 6,081,223 A | 6/2000 | Kitahara et al. | |
| 6,085,090 A | 7/2000 | Yee et al. | |
| 6,115,580 A | 9/2000 | Chuprun et al. | |
| 6,134,445 A | 10/2000 | Gould et al. | |
| 6,144,336 A | 11/2000 | Preston et al. | |
| 6,157,619 A | 12/2000 | Ozluturk et al. | |
| 6,160,511 A | 12/2000 | Pfeil et al. | |
| 6,167,277 A | 12/2000 | Kawamoto | |
| 6,167,359 A * | 12/2000 | Demir ................ G01R 31/2824 |
| | | | 702/191 |
| 6,185,309 B1 | 2/2001 | Attias | |
| 6,188,715 B1 | 2/2001 | Partyka | |
| 6,191,731 B1 | 2/2001 | McBurney et al. | |
| 6,198,414 B1 | 3/2001 | McPherson et al. | |
| 6,243,576 B1 | 6/2001 | Seike et al. | |
| 6,249,252 B1 | 6/2001 | Dupray | |
| 6,286,021 B1 | 9/2001 | Tran et al. | |
| 6,296,612 B1 | 10/2001 | Mo et al. | |
| 6,304,760 B1 | 10/2001 | Thomson et al. | |
| 6,314,366 B1 | 11/2001 | Farmakis et al. | |
| 6,339,396 B1 | 1/2002 | Mayersak | |
| 6,384,776 B1 | 5/2002 | Martin | |
| 6,400,647 B1 | 6/2002 | Huntress | |
| 6,418,131 B1 | 7/2002 | Snelling et al. | |
| 6,430,418 B1 | 8/2002 | Nivens et al. | |
| 6,433,671 B1 | 8/2002 | Nysen | |
| 6,490,318 B1 | 12/2002 | Larsson et al. | |
| 6,492,945 B2 | 12/2002 | Lii et al. | |
| 6,512,788 B1 | 1/2003 | Kuhn et al. | |
| 6,608,559 B1 | 8/2003 | Lemelson et al. | |
| 6,628,231 B2 | 9/2003 | Mayersak | |
| 6,677,895 B1 | 1/2004 | Holt | |
| 6,697,439 B1 | 2/2004 | Trivedi et al. | |
| 6,707,910 B1 | 3/2004 | Valve et al. | |
| 6,711,404 B1 | 3/2004 | Arpee et al. | |
| 6,741,595 B2 | 5/2004 | Maher et al. | |
| 6,771,957 B2 | 8/2004 | Chitrapu | |
| 6,785,321 B1 | 8/2004 | Yang et al. | |
| 6,834,180 B1 | 12/2004 | Marshall | |
| 6,850,557 B1 | 2/2005 | Gronemeyer | |
| 6,850,735 B2 | 2/2005 | Sugar et al. | |
| 6,859,831 B1 | 2/2005 | Gelvin et al. | |
| 6,861,982 B2 | 3/2005 | Forstrom et al. | |
| 6,876,326 B2 | 4/2005 | Martorana | |
| 6,898,197 B1 | 5/2005 | Lavean | |
| 6,898,235 B1 | 5/2005 | Carlin et al. | |
| 6,904,269 B1 | 6/2005 | Deshpande et al. | |
| 6,985,437 B1 | 1/2006 | Vogel | |
| 6,991,514 B1 | 1/2006 | Meloni et al. | |
| 7,035,593 B2 | 4/2006 | Miller et al. | |
| 7,043,207 B2 | 5/2006 | Miyazaki | |
| 7,049,965 B2 | 5/2006 | Kelliher et al. | |
| 7,110,756 B2 | 9/2006 | Diener | |
| 7,116,943 B2 | 10/2006 | Sugar et al. | |
| 7,146,176 B2 | 12/2006 | Mchenry | |
| 7,151,790 B1 | 12/2006 | Patenaude et al. | |
| 7,151,938 B2 | 12/2006 | Weigand | |
| 7,152,025 B2 | 12/2006 | Lusky et al. | |
| 7,162,207 B2 | 1/2007 | Kursula et al. | |
| 7,171,161 B2 | 1/2007 | Miller | |
| 7,187,326 B2 | 3/2007 | Beadle et al. | |
| 7,206,350 B2 | 4/2007 | Korobkov et al. | |
| 7,215,716 B1 | 5/2007 | Smith | |
| 7,254,191 B2 | 8/2007 | Sugar et al. | |
| 7,259,868 B2 | 8/2007 | Ozcan et al. | |
| 7,269,151 B2 | 9/2007 | Diener et al. | |
| 7,289,733 B1 | 10/2007 | He | |
| 7,292,656 B2 | 11/2007 | Kloper et al. | |

(56)　　　　References Cited

U.S. PATENT DOCUMENTS

| | | | |
|---|---|---|---|
| 7,298,327 | B2 | 11/2007 | Dupray et al. |
| 7,340,375 | B1 | 3/2008 | Patenaud et al. |
| 7,366,463 | B1 | 4/2008 | Archer et al. |
| 7,408,907 | B2 | 8/2008 | Diener |
| 7,424,268 | B2 | 9/2008 | Diener et al. |
| 7,428,270 | B1 | 9/2008 | Dubuc et al. |
| 7,430,254 | B1 | 9/2008 | Anderson |
| 7,459,898 | B1 | 12/2008 | Woodings |
| 7,466,960 | B2 | 12/2008 | Sugar |
| 7,471,683 | B2 | 12/2008 | Maher, III et al. |
| 7,522,917 | B1 | 4/2009 | Purdy, Jr. et al. |
| 7,555,262 | B2 | 6/2009 | Brenner |
| 7,564,816 | B2 | 7/2009 | Mchenry et al. |
| 7,595,754 | B2 | 9/2009 | Mehta |
| 7,606,335 | B2 | 10/2009 | Kloper et al. |
| 7,606,597 | B2 | 10/2009 | Weigand |
| 7,620,396 | B2 | 11/2009 | Floam et al. |
| 7,653,020 | B2 | 1/2010 | Roberts |
| 7,676,192 | B1 | 3/2010 | Wilson |
| 7,692,532 | B2 | 4/2010 | Fischer et al. |
| 7,692,573 | B1 | 4/2010 | Funk |
| 7,702,044 | B2 | 4/2010 | Nallapureddy et al. |
| 7,725,110 | B2 | 5/2010 | Weigand |
| 7,728,755 | B1 | 6/2010 | Jocic |
| 7,801,490 | B1 | 9/2010 | Scherzer |
| 7,813,742 | B1 | 10/2010 | Mitchell |
| 7,835,319 | B2 | 11/2010 | Sugar |
| 7,865,140 | B2 | 1/2011 | Levien et al. |
| 7,893,875 | B1 | 2/2011 | Smith |
| 7,929,508 | B1 | 4/2011 | Yucek et al. |
| 7,933,344 | B2 | 4/2011 | Hassan et al. |
| 7,945,215 | B2 | 5/2011 | Tang |
| 7,953,549 | B2 | 5/2011 | Graham et al. |
| 7,965,641 | B2 | 6/2011 | Ben Letaief et al. |
| 8,001,901 | B2 | 8/2011 | Bass |
| 8,006,195 | B1 | 8/2011 | Woodings et al. |
| 8,023,957 | B2 | 9/2011 | Weigand |
| 8,026,846 | B2 | 9/2011 | Mcfadden et al. |
| 8,027,249 | B2 | 9/2011 | Mchenry et al. |
| 8,027,690 | B2 | 9/2011 | Shellhammer |
| 8,045,654 | B1 | 10/2011 | Anderson |
| 8,045,660 | B1 | 10/2011 | Gupta |
| 8,055,204 | B2 | 11/2011 | Livsics et al. |
| 8,059,694 | B2 | 11/2011 | Junell et al. |
| 8,060,017 | B2 | 11/2011 | Schlicht et al. |
| 8,060,035 | B2 | 11/2011 | Haykin |
| 8,060,104 | B2 | 11/2011 | Chaudhri et al. |
| 8,064,840 | B2 | 11/2011 | McHenry et al. |
| 8,077,662 | B2 | 12/2011 | Srinivasan et al. |
| RE43,066 | E | 1/2012 | McHenry |
| 8,094,610 | B2 | 1/2012 | Wang et al. |
| 8,107,391 | B2 | 1/2012 | Wu et al. |
| 8,125,213 | B2 | 2/2012 | Goguillon et al. |
| 8,131,239 | B1 | 3/2012 | Walker et al. |
| 8,134,493 | B2 | 3/2012 | Noble et al. |
| 8,151,311 | B2 | 4/2012 | Huffman et al. |
| 8,155,039 | B2 | 4/2012 | Wu et al. |
| 8,155,649 | B2 | 4/2012 | McHenry et al. |
| 8,160,839 | B1 | 4/2012 | Woodings et al. |
| 8,170,577 | B2 | 5/2012 | Singh |
| 8,175,539 | B2 | 5/2012 | Diener et al. |
| 8,184,653 | B2 | 5/2012 | Dain et al. |
| 8,193,981 | B1 | 6/2012 | Hwang et al. |
| 8,213,868 | B2 | 7/2012 | Du et al. |
| 8,224,254 | B2 | 7/2012 | Haykin |
| 8,229,368 | B1 | 7/2012 | Immendorf et al. |
| 8,233,928 | B2 | 7/2012 | Stanforth et al. |
| 8,238,247 | B2 | 8/2012 | Wu et al. |
| 8,249,028 | B2 | 8/2012 | Porras et al. |
| 8,249,631 | B2 | 8/2012 | Sawai |
| 8,260,207 | B2 | 9/2012 | Srinivasan et al. |
| 8,265,684 | B2 | 9/2012 | Sawai |
| 8,279,786 | B1 | 10/2012 | Smith et al. |
| 8,280,433 | B2 | 10/2012 | Quinn et al. |
| 8,289,907 | B2 | 10/2012 | Seidel et al. |
| 8,290,503 | B2 | 10/2012 | Sadek et al. |
| 8,295,859 | B1 | 10/2012 | Yarkan et al. |
| 8,295,877 | B2 | 10/2012 | Hui et al. |
| 8,301,075 | B2 | 10/2012 | Sherman et al. |
| 8,305,215 | B2 | 11/2012 | Markhovsky et al. |
| 8,311,483 | B2 | 11/2012 | Tillman et al. |
| 8,311,509 | B2 | 11/2012 | Feher |
| 8,315,571 | B2 | 11/2012 | Lindoff et al. |
| 8,320,910 | B2 | 11/2012 | Bobier |
| 8,326,240 | B1 | 12/2012 | Kadambe et al. |
| 8,326,309 | B2 | 12/2012 | Mody et al. |
| 8,326,313 | B2 | 12/2012 | McHenry et al. |
| 8,335,204 | B2 | 12/2012 | Samarasooriya et al. |
| 8,346,273 | B2 | 1/2013 | Weigand |
| 8,346,578 | B1 | 1/2013 | Hopkins, III et al. |
| 8,350,970 | B2 | 1/2013 | Birkett et al. |
| 8,352,223 | B1 | 1/2013 | Anthony et al. |
| 8,358,723 | B1 | 1/2013 | Hamkins et al. |
| 8,364,188 | B2 | 1/2013 | Srinivasan et al. |
| 8,369,305 | B2 | 2/2013 | Diener et al. |
| 8,373,759 | B2 | 2/2013 | Samarasooriya et al. |
| 8,391,794 | B2 | 3/2013 | Sawai et al. |
| 8,391,796 | B2 | 3/2013 | Srinivasan et al. |
| 8,401,564 | B2 | 3/2013 | Singh |
| 8,406,776 | B2 | 3/2013 | Jallon |
| 8,406,780 | B2 | 3/2013 | Mueck |
| RE44,142 | E | 4/2013 | Wilson |
| 8,421,676 | B2 | 4/2013 | Moshfeghi |
| 8,422,453 | B2 | 4/2013 | Abedi |
| 8,422,958 | B2 | 4/2013 | Du et al. |
| RE44,237 | E | 5/2013 | Mchenry |
| 8,437,700 | B2 | 5/2013 | Mody et al. |
| 8,442,445 | B2 | 5/2013 | Mody et al. |
| 8,447,237 | B2 | 5/2013 | Reial et al. |
| 8,451,751 | B2 | 5/2013 | Challapali et al. |
| 8,463,195 | B2 | 6/2013 | Shellhammer |
| 8,467,353 | B2 | 6/2013 | Proctor |
| 8,467,996 | B2 | 6/2013 | Perez et al. |
| 8,483,155 | B1 | 7/2013 | Banerjea et al. |
| 8,494,464 | B1 | 7/2013 | Kadambe et al. |
| 8,503,955 | B2 | 8/2013 | Kang et al. |
| 8,504,087 | B2 | 8/2013 | Stanforth et al. |
| 8,514,729 | B2 | 8/2013 | Blackwell |
| 8,515,473 | B2 | 8/2013 | Mody et al. |
| 8,520,606 | B2 | 8/2013 | Cleveland |
| RE44,492 | E | 9/2013 | Mchenry |
| 8,526,974 | B2 | 9/2013 | Olsson et al. |
| 8,532,686 | B2 | 9/2013 | Schmidt et al. |
| 8,538,339 | B2 | 9/2013 | Hu et al. |
| 8,548,521 | B2 | 10/2013 | Hui et al. |
| 8,554,264 | B1 | 10/2013 | Gibbons et al. |
| 8,559,301 | B2 | 10/2013 | Mchenry et al. |
| 8,565,811 | B2 | 10/2013 | Tan et al. |
| 8,599,024 | B2 | 12/2013 | Bloy |
| 8,718,838 | B2 | 5/2014 | Kokkeby et al. |
| 8,750,156 | B1* | 6/2014 | Carbajal .............. H04W 16/14 |
| | | | 370/252 |
| 8,761,051 | B2 | 6/2014 | Brisebois et al. |
| 8,773,966 | B1 | 7/2014 | Petrovic et al. |
| 8,780,968 | B1 | 7/2014 | Garcia et al. |
| 8,792,901 | B2 | 7/2014 | Schmidt |
| 8,798,548 | B1 | 8/2014 | Carbajal |
| 8,805,291 | B1 | 8/2014 | Garcia et al. |
| 8,818,283 | B2 | 8/2014 | McHenry et al. |
| 8,824,536 | B1 | 9/2014 | Garcia et al. |
| 8,843,155 | B2 | 9/2014 | Burton et al. |
| 8,886,210 | B1 | 11/2014 | Sugar |
| 8,941,491 | B2 | 1/2015 | Polk et al. |
| 8,977,212 | B2 | 3/2015 | Carbajal |
| 9,007,262 | B1 | 4/2015 | Witzgall |
| 9,008,587 | B2 | 4/2015 | Carbajal |
| 9,078,162 | B2 | 7/2015 | Garcia et al. |
| 9,143,968 | B1 | 9/2015 | Manku et al. |
| 9,185,591 | B2 | 11/2015 | Carbajal |
| 9,229,102 | B1 | 1/2016 | Wright et al. |
| 9,245,378 | B1 | 1/2016 | Villagomez et al. |
| 9,288,683 | B2 | 3/2016 | Garcia et al. |
| 9,356,727 | B2 | 5/2016 | Immendorf et al. |
| 9,397,619 | B2 | 7/2016 | Lozhkin |

(56)                References Cited

U.S. PATENT DOCUMENTS

| | | |
|---|---|---|
| 9,406,237 B2 | 8/2016 | Downey et al. |
| 9,412,278 B1 | 8/2016 | Gong et al. |
| 9,413,574 B1 | 8/2016 | Timofeev et al. |
| 9,414,237 B2 | 8/2016 | Garcia et al. |
| 9,439,078 B2 | 9/2016 | Menon et al. |
| 9,466,881 B1 | 10/2016 | Berry et al. |
| 9,529,360 B1 | 12/2016 | Melamed et al. |
| 9,537,586 B2 | 1/2017 | Carbajal |
| 9,538,040 B2 | 1/2017 | Goergen et al. |
| 9,572,055 B2 | 2/2017 | Immendorf et al. |
| 9,635,669 B2 | 4/2017 | Gormley et al. |
| 9,658,341 B2 | 5/2017 | Mathews et al. |
| 9,674,684 B1 | 6/2017 | Mendelson |
| 9,674,836 B2 | 6/2017 | Gormley et al. |
| 9,686,789 B2 | 6/2017 | Gormley et al. |
| 9,715,009 B1 | 7/2017 | Parker et al. |
| 9,749,069 B2 | 8/2017 | Garcia et al. |
| 9,755,972 B1 | 9/2017 | Mao et al. |
| 9,767,699 B1 | 9/2017 | Borghese et al. |
| 9,769,834 B2 | 9/2017 | Immendorf et al. |
| 9,805,273 B1 | 10/2017 | Seeber et al. |
| 9,819,441 B2 | 11/2017 | Immendorf et al. |
| 9,858,947 B2 | 1/2018 | Hearing et al. |
| 9,862,489 B1 | 1/2018 | Weinstein et al. |
| 9,923,700 B2 | 3/2018 | Gormley et al. |
| 9,942,775 B2 | 4/2018 | Yun et al. |
| 9,973,278 B2 | 5/2018 | Wang et al. |
| 9,989,633 B1 | 6/2018 | Pandey et al. |
| 9,998,243 B2 | 6/2018 | Garcia et al. |
| 10,027,429 B1 | 7/2018 | Kiannejad |
| 10,104,559 B2 | 10/2018 | Immendorf et al. |
| 10,157,548 B2 | 12/2018 | Priest |
| 10,194,324 B2 | 1/2019 | Yun et al. |
| 10,198,955 B1 | 2/2019 | Boyd et al. |
| 10,227,429 B2 | 3/2019 | Watanabe et al. |
| 10,234,857 B1 | 3/2019 | Melamed et al. |
| 10,235,523 B1 | 3/2019 | Keller, III et al. |
| 10,241,140 B2 | 3/2019 | Moinuddin |
| 10,251,242 B1 | 4/2019 | Rosen et al. |
| 10,281,570 B2 | 5/2019 | Parker et al. |
| 10,389,616 B2 | 8/2019 | Ryan et al. |
| 10,393,784 B2 | 8/2019 | Logan et al. |
| 10,408,936 B2 | 9/2019 | Van Voorst |
| 10,459,020 B2 | 10/2019 | Dzierwa et al. |
| 10,540,905 B2 | 1/2020 | Bohanan et al. |
| 10,552,738 B2 | 2/2020 | Holt et al. |
| 10,587,352 B2 | 3/2020 | Kiannejad |
| 10,594,034 B1 | 3/2020 | Tran et al. |
| 10,613,209 B2 | 4/2020 | Emami et al. |
| 10,642,813 B1 | 5/2020 | Lazier et al. |
| 10,698,076 B2 | 6/2020 | Jones et al. |
| 10,700,721 B2 | 6/2020 | Ayala et al. |
| 10,701,574 B2 | 6/2020 | Gormley et al. |
| 10,764,718 B1 | 9/2020 | Boettcher et al. |
| 10,784,974 B2 | 9/2020 | Menon |
| 10,811,771 B1 | 10/2020 | Tran et al. |
| 10,907,940 B1 | 2/2021 | Parker et al. |
| 10,916,845 B2 | 2/2021 | Tran et al. |
| 10,917,797 B2 | 2/2021 | Menon et al. |
| 11,012,340 B2 | 5/2021 | Ryan et al. |
| 11,035,929 B2 | 6/2021 | Parker et al. |
| 11,063,653 B2 | 7/2021 | Ottersten et al. |
| 11,190,233 B2 | 11/2021 | Lo et al. |
| 11,223,431 B2 | 1/2022 | Garcia et al. |
| 11,265,652 B2 | 3/2022 | Kallai et al. |
| 11,321,282 B2 | 5/2022 | Tran |
| 11,334,807 B1 | 5/2022 | O'Shea et al. |
| 11,336,011 B2 | 5/2022 | Tran et al. |
| 11,516,071 B2 | 11/2022 | Karapantelakis et al. |
| 11,637,641 B1 | 4/2023 | Garcia et al. |
| 11,663,992 B2 | 5/2023 | Canberk et al. |
| 11,671,839 B2 | 6/2023 | Guo et al. |
| 11,700,304 B2 | 7/2023 | Brown, Jr. et al. |
| 11,757,185 B2 | 9/2023 | Tran et al. |
| 11,777,783 B2 | 10/2023 | Meirosu et al. |
| 11,791,913 B2 | 10/2023 | Garcia et al. |
| 11,871,103 B2 | 1/2024 | Kleinbeck |
| 11,874,674 B2 | 1/2024 | Groden et al. |
| 11,880,888 B1 | 1/2024 | Gold et al. |
| 11,889,351 B2 | 1/2024 | Tagg |
| 11,910,305 B2 | 2/2024 | Buyukdura |
| 11,994,880 B2 | 5/2024 | Vallelonga et al. |
| 12,095,518 B2 | 9/2024 | Garcia et al. |
| 12,156,037 B2 | 11/2024 | Montalvo |
| 12,183,213 B1 | 12/2024 | Kleinbeck et al. |
| 12,184,963 B2 | 12/2024 | Kleinbeck |
| 12,243,431 B2 | 3/2025 | Kleinbeck et al. |
| 2001/0000959 A1 | 5/2001 | Campana et al. |
| 2001/0005423 A1 | 6/2001 | Rhoads |
| 2001/0016503 A1 | 8/2001 | Kang |
| 2001/0020220 A1 | 9/2001 | Kurosawa |
| 2002/0044082 A1 | 4/2002 | Woodington et al. |
| 2002/0070889 A1 | 6/2002 | Griffin et al. |
| 2002/0072331 A1 | 6/2002 | Fischer et al. |
| 2002/0097184 A1 | 7/2002 | Mayersak |
| 2002/0119754 A1 | 8/2002 | Wakutsu et al. |
| 2002/0161775 A1 | 10/2002 | Lasensky et al. |
| 2002/0167417 A1 | 11/2002 | Welles, II et al. |
| 2002/0173341 A1 | 11/2002 | Abdelmonem et al. |
| 2003/0013454 A1 | 1/2003 | Hunzinger |
| 2003/0040277 A1 | 2/2003 | Deats |
| 2003/0083091 A1 | 5/2003 | Nuutinen et al. |
| 2003/0087648 A1 | 5/2003 | Mezhvinsky et al. |
| 2003/0104831 A1 | 6/2003 | Razavilar et al. |
| 2003/0144601 A1 | 7/2003 | Prichep |
| 2003/0145008 A1 | 7/2003 | Burrell |
| 2003/0145328 A1 | 7/2003 | Rabinowitz et al. |
| 2003/0198304 A1 | 10/2003 | Sugar et al. |
| 2003/0206640 A1 | 11/2003 | Malvar et al. |
| 2003/0224801 A1 | 12/2003 | Lovberg et al. |
| 2003/0232612 A1 | 12/2003 | Richards et al. |
| 2004/0001688 A1 | 1/2004 | Shen |
| 2004/0023674 A1 | 2/2004 | Miller |
| 2004/0041725 A1 | 3/2004 | Matsuda et al. |
| 2004/0127214 A1 | 7/2004 | Reddy et al. |
| 2004/0137915 A1 | 7/2004 | Diener et al. |
| 2004/0147254 A1 | 7/2004 | Reddy et al. |
| 2004/0171390 A1 | 9/2004 | Chitrapu |
| 2004/0203725 A1 | 10/2004 | Lahav et al. |
| 2004/0203826 A1 | 10/2004 | Sugar et al. |
| 2004/0208238 A1 | 10/2004 | Thomas et al. |
| 2004/0219885 A1 | 11/2004 | Sugar et al. |
| 2004/0233100 A1 | 11/2004 | Dibble et al. |
| 2005/0003828 A1 | 1/2005 | Sugar et al. |
| 2005/0096026 A1 | 5/2005 | Chitrapu et al. |
| 2005/0107102 A1 | 5/2005 | Yoon et al. |
| 2005/0114023 A1 | 5/2005 | Williamson et al. |
| 2005/0152317 A1 | 7/2005 | Awater et al. |
| 2005/0159928 A1 | 7/2005 | Moser |
| 2005/0176401 A1 | 8/2005 | Nanda et al. |
| 2005/0185618 A1 | 8/2005 | Friday et al. |
| 2005/0192727 A1 | 9/2005 | Shostak et al. |
| 2005/0227625 A1 | 10/2005 | Diener |
| 2005/0285792 A1 | 12/2005 | Sugar et al. |
| 2006/0025118 A1 | 2/2006 | Chitrapu et al. |
| 2006/0047704 A1 | 3/2006 | Gopalakrishnan |
| 2006/0074558 A1 | 4/2006 | Williamson et al. |
| 2006/0080040 A1 | 4/2006 | Garczarek et al. |
| 2006/0100530 A1 | 5/2006 | Kliot et al. |
| 2006/0111899 A1 | 5/2006 | Padhi et al. |
| 2006/0128311 A1 | 6/2006 | Tesfai |
| 2006/0133263 A1 | 6/2006 | Bernard et al. |
| 2006/0199546 A1 | 9/2006 | Durgin |
| 2006/0235574 A1 | 10/2006 | Lapinski et al. |
| 2006/0238417 A1 | 10/2006 | Jendbro et al. |
| 2006/0258347 A1 | 11/2006 | Chitrapu |
| 2007/0003059 A1 | 1/2007 | Langelaar |
| 2007/0016412 A1 | 1/2007 | Mehrotra et al. |
| 2007/0041481 A1 | 2/2007 | Malkemes et al. |
| 2007/0049823 A1 | 3/2007 | Li |
| 2007/0076657 A1 | 4/2007 | Woodings et al. |
| 2007/0098089 A1 | 5/2007 | Li et al. |
| 2007/0111746 A1 | 5/2007 | Anderson |
| 2007/0126636 A1 | 6/2007 | Zhang et al. |

(56) References Cited

U.S. PATENT DOCUMENTS

| | | |
|---|---|---|
| 2007/0149216 A1 | 6/2007 | Misikangas |
| 2007/0168580 A1 | 7/2007 | Schumacher |
| 2007/0171889 A1 | 7/2007 | Kwon et al. |
| 2007/0203645 A1 | 8/2007 | Dees et al. |
| 2007/0223419 A1 | 9/2007 | Ji et al. |
| 2007/0233336 A1 | 10/2007 | Serguei et al. |
| 2007/0233409 A1 | 10/2007 | Boyan et al. |
| 2007/0273581 A1 | 11/2007 | Garrison et al. |
| 2007/0293171 A1 | 12/2007 | Li et al. |
| 2007/0296591 A1 | 12/2007 | Frederick et al. |
| 2007/0297541 A1 | 12/2007 | Mcgehee |
| 2008/0001735 A1 | 1/2008 | Tran |
| 2008/0010040 A1 | 1/2008 | Mcgehee |
| 2008/0090563 A1 | 4/2008 | Chitrapu |
| 2008/0113634 A1 | 5/2008 | Gates et al. |
| 2008/0123731 A1 | 5/2008 | Wegener |
| 2008/0129367 A1 | 6/2008 | Murata et al. |
| 2008/0130519 A1 | 6/2008 | Bahl et al. |
| 2008/0133190 A1 | 6/2008 | Peretz et al. |
| 2008/0180325 A1 | 7/2008 | Chung et al. |
| 2008/0186235 A1 | 8/2008 | Struckman et al. |
| 2008/0195584 A1 | 8/2008 | Nath et al. |
| 2008/0209117 A1 | 8/2008 | Kajigaya |
| 2008/0211481 A1 | 9/2008 | Chen |
| 2008/0214903 A1 | 9/2008 | Orbach |
| 2008/0252516 A1 | 10/2008 | Ho et al. |
| 2008/0261509 A1 | 10/2008 | Sen |
| 2008/0293353 A1 | 11/2008 | Mody et al. |
| 2009/0006103 A1 | 1/2009 | Koishida et al. |
| 2009/0011713 A1 | 1/2009 | Abusubaih et al. |
| 2009/0018422 A1 | 1/2009 | Banet et al. |
| 2009/0021420 A1 | 1/2009 | Sahinoglu |
| 2009/0046003 A1 | 2/2009 | Tung et al. |
| 2009/0046625 A1 | 2/2009 | Diener et al. |
| 2009/0066578 A1 | 3/2009 | Beadle et al. |
| 2009/0086993 A1 | 4/2009 | Kawaguchi et al. |
| 2009/0103094 A1 | 4/2009 | Hilfiker et al. |
| 2009/0111463 A1 | 4/2009 | Simms et al. |
| 2009/0131067 A1 | 5/2009 | Aaron |
| 2009/0135046 A1 | 5/2009 | Steele et al. |
| 2009/0136052 A1 | 5/2009 | Hohlfeld et al. |
| 2009/0143019 A1 | 6/2009 | Shellhammer |
| 2009/0146881 A1 | 6/2009 | Mesecher |
| 2009/0149202 A1 | 6/2009 | Hill et al. |
| 2009/0190511 A1 | 7/2009 | Li et al. |
| 2009/0207950 A1 | 8/2009 | Tsuruta et al. |
| 2009/0224957 A1 | 9/2009 | Chung et al. |
| 2009/0245327 A1 | 10/2009 | Michaels |
| 2009/0273517 A1 | 11/2009 | Thiesen et al. |
| 2009/0278733 A1 | 11/2009 | Haworth |
| 2009/0280748 A1 | 11/2009 | Shan et al. |
| 2009/0282130 A1 | 11/2009 | Antoniou et al. |
| 2009/0285173 A1 | 11/2009 | Koorapaty et al. |
| 2009/0286563 A1 | 11/2009 | Ji et al. |
| 2009/0322510 A1 | 12/2009 | Berger et al. |
| 2010/0020707 A1 | 1/2010 | Woodings |
| 2010/0044122 A1 | 2/2010 | Sleeman et al. |
| 2010/0056200 A1 | 3/2010 | Tolonen |
| 2010/0075704 A1* | 3/2010 | McHenry ............. H04W 16/14 |
| | | 455/67.11 |
| 2010/0109936 A1 | 5/2010 | Levy |
| 2010/0142454 A1 | 6/2010 | Chang |
| 2010/0150122 A1 | 6/2010 | Berger et al. |
| 2010/0172443 A1 | 7/2010 | Shim et al. |
| 2010/0173586 A1 | 7/2010 | Mchenry et al. |
| 2010/0176988 A1 | 7/2010 | Maezawa et al. |
| 2010/0177710 A1 | 7/2010 | Gutkin et al. |
| 2010/0220011 A1 | 9/2010 | Heuser |
| 2010/0253512 A1 | 10/2010 | Wagner et al. |
| 2010/0255794 A1 | 10/2010 | Agnew |
| 2010/0255801 A1 | 10/2010 | Gunasekara et al. |
| 2010/0259998 A1 | 10/2010 | Kwon et al. |
| 2010/0279680 A1 | 11/2010 | Reudink |
| 2010/0292930 A1 | 11/2010 | Koster et al. |
| 2010/0306249 A1 | 12/2010 | Hill et al. |
| 2010/0309317 A1 | 12/2010 | Wu et al. |
| 2010/0325621 A1 | 12/2010 | Andrade et al. |
| 2011/0022342 A1 | 1/2011 | Pandharipande et al. |
| 2011/0045781 A1 | 2/2011 | Shellhammer et al. |
| 2011/0053604 A1 | 3/2011 | Kim et al. |
| 2011/0059747 A1 | 3/2011 | Lindoff et al. |
| 2011/0070885 A1 | 3/2011 | Ruuska et al. |
| 2011/0074631 A1 | 3/2011 | Parker |
| 2011/0077017 A1 | 3/2011 | Yu et al. |
| 2011/0087639 A1 | 4/2011 | Gurney |
| 2011/0090939 A1 | 4/2011 | Diener et al. |
| 2011/0096770 A1 | 4/2011 | Henry |
| 2011/0102258 A1 | 5/2011 | Underbrink et al. |
| 2011/0111751 A1 | 5/2011 | Markhovsky et al. |
| 2011/0116484 A1 | 5/2011 | Henry |
| 2011/0117869 A1 | 5/2011 | Woodings |
| 2011/0122855 A1 | 5/2011 | Henry |
| 2011/0129006 A1 | 6/2011 | Jung et al. |
| 2011/0131260 A1 | 6/2011 | Mody |
| 2011/0134878 A1 | 6/2011 | Geiger et al. |
| 2011/0136478 A1 | 6/2011 | Trigui |
| 2011/0151876 A1 | 6/2011 | Ishii et al. |
| 2011/0183621 A1 | 7/2011 | Quan et al. |
| 2011/0183685 A1 | 7/2011 | Burton et al. |
| 2011/0185059 A1 | 7/2011 | Adnani et al. |
| 2011/0188544 A1 | 8/2011 | Ponnuswamy |
| 2011/0235728 A1 | 9/2011 | Karabinis |
| 2011/0237243 A1 | 9/2011 | Guvenc et al. |
| 2011/0241923 A1 | 10/2011 | Chernukhin |
| 2011/0273328 A1 | 11/2011 | Parker |
| 2011/0286555 A1 | 11/2011 | Cho et al. |
| 2011/0286604 A1 | 11/2011 | Matsuo |
| 2011/0287779 A1 | 11/2011 | Harper |
| 2011/0299481 A1 | 12/2011 | Kim et al. |
| 2011/0300849 A1 | 12/2011 | Chan |
| 2011/0319120 A1 | 12/2011 | Chen et al. |
| 2012/0014332 A1 | 1/2012 | Smith et al. |
| 2012/0032854 A1 | 2/2012 | Bull et al. |
| 2012/0039284 A1 | 2/2012 | Barbieri et al. |
| 2012/0040602 A1 | 2/2012 | Charland |
| 2012/0047544 A1 | 2/2012 | Bouchard |
| 2012/0052869 A1 | 3/2012 | Lindoff et al. |
| 2012/0058775 A1 | 3/2012 | Dupray et al. |
| 2012/0063302 A1 | 3/2012 | Damnjanovic et al. |
| 2012/0071188 A1 | 3/2012 | Wang et al. |
| 2012/0072986 A1 | 3/2012 | Livsics et al. |
| 2012/0077510 A1 | 3/2012 | Chen et al. |
| 2012/0078071 A1 | 3/2012 | Bohm et al. |
| 2012/0081248 A1 | 4/2012 | Kennedy et al. |
| 2012/0094681 A1 | 4/2012 | Freda et al. |
| 2012/0100810 A1 | 4/2012 | Oksanen et al. |
| 2012/0105066 A1 | 5/2012 | Marvin et al. |
| 2012/0115522 A1 | 5/2012 | Nama et al. |
| 2012/0115525 A1 | 5/2012 | Kang et al. |
| 2012/0120892 A1 | 5/2012 | Freda et al. |
| 2012/0129522 A1 | 5/2012 | Kim et al. |
| 2012/0140236 A1 | 6/2012 | Babbitt et al. |
| 2012/0142386 A1 | 6/2012 | Mody et al. |
| 2012/0148068 A1 | 6/2012 | Chandra et al. |
| 2012/0148069 A1 | 6/2012 | Bai et al. |
| 2012/0155217 A1 | 6/2012 | Dellinger et al. |
| 2012/0169424 A1 | 7/2012 | Pinarello et al. |
| 2012/0182430 A1 | 7/2012 | Birkett et al. |
| 2012/0195269 A1 | 8/2012 | Kang et al. |
| 2012/0212628 A1 | 8/2012 | Wu et al. |
| 2012/0214511 A1 | 8/2012 | Vartanian et al. |
| 2012/0230214 A1 | 9/2012 | Kozisek et al. |
| 2012/0246392 A1 | 9/2012 | Cheon |
| 2012/0264388 A1 | 10/2012 | Guo et al. |
| 2012/0264445 A1 | 10/2012 | Lee et al. |
| 2012/0275354 A1 | 11/2012 | Villain |
| 2012/0281000 A1 | 11/2012 | Woodings |
| 2012/0282942 A1 | 11/2012 | Uusitalo et al. |
| 2012/0295575 A1 | 11/2012 | Nam |
| 2012/0302190 A1 | 11/2012 | Mchenry |
| 2012/0302263 A1 | 11/2012 | Tinnakornsrisuphap et al. |
| 2012/0309288 A1 | 12/2012 | Lu |
| 2012/0321024 A1 | 12/2012 | Wasiewicz et al. |
| 2012/0322487 A1 | 12/2012 | Stanforth |

(56) References Cited

U.S. PATENT DOCUMENTS

| | | |
|---|---|---|
| 2013/0005240 A1 | 1/2013 | Novak et al. |
| 2013/0005374 A1 | 1/2013 | Uusitalo et al. |
| 2013/0012134 A1 | 1/2013 | Jin et al. |
| 2013/0017794 A1 | 1/2013 | Kloper et al. |
| 2013/0023285 A1 | 1/2013 | Markhovsky et al. |
| 2013/0028111 A1 | 1/2013 | Dain et al. |
| 2013/0035108 A1 | 2/2013 | Joslyn et al. |
| 2013/0035128 A1 | 2/2013 | Chan et al. |
| 2013/0045754 A1 | 2/2013 | Markhovsky et al. |
| 2013/0052939 A1 | 2/2013 | Anniballi et al. |
| 2013/0053054 A1 | 2/2013 | Lovitt et al. |
| 2013/0062334 A1 | 3/2013 | Bilchinsky et al. |
| 2013/0064197 A1 | 3/2013 | Novak et al. |
| 2013/0064328 A1 | 3/2013 | Adnani et al. |
| 2013/0070639 A1 | 3/2013 | Demura et al. |
| 2013/0090071 A1 | 4/2013 | Abraham et al. |
| 2013/0095843 A1 | 4/2013 | Smith et al. |
| 2013/0100154 A1 | 4/2013 | Woodings et al. |
| 2013/0103684 A1 | 4/2013 | Yee et al. |
| 2013/0113659 A1 | 5/2013 | Morgan |
| 2013/0165051 A9 | 6/2013 | Li et al. |
| 2013/0165134 A1 | 6/2013 | Touag et al. |
| 2013/0165170 A1 | 6/2013 | Kang |
| 2013/0183989 A1 | 7/2013 | Hasegawa et al. |
| 2013/0183994 A1 | 7/2013 | Ringstroem et al. |
| 2013/0184022 A1 | 7/2013 | Schmidt |
| 2013/0190003 A1 | 7/2013 | Smith et al. |
| 2013/0190028 A1 | 7/2013 | Wang et al. |
| 2013/0196677 A1 | 8/2013 | Smith et al. |
| 2013/0208587 A1 | 8/2013 | Bala et al. |
| 2013/0210457 A1 | 8/2013 | Kummetz |
| 2013/0210473 A1 | 8/2013 | Weigand |
| 2013/0217406 A1 | 8/2013 | Villardi et al. |
| 2013/0217408 A1 | 8/2013 | Difazio et al. |
| 2013/0217450 A1 | 8/2013 | Kanj et al. |
| 2013/0231121 A1 | 9/2013 | Kwak et al. |
| 2013/0237212 A1 | 9/2013 | Khayrallah et al. |
| 2013/0242792 A1 | 9/2013 | Woodings |
| 2013/0242934 A1 | 9/2013 | Ueda et al. |
| 2013/0260703 A1 | 10/2013 | Actis et al. |
| 2013/0265198 A1 | 10/2013 | Stroud |
| 2013/0272436 A1 | 10/2013 | Makhlouf et al. |
| 2013/0275346 A1 | 10/2013 | Srikanteswara et al. |
| 2013/0279556 A1 | 10/2013 | Seller |
| 2013/0288734 A1 | 10/2013 | Mody et al. |
| 2013/0309975 A1 | 11/2013 | Kpodzo et al. |
| 2013/0315112 A1 | 11/2013 | Gormley et al. |
| 2013/0329690 A1 | 12/2013 | Kim et al. |
| 2013/0331114 A1 | 12/2013 | Gormley et al. |
| 2014/0003547 A1 | 1/2014 | Williams et al. |
| 2014/0015796 A1 | 1/2014 | Philipp |
| 2014/0018683 A1 | 1/2014 | Park et al. |
| 2014/0018979 A1 | 1/2014 | Goossen et al. |
| 2014/0024405 A1 | 1/2014 | Qiu |
| 2014/0064723 A1 | 3/2014 | Adles et al. |
| 2014/0066060 A1 | 3/2014 | Ngai |
| 2014/0073261 A1 | 3/2014 | Hassan et al. |
| 2014/0086212 A1 | 3/2014 | Kafle et al. |
| 2014/0112281 A1 | 4/2014 | Lau et al. |
| 2014/0128032 A1 | 5/2014 | Muthukumar et al. |
| 2014/0139374 A1 | 5/2014 | Wellman et al. |
| 2014/0163309 A1 | 6/2014 | Bernhard et al. |
| 2014/0199993 A1 | 7/2014 | Dhanda et al. |
| 2014/0201367 A1 | 7/2014 | Trummer et al. |
| 2014/0204766 A1 | 7/2014 | Immendorf et al. |
| 2014/0206279 A1 | 7/2014 | Immendorf et al. |
| 2014/0206307 A1 | 7/2014 | Maurer et al. |
| 2014/0206343 A1 | 7/2014 | Immendorf et al. |
| 2014/0207414 A1 | 7/2014 | Bordow |
| 2014/0225590 A1 | 8/2014 | Jacobs |
| 2014/0256268 A1 | 9/2014 | Olgaard |
| 2014/0256370 A9 | 9/2014 | Gautier et al. |
| 2014/0269374 A1 | 9/2014 | Abdelmonem et al. |
| 2014/0269376 A1 | 9/2014 | Garcia et al. |
| 2014/0274103 A1 | 9/2014 | Steer et al. |
| 2014/0287100 A1 | 9/2014 | Libman |
| 2014/0301216 A1 | 10/2014 | Immendorf et al. |
| 2014/0302796 A1 | 10/2014 | Gormley et al. |
| 2014/0335879 A1 | 11/2014 | Immendorf et al. |
| 2014/0340684 A1 | 11/2014 | Edler et al. |
| 2014/0342675 A1* | 11/2014 | Massarella ............ H04B 17/00 |
| | | 455/67.14 |
| 2014/0348004 A1 | 11/2014 | Ponnuswamy |
| 2014/0362934 A1 | 12/2014 | Kumar |
| 2015/0016429 A1 | 1/2015 | Menon et al. |
| 2015/0023329 A1 | 1/2015 | Jiang et al. |
| 2015/0068296 A1 | 3/2015 | Lanza di et al. |
| 2015/0072633 A1 | 3/2015 | Massarella et al. |
| 2015/0126181 A1 | 5/2015 | Breuer et al. |
| 2015/0133058 A1 | 5/2015 | Livis et al. |
| 2015/0150753 A1 | 6/2015 | Racette |
| 2015/0156827 A1 | 6/2015 | Ibragimov et al. |
| 2015/0170145 A1 | 6/2015 | Patel et al. |
| 2015/0201385 A1 | 7/2015 | Mercer et al. |
| 2015/0208312 A1 | 7/2015 | Fudaba |
| 2015/0215794 A1 | 7/2015 | Gormley et al. |
| 2015/0215949 A1 | 7/2015 | Gormley et al. |
| 2015/0242384 A1 | 8/2015 | Reiter |
| 2015/0248047 A1 | 9/2015 | Chakraborty |
| 2015/0289254 A1 | 10/2015 | Garcia et al. |
| 2015/0289265 A1 | 10/2015 | Gormley et al. |
| 2015/0296386 A1 | 10/2015 | Menon et al. |
| 2015/0301167 A1 | 10/2015 | Sentelle et al. |
| 2015/0319768 A1 | 11/2015 | Abdelmonem et al. |
| 2015/0373528 A1 | 12/2015 | Iwai |
| 2016/0014713 A1 | 1/2016 | Kennedy et al. |
| 2016/0037550 A1 | 2/2016 | Barabell et al. |
| 2016/0050690 A1 | 2/2016 | Yun et al. |
| 2016/0061583 A1 | 3/2016 | Ryu et al. |
| 2016/0069994 A1 | 3/2016 | Allen et al. |
| 2016/0072597 A1 | 3/2016 | Carbajal |
| 2016/0073318 A1 | 3/2016 | Aguirre |
| 2016/0080955 A1 | 3/2016 | Carbajal |
| 2016/0086621 A1 | 3/2016 | Hearing et al. |
| 2016/0095188 A1 | 3/2016 | Verberkt et al. |
| 2016/0117853 A1 | 4/2016 | Zhong et al. |
| 2016/0124041 A1 | 5/2016 | Pathak et al. |
| 2016/0124071 A1 | 5/2016 | Baxley et al. |
| 2016/0126988 A1 | 5/2016 | Mester et al. |
| 2016/0127110 A1 | 5/2016 | McMeekin et al. |
| 2016/0127392 A1 | 5/2016 | Baxley et al. |
| 2016/0154406 A1 | 6/2016 | Im et al. |
| 2016/0161578 A1 | 6/2016 | Weissler et al. |
| 2016/0198471 A1 | 7/2016 | Young et al. |
| 2016/0219506 A1 | 7/2016 | Pratt et al. |
| 2016/0219590 A1 | 7/2016 | Khawer et al. |
| 2016/0225240 A1 | 8/2016 | Voddhi et al. |
| 2016/0241910 A1 | 8/2016 | Rowe |
| 2016/0245921 A1 | 8/2016 | Li et al. |
| 2016/0252342 A1 | 9/2016 | Feldmann et al. |
| 2016/0323920 A1 | 11/2016 | Carbajal |
| 2016/0328983 A1 | 11/2016 | Hutchinson et al. |
| 2016/0334527 A1 | 11/2016 | Xu et al. |
| 2016/0345135 A1 | 11/2016 | Garcia et al. |
| 2016/0364079 A1 | 12/2016 | Qiu et al. |
| 2016/0366685 A1 | 12/2016 | Gormley et al. |
| 2016/0374088 A1 | 12/2016 | Garcia et al. |
| 2017/0024767 A1 | 1/2017 | Johnson, Jr. et al. |
| 2017/0025996 A1 | 1/2017 | Cheung et al. |
| 2017/0039413 A1 | 2/2017 | Nadler |
| 2017/0041895 A1 | 2/2017 | Gan |
| 2017/0048838 A1 | 2/2017 | Chrisikos et al. |
| 2017/0059692 A1 | 3/2017 | Laufer et al. |
| 2017/0061690 A1 | 3/2017 | Laughlin et al. |
| 2017/0064564 A1 | 3/2017 | Yun et al. |
| 2017/0078792 A1 | 3/2017 | Simons |
| 2017/0079007 A1 | 3/2017 | Carbajal |
| 2017/0094527 A1 | 3/2017 | Shattil et al. |
| 2017/0118049 A1 | 4/2017 | Miao et al. |
| 2017/0134631 A1 | 5/2017 | Zhao et al. |
| 2017/0146462 A1 | 5/2017 | Baker et al. |
| 2017/0148332 A1 | 5/2017 | Ziemba et al. |
| 2017/0148467 A1 | 5/2017 | Franklin et al. |
| 2017/0192089 A1 | 7/2017 | Parker et al. |

(56) References Cited

U.S. PATENT DOCUMENTS

| | | |
|---|---|---|
| 2017/0208495 A1 | 7/2017 | Kleinbeck et al. |
| 2017/0234979 A1 | 8/2017 | Mathews et al. |
| 2017/0237484 A1 | 8/2017 | Heath et al. |
| 2017/0238201 A1 | 8/2017 | Gormley et al. |
| 2017/0238203 A1 | 8/2017 | Dzierwa et al. |
| 2017/0243138 A1 | 8/2017 | Dzierwa et al. |
| 2017/0243139 A1 | 8/2017 | Dzierwa et al. |
| 2017/0248677 A1 | 8/2017 | Mahmood et al. |
| 2017/0248807 A1 | 8/2017 | Jiang et al. |
| 2017/0250766 A1 | 8/2017 | Dzierwa et al. |
| 2017/0253330 A1 | 9/2017 | Saigh et al. |
| 2017/0261604 A1 | 9/2017 | Van Voorst |
| 2017/0261613 A1 | 9/2017 | Van Voorst |
| 2017/0261615 A1 | 9/2017 | Ying et al. |
| 2017/0274992 A1 | 9/2017 | Chretien |
| 2017/0276763 A1 | 9/2017 | Howard |
| 2017/0289840 A1 | 10/2017 | Sung et al. |
| 2017/0290075 A1 | 10/2017 | Carbajal et al. |
| 2017/0303014 A1 | 10/2017 | Ghessassi |
| 2017/0311307 A1 | 10/2017 | Negus et al. |
| 2017/0358103 A1 | 12/2017 | Shao et al. |
| 2017/0366361 A1 | 12/2017 | Afkhami et al. |
| 2017/0374572 A1 | 12/2017 | Kleinbeck et al. |
| 2017/0374573 A1 | 12/2017 | Kleinbeck et al. |
| 2018/0006730 A1 | 1/2018 | Kuo et al. |
| 2018/0014217 A1 | 1/2018 | Kleinbeck et al. |
| 2018/0024220 A1* | 1/2018 | Massarella .............. G01S 3/043 342/417 |
| 2018/0046869 A1 | 2/2018 | Cordell et al. |
| 2018/0070362 A1 | 3/2018 | Ryan et al. |
| 2018/0074170 A1 | 3/2018 | Ray |
| 2018/0074171 A1 | 3/2018 | Ray et al. |
| 2018/0081355 A1 | 3/2018 | Magy et al. |
| 2018/0083721 A1 | 3/2018 | Wada et al. |
| 2018/0098173 A1 | 4/2018 | van Brandenburg et al. |
| 2018/0115065 A1 | 4/2018 | Valdes Garcia et al. |
| 2018/0124533 A1 | 5/2018 | Messier et al. |
| 2018/0129881 A1 | 5/2018 | Seeber et al. |
| 2018/0131445 A1 | 5/2018 | Esman et al. |
| 2018/0143314 A1 | 5/2018 | Pelletier et al. |
| 2018/0149729 A1 | 5/2018 | Grandin et al. |
| 2018/0211179 A1 | 7/2018 | Dzierwa |
| 2018/0284758 A1 | 10/2018 | Cella et al. |
| 2018/0288620 A1 | 10/2018 | Jayawickrama et al. |
| 2018/0288630 A1 | 10/2018 | Guirguis et al. |
| 2018/0294901 A1 | 10/2018 | Garcia et al. |
| 2018/0313877 A1 | 11/2018 | Brant et al. |
| 2018/0313945 A1 | 11/2018 | Parker et al. |
| 2018/0324595 A1 | 11/2018 | Shima |
| 2018/0329020 A1 | 11/2018 | Hafizovic et al. |
| 2018/0331863 A1 | 11/2018 | Carbajal |
| 2019/0004518 A1 | 1/2019 | Zhou et al. |
| 2019/0011534 A1 | 1/2019 | Trotta et al. |
| 2019/0018103 A1 | 1/2019 | Qian et al. |
| 2019/0049943 A1 | 2/2019 | Xue et al. |
| 2019/0064130 A1 | 2/2019 | Kanazawa et al. |
| 2019/0064223 A1 | 2/2019 | Kincaid |
| 2019/0072601 A1 | 3/2019 | Dzierwa et al. |
| 2019/0074802 A1 | 3/2019 | Geha et al. |
| 2019/0077507 A1 | 3/2019 | Ferris et al. |
| 2019/0123428 A1 | 4/2019 | Packer et al. |
| 2019/0180630 A1 | 6/2019 | Kleinbeck |
| 2019/0190553 A1 | 6/2019 | Tsuji et al. |
| 2019/0191313 A1 | 6/2019 | Dzierwa et al. |
| 2019/0200303 A1 | 6/2019 | Nakahara |
| 2019/0208112 A1 | 7/2019 | Kleinbeck |
| 2019/0208491 A1 | 7/2019 | Dzierwa et al. |
| 2019/0215709 A1 | 7/2019 | Kleinbeck et al. |
| 2019/0223139 A1 | 7/2019 | Kleinbeck et al. |
| 2019/0230539 A1 | 7/2019 | Dzierwa et al. |
| 2019/0230540 A1 | 7/2019 | Carbajal et al. |
| 2019/0236266 A1 | 8/2019 | Nashimoto et al. |
| 2019/0245722 A1 | 8/2019 | Carbajal |
| 2019/0246304 A1 | 8/2019 | Dzierwa et al. |
| 2019/0253160 A1 | 8/2019 | Garcia et al. |
| 2019/0253905 A1 | 8/2019 | Kleinbeck et al. |
| 2019/0260768 A1 | 8/2019 | Mestha et al. |
| 2019/0274059 A1 | 9/2019 | Kleinbeck et al. |
| 2019/0296910 A1 | 9/2019 | Cheung |
| 2019/0302249 A1 | 10/2019 | High et al. |
| 2019/0302275 A1 | 10/2019 | Tao et al. |
| 2019/0342202 A1 | 11/2019 | Ryan et al. |
| 2019/0346571 A1 | 11/2019 | Furumoto |
| 2019/0360783 A1 | 11/2019 | Whittaker |
| 2019/0364433 A1 | 11/2019 | Das |
| 2019/0364533 A1 | 11/2019 | Kleinbeck et al. |
| 2020/0034620 A1 | 1/2020 | Lutterodt |
| 2020/0036459 A1 | 1/2020 | Menon |
| 2020/0036487 A1 | 1/2020 | Hammond et al. |
| 2020/0043346 A1 | 2/2020 | Vacek |
| 2020/0059800 A1 | 2/2020 | Menon et al. |
| 2020/0066132 A1 | 2/2020 | Kleinbeck |
| 2020/0067752 A1 | 2/2020 | DelMarco |
| 2020/0068573 A1 | 2/2020 | Drozd et al. |
| 2020/0096548 A1 | 3/2020 | Dzierwa et al. |
| 2020/0107207 A1 | 4/2020 | Kleinbeck et al. |
| 2020/0120266 A1 | 4/2020 | Kleinbeck |
| 2020/0128418 A1 | 4/2020 | Dzierwa et al. |
| 2020/0137583 A1 | 4/2020 | Economy et al. |
| 2020/0142029 A1 | 5/2020 | Brooker et al. |
| 2020/0145032 A1 | 5/2020 | Ayala et al. |
| 2020/0162890 A1 | 5/2020 | Spencer et al. |
| 2020/0167196 A1 | 5/2020 | Smith et al. |
| 2020/0169892 A1 | 5/2020 | Dzierwa et al. |
| 2020/0184832 A1 | 6/2020 | Kleinbeck |
| 2020/0196269 A1 | 6/2020 | Dzierwa et al. |
| 2020/0196270 A1 | 6/2020 | Kleinbeck et al. |
| 2020/0242603 A1 | 7/2020 | Salkintzis |
| 2020/0245167 A1 | 7/2020 | Kleinbeck et al. |
| 2020/0260306 A1 | 8/2020 | Kleinbeck et al. |
| 2020/0294032 A1 | 9/2020 | Cheng et al. |
| 2020/0295855 A1 | 9/2020 | Kleinbeck et al. |
| 2020/0382961 A1 | 12/2020 | Shattil et al. |
| 2020/0388036 A1 | 12/2020 | Skrede et al. |
| 2021/0014696 A1 | 1/2021 | Brookes |
| 2021/0067974 A1 | 3/2021 | Guo et al. |
| 2021/0082254 A1 | 3/2021 | Givant |
| 2021/0084217 A1 | 3/2021 | Kleinbeck |
| 2021/0211911 A1 | 7/2021 | Kleinbeck et al. |
| 2021/0250795 A1 | 8/2021 | Dzierwa et al. |
| 2021/0255356 A1 | 8/2021 | Vu et al. |
| 2021/0280039 A1 | 9/2021 | Kleinbeck |
| 2021/0281510 A1 | 9/2021 | Brown, Jr. et al. |
| 2021/0306022 A1 | 9/2021 | Fernando et al. |
| 2021/0360423 A1 | 11/2021 | Dzierwa et al. |
| 2021/0360450 A1 | 11/2021 | Kleinbeck et al. |
| 2021/0360453 A1 | 11/2021 | Kleinbeck et al. |
| 2021/0360454 A1 | 11/2021 | Carbajal et al. |
| 2021/0407305 A1 | 12/2021 | Jordan et al. |
| 2021/0409591 A1 | 12/2021 | Kleinbeck |
| 2022/0030541 A1 | 1/2022 | Dzierwa et al. |
| 2022/0052770 A1 | 2/2022 | Kleinbeck et al. |
| 2022/0128612 A1 | 4/2022 | Dzierwa et al. |
| 2022/0131623 A1 | 4/2022 | Garcia et al. |
| 2022/0150824 A1 | 5/2022 | Kleinbeck et al. |
| 2022/0174525 A1 | 6/2022 | Dzierwa et al. |
| 2022/0253407 A1 | 8/2022 | Tran |
| 2022/0262228 A1 | 8/2022 | Kleinbeck |
| 2022/0262261 A1 | 8/2022 | Kleinbeck |
| 2022/0286997 A1 | 9/2022 | Kleinbeck et al. |
| 2022/0376921 A1 | 11/2022 | Maria |
| 2023/0018133 A1 | 1/2023 | Burnette et al. |
| 2023/0045636 A1 | 2/2023 | Dzierwa et al. |
| 2023/0087729 A1 | 3/2023 | Goldstein et al. |
| 2023/0098387 A1 | 3/2023 | Hafeez et al. |
| 2023/0105718 A1 | 4/2023 | Carbajal |
| 2023/0114804 A1 | 4/2023 | Kleinbeck |
| 2023/0116761 A1 | 4/2023 | Barry et al. |
| 2023/0118723 A1 | 4/2023 | Carbajal et al. |
| 2023/0123375 A1 | 4/2023 | Dzierwa et al. |
| 2023/0126223 A1 | 4/2023 | Kleinbeck et al. |
| 2023/0189010 A1 | 6/2023 | Muhammad et al. |
| 2023/0189382 A1 | 6/2023 | Haustein et al. |
| 2023/0206216 A1 | 6/2023 | Lehmann et al. |

(56) References Cited

U.S. PATENT DOCUMENTS

| 2023/0209378 A1 | 6/2023 | Kleinbeck et al. |
| 2023/0232244 A1 | 7/2023 | Dzierwa et al. |
| 2023/0252744 A1 | 8/2023 | Miller et al. |
| 2023/0254054 A1 | 8/2023 | Garcia et al. |
| 2023/0254567 A1 | 8/2023 | Kleinbeck |
| 2023/0254702 A1 | 8/2023 | Damnjanovic et al. |
| 2023/0275791 A1 | 8/2023 | Carbajal |
| 2023/0276280 A1 | 8/2023 | Kleinbeck et al. |
| 2023/0300256 A1 | 9/2023 | Zhao et al. |
| 2023/0308789 A1 | 9/2023 | Tian et al. |
| 2023/0308915 A1 | 9/2023 | Carbajal et al. |
| 2023/0326323 A1 | 10/2023 | Kleinbeck |
| 2023/0334472 A1 | 10/2023 | Pene |
| 2023/0345441 A1 | 10/2023 | Baxley |
| 2023/0349962 A1 | 11/2023 | Dzierwa et al. |
| 2023/0378645 A1 | 11/2023 | Tran |
| 2023/0403564 A1 | 12/2023 | Dzierwa et al. |
| 2024/0005409 A1 | 1/2024 | Doney |
| 2024/0007204 A1 | 1/2024 | Kleinbeck et al. |
| 2024/0007479 A1 | 1/2024 | Doney |
| 2024/0023054 A1 | 1/2024 | Dzierwa et al. |
| 2024/0029572 A1 | 1/2024 | Kleinbeck |
| 2024/0031042 A1 | 1/2024 | Garcia et al. |
| 2024/0032084 A1 | 1/2024 | Hellwig |
| 2024/0087460 A1 | 3/2024 | Zelenka |
| 2024/0089130 A1 | 3/2024 | Wang et al. |
| 2024/0097951 A1 | 3/2024 | Carbajal |
| 2024/0103059 A1 | 3/2024 | Dzierwa et al. |
| 2024/0114370 A1 | 4/2024 | Kleinbeck et al. |
| 2024/0160791 A1 | 5/2024 | He et al. |
| 2024/0241163 A1 | 7/2024 | Dzierwa et al. |
| 2024/0242589 A1 | 7/2024 | Kleinbeck |
| 2024/0244461 A1 | 7/2024 | Kleinbeck et al. |
| 2024/0267268 A1 | 8/2024 | Carbajal |
| 2024/0267769 A1 | 8/2024 | Dzierwa et al. |
| 2024/0275504 A1 | 8/2024 | Kleinbeck et al. |
| 2024/0276261 A1 | 8/2024 | Kleinbeck et al. |
| 2024/0276262 A1 | 8/2024 | Kleinbeck et al. |
| 2024/0284214 A1 | 8/2024 | Kleinbeck et al. |
| 2024/0292248 A1 | 8/2024 | Kleinbeck et al. |
| 2024/0306019 A1 | 9/2024 | Murias et al. |
| 2024/0330927 A1 | 10/2024 | Abdelrahman et al. |
| 2024/0362631 A1 | 10/2024 | Agrawal et al. |
| 2024/0373463 A1 | 11/2024 | Furuichi et al. |
| 2024/0378982 A1 | 11/2024 | Kleinbeck |
| 2024/0381106 A1 | 11/2024 | Montalvo et al. |
| 2024/0386800 A1 | 11/2024 | Kleinbeck et al. |
| 2024/0386801 A1 | 11/2024 | Kleinbeck et al. |
| 2024/0388935 A1 | 11/2024 | Carbajal et al. |
| 2024/0388937 A1 | 11/2024 | Murias et al. |
| 2024/0396648 A1 | 11/2024 | Kleinbeck et al. |
| 2024/0430142 A1 | 12/2024 | Carbajal |
| 2025/0007629 A1 | 1/2025 | Dzierwa et al. |
| 2025/0039711 A1 | 1/2025 | Dzierwa et al. |
| 2025/0063405 A1 | 2/2025 | Carbajal et al. |
| 2025/0071584 A1 | 2/2025 | Kleinbeck et al. |

FOREIGN PATENT DOCUMENTS

| KR | 20140041618 A | 4/2014 |
| SU | 953557 A1 | 8/1982 |
| WO | 2012129932 A1 | 10/2012 |
| WO | 2018184682 A1 | 10/2018 |
| WO | 2023197982 A1 | 10/2023 |
| WO | 2023232010 A1 | 12/2023 |

OTHER PUBLICATIONS

"A Low-Cost, Near-Real-Time Two-LIAS-Based UWB Emitter Monitoring System"; Wang et al.; IEEE A&E Systems Magazine Nov. 2015 (Year: 2015).

"Joint TDOA and FDOA Estimation: A Conditional Bound and Its Use for Optimally Weighted Localization"; Yeredor et al.; IEEE Transactions On Signal Processing, vol. 59, No. 4, Apr. 2011 (Year: 2011).

"Multipath TDOA and FDOA Estimation Using the EM Algorithm"; Belanger; Apr. 27, 1993; 1993 IEEE International Conference on Acoustics, Speech, and Signal Processing (Year: 1993).

"Noise Figure", Wikipedia, located at https://en.wikipedia.org/wiki/Noise_figure (Year: 2022).

"Signal Models for TDOA/FDOA Estimation"; Fowler et al.; IEEE Transactions On Aerospace and Electronic Systems vol. 44, No. Oct. 4, 2008 (Year: 2008).

"Specific attenuation model for rain for use in prediction methods", Recommendation ITU-R P.838-3 (Year: 2005).

Bluetooth vs Zigbee-difference between Bluetooth and Zigbee (located at https://www.rfwireless-world.com/Terminology/Bluetooth-vs-zigbee.html) (Year: 2012).

Boll S.F., Suppression of Acoustic Noise in Speech Using Spectral Subtraction, Apr. 1979, IEEE Transactions On Acoustics, Speech, and Signal Processing, vol. ASSP-27, No. 2, (Year: 1979).

David Eppink and Wolf Kuebler, "TIREM/SEM Handbook", Mar. 1994, IIT Research Institute, p. 1-6, located at http://www.dtic.mil/cgi-bin/GetTRDoc?Location=U2&doc=GetTRDoc.pdf&AD=ADA296913.

English translation of SU-953557-A1 (Year: 2024).

Gabriel Garcia and Daniel Carbajal, U.S. Appl. No. 61/789,758, Provisional Patent Application, Filed Mar. 15, 2013 (Specification, Claims, and Drawings).

Gary L. Sugar, System and method for locating wireless devices in an unsynchronized wireless network, U.S. Appl. No. 60/319,737, Provisional Patent Application filed on Nov. 27, 2002, Specification including the claims, abstract, and drawings.

IEEE 100 The Authoritative Dictionary of IEEE Standards Terms. Seventh Edition. Published by Standards Information Network IEEE Press. P. 6 (Year: 2000).

International Search Report and Written Opinion dated Jun. 21, 2018 issued by the International Application Division, Korean Intellectual Property Office as International Searching Authority in connection with International Application No. PCT/US2018/014504 (21 pages).

Mehmet Ali Aygul, Ahmed Naeem, Huseyin Arslan. "Blind Signal Analysis—Wireless Communication Signals", located at https://doi.org/10.1002/9781119764441.ch12 (Year: 2021).

Mobile Emitter Geolocation and Tracking Using TDOA and FDOA Measurements; Musicki et al.; IEEE Transactions on Signal Processing, vol. 58, No. 3, Mar. 2010 (Year: 2010).

RF and Digital Signal Processing for Software-Defined Radio, Chapter 4—High-Level Requirements and Link Budget Analysis (Year: 2009).

S. Dörner, S. Cammerer, J. Hoydis and S. t. Brink, "Deep Learning Based Communication Over the Air," in IEEE Journal of Selected Topics in Signal Processing, vol. 12, No. 1, pp. 132-143, Feb. 2018, doi: 10.1109/JSTSP.2017.2784180.

Steven W. Smith, The Scientist & Engineer's Guide to Digital Signal Processing, 1999, California Technical Publishing, San Diego, California, 2nd Edition, p. 312 (located at http://www.analog.com/media/en/technical-documentation/dsp-book/dsp_book_ch18.pdf) (Year: 1999).

T. J. O'Shea, K. Karra and T. C. Clancy, "Learning to communicate: Channel auto-encoders, domain specific regularizers, and attention," 2016 IEEE International Symposium on Signal Processing and Information Technology (ISSPIT), Limassol, Cyprus, 2016, pp. 223-228, doi: 10.1109/ISSPIT.2016.7886039.

T. O'Shea and J. Hoydis, "An Introduction to Deep Learning for the Physical Layer," in IEEE Transactions on Cognitive Communications and Networking, vol. 3, No. 4, pp. 563-575, Dec. 2017, doi: 10.1109/TCCN.2017.2758370.

CN110035440A—English translation.

CN115482071A—English translation.

CN117196617A—English translation.

CN117998368A—English translation.

Gang Wang, Exploring Blockchains Interoperability (Year: 2021).

* cited by examiner

400

700

Determine Current Location — 702

Compare Current Location to Historical Database — 704

706

Matches?

No

Yes

Display Plot of Signals Matching Current Location — 708

Indicate Incomplete Data — 710

Determine One or More Open Frequency at Current Location — 712

Display One or More Open Frequency — 714

1100

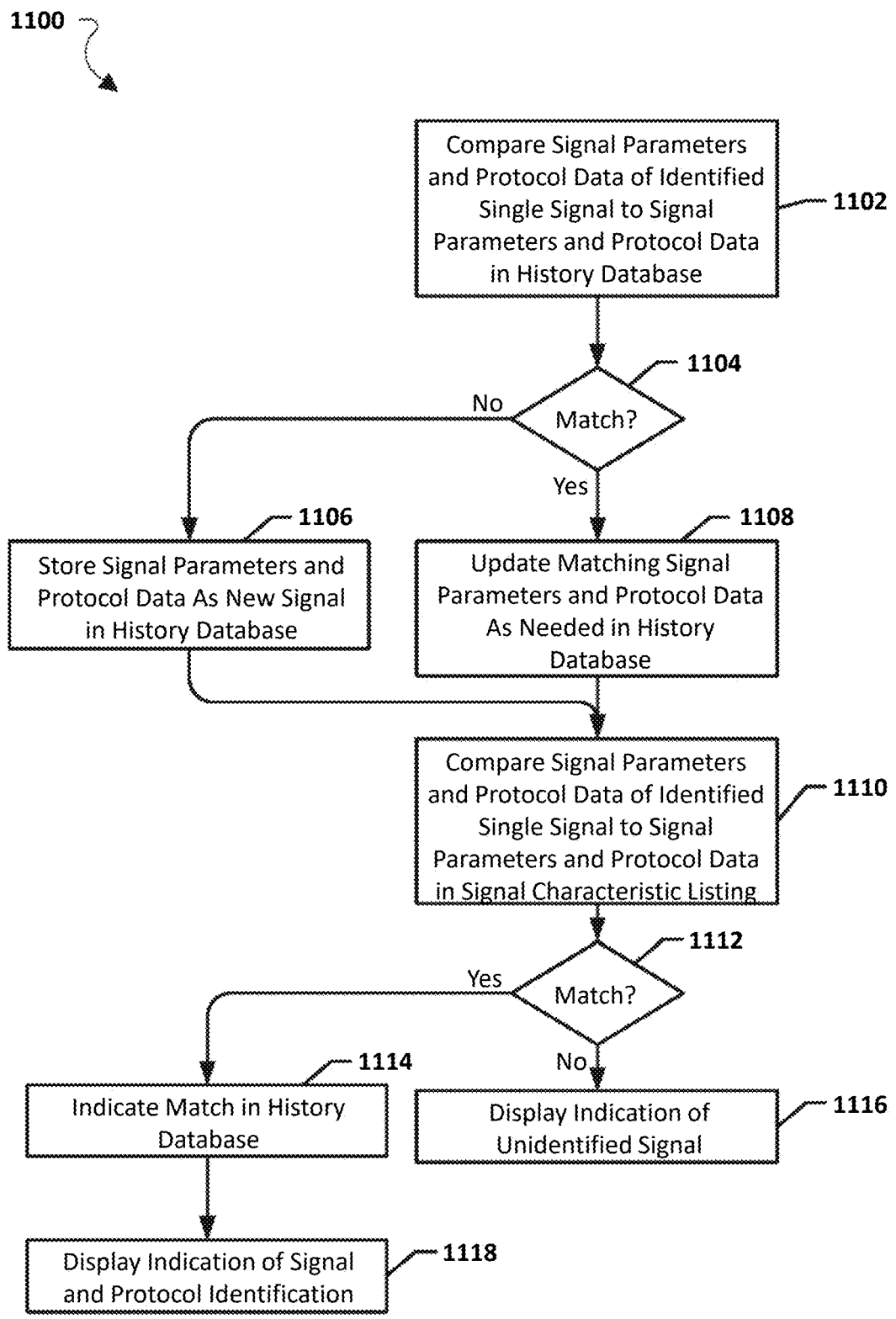

Compare Signal Parameters and Protocol Data of Identified Single Signal to Signal Parameters and Protocol Data in History Database ⟶ 1102

1104

No — Match? — Yes

Store Signal Parameters and Protocol Data As New Signal in History Database ⟶ 1106

Update Matching Signal Parameters and Protocol Data As Needed in History Database ⟶ 1108

Compare Signal Parameters and Protocol Data of Identified Single Signal to Signal Parameters and Protocol Data in Signal Characteristic Listing ⟶ 1110

1112

Yes — Match? — No

Indicate Match in History Database ⟶ 1114

Display Indication of Unidentified Signal ⟶ 1116

Display Indication of Signal and Protocol Identification ⟶ 1118

FIG. 11

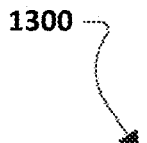

1300

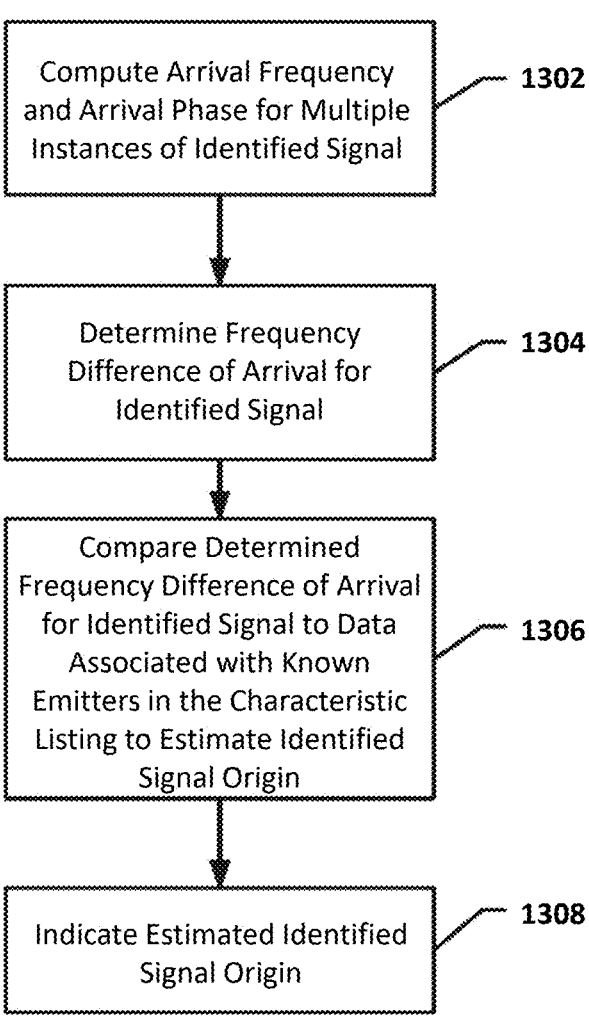

Compute Arrival Frequency and Arrival Phase for Multiple Instances of Identified Signal — 1302

Determine Frequency Difference of Arrival for Identified Signal — 1304

Compare Determined Frequency Difference of Arrival for Identified Signal to Data Associated with Known Emitters in the Characteristic Listing to Estimate Identified Signal Origin — 1306

Indicate Estimated Identified Signal Origin — 1308

FIG. 13

| Name | Start Frequency | Frequency | End Frequency | Assignment | Alert |
|---|---|---|---|---|---|
| | 1922.343 MHz | 1921.303 MHz | 1919.283 MHz | | InBandAbsent |
| | 1923.373 MHz | 1922.333 MHz | 1920.313 MHz | | InBandAbsent |
| | 1924.403 MHz | 1923.363 MHz | 1921.343 MHz | | InBandAbsent |
| | 1925.433 MHz | 1924.393 MHz | 1922.373 MHz | | InBandPresent |
| | 1926.463 MHz | 1925.423 MHz | 1923.403 MHz | | InBandPresent |
| | 1927.493 MHz | 1926.453 MHz | 1924.433 MHz | | InBandAbsent |
| | 1928.523 MHz | 1927.483 MHz | 1925.463 MHz | | InBandAbsent |
| | 1929.553 MHz | 1928.513 MHz | 1926.493 MHz | | InBandAbsent |

Channel Information

File  Edit  View  Window  Profile  Help

DIGITAL
GLOBAL SYSTEMS

Enable DOB Signals   Start Learning   ACK   Enable   Disable

FIG. 32

Channel Information

File  Edit  View  Window  Profile  Help

DIGITAL GLOBAL SYSTEMS

Enable DOB Signals  Start Learning  ACK  Enable  Disable

| Name | Start Frequency | Frequency | End Frequency | Assignment | Alert |
|---|---|---|---|---|---|
| | 1922.343 MHz | 1921.303 MHz | 1919.283 MHz | | InBandAbsent |
| | 1957.373 MHz | 1956.333 MHz | 1954.313 MHz | | InBandAbsent |
| | 1992.403 MHz | 1991.363 MHz | 1989.343 MHz | | InBandAbsent |
| | 2027.433 MHz | 2026.393 MHz | 2024.373 MHz | | InBandPresent |
| | 2062.463 MHz | 2061.423 MHz | 2059.403 MHz | | InBandPresent |
| | 2097.493 MHz | 2096.453 MHz | 2094.433 MHz | | InBandAbsent |
| | 2132.523 MHz | 2131.483 MHz | 2129.463 MHz | | InBandAbsent |
| | 2167.553 MHz | 2166.513 MHz | 2164.493 MHz | | InBandAbsent |
| | 2202.583 MHz | 2201.543 MHz | 2199.523 MHz | | OutBandAbsent |
| | 2237.613 MHz | 2236.573 MHz | 2234.553 MHz | | InBandAbsent |
| | 2272.643 MHz | 2271.603 MHz | 2269.583 MHz | | OutBandPresent |
| | 2307.673 MHz | 2306.633 MHz | 2304.613 MHz | | InBandAbsent |
| | 2342.703 MHz | 2341.663 MHz | 2339.643 MHz | | InBandAbsent |
| | 2377.733 MHz | 2376.693 MHz | 2374.673 MHz | | OutBandAbsent |

FIG. 33

Channel Information

D I G I T A L
GLOBAL SYSTEMS

Enable DOB Signals | Start Learning | ACK | Enable | Disable

| Name | Model | Frequency | Channel | Zone | Assignment | TV Ch | Alert |
|---|---|---|---|---|---|---|---|
| WGN Radio | Generic | 0.720 MHz | | HOUSE_United Centar | Radio | | Out Of Scan Range |
| WMVP | Generic | 1.000 MHz | | HOUSE_United Centar | Radio | | Out Of Scan Range |
| ADA2 | Generic | 75.700 MHz | | HOUSE_United Centar | Assistive listening | | Out Of Scan Range |
| | Comtak BST-25 5/6 | 85.300 MHz | | HOST_CBC_GregBo | IFB | | Out Of Scan Range |
| ADA1 | Generic | 184.300 MHz | | ENG_WCYB_STEVE | MIC | 6 | |
| | Comtak BST-216 Wide | 215.125 MHz | 49 | HOST_CBC_GregBo | Assistive listening | | InBandPresent |
| | Comtak BST-216 Wide | 215.425 MHz | 59 | HOST_CBC_GregBo | IFB | | OutOfBandAbsent |
| | | 245.605 MHz | | | IFB | | OutOfBandAbsent |
| | | 301.191 MHz | | | | | OutOfBandAbsent |
| 17 Custom | PocketWizard 300MM | 344.011 MHz | 17Custom'17 cust | PHOTO_NHL_BILL | Photog | | |
| 17 Custom | PocketWizard 300MM | 344.050 MHz | 17Custom'17 cust | PHOTO_USAToday | Unassigned | | |
| | PocketWizard 300MM | 379.080 MHz | 04Custom'01 cust | PHOTO_GETTY | Photog | | InBandAbsent |
| | PocketWizard 300MM | 414.110 MHz | 20Custom'20 cust | PHOTO_ICON | Photog | | |
| | PocketWizard 300MM | 449.140 MHz | 21Custom'21 cust | PHOTO_BRIAN | Photog | | |
| | PocketWizard 300MM | 484.170 MHz | 21Custom'21 cust | PHOTO_Thomas | Photog | | |
| | PocketWizard 300MM | 519.200 MHz | 21Custom'21 cust | PHOTO_John | Photog | | |

FIG. 34

```
public JSONArray getJsonMaxAlerts
    JSONArray jsonAlertsArray boolean newFound = false;
```

FIG. 54

```
for (int index = 0; index < fftArrayValues.length; index++) {
    if ((!(newFound && (fftArrayValues[index] > maxValues[index] + dbOffset))
        || (newFound && (fftArrayValues[index] > maxValues[index] - negativeOffset))) {
        if (newFound == false) {
            newFound = true;
            tempMax = fftArrayValues[index];
            tempMaxIndex = index;
        } else {
            if (fftArrayValues[index] > tempMax) {
                tempMax = fftArrayValues[index];
                tempMaxIndex = index;
            }
        }
    } else {
        if (tempMax != null) {
            if (addCount(tempMaxIndex, seconds, precisionUnit)) {
                JSONObject alarm = new JSONObject();
                alarm.put("position", tempMaxIndex);
                alarm.put("fft_max_value", tempMax);
                jsonAlertsArray.put(alarm);
                tempMax = null;
                tempMaxIndex = null;
                newFound = false;
            }
        }
    }
}
```

FIG. 55

```
long time = System.currentTimeMillis();
long secondsElapsed = time - initial;
if (secondsElapsed > amountOfSeconds) {
    if (secondsElapsed <= ((amountOfSeconds) + 1000)) {
        Long alarmCnt = alarmCount.get(position);
        SigbaseHelper.log("Logged Data: " + alarmCnt);
        if ((alarmCnt) >= precisionUnit.getThresholdAmount()) {
            alarmTime.remove(position);
            alarmCount.remove(position);
            return true;
        } else {
            alarmCount.put(position, ++alarmCnt);
            alarmTime.remove(position);
            return false;
        }
    }
} else {
    alarmTime.remove(position);
    alarmCount.remove(position);
    return false;
}
```

FIG. 58

```
public void checkAlarmsAlgorithm(FASDMask mask, PrecisionUnit precision, int[] fft) throws JsonProcessingException, IOException{
    JSONArray alarmValues = alarmValues = algorithmCH.getJsonMaxAlerts(mask, precision, fft, precision.getMinAlarmDuration(), precis
    for(int i=0;i< alarmValues.length();i++){
        Double frequencySpan = mask.getEndFreq() - mask.getStartFreq();
        Integer centerFreqPosition = alarmValues.getJSONObject(i).getInt("position");
        Double centerFrequency = obtainAlertCenterFrequency(centerFreqPosition, fft.length, frequencySpan, mask.getStartFreq());
        triggerItem.setRealPower(alarmValues.getJSONObject(i).getInt("fft_max_value"));
        triggerItem.setrealCenterFrequency(centerFrequency);
        triggerItem.setTriggerCenterFrequency(centerFrequency);
        triggerItem.setTechnology(getTypeFromBasicKnowledge((long)triggerItem.getRealCenterFrequency()));
        triggerItem.setAdditionalDetail(getAdditionalDetailFromBasicKnowledge((long)triggerItem.getRealCenterFrequency()));
        JSONObject jsonSigbaseAlertData = buildAlertData(mask.getStartFreq(),
            mask.getEndFreq(),
            triggerItem.getAdditionalDetail(),
            "FASD", "FASD",
            triggerItem.getRealCenterFrequency(), this.fasdNotifiedTo, triggerItem);
        fireAlert(jsonSigbaseAlertData.toString());
```

| Detection Method | Potential Range | Comment |
|---|---|---|
| Audio Detection - Acoustics | 150 meters | Unreliable in urban environments |
| Video Detection - Optics | 300 meters (small multicopter) | Dependent on line of site/heavily influenced by weather |
| Thermal Detection | 250 meters | Highly ineffective against UASs due to cooling from rotors |
| Radar Detection | Range dependent on radar system utilized (e.g., 1 kilometer commercial) | Radar has difficulty differentiating small, plastic devices from other flying objects, such as birds |
| Radio Frequency (RF) Detection | Dependent on antenna height, but detection can be > 2 kilometers | The most effective way to detect/classify a UAS at long distance |

FIG. 71

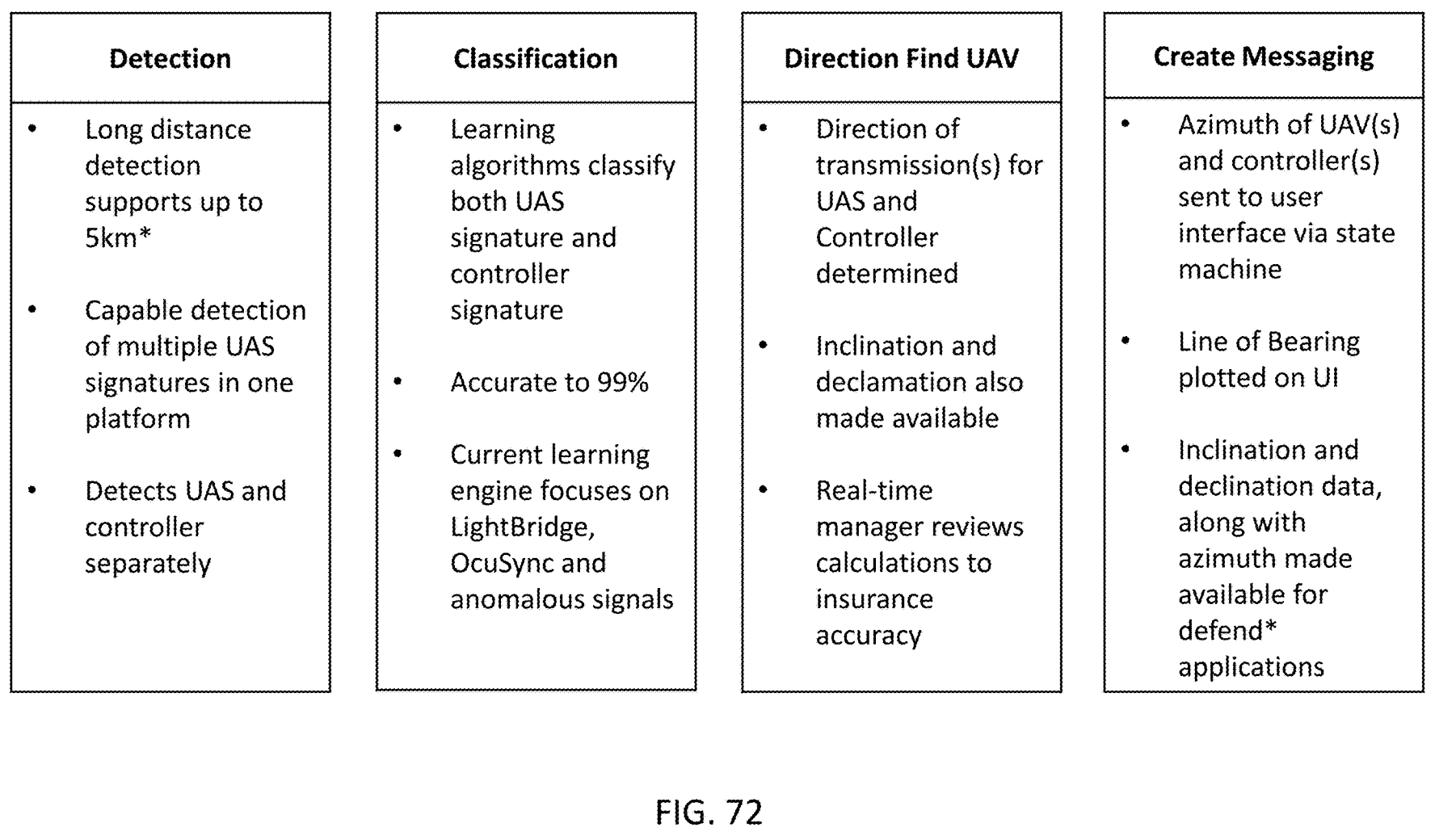

Create Messaging

- Azimuth of UAV(s) and controller(s) sent to user interface via state machine

- Line of Bearing plotted on UI

- Inclination and declination data, along with azimuth made available for defend* applications

Direction Find UAV

- Direction of transmission(s) for UAS and Controller determined

- Inclination and declamation also made available

- Real-time manager reviews calculations to insurance accuracy

Classification

- Learning algorithms classify both UAS signature and controller signature

- Accurate to 99%

- Current learning engine focuses on LightBridge, OcuSync and anomalous signals

Detection

- Long distance detection supports up to 5km*

- Capable detection of multiple UAS signatures in one platform

- Detects UAS and controller separately

FIG. 72

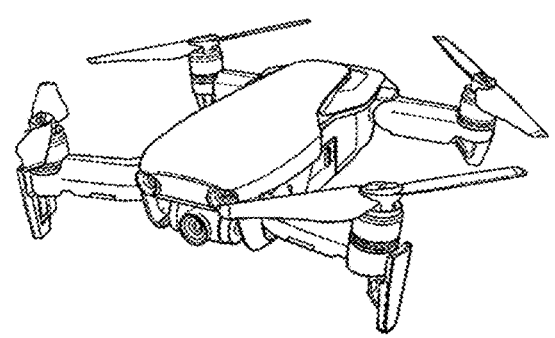

OcuSync Family

DJI's OcuSync transmission system, utilized by the
Mavic Family, is the most advanced commercial UAS
System on the market.

- Transmits HD video at 720 and 1080 reliably in
  environments even with strong radio interference.

- Automatically scans the environment, choosing the
  frequency band with the lowest interference. Can
  communicate with the controller at nearly 7km.

- OcuSync can establish or re-establish links within
  one second.

- With adaptable and automated power settings,
  battery life is extended by nearly 100% v
  Lightbridge UAS's.

FIG. 74

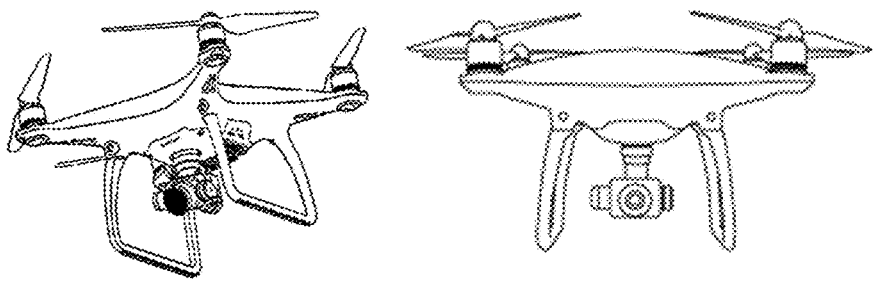

Lightbridge Family

The Phantom Family of UASs utilize the Lightbridge transmission system.
The system was developed for long range and robust communication.

- Significant improvement over WiFi UASs, with up to a 5 km
  communication potential.

- 8 selectable channels, which can be altered manually or automatically
  by the system to avoid interference.

- A live stream in HDMI or SDI format is sent to the controller for display.

FIG. 75

Perpetrator coordinating with Associates at Site via Mobile Device

Network Operations Center Terminal – Single Pane of Glass

| | |
|---|---|
| A | Link 1 Status LED – Indicates data is being passed over one of the two 10GigE links (CPU to Rx) |
| B | Link 2 Status LED – Indicates data is being passed over the other of the two 10GigE links (CPU to Rx) |
| C | Computer Status LED – Indicates the system's computer is active |
| D | Rx Status LED – Indicates that data is streaming on the Rx0 and/or Rx1 channel |
| E | Ref – Indicates that external reference clock is locked |
| F | PPS – Indicates a valid PPS signal by pulsing once per second |
| G | Link – Indicates that the host computer is communicating with the receiver |
| H | Rx Status LED – Indicates that data is streaming on the Rx2 and/or Rx3 channel |
| I | 4 X RF In N-Type Female Connectors |
| J | GPS SMA Female Connector |
| K | CPU Power On/Reset Button (Note: Must be held for 5 seconds to turn computer off) |

FIG. 81

| Mobile Phone States with/without a network | CLEARSKY™ Result |
|---|---|
| 1. User is actively on network – completing a voice call, engaged in a data session, or streaming video. | The system will detect and alarm |
| 2. Idle mode (dormant or hibernating) – the user is not actively interacting on a voice call, texting or with a data session. | The system will detect and alarm |
| 3. Phone is actively searching for a network to register on – the phone will only transmit a registration once it discovers viable network. | The system will detect and alarm |
| 4. Airplane mode with WiFi enabled – the phone will attempt to register on WiFi networks | The system will detect and alarm |
| 5. Phone is turned off – there is no signal produced by the mobile. | The system will not detect |
| +1 Mobile phone service does not exist as the phone has entered an area without coverage | With a femto cell added to the system the system will detect the registration event and alarm |

FIG. 83

| | Orange | Vodafone | Telefonica |
|---|---|---|---|
| Frequencies | 791 to 801 | 801 to 811 | 811 to 821 |
| Technology | LTE (FDD) | LTE (FDD) | LTE (FDD) |
| Band | Band 20 (800 DD) | Band 20 (800 DD) | Band 20 (800 DD) |
| Carrier | Orange | Vodafone (214-01) | Movistar (214-07) |
| DL EARFCN | 6200 | 6300 | 6400 |
| DL Frequency | 796 | 806 MHz | 816 MHz |
| UL EARFCN | 24200 | 24300 | 24400 |
| UL Frequency | 837 | 847 MHz | 857 MHz |

| | Orange | Vodafone | Telefonica |
|---|---|---|---|
| | 925.1 to 935.1 | 949.9 to 959.9 | 935.1 to 949.9 |
| Technology | N/A | UMTS | UMTS |
| Band | N/A | Band 8 (E-GSM) | Band 8 (E-GSM) |
| Carrier | N/A | Vodafone (214-01) | Movistar (214-07) |
| DL UARFCN | N/A | 3062 | 3011 |
| DL Frequency | N/A | 952.4 MHz | 942.2 MHz |
| UL UARFCN | N/A | 2837 | 2786 |
| UL Frequency | N/A | 907.4 MHz | 897.2 MHz |

| | Orange | Vodafone | Telefonica | Yoigo |
|---|---|---|---|---|
| Frequencies | 1859.9 to 1879.9 | 1825.1 to 1845.1 | 1805.1 to 1825.1 | 1845.1 to 1859.9 |
| Technology | LTE (FDD) | LTE (FDD) | LTE (FDD) | LTE (FDD) |
| Band | Band 3 (DCS 1800) | Band 3 (DCS 1800) | Band 20 (800 DD) | Band 3 (DCS 1800) |
| Carrier | Orange (214-03) | Vodafone (214-01) | Movistar (214-07) | Yoigo (214-04) |
| DL EARFCN | 1849 | 1501 | 6300 | 1675 |
| DL Frequency | 1869.9 MHz | 1835.1 MHz | 806 MHz | 1852.5 MHz |
| UL EARFCN | 19849 | 19501 | 24300 | 19675 |
| UL Frequency | 1774.9 MHz | 1740.1 MHz | 847 MHz | 1757.5 MHz |

| | Yoigo | Yoigo | Yoigo |
|---|---|---|---|
| | 2110.5 to 2125.3 | 2110.5 to 2125.3 | 2110.5 to 2125.3 |
| Technology | UMTS | UMTS | UMTS |
| Band | Band 10 (EAWS A-G) | Band 1 (IMT) | Band 4 (AWS A-F) |
| Carrier | Yoigo (214-04) | Yoigo (214-04) | Yoigo (214-04) |
| DL UARFCN | 3138 | 10588 | 1563 |
| DL Frequency | 2117.6 MHz | 2117.6 MHz | 2117.6 MHz |
| UL UARFCN | 2813 | 9638 | 1338 |
| UL Frequency | 1717.6 MHz | 1927.6 MHz | 1717.6 MHz |

FIG. 85

SYSTEMS, METHODS, AND DEVICES FOR AUTOMATIC SIGNAL DETECTION BASED ON POWER DISTRIBUTION BY FREQUENCY OVER TIME WITHIN A SPECTRUM

CROSS-REFERENCE TO RELATED APPLICATIONS

This application relates to and claims priority from the following applications. This application is a continuation of U.S. application Ser. No. 19/084,078, filed Mar. 19, 2025, which is a continuation of U.S. application Ser. No. 18/620, 352, filed Mar. 28, 2024, which is a continuation of U.S. application Ser. No. 18/526,342, filed Dec. 1, 2023, which is a continuation of U.S. application Ser. No. 18/205,242, filed Jun. 2, 2023, which is a continuation of U.S. application Ser. No. 18/081,316, filed Dec. 14, 2022, which is a continuation of U.S. application Ser. No. 17/570,005, filed Jan. 6, 2022, which is a continuation of U.S. application Ser. No. 17/247, 248 filed Dec. 4, 2020, which is a continuation of U.S. application Ser. No. 16/657,190 filed Oct. 18, 2019, which is a continuation of U.S. application Ser. No. 16/180,690 filed Nov. 5, 2018, which is a continuation-in-part of U.S. patent application Ser. No. 15/412,982 filed Jan. 23, 2017. U.S. application Ser. No. 16/180,690 also claims priority from U.S. Provisional Patent Application No. 62/722,420 filed Aug. 24, 2018. Each of the above-mentioned documents is incorporated herein in their entirety.

BACKGROUND OF THE INVENTION

1. Field of the Invention

The present invention relates to spectrum analysis and management for radio frequency (RF) signals, and more particularly for automatically identifying signals in a wireless communications spectrum based on temporal feature extraction.

2. Description of the Prior Art

Generally, it is known in the prior art to provide wireless communications spectrum management for detecting devices for managing the space. Spectrum management includes the process of regulating the use of radio frequencies to promote efficient use and gain net social benefit. A problem faced in effective spectrum management is the various numbers of devices emanating wireless signal propagations at different frequencies and across different technological standards. Coupled with the different regulations relating to spectrum usage around the globe effective spectrum management becomes difficult to obtain and at best can only be reached over a long period of time.

Another problem facing effective spectrum management is the growing need from spectrum despite the finite amount of spectrum available. Wireless technologies have exponentially grown in recent years. Consequently, available spectrum has become a valuable resource that must be efficiently utilized. Therefore, systems and methods are needed to effectively manage and optimize the available spectrum that is being used.

Most spectrum management devices may be categorized into two primary types. The first type is a spectral analyzer where a device is specifically fitted to run a 'scanner' type receiver that is tailored to provide spectral information for a narrow window of frequencies related to a specific and limited type of communications standard, such as cellular communication standard. Problems arise with these narrowly tailored devices as cellular standards change and/or spectrum use changes impact the spectrum space of these technologies. Changes to the software and hardware for these narrowly tailored devices become too complicated, thus necessitating the need to purchase a totally different and new device. Unfortunately, this type of device is only for a specific use and cannot be used to alleviate the entire needs of the spectrum management community.

The second type of spectral management device employs a methodology that requires bulky, extremely difficult to use processes, and expensive equipment. In order to attain a broad spectrum management view and complete all the necessary tasks, the device ends up becoming a conglomerate of software and hardware devices that is both hard to use and difficult to maneuver from one location to another.

While there may be several additional problems associated with current spectrum management devices, at least four major problems exist overall: 1) most devices are built to inherently only handle specific spectrum technologies such as 900 MHz cellular spectrum while not being able to mitigate other technologies that may be interfering or competing with that spectrum, 2) the other spectrum management devices consist of large spectrum analyzers, database systems, and spectrum management software that is expensive, too bulky, and too difficult to manage for a user's basic needs, 3) other spectrum management devices in the prior art require external connectivity to remote databases to perform analysis and provide results or reports with analytics to aid in management of spectrum and/or devices, and 4) other devices of the prior art do not function to provide real-time or near real-time data and analysis to allow for efficient management of the space and/or devices and signals therein.

In today's complex RF environment, to detect a signal can be difficult, especially for those that are less consistent, with low power levels, or buried in easily identified signals. These signals cannot be detected by a radio gear in the prior art. Some devices in the prior art can do automatic violation detection by creating a rough channel mask based on external database, for example the FCC database and comparing the spectrum against that channel mask and detecting signals that violate the channel mask. However, these devices cannot detect signals that are not in the external database.

Examples of relevant prior art documents include the following:

U.S. Pat. No. 8,326,313 for "Method and system for dynamic spectrum access using detection periods" by inventors McHenry, et al., filed Aug. 14, 2009, discloses methods and systems for dynamic spectrum access (DSA) in a wireless network. A DSA-enabled device may sense spectrum use in a region and, based on the detected spectrum use, select one or more communication channels for use. The devices also may detect one or more other DSA-enabled devices with which they can form DSA networks. A DSA network may monitor spectrum use by cooperative and non-cooperative devices, to dynamically select one or more channels to use for communication while avoiding or reducing interference with other devices. Classification results can be used to "learn" classifications to reduce future errors.

U.S. Publication No. 2013/0005240 for "System and Method for Dynamic Coordination of Radio Resources Usage in a Wireless Network Environment" by inventors Novak, et al., filed Sep. 12, 2012, discloses an architecture, system and associated method for dynamic coordination of radio resource usage in a network environment. The publication discloses a relay communication method comprises detecting, by a first wireless mobile device, sensory data associated with multiple radio channels relative to at least one radio element in a sensing area of the first wireless mobile device. If the first wireless mobile device is out of range of a wide area cellular network, a short-range wireless communication path is established with a second wireless mobile device having a wide area cellular communication connection. The sensory data is transmitted by the first wireless mobile device to the second wireless mobile device for reporting to a network element via a wide area cellular network serving the second wireless mobile device. The sensory data are processed by sensing elements and sent to a distributed channel occupancy and location database (COLD) system. The sensory data is updated dynamically to provide a real-time view of channel usage.

U.S. Pat. No. 8,515,473 for "Cognitive radio methodology, physical layer policies and machine learning" by inventors Mody, et al., filed Mar. 6, 2008, discloses a method of cognitive communication for non-interfering transmission, wherein the improvement comprises the step of conducting radio scene analysis to find not just the spectrum holes or White spaces; but also to use the signal classification, machine learning, pattern-matching and prediction information to learn more things about the existing signals and its underlying protocols, to find the Gray space, hence utilizing the signal space, consisting of space, time, frequency (spectrum), code and location more efficiently.

U.S. Publication 2013/0217450 for "Radiation Pattern Recognition System and Method for a Mobile Communications Device" by inventors Kanj, et al., filed Nov. 26, 2010, discloses a radiation pattern recognition system and method for a wireless user equipment (UE) device wherein a set of benchmark radiation patterns are matched based on the wireless UE device's usage mode. The publication discloses that the wireless UE device includes one or more antennas adapted for radio communication with a telecommunications network. A memory is provided including a database of benchmark radiation patterns for each of the one or more antennas in one or more usage modes associated with the wireless UE device. A processor is configured to execute an antenna application process for optimizing performance of the wireless UE device based at least in part upon using the matched set of benchmark radiation patterns.

U.S. Pat. No. 8,224,254 for "Operating environment analysis techniques for wireless communication systems" by inventor Simon Haykin, filed Oct. 13, 2005, describes methods and systems of analyzing an operating environment of wireless communication equipment in a wireless communication system. A stimulus in the operating environment at a location of the wireless communication equipment is sensed and linearly expanded in Slepian sequences using a multitaper spectral estimation procedure. A singular value decomposition is performed on the linearly expanded stimulus, and a singular value of the linearly expanded stimulus provides an estimate of interference at the location of the wireless communication equipment. The traffic model, which could be built on historical data, provides a basis for predicting future traffic patterns in that space which, in turn, makes it possible to predict the duration for which a spectrum hole vacated by the incumbent primary user is likely to be available for use by a cognitive radio operator. In a wireless environment, two classes of traffic data pattern are distinguished, including deterministic patterns and stochastic patterns.

U.S. Pat. No. 5,393,713 for "Broadcast receiver capable of automatic station identification and format-scanning based on an internal database updatable over the airwaves with automatic receiver location determination" by inventor Pierre R. Schwob, filed Sep. 25, 1992, describes a broadcasting system capable of automatically or semi-automatically updating its database and using the database to identify received broadcasting stations, and search for stations according to user-chosen attributes and current data. The receiver is capable of receiving current location information within the received data stream, and also of determining the current location of the receiver by using a received station attribute. The patent provides an automatic or quasi-automatic data updating system based on subcarrier technology or other on-the-air data transmission techniques.

U.S. Pat. No. 6,741,595 for "Device for enabling trap and trace of internet protocol communications" by inventors Maher, III, et al., filed Jun. 11, 2002, describes a network processing system for use in a network and operable to intercept communications flowing over the network, the network passing a plurality of data packets, which form a plurality of flows, the network processing system comprising: a learning state machine operable to identify characteristics of one or more of the flows and to compare the characteristics to a database of known signatures, one or more of the known signatures representing a search criteria, wherein when one or more characteristics of one or more of the flows matches the search criteria the learning state machine intercepts the flow and replicates the flow, redirecting the replication to a separate address.

U.S. Pat. No. 7,676,192 for "Radio scanner programmed from frequency database and method" by inventor Wayne K. Wilson, filed Jan. 7, 2011, discloses a scanning radio and method using a receiver, a channel memory and a display in conjunction with a frequency-linked descriptor database. The frequency-linked descriptor database is queried using a geographic reference to produce a list of local radio channels that includes a list of frequencies with linked descriptors. The list of radio channels is transferred into the channel memory of the scanner, and the receiver is sequentially tuned to the listed frequencies recalled from the list of radio channels while the corresponding linked descriptors are simultaneously displayed.

U.S. Publication 2012/0148069 for "Coexistence of white space devices and wireless narrowband devices" by inventors Chandra, et al., filed Dec. 8, 2010, discloses architecture enabling wireless narrowband devices (e.g., wireless microphones) and white space devices to efficiently coexist on the same telecommunications channels, while not interfering with the usability of the wireless narrowband device. The architecture provides interference detection, strobe generation and detection and, power ramping and suppression (interference-free coexistence with spectrum efficiency). The architecture provides the ability of the white space device to learn about the presence of the microphone. This can be accomplished using a geolocation database, reactively via a strober device, and/or proactively via the strober device. The strober device can be positioned close to the microphone receiver and signals the presence of a microphone to white space devices on demand. The strober device takes into consideration the microphone's characteristics as well as the relative signal strength from the microphone transmitter versus the white space device, in order to enable maximum use of the available white space spectrum.

U.S. Pat. No. 8,326,240 for "System for specific emitter identification" by inventors Kadambe, et al., filed Sep. 27, 2010, describes an apparatus for identifying a specific emitter in the presence of noise and/or interference including (a) a sensor configured to sense radio frequency signal and noise data, (b) a reference estimation unit configured to estimate a reference signal relating to the signal transmitted by one emitter, (c) a feature estimation unit configured to generate one or more estimates of one or more feature from the reference signal and the signal transmitted by that particular emitter, and (d) an emitter identifier configured to identify the signal transmitted by that particular emitter as belonging to a specific device (e.g., devices using Gaussian Mixture Models and the Bayesian decision engine). The apparatus may also include an SINR enhancement unit configured to enhance the SINR of the data before the reference estimation unit estimates the reference signal.

U.S. Pat. No. 7,835,319 for "System and method for identifying wireless devices using pulse fingerprinting and sequence analysis" by inventor Sugar, filed May 9, 2007, discloses methods for identifying devices that are sources of wireless signals from received radio frequency (RF) energy, and, particularly, sources emitting frequency hopping spread spectrum (FHSS). Pulse metric data is generated from the received RF energy and represents characteristics associated thereto. The pulses are partitioned into groups based on their pulse metric data such that a group comprises pulses having similarities for at least one item of pulse metric data. Sources of the wireless signals are identified based on the partitioning process. The partitioning process involves iteratively subdividing each group into subgroups until all resulting subgroups contain pulses determined to be from a single source. At each iteration, subdividing is performed based on different pulse metric data than at a prior iteration. Ultimately, output data is generated (e.g., a device name for display) that identifies a source of wireless signals for any subgroup that is determined to contain pulses from a single source.

U.S. Pat. No. 8,131,239 for "Method and apparatus for remote detection of radio-frequency devices" by inventors Walker, et al., filed Aug. 21, 2007, describes methods and apparatus for detecting the presence of electronic communications devices, such as cellular phones, including a complex RF stimulus is transmitted into a target area, and nonlinear reflection signals received from the target area are processed to obtain a response measurement. The response measurement is compared to a pre-determined filter response profile to detect the presence of a radio device having a corresponding filter response characteristic. The patent discloses that the pre-determined filter response profile comprises a pre-determined band-edge profile, so that comparing the response measurement to a pre-determined filter response profile comprises comparing the response measurement to the pre-determined band-edge profile to detect the presence of a radio device having a corresponding band-edge characteristic. The method and apparatus aim to be useful in detecting hidden electronic devices.

U.S. Pat. No. 8,369,305 for "Correlating multiple detections of wireless devices without a unique identifier" by inventors Diener, et al., filed Jun. 30, 2008, describes at a plurality of first devices, wireless transmissions are received at different locations in a region where multiple target devices may be emitting, and identifier data is subsequently generated. Similar identifier data associated with received emissions at multiple first devices are grouped together into a cluster record that potentially represents the same target device detected by multiple first devices. Data is stored that represents a plurality of cluster records from identifier data associated with received emissions made over time by multiple first devices. The cluster records are analyzed over time to correlate detections of target devices across multiple first devices. It aims to lessen disruptions caused by devices using the same frequency and to protect data.

U.S. Pat. No. 8,155,649 for "Method and system for classifying communication signals in a dynamic spectrum access system" by inventors McHenry, et al., filed Aug. 14, 2009, discloses methods and systems for dynamic spectrum access (DSA) in a wireless network wherein a DSA-enabled device may sense spectrum use in a region and, based on the detected spectrum use, select one or more communication channels for use. The devices also may detect one or more other DSA-enabled devices with which they can form DSA networks. A DSA network may monitor spectrum use by cooperative and non-cooperative devices, to dynamically select one or more channels to use for communication while avoiding or reducing interference with other devices. A DSA network may include detectors such as a narrow-band detector, wide-band detector, TV detector, radar detector, a wireless microphone detector, or any combination thereof.

U.S. Pat. No. RE43,066 for "System and method for reuse of communications spectrum for fixed and mobile applications with efficient method to mitigate interference" by inventor Mark Allen McHenry, filed Dec. 2, 2008, describes a communications system network enabling secondary use of spectrum on a non-interference basis. The system uses a modulation method to measure the background signals that eliminates self-generated interference and also identifies the secondary signal to all primary users via on/off amplitude modulation, allowing easy resolution of interference claims. The system uses high-processing gain probe waveforms that enable propagation measurements to be made with minimal interference to the primary users. The system measures background signals and identifies the types of nearby receivers and modifies the local frequency assignments to minimize interference caused by a secondary system due to non-linear mixing interference and interference caused by out-of-band transmitted signals (phase noise, harmonics, and spurs). The system infers a secondary node's elevation and mobility (thus, its probability to cause interference) by analysis of the amplitude of background signals. Elevated or mobile nodes are given more conservative frequency assignments than stationary nodes.

U.S. Pat. No. 7,424,268 for "System and Method for Management of a Shared Frequency Band" by inventors Diener, et al., filed Apr. 22, 2003, discloses a system, method, software and related functions for managing activity in an unlicensed radio frequency band that is shared, both in frequency and time, by signals of multiple types. Signal pulse energy in the band is detected and is used to classify signals according to signal type. Using knowledge of the types of signals occurring in the frequency band and other spectrum activity related statistics (referred to as spectrum intelligence), actions can be taken in a device or network of devices to avoid interfering with other signals, and in general to optimize simultaneous use of the frequency band with the other signals. The spectrum intelligence may be used to suggest actions to a device user or network administrator, or to automatically invoke actions in a device or network of devices to maintain desirable performance.

U.S. Pat. No. 8,249,631 for "Transmission power allocation/control method, communication device and program" by inventor Ryo Sawai, filed Jul. 21, 2010, teaches a method for allocating transmission power to a second communication service making secondary usage of a spectrum assigned to a first communication service, in a node which is able to communicate with a secondary usage node. The method determines an interference power acceptable for two or more second communication services when the two or more second communication services are operated and allocates the transmission powers to the two or more second communication services.

U.S. Pat. No. 8,094,610 for "Dynamic cellular cognitive system" by inventors Wang, et al., filed Feb. 25, 2009, discloses permitting high quality communications among a diverse set of cognitive radio nodes while minimizing interference to primary and other secondary users by employing dynamic spectrum access in a dynamic cellular cognitive system. Diverse device types interoperate, cooperate, and communicate with high spectrum efficiency and do not require infrastructure to form the network. The dynamic cellular cognitive system can expand to a wider geographical distribution via linking to existing infrastructure.

U.S. Pat. No. 8,565,811 for "Software-defined radio using multi-core processor" by inventors Tan, et al., discloses a radio control board passing a plurality of digital samples between a memory of a computing device and a radio frequency (RF) transceiver coupled to a system bus of the computing device. Processing of the digital samples is carried out by one or more cores of a multi-core processor to implement a software-defined radio.

U.S. Pat. No. 8,064,840 for "Method and system for determining spectrum availability within a network" by inventors McHenry, et al., filed Jun. 18, 2009, discloses a method and system which determine spectrum holes for a communication network by accumulating the information obtained from previous received signals to determine the presence of a larger spectrum hole that allows a reduced listening period, higher transmit power and a reduced probability of interference with other networks and transmitters.

U.S. Publication No. 2009/0143019 for "Method and apparatus for distributed spectrum sensing for wireless communication" by inventor Stephen J. Shellhammer, filed Jan. 4, 2008, discloses methods and apparatus for determining if a licensed signal having or exceeding a predetermined field strength is present in a wireless spectrum. The signal of interest maybe a television signal or a wireless microphone signal using licensed television spectrum.

U.S. Publication No. 2013/0090071 for "Systems and methods for communication in a white space" by inventors Abraham, et al., filed Apr. 3, 2012, discloses systems, methods, and devices to communicate in a white space. The publication discloses that wireless communication transmitted in the white space authorizes an initial transmission by a device. The wireless communication may include power information for determining a power at which to transmit the initial transmission. The initial transmission may be used to request information identifying one or more channels in the white space available for transmitting data.

U.S. Publication No. 2012/0072986 for "Methods for detecting and classifying signals transmitted over a radio frequency spectrum" by inventors Livsics, et al., filed Nov. 1, 2011, discloses a method to classify a signal as non-cooperative (NC) or a target signal. The percentage of power above a first threshold is computed for a channel. Based on the percentage, a signal is classified as a narrowband signal. If the percentage indicates the absence of a narrowband signal, then a lower second threshold is applied to confirm the absence according to the percentage of power above the second threshold. The signal is classified as a narrowband signal or pre-classified as a wideband signal based on the percentage. Pre-classified wideband signals are classified as a wideband NC signal or target signal using spectrum masks.

U.S. Pat. No. 8,494,464 for "Cognitive networked electronic warfare" by inventors Kadambe, et al., filed Sep. 8, 2010, describes an apparatus for sensing and classifying radio communications including sensor units configured to detect RF signals, a signal classifier configured to classify the detected RF signals into a classification, the classification including at least one known signal type and an unknown signal type, a clustering learning algorithm capable of finding clusters of common signals among the previously seen unknown signals; it is then further configured to use these clusters to retrain the signal classifier to recognize these signals as a new signal type, aiming to provide signal identification to better enable electronic attacks and jamming signals.

U.S. Publication No. 2011/0059747 for "Sensing Wireless Transmissions From a Licensed User of a Licensed Spectral Resource" by inventors Lindoff, et al., filed Sep. 7, 2009, describes sensing wireless transmissions from a licensed user of a licensed spectral resource includes obtaining information indicating a number of adjacent sensors that are concurrently sensing wireless transmissions from the licensed user of the licensed spectral resource. Such information can be obtained from a main node controlling the sensor and its adjacent sensors, or by the sensor itself (e.g., by means of short-range communication equipment targeting any such adjacent sensors). A sensing rate is then determined as a function, at least in part, of the information indicating the number of adjacent sensors that are concurrently sensing wireless transmissions from the licensed user of the licensed spectral resource. Receiver equipment is then periodically operated at the determined sensing rate, wherein the receiver equipment is configured to detect wireless transmissions from the licensed user of the licensed spectral resource.

U.S. Pat. No. 8,463,195 for "Methods and apparatus for spectrum sensing of signal features in a wireless channel" by inventor Shellhammer, filed Nov. 13, 2009, discloses methods and apparatus for sensing features of a signal in a wireless communication system. The disclosed methods and apparatus sense signal features by determining a number of spectral density estimates, where each estimate is derived based on reception of the signal by a respective antenna in a system with multiple sensing antennas. The spectral density estimates are then combined, and the signal features are sensed based on the combination of the spectral density estimates. The methods and apparatus aim to increase sensing performance by addressing problems associated with Rayleigh fading, which causes signals to be less detectable.

U.S. Pat. No. 8,151,311 for "System and method of detecting potential video traffic interference" by inventors Huffman, et al., filed Nov. 30, 2007, describes a method of detecting potential video traffic interference at a video head-end of a video distribution network is disclosed and includes detecting, at a video head-end, a signal populating an ultra-high frequency (UHF) white space frequency. The method also includes determining that a strength of the signal is equal to or greater than a threshold signal strength. Further, the method includes sending an alert from the video head-end to a network management system. The alert indicates that the UHF white space frequency is populated by a signal having a potential to interfere with video traffic delivered via the video head-end. Cognitive radio technology, various sensing mechanisms (energy sensing, National Television System Committee signal sensing, Advanced Television Systems Committee sensing), filtering, and signal reconstruction are disclosed.

U.S. Pat. No. 8,311,509 for "Detection, communication and control in multimode cellular, TDMA, GSM, spread spectrum, CDMA, OFDM, WiLAN, and WiFi systems" by inventor Feher, filed Oct. 31, 2007, teaches a device for detection of signals, with location finder or location tracker or navigation signal and with Modulation Demodulation (Modem) Format Selectable (MFS) communication signal. Processor for processing a digital signal into cross-correlated in-phase and quadrature-phase filtered signal and for processing a voice signal into Orthogonal Frequency Division Multiplexed (OFDM) or Orthogonal Frequency Division Multiple Access (OFDMA) signal. Each is used in a Wireless Local Area Network (WLAN) and in Voice over Internet Protocol (VOIP) network. Device and location finder with Time Division Multiple Access (TDMA), Global Mobile System (GSM) and spread spectrum Code Division Multiple Access (CDMA) is used in a cellular network. Polar and quadrature modulator and two antenna transmitter for transmission of provided processed signal. Transmitter with two amplifiers operated in separate radio frequency (RF) bands. One transmitter is operated as a Non-Linearly Amplified (NLA) transmitter and the other transmitter is operated as a linearly amplified or linearized amplifier transmitter.

U.S. Pat. No. 8,514,729 for "Method and system for analyzing RF signals in order to detect and classify actively transmitting RF devices" by inventor Blackwell, filed Apr. 3, 2009, discloses methods and apparatuses to analyze RF signals in order to detect and classify RF devices in wireless networks. The method includes detecting one or more radio frequency (RF) samples; determining burst data by identifying start and stop points of the one or more RF samples; comparing time domain values for an individual burst with time domain values of one or more predetermined RF device profiles; generating a human-readable result indicating whether the individual burst should be assigned to one of the predetermined RF device profiles; and, classifying the individual burst if assigned to one of the predetermined RF device profiles as being a WiFi device or a non-WiFi device with the non-WiFi device being a RF interference source to a wireless network.

SUMMARY OF THE INVENTION

The present invention relates to systems, methods and apparatus for automatic signal detection with temporal feature extraction in an RF environment. An apparatus learns the RF environment in a predetermined period based on statistical learning techniques, thereby creating learning data. A knowledge map is formed based on the learning data. The apparatus automatically extracts temporal features of the RF environment from the knowledge map. A real-time spectral sweep is scrubbed against the knowledge map. The apparatus is operable to detect a signal in the RF environment, which has a low power level or is a narrowband signal buried in a wideband signal, and which cannot be identified otherwise.

These and other aspects of the present invention will become apparent to those skilled in the art after a reading of the following description of the preferred embodiment when considered with the drawings, as they support the claimed invention.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

FIG. 11 is a process flow diagram illustrating an embodiment method for displaying signal and protocol identification information.

FIG. 13 is a process flow diagram illustrating an embodiment method for estimating a signal origin based on a frequency difference of arrival.

FIG. 32 shows another screen shot illustration for automatic signal detection indications on displays associated with the present invention.

FIG. 33 shows yet another screen shot illustration for automatic signal detection indications on displays associated with the present invention.

FIG. 34 shows still another screen shot illustration for automatic signal detection indications on displays associated with the present invention.

FIG. 54 is a snippet of the code of the detection algorithm defining a flag according to one embodiment of the embodiment.

FIG. 55 is a snippet of the code of the detection algorithm identifying peak values according to one embodiment of the present invention.

FIG. 58 is a snippet of the code of the detection algorithm checking the alarm duration according to one embodiment of the present invention.

FIG. 59 is a snippet of the code of the detection algorithm triggering an alarm according to one embodiment of the present invention.

FIG. 67 lists signal strength measurements according to one embodiment of the present invention.

FIG. 71 is a comparison of multiple methodologies for detecting and classifying UAS.

FIG. 72 lists capabilities of an RF-based counter-UAS system according to one embodiment of the present invention.

FIG. 74 illustrates features of drones in the OcuSync family.

FIG. 75 illustrates features of drones in the Lightbridge family.

FIG. 81 lists all the labels in FIG. 79 representing different part of the front panel of the spectrum monitoring device according to one embodiment of the present invention.

FIG. 83 lists the capabilities of a spectrum monitoring system according to 5 main on-network mobile phone states plus 1 no-network mobile phone state.

FIG. 85 is a site cellular survey result according to one embodiment of the present invention.

DETAILED DESCRIPTION

Figure 1:
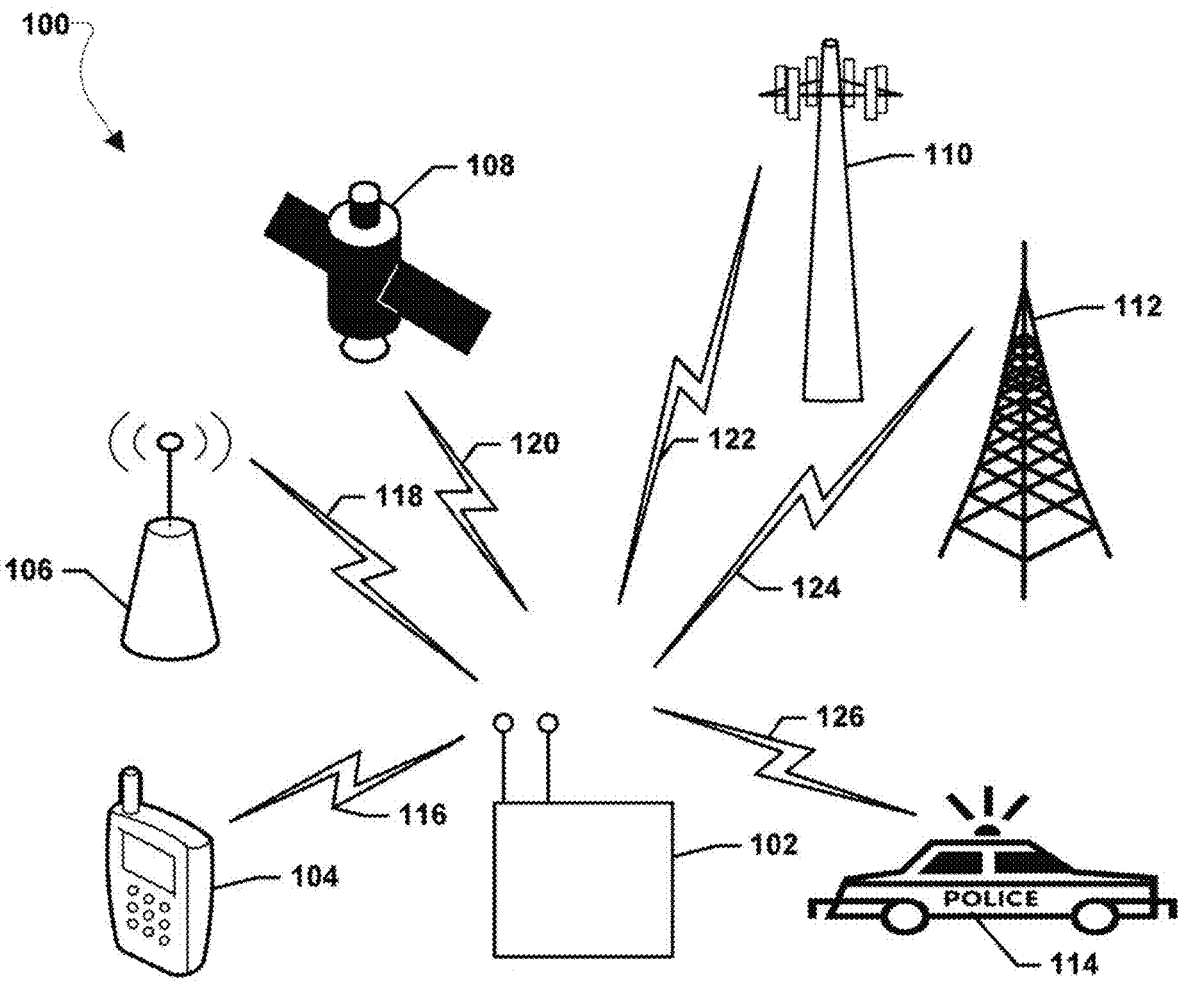
FIG. 1 is a system block diagram of a wireless environment suitable for use with the various embodiments.

Related US patents and patent applications include U.S. application Ser. No. 15/357,157, U.S. Pat. Nos. 9,537,586, 9,185,591, 8,977,212, 8,798,548, 8,805,291, 8,780,968, 8,824,536, 9,288,683, 9,078,162, U.S. application Ser. No. 13/913,013, and U.S. Application No. 61/789,758. All of them are incorporated herein by reference in their entirety.

The present invention addresses the longstanding, unmet needs existing in the prior art and commercial sectors to provide solutions to the at least four major problems existing before the present invention, each one that requires near real time results on a continuous scanning of the target environment for the spectrum.

The present invention relates to systems, methods, and devices of the various embodiments enable spectrum management by identifying, classifying, and cataloging signals of interest based on radio frequency measurements. Furthermore, present invention relates to spectrum analysis and management for radio frequency (RF) signals, and for automatically identifying baseline data and changes in state for signals from a multiplicity of devices in a wireless communications spectrum, and for providing remote access to measured and analyzed data through a virtualized computing network. In an embodiment, signals and the parameters of the signals may be identified and indications of available frequencies may be presented to a user. In another embodiment, the protocols of signals may also be identified. In a further embodiment, the modulation of signals, data types carried by the signals, and estimated signal origins may be identified.

It is an object of this invention to provide an apparatus for identifying signal emitting devices including: a housing, at least one processor and memory, at least one receiver and sensors constructed and configured for sensing and measuring wireless communications signals from signal emitting devices in a spectrum associated with wireless communications; and wherein the apparatus is operable to automatically analyze the measured data to identify at least one signal emitting device in near real time from attempted detection and identification of the at least one signal emitting device, and then to identify open space available for wireless communications, based upon the information about the signal emitting device(s) operating in the predetermined spectrum; furthermore, the present invention provides baseline data and changes in state for compressed data to enable near real time analytics and results for individual units and for aggregated units for making unique comparisons of data.

The present invention further provides systems for identifying white space in wireless communications spectrum by detecting and analyzing signals from any signal emitting devices including at least one apparatus, wherein the at least one apparatus is operable for network-based communication with at least one server computer including a database, and/or with at least one other apparatus, but does not require a connection to the at least one server computer to be operable for identifying signal emitting devices; wherein each of the apparatus is operable for identifying signal emitting devices including: a housing, at least one processor and memory, at least one receiver, and sensors constructed and configured for sensing and measuring wireless communications signals from signal emitting devices in a spectrum associated with wireless communications; and wherein the apparatus is operable to automatically analyze the measured data to identify at least one signal emitting device in near real time from attempted detection and identification of the at least one signal emitting device, and then to identify open space available for wireless communications, based upon the information about the signal emitting device(s) operating in the predetermined spectrum; all of the foregoing using baseline data and changes in state for compressed data to enable near real time analytics and results for individual units and for aggregated units for making unique comparisons of data.

The present invention is further directed to a method for identifying baseline data and changes in state for compressed data to enable near real time analytics and results for individual units and for aggregated units and storing the aggregated data in a database and providing secure, remote access to the compressed data for each unit and to the aggregated data via network-based virtualized computing system or cloud-based system, for making unique comparisons of data in a wireless communications spectrum including the steps of: providing a device for measuring characteristics of signals from signal emitting devices in a spectrum associated with wireless communications, with measured data characteristics including frequency, power, bandwidth, duration, modulation, and combinations thereof; the device including a housing, at least one processor and memory, and sensors constructed and configured for sensing and measuring wireless communications signals within the spectrum; and further including the following steps performed within the device housing: assessing whether the measured data includes analog and/or digital signal(s); determining a best fit based on frequency, if the measured power spectrum is designated in an historical or a reference database(s) for frequency ranges; automatically determining a category for either analog or digital signals, based on power and sideband combined with frequency allocation; determining a TDM/FDM/CDM signal, based on duration and bandwidth; identifying at least one signal emitting device from the composite results of the foregoing steps; and then automatically identifying the open space available for wireless communications, based upon the information about the signal emitting device(s) operating in the predetermined spectrum; all using baseline data and changes in state for compressed data to enable near real time analytics and results for individual units and for aggregated units for making unique comparisons of data.

Additionally, the present invention provides systems, apparatus, and methods for identifying open space in a wireless communications spectrum using an apparatus having a multiplicity of processors and memory, at least one receiver, sensors, and communications transmitters and receivers, all constructed and configured within a housing for automated analysis of detected signals from signal emitting devices, determination of signal duration and other signal characteristics, and automatically generating information relating to device identification, open space, signal optimization, all using baseline data and changes in state for compressed data to enable near real time analytics and results for individual units and for aggregated units for making unique comparisons of data within the spectrum for wireless communication, and for providing secure, remote access via a network to the data stored in a virtualized computer system.

Referring now to the drawings in general, the illustrations are for the purpose of describing at least one preferred embodiment and/or examples of the invention and are not intended to limit the invention thereto. Various embodiments are described in detail with reference to the accompanying drawings. Wherever possible, the same reference numbers are used throughout the drawings to refer to the same or like parts. References made to particular examples and implementations are for illustrative purposes, and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

The present invention provides systems, methods, and devices for spectrum analysis and management by identifying, classifying, and cataloging at least one or a multiplicity of signals of interest based on radio frequency measurements and location and other measurements, and using near real-time parallel processing of signals and their corresponding parameters and characteristics in the context of historical and static data for a given spectrum, and more particularly, all using baseline data and changes in state for compressed data to enable near real time analytics and results for individual units and for aggregated units for making unique comparisons of data.

The systems, methods and apparatus according to the present invention preferably have the ability to detect in near real time, and more preferably to detect, sense, measure, and/or analyze in near real time, and more preferably to perform any near real time operations within about 1 second or less. Advantageously, the present invention and its real time functionality described herein uniquely provide and enable the apparatus units to compare to historical data, to update data and/or information, and/or to provide more data and/or information on the open space, on the apparatus unit or device that may be occupying the open space, and combinations, in the near real time compared with the historically scanned (15 min to 30 days) data, or historical database information. Also, the data from each apparatus unit or device and/or for aggregated data from more than one apparatus unit or device are communicated via a network to at least one server computer and stored on a database in a virtualized or cloud-based computing system, and the data is available for secure, remote access via the network from distributed remote devices having software applications (apps) operable thereon, for example by web access (mobile app) or computer access (desktop app).

The systems, methods, and devices of the various embodiments enable spectrum management by identifying, classifying, and cataloging signals of interest based on radio frequency measurements. In an embodiment, signals and the parameters of the signals may be identified and indications of available frequencies may be presented to a user. In another embodiment, the protocols of signals may also be identified. In a further embodiment, the modulation of signals, data types carried by the signals, and estimated signal origins may be identified.

Embodiments are directed to a spectrum management device that may be configurable to obtain spectrum data over a wide range of wireless communication protocols. Embodiments may also provide for the ability to acquire data from and sending data to database depositories that may be used by a plurality of spectrum management customers.

In one embodiment, a spectrum management device may include a signal spectrum analyzer that may be coupled with a database system and spectrum management interface. The device may be portable or may be a stationary installation and may be updated with data to allow the device to manage different spectrum information based on frequency, bandwidth, signal power, time, and location of signal propagation, as well as modulation type and format and to provide signal identification, classification, and geo-location. A processor may enable the device to process spectrum power density data as received and to process raw I/Q complex data that may be used for further signal processing, signal identification, and data extraction.

In an embodiment, a spectrum management device or apparatus unit may comprise a low noise amplifier that receives a radio frequency (RF) energy from an antenna. The antenna may be any antenna structure that is capable of receiving RF energy in a spectrum of interest. The low noise amplifier may filter and amplify the RF energy. The RF energy may be provided to an RF translator. The RF translator may perform a fast Fourier transform (FFT) and either a square magnitude or a fast convolution spectral periodogram function to convert the RF measurements into a spectral representation. In an embodiment, the RF translator may also store a timestamp to facilitate calculation of a time of arrival and an angle of arrival. The In-Phase and Quadrature (I/Q) data may be provided to a spectral analysis receiver or it may be provided to a sample data store where it may be stored without being processed by a spectral analysis receiver. The input RF energy may also be directly digital down-converted and sampled by an analog to digital converter (ADC) to generate complex I/Q data. The complex I/Q data may be equalized to remove multipath, fading, white noise and interference from other signaling systems by fast parallel adaptive filter processes. This data may then be used to calculate modulation type and baud rate. Complex sampled I/Q data may also be used to measure the signal angle of arrival and time of arrival. Such information as angle of arrival and time of arrival may be used to compute more complex and precise direction finding. In addition, they may be used to apply geo-location techniques. Data may be collected from known signals or unknown signals and time spaced in order to provide expedient information. I/Q sampled data may contain raw signal data that may be used to demodulate and translate signals by streaming them to a signal analyzer or to a real-time demodulator software defined radio that may have the newly identified signal parameters for the signal of interest. The inherent nature of the input RF allows for any type of signal to be analyzed and demodulated based on the reconfiguration of the software defined radio interfaces.

A spectral analysis receiver may be configured to read raw In-Phase (I) and Quadrature (Q) data and either translate directly to spectral data or down convert to an intermediate frequency (IF) up to half the Nyquist sampling rate to analyze the incoming bandwidth of a signal. The translated spectral data may include measured values of signal energy, frequency, and time. The measured values provide attributes of the signal under review that may confirm the detection of a particular signal of interest within a spectrum of interest. In an embodiment, a spectral analysis receiver may have a referenced spectrum input of 0 Hz to 12.4 GHz, preferably not lower than 9 kHz, with capability of fiber optic input for spectrum input up to 60 GHz.

For each device, at least one receiver is used. In one embodiment, the spectral analysis receiver may be configured to sample the input RF data by fast analog down-conversion of the RF signal. The down-converted signal may then be digitally converted and processed by fast convolution filters to obtain a power spectrum. This process may also provide spectrum measurements including the signal power, the bandwidth, the center frequency of the signal as well as a Time of Arrival (TOA) measurement. The TOA measurement may be used to create a timestamp of the detected signal and/or to generate a time difference of arrival iterative process for direction finding and fast triangulation of signals. In an embodiment, the sample data may be provided to a spectrum analysis module. In an embodiment, the spectrum analysis module may evaluate the sample data to obtain the spectral components of the signal.

In an embodiment, the spectral components of the signal may be obtained by the spectrum analysis module from the raw I/Q data as provided by an RF translator. The I/Q data analysis performed by the spectrum analysis module may operate to extract more detailed information about the signal, including by way of example, modulation type (e.g., FM, AM, QPSK, 16QAM, etc.) and/or protocol (e.g., GSM, CDMA, OFDM, LTE, etc.). In an embodiment, the spectrum analysis module may be configured by a user to obtain specific information about a signal of interest. In an alternate embodiment, the spectral components of the signal may be obtained from power spectral component data produced by the spectral analysis receiver.

In an embodiment, the spectrum analysis module may provide the spectral components of the signal to a data extraction module. The data extraction module may provide the classification and categorization of signals detected in the RF spectrum. The data extraction module may also acquire additional information regarding the signal from the spectral components of the signal. For example, the data extraction module may provide modulation type, bandwidth, and possible system in use information. In another embodiment, the data extraction module may select and organize the extracted spectral components in a format selected by a user.

The information from the data extraction module may be provided to a spectrum management module. The spectrum management module may generate a query to a static database to classify a signal based on its components. For example, the information stored in static database may be used to determine the spectral density, center frequency, bandwidth, baud rate, modulation type, protocol (e.g., GSM, CDMA, OFDM, LTE, etc.), system or carrier using licensed spectrum, location of the signal source, and a timestamp of the signal of interest. These data points may be provided to a data store for export. In an embodiment and as more fully described below, the data store may be configured to access mapping software to provide the user with information on the location of the transmission source of the signal of interest. In an embodiment, the static database includes frequency information gathered from various sources including, but not limited to, the Federal Communication Commission, the International Telecommunication Union, and data from users. As an example, the static database may be an SQL database. The data store may be updated, downloaded or merged with other devices or with its main relational database. Software API applications may be included to allow database merging with third-party spectrum databases that may only be accessed securely.

In the various embodiments, the spectrum management device may be configured in different ways. In an embodiment, the front end of the system may comprise various hardware receivers that may provide In-Phase and Quadrature complex data. The front end receiver may include API set commands via which the system software may be configured to interface (i.e., communicate) with a third party receiver. In an embodiment, the front end receiver may perform the spectral computations using FFT (Fast Fourier Transform) and other DSP (Digital Signal Processing) to generate a fast convolution periodogram that may be re-sampled and averaged to quickly compute the spectral density of the RF environment.

In an embodiment, cyclic processes may be used to average and correlate signal information by extracting the changes inside the signal to better identify the signal of interest that is present in the RF space. A combination of amplitude and frequency changes may be measured and averaged over the bandwidth time to compute the modulation type and other internal changes, such as changes in frequency offsets, orthogonal frequency division modulation, changes in time (e.g., Time Division Multiplexing), and/or changes in I/Q phase rotation used to compute the baud rate and the modulation type. In an embodiment, the spectrum management device may have the ability to compute several processes in parallel by use of a multi-core processor and along with several embedded field programmable gate arrays (FPGA). Such multi-core processing may allow the system to quickly analyze several signal parameters in the RF environment at one time in order to reduce the amount of time it takes to process the signals. The amount of signals computed at once may be determined by their bandwidth requirements. Thus, the capability of the system may be based on a maximum frequency Fs/2. The number of signals to be processed may be allocated based on their respective bandwidths. In another embodiment, the signal spectrum may be measured to determine its power density, center frequency, bandwidth and location from which the signal is emanating and a best match may be determined based on the signal parameters based on information criteria of the frequency.

In another embodiment, a GPS and direction finding location (DF) system may be incorporated into the spectrum management device and/or available to the spectrum management device. Adding GPS and DF ability may enable the user to provide a location vector using the National Marine Electronics Association's (NMEA) standard form. In an embodiment, location functionality is incorporated into a specific type of GPS unit, such as a U.S. government issued receiver. The information may be derived from the location presented by the database internal to the device, a database imported into the device, or by the user inputting geo-location parameters of longitude and latitude which may be derived as degrees, minutes and seconds, decimal minutes, or decimal form and translated to the necessary format with the default being 'decimal' form. This functionality may be incorporated into a GPS unit. The signal information and the signal classification may then be used to locate the signaling device as well as to provide a direction finding capability.

A type of triangulation using three units as a group antenna configuration performs direction finding by using multilateration. Commonly used in civil and military surveillance applications, multilateration is able to accurately locate an aircraft, vehicle, or stationary emitter by measuring the "Time Difference of Arrival" (TDOA) of a signal from the emitter at three or more receiver sites. If a pulse is emitted from a platform, it will arrive at slightly different times at two spatially separated receiver sites, the TDOA being due to the different distances of each receiver from the platform. This location information may then be supplied to a mapping process that utilizes a database of mapping images that are extracted from the database based on the latitude and longitude provided by the geo-location or direction finding device. The mapping images may be scanned in to show the points of interest where a signal is either expected to be emanating from based on the database information or from an average taken from the database information and the geo-location calculation performed prior to the mapping software being called. The user can control the map to maximize or minimize the mapping screen to get a better view which is more fit to provide information of the signal transmissions. In an embodiment, the mapping process does not rely on outside mapping software. The mapping capability has the ability to generate the map image and to populate a mapping database that may include information from third party maps to meet specific user requirements.

In an embodiment, triangulation and multilateration may utilize a Bayesian type filter that may predict possible movement and future location and operation of devices based on input collected from the TDOA and geolocation processes and the variables from the static database pertaining to the specified signal of interest. The Bayesian filter takes the input changes in time difference and its inverse function (i.e., frequency difference) and takes an average change in signal variation to detect and predict the movement of the signals. The signal changes are measured within 1 ns time difference and the filter may also adapt its gradient error calculation to remove unwanted signals that may cause errors due to signal multipath, inter-symbol interference, and other signal noise.

In an embodiment the changes within a 1 ns time difference for each sample for each unique signal may be recorded. The spectrum management device may then perform the inverse and compute and record the frequency difference and phase difference between each sample for each unique signal. The spectrum management device may take the same signal and calculates an error based on other input signals coming in within the 1 ns time and may average and filter out the computed error to equalize the signal. The spectrum management device may determine the time difference and frequency difference of arrival for that signal and compute the odds of where the signal is emanating from based on the frequency band parameters presented from the spectral analysis and processor computations, and determines the best position from which the signal is transmitted (i.e., origin of the signal).

FIG. 1 illustrates a wireless environment 100 suitable for use with the various embodiments. The wireless environment 100 may include various sources 104, 106, 108, 110, 112, and 114 generating various radio frequency (RF) signals 116, 118, 120, 122, 124, 126. As an example, mobile devices 104 may generate cellular RF signals 116, such as CDMA, GSM, 3G signals, etc. As another example, wireless access devices 106, such as Wi-Fi® routers, may generate RF signals 118, such as Wi-Fi® signals. As a further example, satellites 108, such as communication satellites or GPS satellites, may generate RF signals 120, such as satellite radio, television, or GPS signals. As a still further example, base stations 110, such as a cellular base station, may generate RF signals 122, such as CDMA, GSM, 3G signals, etc. As another example, radio towers 112, such as local AM or FM radio stations, may generate RF signals 124, such as AM or FM radio signals. As another example, government service provides 114, such as police units, fire fighters, military units, air traffic control towers, etc. may generate RF signals 126, such as radio communications, tracking signals, etc. The various RF signals 116, 118, 120, 122, 124, 126 may be generated at different frequencies, power levels, in different protocols, with different modulations, and at different times. The various sources 104, 106, 108, 110, 112, and 114 may be assigned frequency bands, power limitations, or other restrictions, requirements, and/or licenses by a government spectrum control entity, such as the FCC. However, with so many different sources 104, 106, 108, 110, 112, and 114 generating so many different RF signals 116, 118, 120, 122, 124, 126, overlaps, interference, and/or other problems may occur. A spectrum management device 102 in the wireless environment 100 may measure the RF energy in the wireless environment 100 across a wide spectrum and identify the different RF signals 116, 118, 120, 122, 124, 126 which may be present in the wireless environment 100. The identification and cataloging of the different RF signals 116, 118, 120, 122, 124, 126 which may be present in the wireless environment 100 may enable the spectrum management device 102 to determine available frequencies for use in the wireless environment 100. In addition, the spectrum management device 102 may be able to determine if there are available frequencies for use in the wireless environment 100 under certain conditions (i.e., day of week, time of day, power level, frequency band, etc.). In this manner, the RF spectrum in the wireless environment 100 may be managed.

Figure 2A:
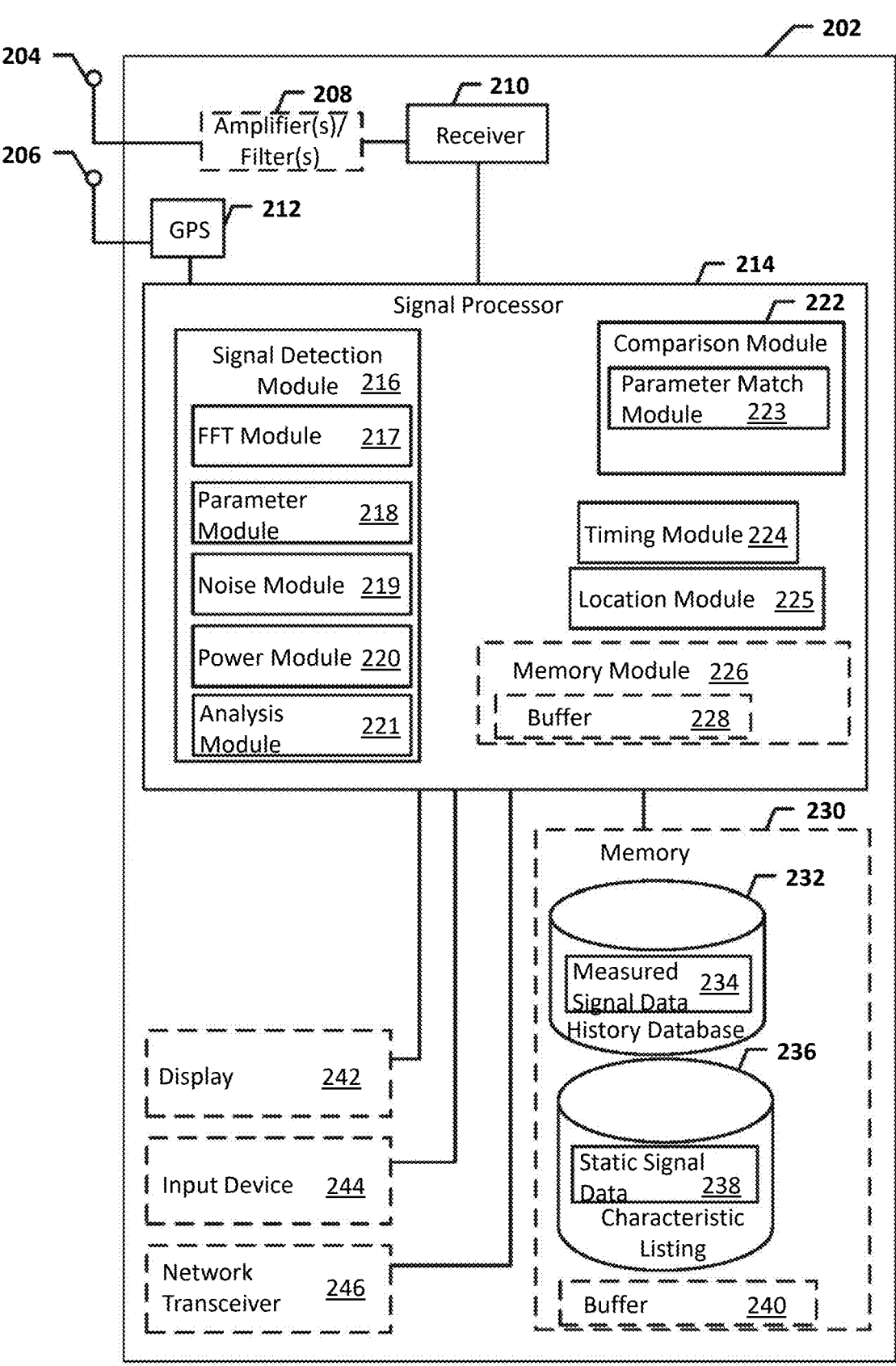
FIG. 2A is a block diagram of a spectrum management device according to an embodiment.

FIG. 2A is a block diagram of a spectrum management device 202 according to an embodiment. The spectrum management device 202 may include an antenna structure 204 configured to receive RF energy expressed in a wireless environment. The antenna structure 204 may be any type antenna, and may be configured to optimize the receipt of RF energy across a wide frequency spectrum. The antenna structure 204 may be connected to one or more optional amplifiers and/or filters 208 which may boost, smooth, and/or filter the RF energy received by antenna structure 204 before the RF energy is passed to an RF receiver 210 connected to the antenna structure 204. In an embodiment, the RF receiver 210 may be configured to measure the RF energy received from the antenna structure 204 and/or optional amplifiers and/or filters 208. In an embodiment, the RF receiver 210 may be configured to measure RF energy in the time domain and may convert the RF energy measurements to the frequency domain. In an embodiment, the RF receiver 210 may be configured to generate spectral representation data of the received RF energy. The RF receiver 210 may be any type RF receiver, and may be configured to generate RF energy measurements over a range of frequencies, such as 0 kHz to 24 GHz, 9 kHz to 6 GHZ, etc. In an embodiment, the frequency scanned by the RF receiver 210 may be user selectable. In an embodiment, the RF receiver 210 may be connected to a signal processor 214 and may be configured to output RF energy measurements to the signal processor 214. As an example, the RF receiver 210 may output raw In-Phase (I) and Quadrature (Q) data to the signal processor 214. As another example, the RF receiver 210 may apply signals processing techniques to output complex In-Phase (I) and Quadrature (Q) data to the signal processor 214. In an embodiment, the spectrum management device may also include an antenna 206 connected to a location receiver 212, such as a GPS receiver, which may be connected to the signal processor 214. The location receiver 212 may provide location inputs to the signal processor 214.

The signal processor 214 may include a signal detection module 216, a comparison module 222, a timing module 224, and a location module 225. Additionally, the signal processor 214 may include an optional memory module 226 which may include one or more optional buffers 228 for storing data generated by the other modules of the signal processor 214.

In an embodiment, the signal detection module 216 may operate to identify signals based on the RF energy measurements received from the RF receiver 210. The signal detection module 216 may include a Fast Fourier Transform (FFT) module 217 which may convert the received RF energy measurements into spectral representation data. The signal detection module 216 may include an analysis module 221 which may analyze the spectral representation data to identify one or more signals above a power threshold.

A power module 220 of the signal detection module 216 may control the power threshold at which signals may be identified. In an embodiment, the power threshold may be a default power setting or may be a user selectable power setting. A noise module 219 of the signal detection module 216 may control a signal threshold, such as a noise threshold, at or above which signals may be identified.

The signal detection module 216 may include a parameter module 218 which may determine one or more signal parameters for any identified signals, such as center frequency, bandwidth, power, number of detected signals, frequency peak, peak power, average power, signal duration, etc. In an embodiment, the signal processor 214 may include a timing module 224 which may record time information and provide the time information to the signal detection module 216. Additionally, the signal processor 214 may include a location module 225 which may receive location inputs from the location receiver 212 and determine a location of the spectrum management device 202. The location of the spectrum management device 202 may be provided to the signal detection module 216.

In an embodiment, the signal processor 214 may be connected to one or more memory 230. The memory 230 may include multiple databases, such as a history or historical database 232 and characteristics listing 236, and one or more buffers 240 storing data generated by signal processor 214. While illustrated as connected to the signal processor 214 the memory 230 may also be on chip memory residing on the signal processor 214 itself. In an embodiment, the history or historical database 232 may include measured signal data 234 for signals that have been previously identified by the spectrum management device 202. The measured signal data 234 may include the raw RF energy measurements, time stamps, location information, one or more signal parameters for any identified signals, such as center frequency, bandwidth, power, number of detected signals, frequency peak, peak power, average power, signal duration, etc., and identifying information determined from the characteristics listing 236. In an embodiment, the history or historical database 232 may be updated as signals are identified by the spectrum management device 202. In an embodiment, the characteristic listing 236 may be a database of static signal data 238. The static signal data 238 may include data gathered from various sources including by way of example and not by way of limitation the Federal Communication Commission, the International Telecommunication Union, telecom providers, manufacture data, and data from spectrum management device users. Static signal data 238 may include known signal parameters of transmitting devices, such as center frequency, bandwidth, power, number of detected signals, frequency peak, peak power, average power, signal duration, geographic information for transmitting devices, and any other data that may be useful in identifying a signal. In an embodiment, the static signal data 238 and the characteristic listing 236 may correlate signal parameters and signal identifications. As an example, the static signal data 238 and characteristic listing 236 may list the parameters of the local fire and emergency communication channel correlated with a signal identification indicating that signal is the local fire and emergency communication channel.

In an embodiment, the signal processor 214 may include a comparison module 222 which may match data generated by the signal detection module 216 with data in the history or historical database 232 and/or characteristic listing 236. In an embodiment the comparison module 222 may receive signal parameters from the signal detection module 216, such as center frequency, bandwidth, power, number of detected signals, frequency peak, peak power, average power, signal duration, and/or receive parameter from the timing module 224 and/or location module 225. The parameter match module 223 may retrieve data from the history or historical database 232 and/or the characteristic listing 236 and compare the retrieved data to any received parameters to identify matches. Based on the matches the comparison module may identify the signal. In an embodiment, the signal processor 214 may be optionally connected to a display 242, an input device 244, and/or network transceiver 246. The display 242 may be controlled by the signal processor 214 to output spectral representations of received signals, signal characteristic information, and/or indications of signal identifications on the display 242. In an embodiment, the input device 244 may be any input device, such as a keyboard and/or knob, mouse, virtual keyboard or even voice recognition, enabling the user of the spectrum management device 202 to input information for use by the signal processor 214. In an embodiment, the network transceiver 246 may enable the spectrum management device 202 to exchange data with wired and/or wireless networks, such as to update the characteristic listing 236 and/or upload information from the history or historical database 232.

Figure 2B:
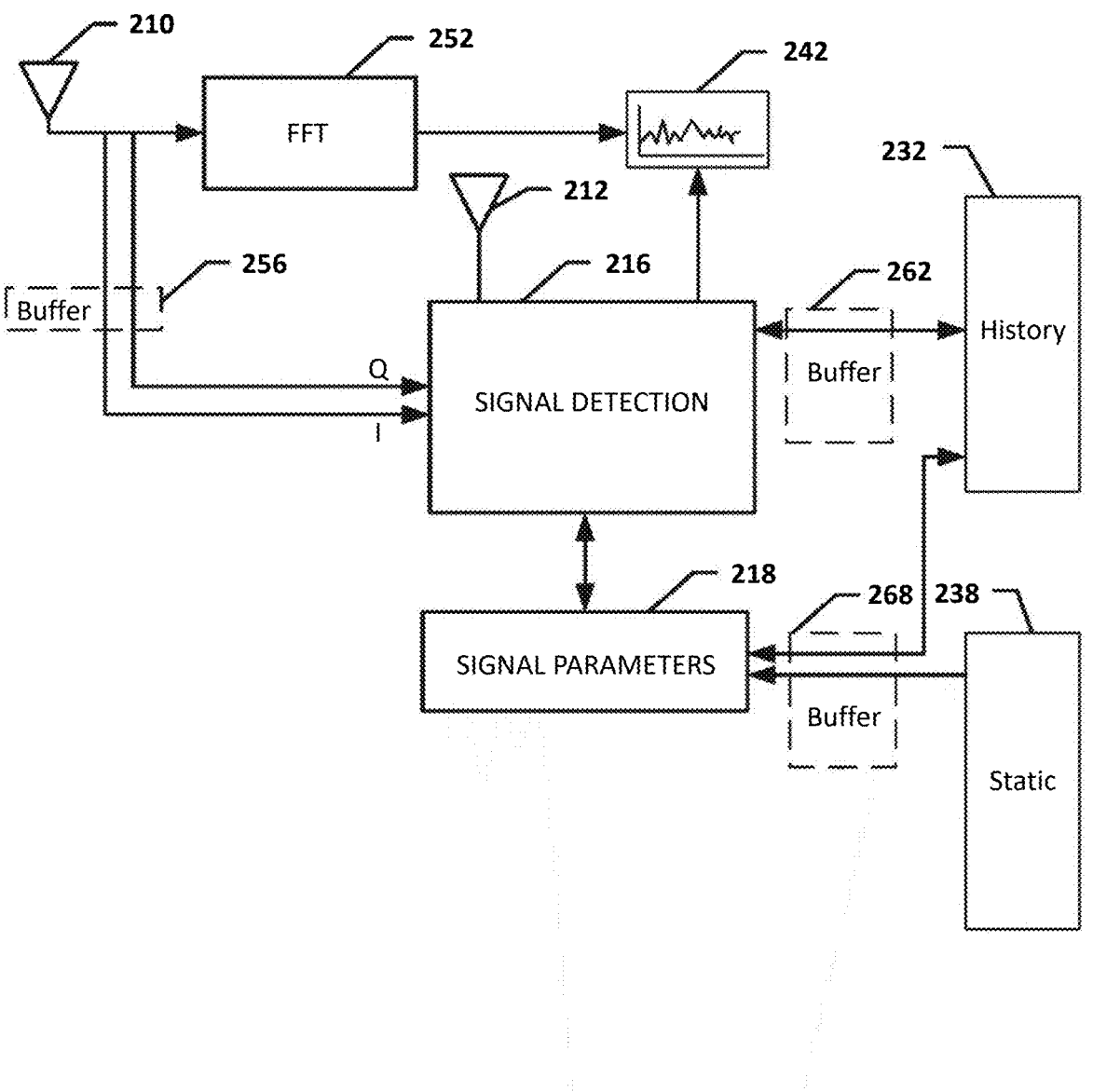
FIG. 2B is a schematic logic flow block diagram illustrating logical operations which may be performed by a spectrum management device according to an embodiment.

FIG. 2B is a schematic logic flow block diagram illustrating logical operations which may be performed by a spectrum management device 202 according to an embodiment. A receiver 210 may output RF energy measurements, such as I and Q data to an FFT module 252 which may generate a spectral representation of the RF energy measurements which may be output on a display 242. The I and Q data may also be buffered in a buffer 256 and sent to a signal detection module 216. The signal detection module 216 may receive location inputs from a location receiver 212 and use the received I and Q data to detect signals. Data from the signal detection module 216 may be buffered in a buffer 262 and written into a history or historical database 232. Additionally, data from the historical database may be used to aid in the detection of signals by the signal detection module 216. The signal parameters of the detected signals may be determined by a signal parameters module 218 using information from the history or historical database 232 and/or a static database 238 listing signal characteristics through a buffer 268. Data from the signal parameters module 218 may be stored in the history or historical database 232 and/or sent to the signal detection module 216 and/or display 242. In this manner, signals may be detected and indications of the signal identification may be displayed to a user of the spectrum management device.

Figure 3:
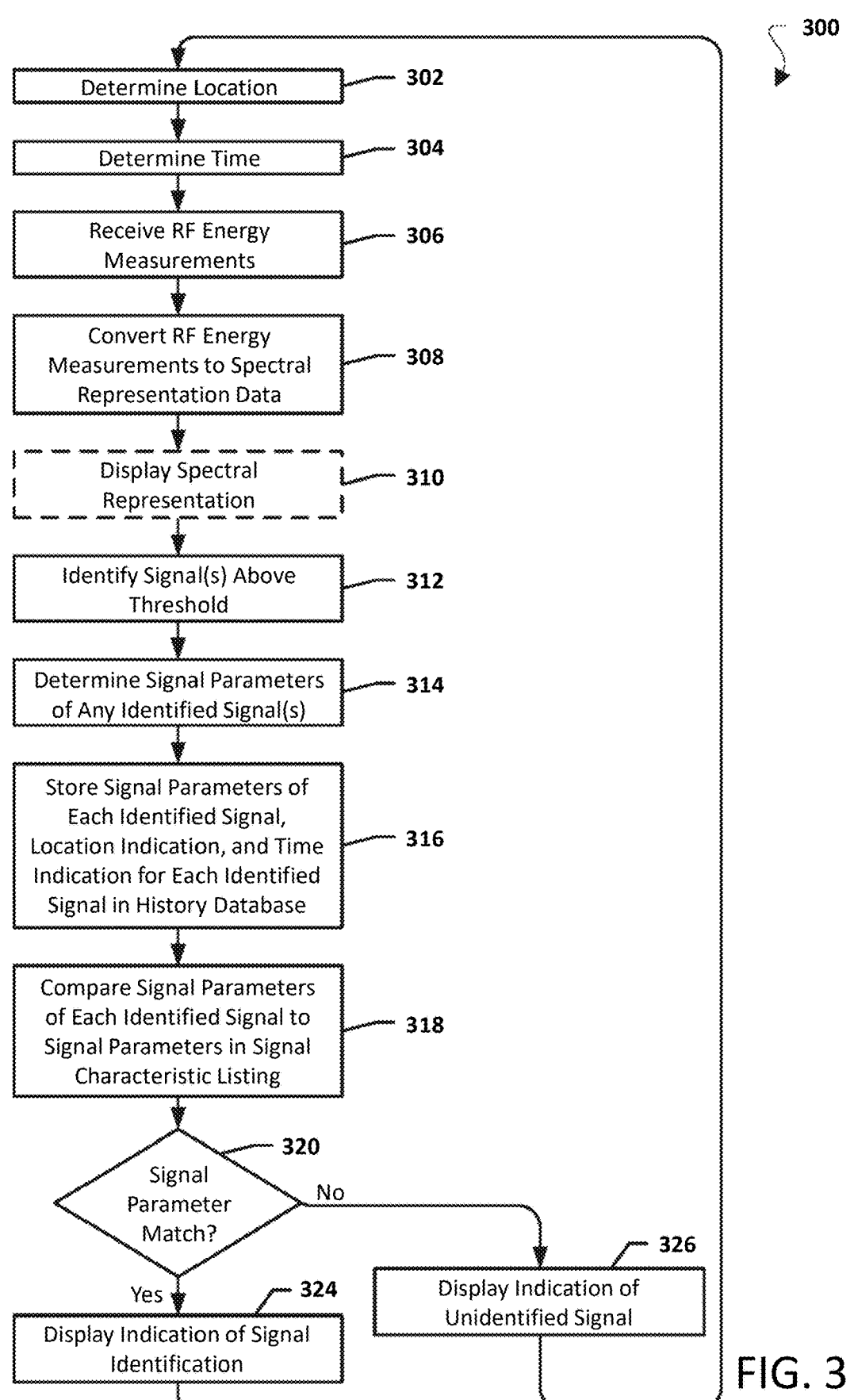
FIG. 3 is a process flow diagram illustrating an embodiment method for identifying a signal.

FIG. 3 illustrates a process flow of an embodiment method 300 for identifying a signal. In an embodiment the operations of method 300 may be performed by the processor 214 of a spectrum management device 202. In block 302 the processor 214 may determine the location of the spectrum management device 202. In an embodiment, the processor 214 may determine the location of the spectrum management device 202 based on a location input, such as GPS coordinates, received from a location receiver, such as a GPS receiver 212. In block 304 the processor 214 may determine the time. As an example, the time may be the current clock time as determined by the processor 214 and may be a time associated with receiving RF measurements. In block 306 the processor 214 may receive RF energy measurements. In an embodiment, the processor 214 may receive RF energy measurements from an RF receiver 210. In block 308 the processor 214 may convert the RF energy measurements to spectral representation data. As an example, the processor may apply a Fast Fourier Transform (FFT) to the RF energy measurements to convert them to spectral representation data. In optional block 310 the processor 214 may display the spectral representation data on a display 242 of the spectrum management device 202, such as in a graph illustrating amplitudes across a frequency spectrum.

In block 312 the processor 214 may identify one or more signal above a threshold. In an embodiment, the processor 214 may analyze the spectral representation data to identify a signal above a power threshold. A power threshold may be an amplitude measure selected to distinguish RF energies associated with actual signals from noise. In an embodiment, the power threshold may be a default value. In another embodiment, the power threshold may be a user selectable value. In block 314 the processor 214 may determine signal parameters of any identified signal or signals of interest. As examples, the processor 214 may determine signal parameters such as center frequency, bandwidth, power, number of detected signals, frequency peak, peak power, average power, signal duration for the identified signals. In block 316 the processor 214 may store the signal parameters of each identified signal, a location indication, and time indication for each identified signal in a history database 232. In an embodiment, a history database 232 may be a database resident in a memory 230 of the spectrum management device 202 which may include data associated with signals actually identified by the spectrum management device.

In block 318 the processor 214 may compare the signal parameters of each identified signal to signal parameters in a signal characteristic listing. In an embodiment, the signal characteristic listing may be a static database 238 stored in the memory 230 of the spectrum management device 202 which may correlate signal parameters and signal identifications. In determination block 320 the processor 214 may determine whether the signal parameters of the identified signal or signals match signal parameters in the characteristic listing 236. In an embodiment, a match may be determined based on the signal parameters being within a specified tolerance of one another. As an example, a center frequency match may be determined when the center frequencies are within plus or minus 1 kHz of each other. In this manner, differences between real world measured conditions of an identified signal and ideal conditions listed in a characteristics listing may be accounted for in identifying matches. If the signal parameters do not match (i.e., determination block 320="No"), in block 326 the processor 214 may display an indication that the signal is unidentified on a display 242 of the spectrum management device 202. In this manner, the user of the spectrum management device may be notified that a signal is detected, but has not been positively identified. If the signal parameters do match (i.e., determination block 320="Yes"), in block 324 the processor 214 may display an indication of the signal identification on the display 242. In an embodiment, the signal identification displayed may be the signal identification correlated to the signal parameter in the signal characteristic listing which matched the signal parameter for the identified signal. Upon displaying the indications in blocks 324 or 326 the processor 214 may return to block 302 and cyclically measure and identify further signals of interest.

Figure 4:
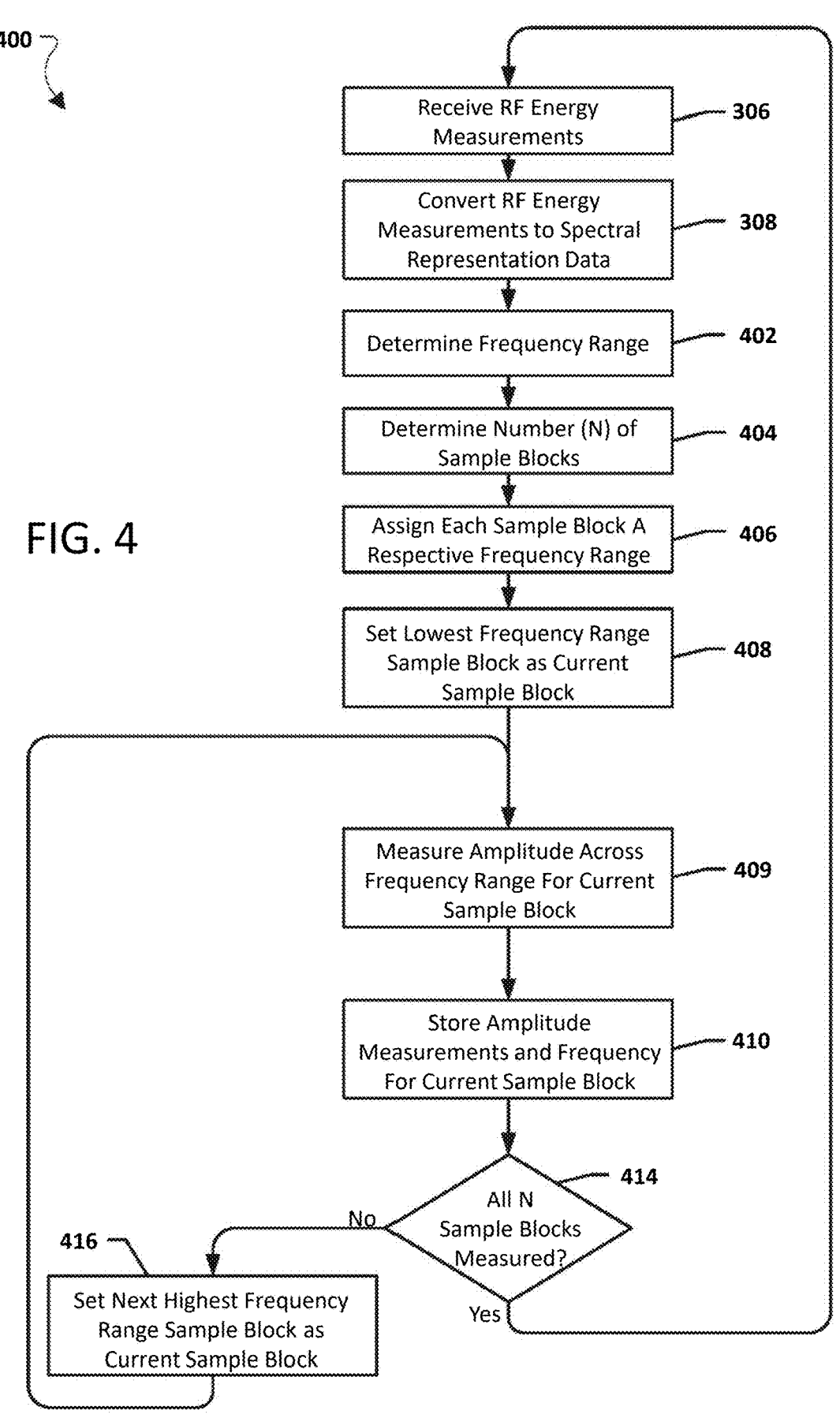
FIG. 4 is a process flow diagram illustrating an embodiment method for measuring sample blocks of a radio frequency scan.

FIG. 4 illustrates an embodiment method 400 for measuring sample blocks of a radio frequency scan. In an embodiment the operations of method 400 may be performed by the processor 214 of a spectrum management device 202. As discussed above, in blocks 306 and 308 the processor 214 may receive RF energy measurements and convert the RF energy measurements to spectral representation data. In block 402 the processor 214 may determine a frequency range at which to sample the RF spectrum for signals of interest. In an embodiment, a frequency range may be a frequency range of each sample block to be analyzed for potential signals. As an example, the frequency range may be 240 kHz. In an embodiment, the frequency range may be a default value. In another embodiment, the frequency range may be a user selectable value. In block 404 the processor 214 may determine a number (N) of sample blocks to measure. In an embodiment, each sample block may be sized to the determined of default frequency range, and the number of sample blocks may be determined by dividing the spectrum of the measured RF energy by the frequency range. In block 406 the processor 214 may assign each sample block a respective frequency range. As an example, if the determined frequency range is 240 kHz, the first sample block may be assigned a frequency range from 0 kHz to 240 kHz, the second sample block may be assigned a frequency range from 240 kHz to 480 kHz, etc. In block 408 the processor 214 may set the lowest frequency range sample block as the current sample block. In block 409 the processor 214 may measure the amplitude across the set frequency range for the current sample block. As an example, at each frequency interval (such as 1 Hz) within the frequency range of the sample block the processor 214 may measure the received signal amplitude. In block 410 the processor 214 may store the amplitude measurements and corresponding frequencies for the current sample block. In determination block 414 the processor 214 may determine if all sample blocks have been measured. If all sample blocks have not been measured (i.e., determination block 414="No"), in block 416 the processor 214 may set the next highest frequency range sample block as the current sample block. As discussed above, in blocks 409, 410, and 414 the processor 214 may measure and store amplitudes and determine whether all blocks are sampled. If all blocks have been sampled (i.e., determination block 414="Yes"), the processor 214 may return to block 306 and cyclically measure further sample blocks.

Figure 5A:
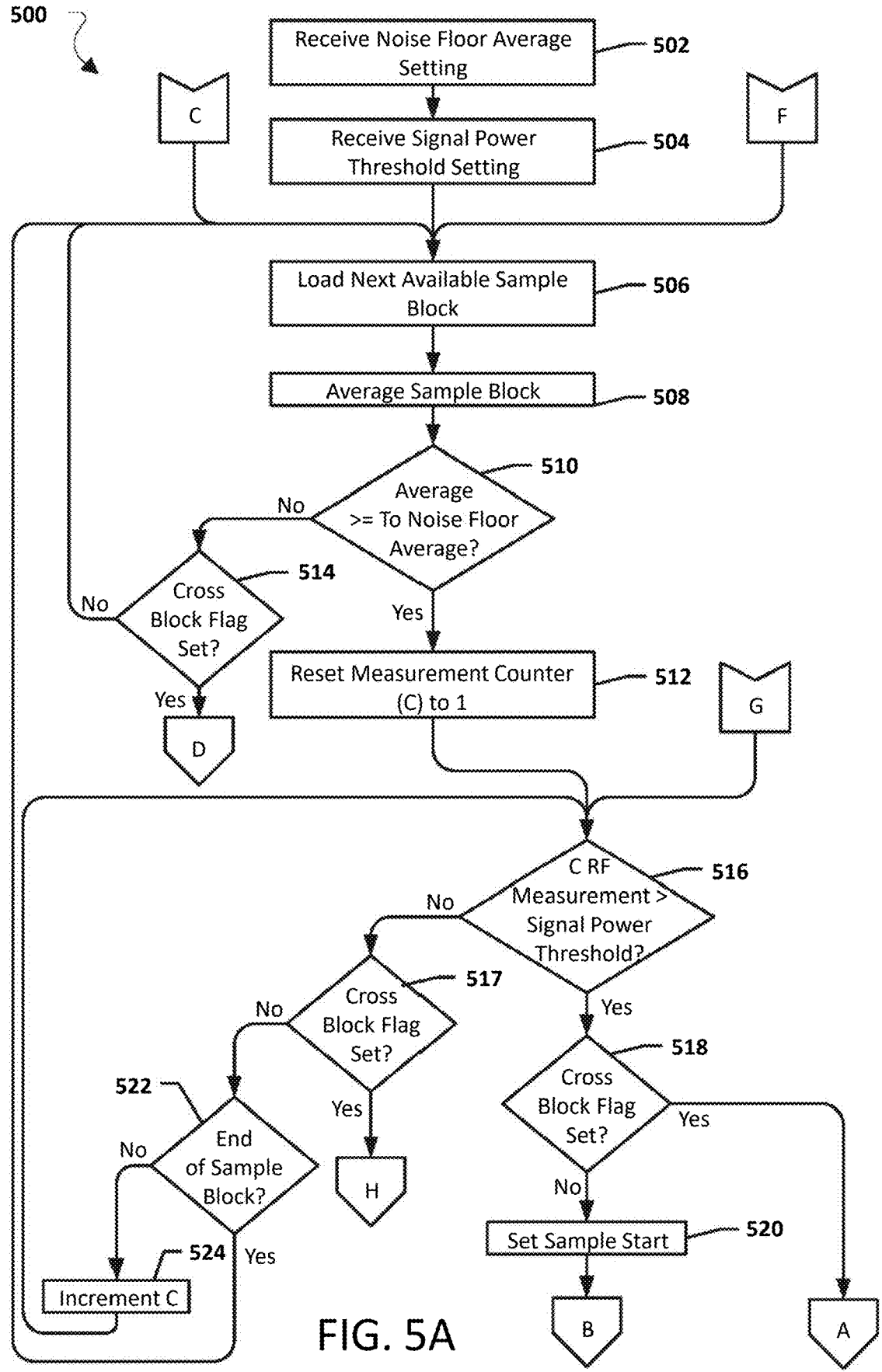
FIG. 5A is a process flow diagram illustrating an embodiment method for determining signal parameters.
Figure 5B:
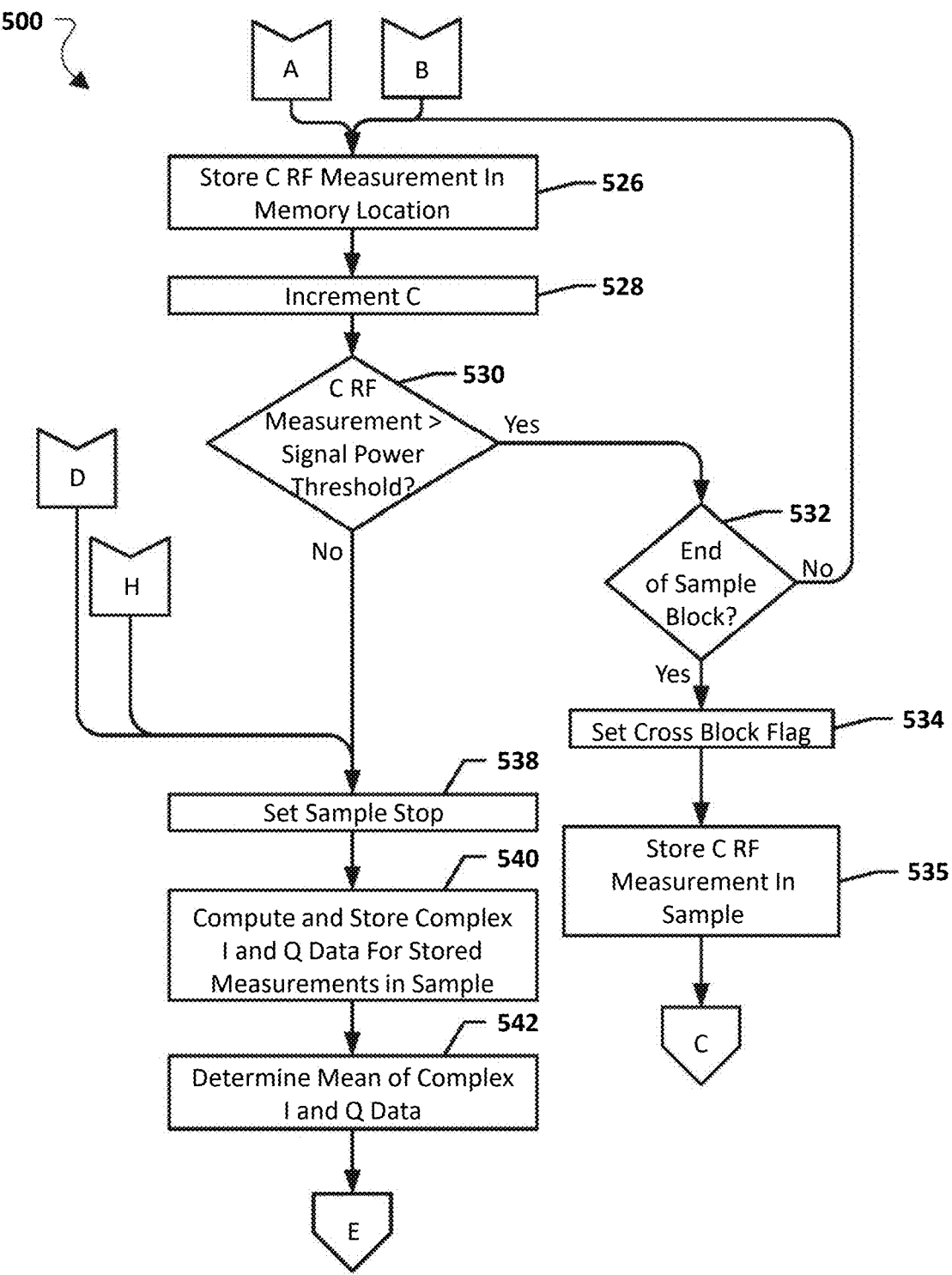
FIG. 5B is a process flow diagram illustrating an embodiment method for determining signal parameters continued from FIG. 5A.
Figure 5C:
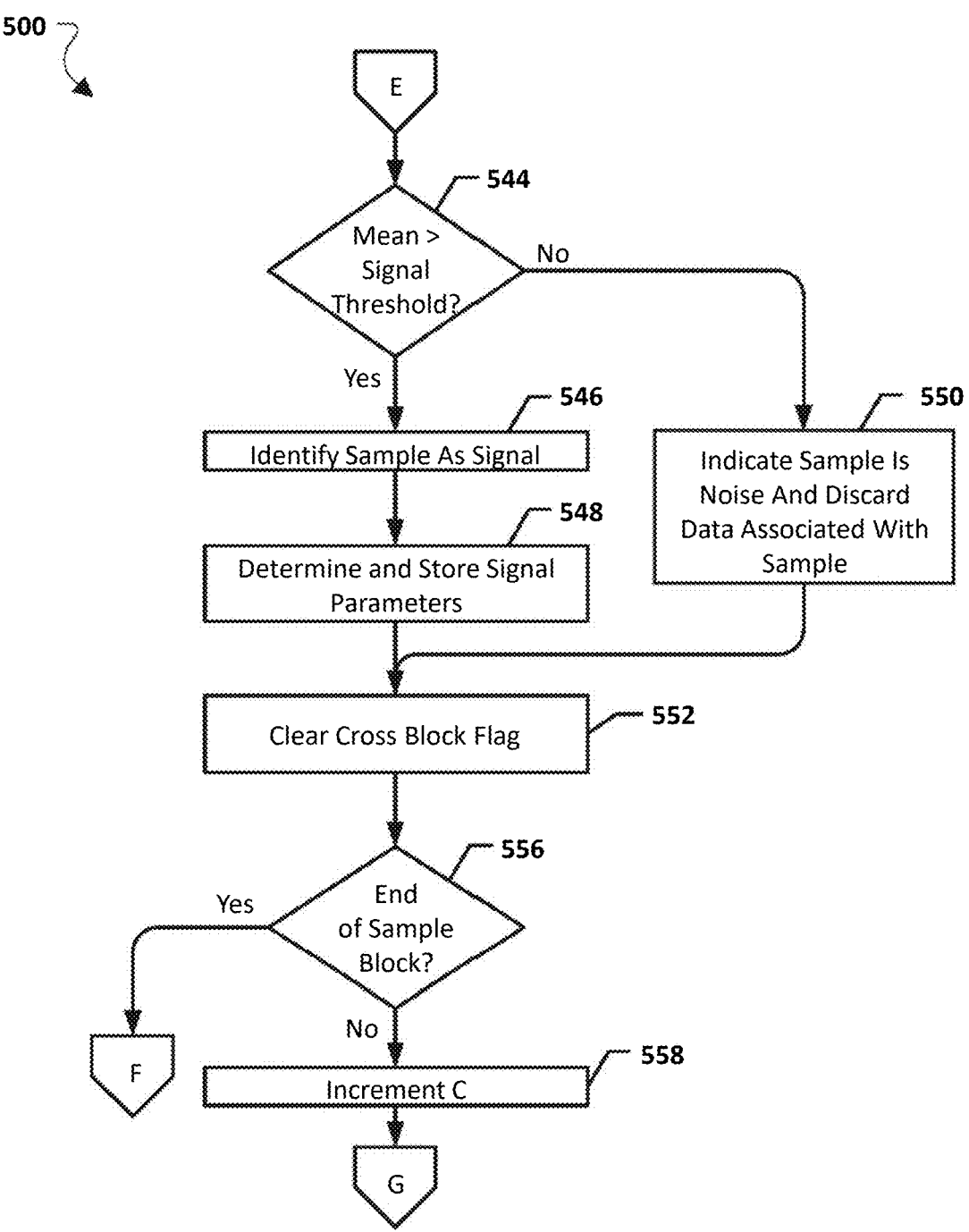
FIG. 5C is a process flow diagram illustrating an embodiment method for determining signal parameters continued from FIGS. 5A-5B.

FIGS. 5A, 5B, and 5C illustrate the process flow for an embodiment method 500 for determining signal parameters. In an embodiment, the operations of method 500 may be performed by the processor 214 of a spectrum management device 202. Referring to FIG. 5A, in block 502 the processor 214 may receive a noise floor average setting. In an embodiment, the noise floor average setting may be an average noise level for the environment in which the spectrum management device 202 is operating. In an embodiment, the noise floor average setting may be a default setting and/or may be user selectable setting. In block 504 the processor 214 may receive the signal power threshold setting. In an embodiment, the signal power threshold setting may be an amplitude measure selected to distinguish RF energies associated with actual signals from noise. In an embodiment, the signal power threshold may be a default value and/or may be a user selectable setting. In block 506 the processor 214 may load the next available sample block. In an embodiment, the sample blocks may be assembled according to the operations of method 400 described above with reference to FIG. 4. In an embodiment, the next available sample block may be an oldest in time sample block which has not been analyzed to determine whether signals of interest are present in the sample block. In block 508 the processor 214 may average the amplitude measurements in the sample block. In determination block 510 the processor 214 may determine whether the average for the sample block is greater than or equal to the noise floor average set in block 502. In this manner, sample blocks including potential signals may be quickly distinguished from sample blocks which may not include potential signals reducing processing time by enabling sample blocks without potential signals to be identified and ignored. If the average for the sample block is lower than the noise floor average (i.e., determination block 510="No"), no signals of interest may be present in the current sample block. In determination block 514 the processor 214 may determine whether a cross block flag is set. If the cross block flag is not set (i.e., determination block 514="No"), in block 506 the processor 214 may load the next available sample block and in block 508 average the sample block 508.

If the average of the sample block is equal to or greater than the noise floor average (i.e., determination block 510="Yes"), the sample block may potentially include a signal of interest and in block 512 the processor 214 may reset a measurement counter (C) to 1. The measurement counter value indicating which sample within a sample block is under analysis. In determination block 516 the processor 214 may determine whether the RF measurement of the next frequency sample (C) is greater than the signal power threshold. In this manner, the value of the measurement counter (C) may be used to control which sample RF measurement in the sample block is compared to the signal power threshold. As an example, when the counter (C) equals 1, the first RF measurement may be checked against the signal power threshold and when the counter (C) equals 2 the second RF measurement in the sample block may be checked, etc. If the C RF measurement is less than or equal to the signal power threshold (i.e., determination block 516="No"), in determination block 517 the processor 214 may determine whether the cross block flag is set. If the cross block flag is not set (i.e., determination block 517="No"), in determination block 522 the processor 214 may determine whether the end of the sample block is reached. If the end of the sample block is reached (i.e., determination block 522="Yes"), in block 506 the processor 214 may load the next available sample block and proceed in blocks 508, 510, 514, and 512 as discussed above. If the end of the sample block is not reached (i.e., determination block 522="No"), in block 524 the processor 214 may increment the measurement counter (C) so that the next sample in the sample block is analyzed.

If the C RF measurement is greater than the signal power threshold (i.e., determination block 516="Yes"), in block 518 the processor 214 may check the status of the cross block flag to determine whether the cross block flag is set. If the cross block flag is not set (i.e., determination block 518="No"), in block 520 the processor 214 may set a sample start. As an example, the processor 214 may set a sample start by indicating a potential signal of interest may be discovered in a memory by assigning a memory location for RF measurements associated with the sample start. Referring to FIG. 5B, in block 526 the processor 214 may store the C RF measurement in a memory location for the sample currently under analysis. In block 528 the processor 214 may increment the measurement counter (C) value.

In determination block 530 the processor 214 may determine whether the C RF measurement (e.g., the next RF measurement because the value of the RF measurement counter was incremented) is greater than the signal power threshold. If the C RF measurement is greater than the signal power threshold (i.e., determination block 530="Yes"), in determination block 532 the processor 214 may determine whether the end of the sample block is reached. If the end of the sample block is not reached (i.e., determination block 532="No"), there may be further RF measurements available in the sample block and in block 526 the processor 214 may store the C RF measurement in the memory location for the sample. In block 528 the processor may increment the measurement counter (C) and in determination block 530 determine whether the C RF measurement is above the signal power threshold and in block 532 determine whether the end of the sample block is reached. In this manner, successive sample RF measurements may be checked against the signal power threshold and stored until the end of the sample block is reached and/or until a sample RF measurement falls below the signal power threshold. If the end of the sample block is reached (i.e., determination block 532="Yes"), in block 534 the processor 214 may set the cross block flag. In an embodiment, the cross block flag may be a flag in a memory available to the processor 214 indicating the signal potential spans across two or more sample blocks. In a further embodiment, prior to setting the cross block flag in block 534, the slope of a line drawn between the last two RF measurement samples may be used to determine whether the next sample block likely contains further potential signal samples. A negative slope may indicate that the signal of interest is fading and may indicate the last sample was the final sample of the signal of interest. In another embodiment, the slope may not be computed and the next sample block may be analyzed regardless of the slope.

If the end of the sample block is reached (i.e., determination block 532="Yes") and in block 534 the cross block flag is set, referring to FIG. 5A, in block 506 the processor 214 may load the next available sample block, in block 508 may average the sample block, and in block 510 determine whether the average of the sample block is greater than or equal to the noise floor average. If the average is equal to or greater than the noise floor average (i.e., determination block 510="Yes"), in block 512 the processor 214 may reset the measurement counter (C) to 1. In determination block 516 the processor 214 may determine whether the C RF measurement for the current sample block is greater than the signal power threshold. If the C RF measurement is greater than the signal power threshold (i.e., determination block 516="Yes"), in determination block 518 the processor 214 may determine whether the cross block flag is set. If the cross block flag is set (i.e., determination block 518="Yes"), referring to FIG. 5B, in block 526 the processor 214 may store the C RF measurement in the memory location for the sample and in block 528 the processor may increment the measurement counter (C). As discussed above, in blocks 530 and 532 the processor 214 may perform operations to determine whether the C RF measurement is greater than the signal power threshold and whether the end of the sample block is reached until the C RF measurement is less than or equal to the signal power threshold (i.e., determination block 530="No") or the end of the sample block is reached (i.e., determination block 532="Yes"). If the end of the sample block is reached (i.e., determination block 532="Yes"), as discussed above in block 534 the cross block flag may be set (or verified and remain set if already set) and in block 535 the C RF measurement may be stored in the sample.

If the end of the sample block is reached (i.e., determination block 532="Yes") and in block 534 the cross block flag is set, referring to FIG. 5A, the processor may perform operations of blocks 506, 508, 510, 512, 516, and 518 as discussed above. If the average of the sample block is less than the noise floor average (i.e., determination block 510="No") and the cross block flag is set (i.e., determination block 514="Yes"), the C RF measurement is less than or equal to the signal power threshold (i.e., determination block 516="No") and the cross block flag is set (i.e., determination block 517="Yes"), or the C RF measurement is less than or equal to the signal power threshold (i.e., determination block 516="No"), referring to FIG. 5B, in block 538 the processor 214 may set the sample stop. As an example, the processor 214 may indicate that a sample end is reached in a memory and/or that a sample is complete in a memory. In block 540 the processor 214 may compute and store complex I and Q data for the stored measurements in the sample. In block 542 the processor 214 may determine a mean of the complex I and Q data. Referring to FIG. 5C, in determination block 544 the processor 214 may determine whether the mean of the complex I and Q data is greater than a signal threshold. If the mean of the complex I and Q data is less than or equal to the signal threshold (i.e., determination block 544="No"), in block 550 the processor 214 may indicate the sample is noise and discard data associated with the sample from memory.

If the mean is greater than the signal threshold (i.e., determination block 544="Yes"), in block 546 the processor 214 may identify the sample as a signal of interest. In an embodiment, the processor 214 may identify the sample as a signal of interest by assigning a signal identifier to the signal, such as a signal number or sample number. In block 548 the processor 214 may determine and store signal parameters for the signal. As an example, the processor 214 may determine and store a frequency peak of the identified signal, a peak power of the identified signal, an average power of the identified signal, a signal bandwidth of the identified signal, and/or a signal duration of the identified signal. In block 552 the processor 214 may clear the cross block flag (or verify that the cross block flag is unset). In block 556 the processor 214 may determine whether the end of the sample block is reached. If the end of the sample block is not reached (i.e., determination block 556="No") in block

558 the processor 214 may increment the measurement counter (C), and referring to FIG. 5A in determination block 516 may determine whether the C RF measurement is greater than the signal power threshold. Referring to FIG. 5C, if the end of the sample block is reached (i.e., determination block 556="Yes"), referring to FIG. 5A, in block 506 the processor 214 may load the next available sample block.

Figure 6:
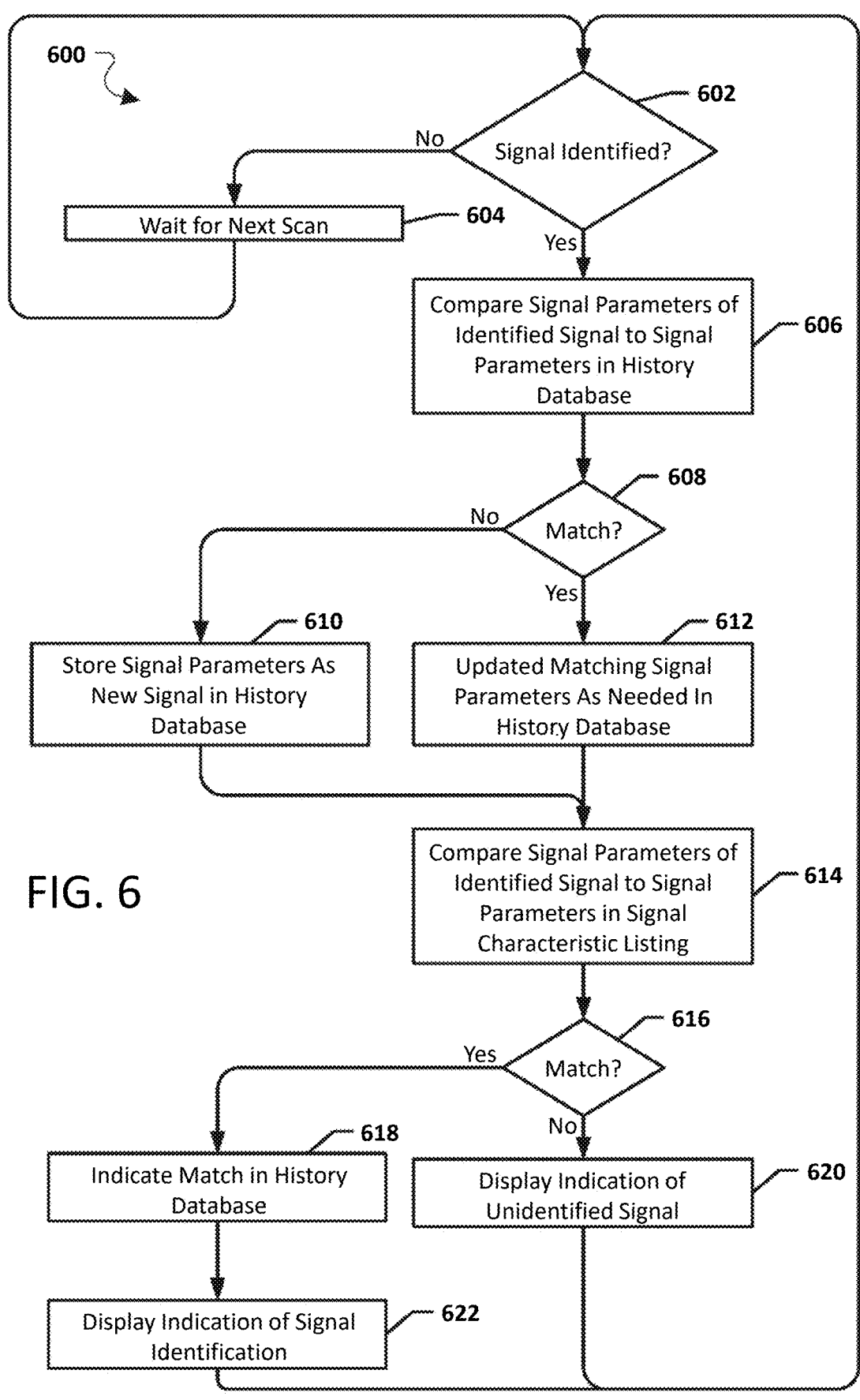
FIG. 6 is a process flow diagram illustrating an embodiment method for displaying signal identifications.

FIG. 6 illustrates a process flow for an embodiment method 600 for displaying signal identifications. In an embodiment, the operations of method 600 may be performed by a processor 214 of a spectrum management device 202. In determination block 602 the processor 214 may determine whether a signal is identified. If a signal is not identified (i.e., determination block 602="No"), in block 604 the processor 214 may wait for the next scan. If a signal is identified (i.e., determination block 602="Yes"), in block 606 the processor 214 may compare the signal parameters of an identified signal to signal parameters in a history database 232. In determination block 608 the processor 214 may determine whether signal parameters of the identified signal match signal parameters in the history database 232. If there is no match (i.e., determination block 608="No"), in block 610 the processor 214 may store the signal parameters as a new signal in the history database 232. If there is a match (i.e., determination block 608="Yes"), in block 612 the processor 214 may update the matching signal parameters as needed in the history database 232.

In block 614 the processor 214 may compare the signal parameters of the identified signal to signal parameters in a signal characteristic listing 236. In an embodiment, the characteristic listing 236 may be a static database separate from the history database 232, and the characteristic listing 236 may correlate signal parameters with signal identifications. In determination block 616 the processor 214 may determine whether the signal parameters of the identified signal match any signal parameters in the signal characteristic listing 236. In an embodiment, the match in determination 616 may be a match based on a tolerance between the signal parameters of the identified signal and the parameters in the characteristic listing 236. If there is a match (i.e., determination block 616="Yes"), in block 618 the processor 214 may indicate a match in the history database 232 and in block 622 may display an indication of the signal identification on a display 242. As an example, the indication of the signal identification may be a display of the radio call sign of an identified FM radio station signal. If there is not a match (i.e., determination block 616="No"), in block 620 the processor 214 may display an indication that the signal is an unidentified signal. In this manner, the user may be notified a signal is present in the environment, but that the signal does not match to a signal in the characteristic listing.

Figure 7:
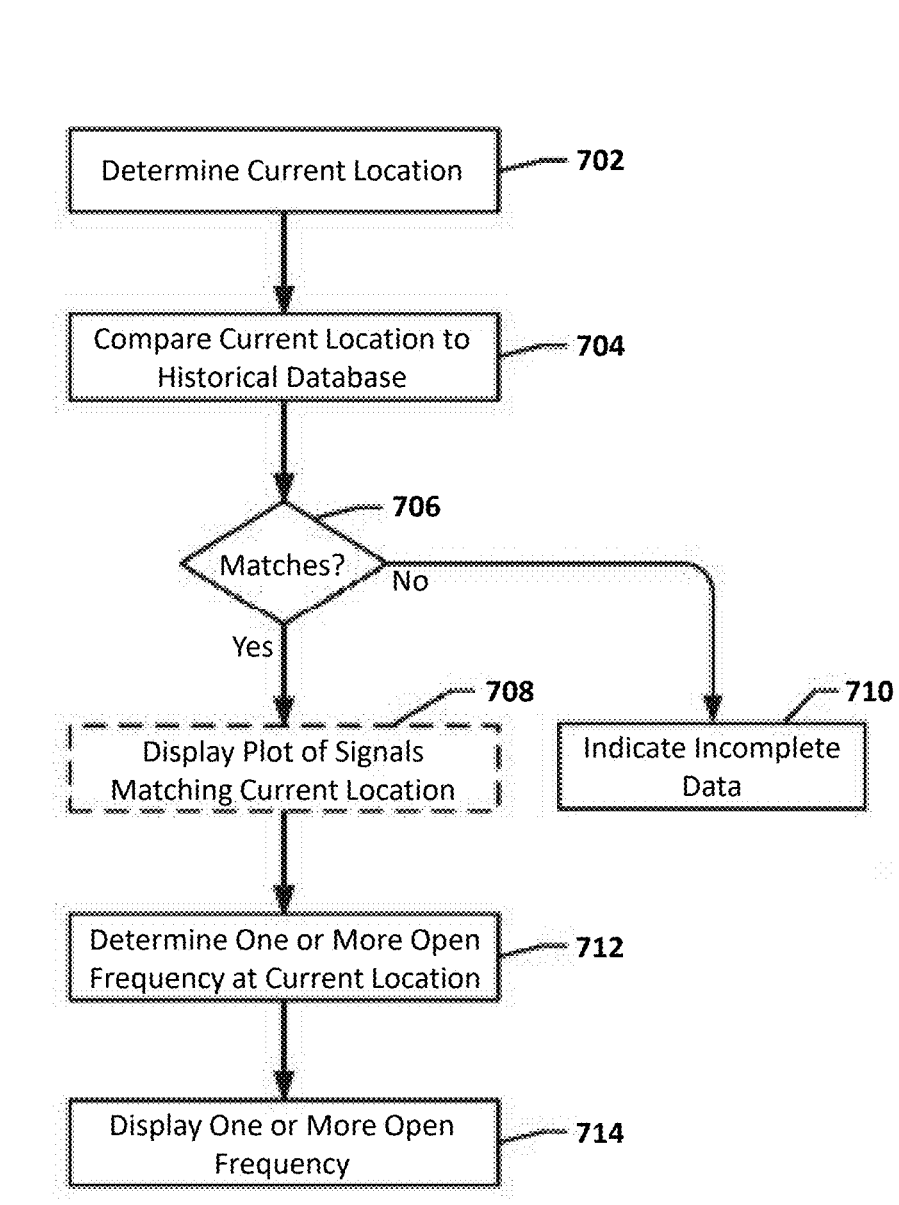
FIG. 7 is a process flow diagram illustrating an embodiment method for displaying one or more open frequency.

FIG. 7 illustrates a process flow of an embodiment method 700 for displaying one or more open frequency. In an embodiment, the operations of method 700 may be performed by the processor 214 of a spectrum management device 202. In block 702 the processor 214 may determine a current location of the spectrum management device 202. In an embodiment, the processor 214 may determine the current location of the spectrum management device 202 based on location inputs received from a location receiver 212, such as GPS coordinates received from a GPS receiver 212. In block 704 the processor 214 may compare the current location to the stored location value in the historical database 232. As discussed above, the historical or history database 232 may be a database storing information about signals previously actually identified by the spectrum management device 202. In determination block 706 the processor 214 may determine whether there are any matches between the location information in the historical database 232 and the current location. If there are no matches (i.e., determination block 706="No"), in block 710 the processor 214 may indicate incomplete data is available. In other words the spectrum data for the current location has not previously been recorded.

If there are matches (i.e., determination block 706="Yes"), in optional block 708 the processor 214 may display a plot of one or more of the signals matching the current location. As an example, the processor 214 may compute the average frequency over frequency intervals across a given spectrum and may display a plot of the average frequency over each interval. In block 712 the processor 214 may determine one or more open frequencies at the current location. As an example, the processor 214 may determine one or more open frequencies by determining frequency ranges in which no signals fall or at which the average is below a threshold. In block 714 the processor 214 may display an indication of one or more open frequency on a display 242 of the spectrum management device 202.

Figure 8A:
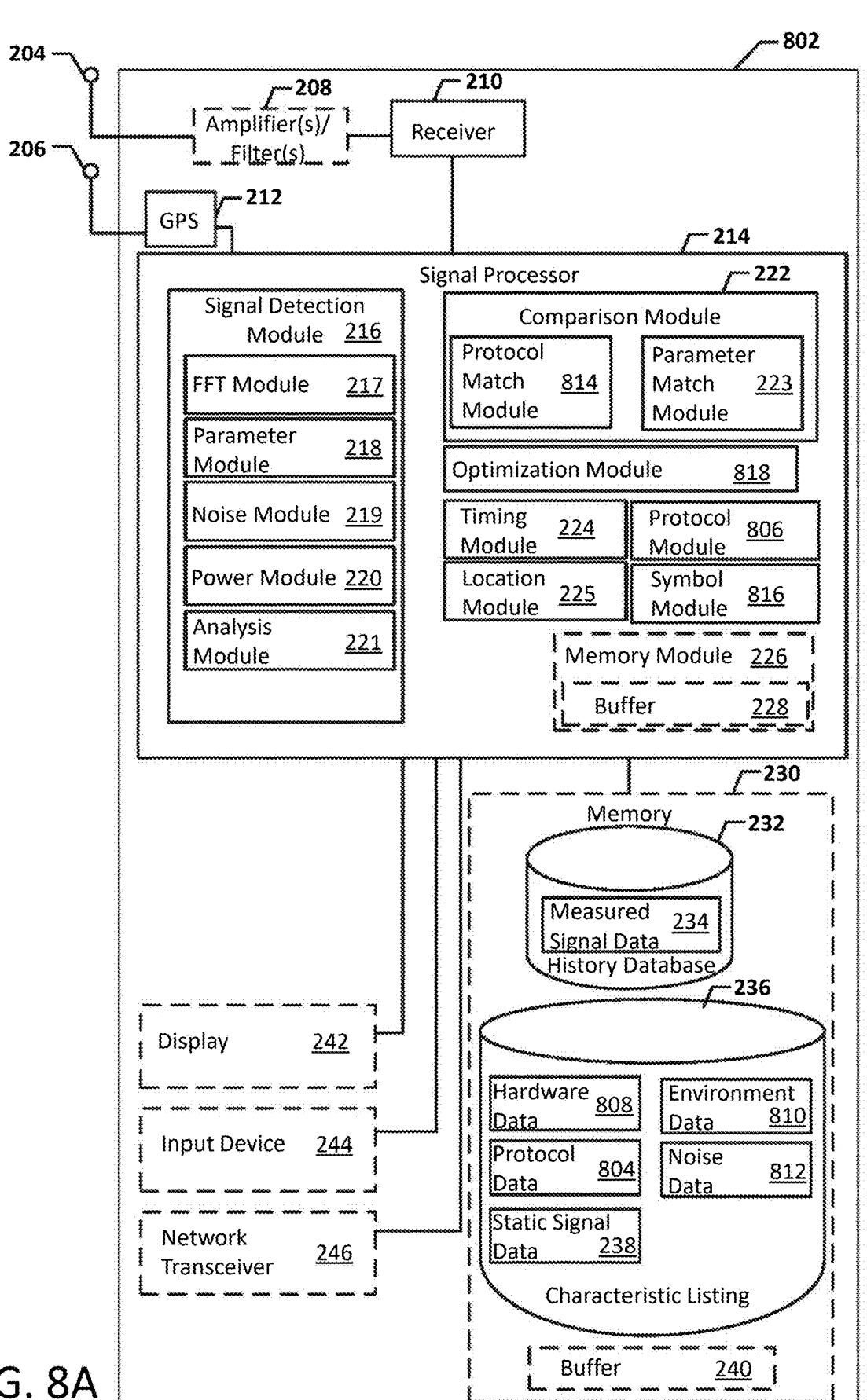
FIG. 8A is a block diagram of a spectrum management device according to another embodiment.

FIG. 8A is a block diagram of a spectrum management device 802 according to an embodiment. Spectrum management device 802 is similar to spectrum management device 202 described above with reference to FIG. 2A, except that spectrum management device 802 may include symbol module 816 and protocol module 806 enabling the spectrum management device 802 to identify the protocol and symbol information associated with an identified signal as well as protocol match module 814 to match protocol information. Additionally, the characteristic listing 236 of spectrum management device 802 may include protocol data 804, hardware data 808, environment data 810, and noise data 812 and an optimization module 818 may enable the signal processor 214 to provide signal optimization parameters.

The protocol module 806 may identify the communication protocol (e.g., LTE, CDMA, etc.) associated with a signal of interest. In an embodiment, the protocol module 806 may use data retrieved from the characteristic listing, such as protocol data 804 to help identify the communication protocol. The symbol detector module 816 may determine symbol timing information, such as a symbol rate for a signal of interest. The protocol module 806 and/or symbol module 816 may provide data to the comparison module 222. The comparison module 222 may include a protocol match module 814 which may attempt to match protocol information for a signal of interest to protocol data 804 in the characteristic listing to identify a signal of interest. Additionally, the protocol module 806 and/or symbol module 816 may store data in the memory module 226 and/or history database 232. In an embodiment, the protocol module 806 and/or symbol module 816 may use protocol data 804 and/or other data from the characteristic listing 236 to help identify protocols and/or symbol information in signals of interest.

The optimization module 818 may gather information from the characteristic listing, such as noise figure parameters, antenna hardware parameters, and environmental parameters correlated with an identified signal of interest to calculate a degradation value for the identified signal of interest. The optimization module 818 may further control the display 242 to output degradation data enabling a user of the spectrum management device 802 to optimize a signal of interest.

Figure 8B:
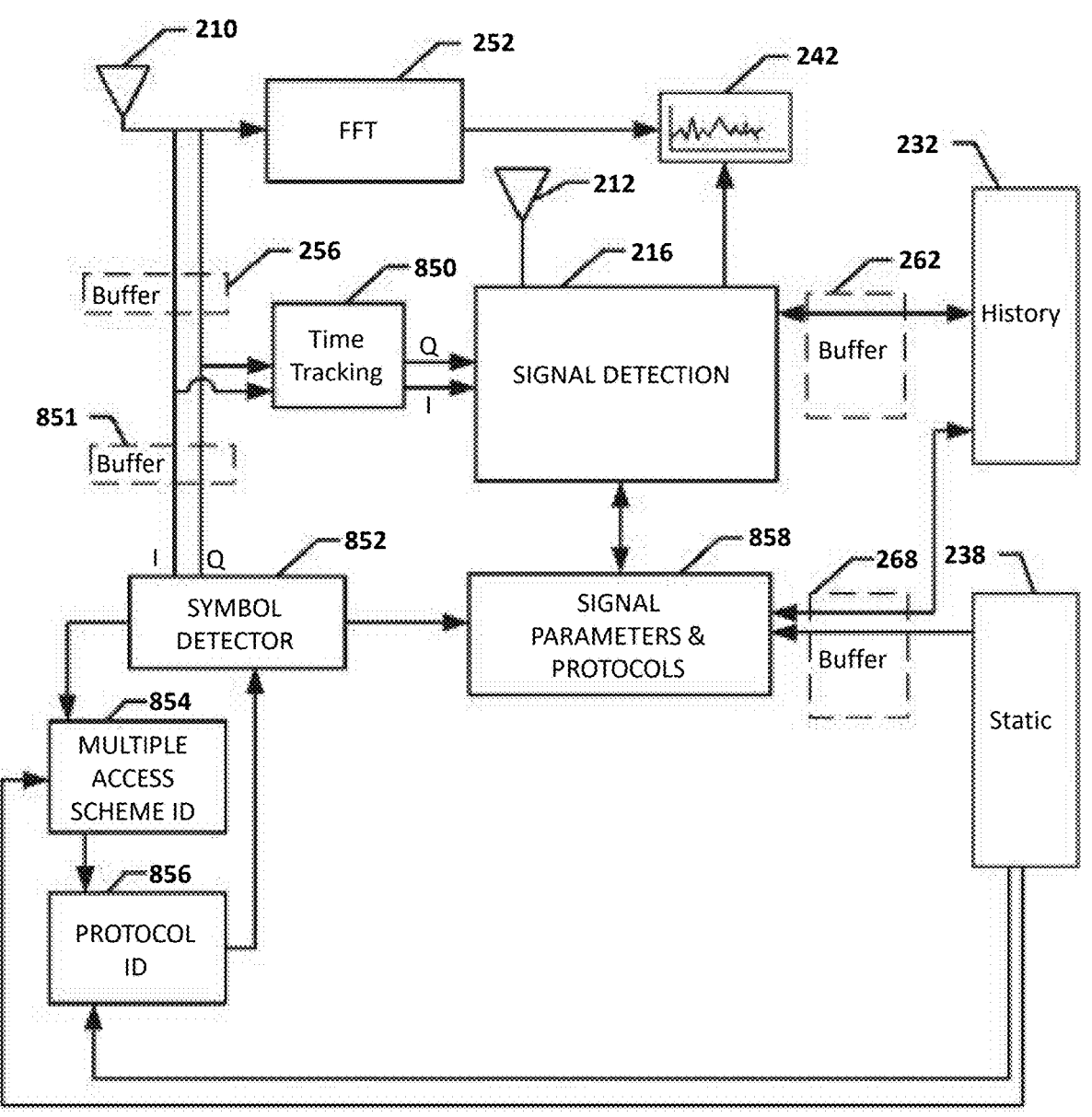
FIG. 8B is a schematic logic flow block diagram illustrating logical operations which may be performed by a spectrum management device according to another embodiment.

FIG. 8B is a schematic logic flow block diagram illustrating logical operations which may be performed by a spectrum management device according to an embodiment. Only those logical operations illustrated in FIG. 8B different from those described above with reference to FIG. 2B will be discussed. As illustrated in FIG. 8B, as received time tracking 850 may be applied to the I and Q data from the receiver 210. An additional buffer 851 may further store the I and Q data received and a symbol detector 852 may identify the symbols of a signal of interest and determine the symbol rate. A multiple access scheme identifier module 854 may identify whether the signal is part of a multiple access scheme (e.g., CDMA), and a protocol identifier module 856 may attempt to identify the protocol the signal of interest is associated with. The multiple access scheme identifier module 854 and protocol identifier module 856 may retrieve data from the static database 238 to aid in the identification of the access scheme and/or protocol. The symbol detector module 852 may pass data to the signal parameters and protocols module 858 which may store protocol and symbol information in addition to signal parameter information for signals of interest.

Figure 9:
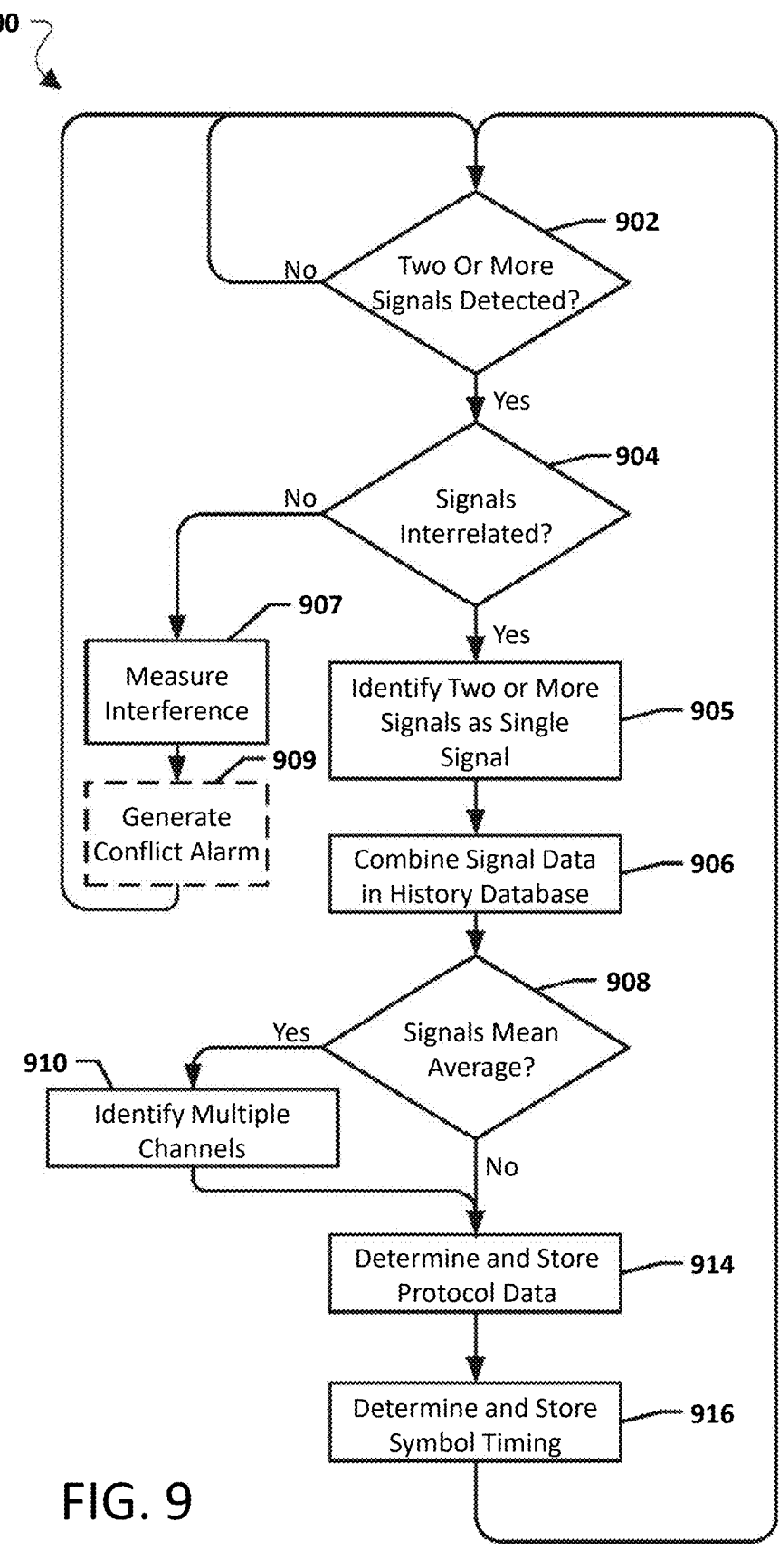
FIG. 9 is a process flow diagram illustrating an embodiment method for determining protocol data and symbol timing data.

FIG. 9 illustrates a process flow of an embodiment method 900 for determining protocol data and symbol timing data. In an embodiment, the operations of method 900 may be performed by the processor 214 of a spectrum management device 802. In determination block 902 the processor 214 may determine whether two or more signals are detected. If two or more signals are not detected (i.e., determination block 902="No"), in determination block 902 the processor 214 may continue to determine whether two or more signals are detected. If two or more signals are detected (i.e., determination block 902="Yes"), in determination block 904 the processor 214 may determine whether the two or more signals are interrelated. In an embodiment, a mean correlation value of the spectral decomposition of each signal may indicate the two or more signals are interrelated. As an example, a mean correlation of each signal may generate a value between 0.0 and 1, and the processor 214 may compare the mean correlation value to a threshold, such as a threshold of 0.75. In such an example, a mean correlation value at or above the threshold may indicate the signals are interrelated while a mean correlation value below the threshold may indicate the signals are not interrelated and may be different signals. In an embodiment, the mean correlation value may be generated by running a full energy bandwidth correlation of each signal, measuring the values of signal transition for each signal, and for each signal transition running a spectral correlation between signals to generate the mean correlation value. If the signals are not interrelated (i.e., determination block 904="No"), the signals may be two or more different signals, and in block 907 processor 214 may measure the interference between the two or more signals. In an optional embodiment, in optional block 909 the processor 214 may generate a conflict alarm indicating the two or more different signals interfere. In an embodiment, the conflict alarm may be sent to the history database and/or a display. In determination block 902 the processor 214 may continue to determine whether two or more signals are detected. If the two signal are interrelated (i.e., determination block 904="Yes"), in block 905 the processor 214 may identify the two or more signals as a single signal. In block 906 the processor 214 may combine signal data for the two or more signals into a signal single entry in the history database. In determination block 908 the processor 214 may determine whether the signals mean averages. If the mean averages (i.e., determination block 908="Yes"), the processor 214 may identify the signal as having multiple channels in block 910. If the mean does not average (i.e., determination block 908="No") or after identifying the signal as having multiple channels, in block 914 the processor 214 may determine and store protocol data for the signal. In block 916 the processor 214 may determine and store symbol timing data for the signal, and the method 900 may return to block 902.

Figure 10:
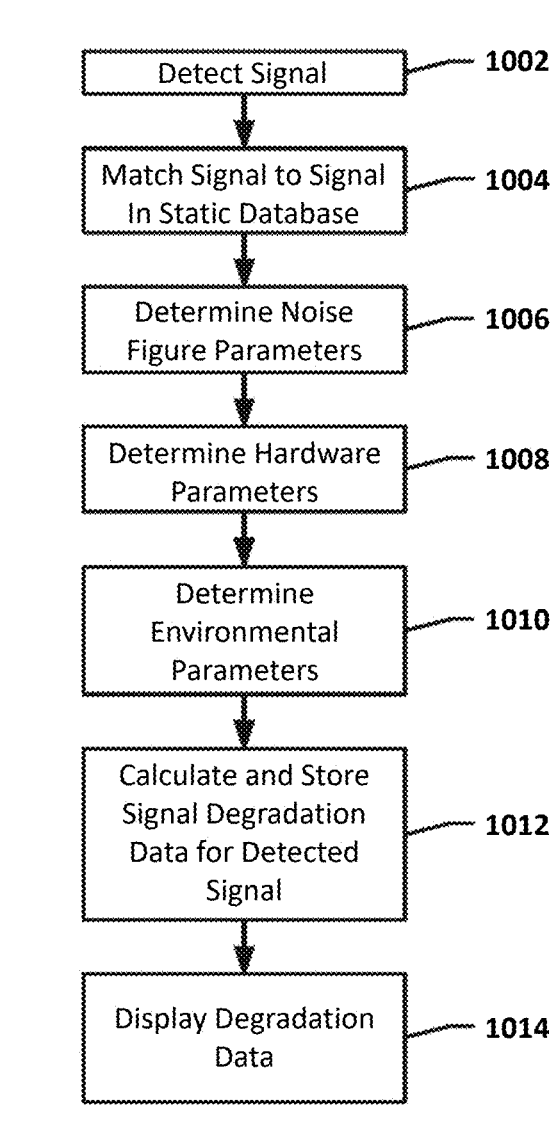
FIG. 10 is a process flow diagram illustrating an embodiment method for calculating signal degradation data.

FIG. 10 illustrates a process flow of an embodiment method 1000 for calculating signal degradation data. In an embodiment, the operations of method 1000 may be performed by the processor 214 of a spectrum management device 202. In block 1002 the processor may detect a signal. In block 1004 the processor 214 may match the signal to a signal in a static database. In block 1006 the processor 214 may determine noise figure parameters based on data in the static database 236 associated with the signal. As an example, the processor 214 may determine the noise figure of the signal based on parameters of a transmitter outputting the signal according to the static database 236. In block 1008 the processor 214 may determine hardware parameters associated with the signal in the static database 236. As an example, the processor 214 may determine hardware parameters such as antenna position, power settings, antenna type, orientation, azimuth, location, gain, and equivalent isotropically radiated power (EIRP) for the transmitter associated with the signal from the static database 236. In block 1010 processor 214 may determine environment parameters associated with the signal in the static database 236. As an example, the processor 214 may determine environment parameters such as rain, fog, and/or haze based on a delta correction factor table stored in the static database and a provided precipitation rate (e.g., mm/hr). In block 1012 the processor 214 may calculate and store signal degradation data for the detected signal based at least in part on the noise figure parameters, hardware parameters, and environmental parameters. As an example, based on the noise figure parameters, hardware parameters, and environmental parameters free space losses of the signal may be determined. In block 1014 the processor 214 may display the degradation data on a display 242 of the spectrum management device 202. In a further embodiment, the degradation data may be used with measured terrain data of geographic locations stored in the static database to perform pattern distortion, generate propagation and/or next neighbor interference models, determine interference variables, and perform best fit modeling to aide in signal and/or system optimization.

FIG. 11 illustrates a process flow of an embodiment method 1100 for displaying signal and protocol identification information. In an embodiment, the operations of method 1100 may be performed by a processor 214 of a spectrum management device 202. In block 1102 the processor 214 may compare the signal parameters and protocol data of an identified signal to signal parameters and protocol data in a history database 232. In an embodiment, a history database 232 may be a database storing signal parameters and protocol data for previously identified signals. In block 1104 the processor 214 may determine whether there is a match between the signal parameters and protocol data of the identified signal and the signal parameters and protocol data in the history database 232. If there is not a match (i.e., determination block 1104="No"), in block 1106 the processor 214 may store the signal parameters and protocol data as a new signal in the history database 232. If there is a match (i.e., determination block 1104="Yes"), in block 1108 the processor 214 may update the matching signal parameters and protocol data as needed in the history database 232.

In block 1110 the processor 214 may compare the signal parameters and protocol data of the identified signal to signal parameters and protocol data in the signal characteristic listing 236. In determination block 1112 the processor 214 may determine whether the signal parameters and protocol data of the identified signal match any signal parameters and protocol data in the signal characteristic listing 236. If there is a match (i.e., determination block 1112="Yes"), in block 1114 the processor 214 may indicate a match in the history database and in block 1118 may display an indication of the signal identification and protocol on a display. If there is not a match (i.e., determination block 1112="No"), in block 1116 the processor 214 may display an indication that the signal is an unidentified signal. In this manner, the user may be notified a signal is present in the environment, but that the signal does not match to a signal in the characteristic listing.

Figure 12A:
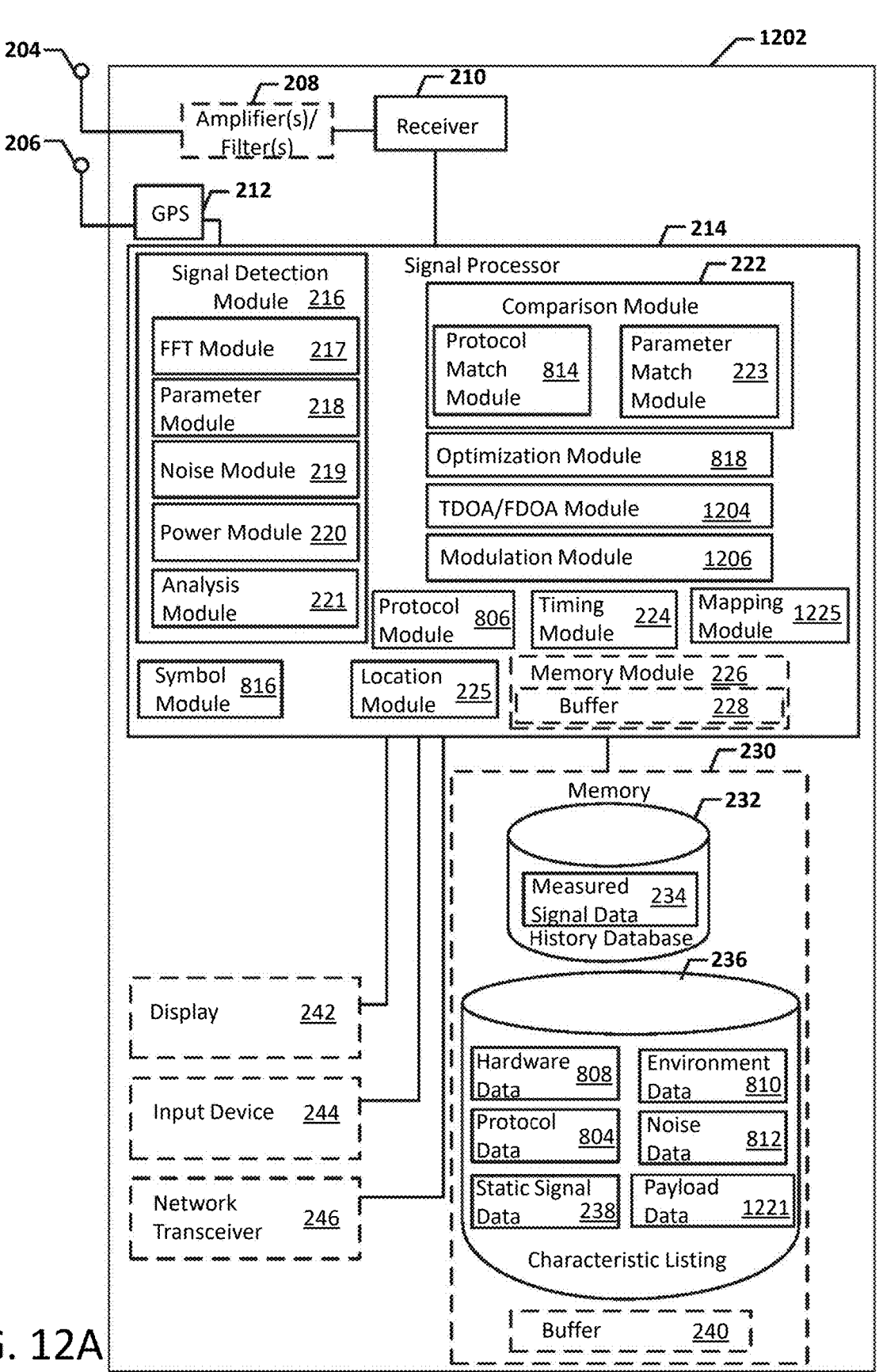
FIG. 12A is a block diagram of a spectrum management device according to a further embodiment.

FIG. 12A is a block diagram of a spectrum management device 1202 according to an embodiment. Spectrum management device 1202 is similar to spectrum management device 802 described above with reference to FIG. 8A, except that spectrum management device 1202 may include TDOA/FDOA module 1204 and modulation module 1206 enabling the spectrum management device 1202 to identify the modulation type employed by a signal of interest and calculate signal origins. The modulation module 1206 may enable the signal processor to determine the modulation applied to signal, such as frequency modulation (e.g., FSK, MSK, etc.) or phase modulation (e.g., BPSK, QPSK, QAM, etc.) as well as to demodulate the signal to identify payload data carried in the signal. The modulation module 1206 may use payload data 1221 from the characteristic listing to identify the data types carried in a signal. As examples, upon demodulating a portion of the signal the payload data may enable the processor 214 to determine whether voice data, video data, and/or text based data is present in the signal. The TDOA/FDOA module 1204 may enable the signal processor 214 to determine time difference of arrival for signals or interest and/or frequency difference of arrival for signals of interest. Using the TDOA/FDOA information estimates of the origin of a signal may be made and passed to a mapping module 1225 which may control the display 242 to output estimates of a position and/or direction of movement of a signal.

Figure 12B:
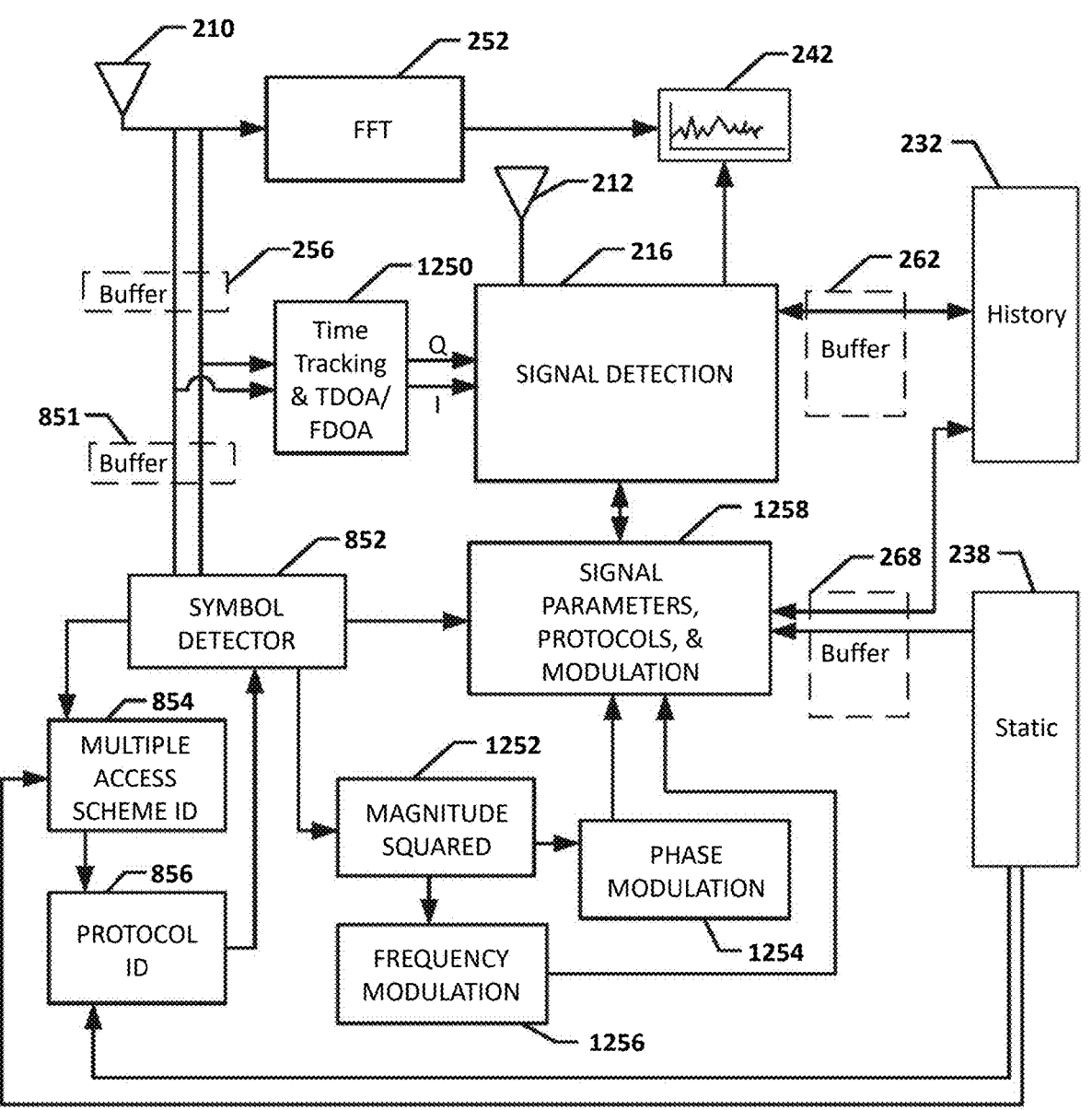
FIG. 12B is a schematic logic flow block diagram illustrating logical operations which may be performed by a spectrum management device according to a further embodiment.

FIG. 12B is a schematic logic flow block diagram illustrating logical operations which may be performed by a spectrum management device according to an embodiment. Only those logical operations illustrated in FIG. 12B different from those described above with reference to FIG. 8B will be discussed. A time tracking operation 1250 may be applied to the I and Q data from the receiver 210, by a time tracking module, such as a TDOA/FDOA module. A magnitude squared 1252 operation may be performed on data from the symbol detector 852 to identify whether frequency or phase modulation is present in the signal. Phase modulated signals may be identified by the phase modulation 1254 processes and frequency modulated signals may be identified by the frequency modulation 1256 processes. The modulation information may be passed to a signal parameters, protocols, and modulation module 1258.

FIG. 13 illustrates a process flow of an embodiment method 1300 for estimating a signal origin based on a frequency difference of arrival. In an embodiment, the operations of method 1300 may be performed by a processor 214 of a spectrum management device 1202. In block 1302 the processor 214 may compute frequency arrivals and phase arrivals for multiple instances of an identified signal. In block 1304 the processor 214 may determine frequency difference of arrival for the identified signal based on the computed frequency difference and phase difference. In block 1306 the processor may compare the determined frequency difference of arrival for the identified signal to data associated with known emitters in the characteristic listing to estimate an identified signal origin. In block 1308 the processor 214 may indicate the estimated identified signal origin on a display of the spectrum management device. As an example, the processor 214 may overlay the estimated origin on a map displayed by the spectrum management device.

Figure 14:
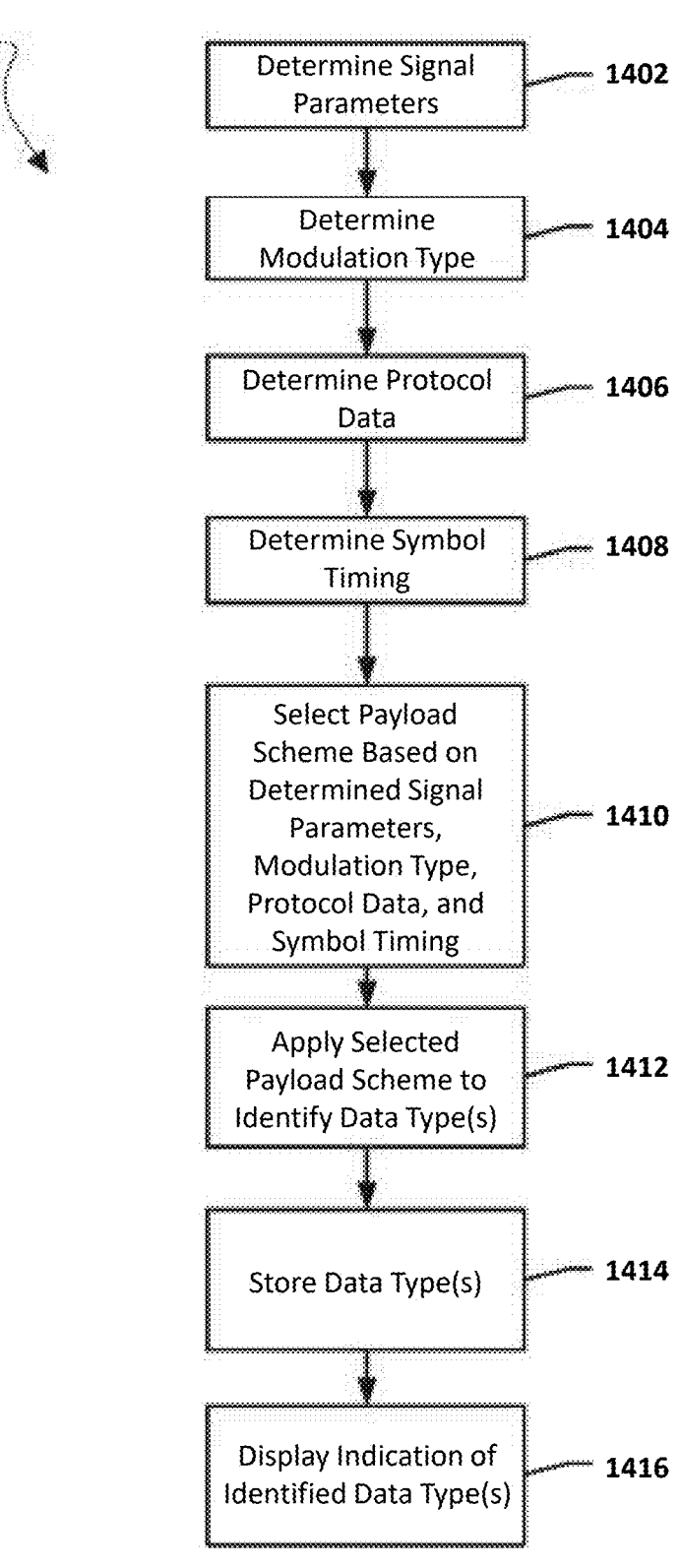
FIG. 14 is a process flow diagram illustrating an embodiment method for displaying an indication of an identified data type within a signal.

FIG. 14 illustrates a process flow of an embodiment method for displaying an indication of an identified data type within a signal. In an embodiment, the operations of method 1400 may be performed by a processor 214 of a spectrum management device 1202. In block 1402 the processor 214 may determine the signal parameters for an identified signal of interest. In block 1404 the processor 214 may determine the modulation type for the signal of interest. In block 1406 the processor 214 may determine the protocol data for the signal of interest. In block 1408 the processor 214 may determine the symbol timing for the signal of interest. In block 1410 the processor 214 may select a payload scheme based on the determined signal parameters, modulation type, protocol data, and symbol timing. As an example, the payload scheme may indicate how data is transported in a signal. For example, data in over the air television broadcasts may be transported differently than data in cellular communications and the signal parameters, modulation type, protocol data, and symbol timing may identify the applicable payload scheme to apply to the signal. In block 1412 the processor 214 may apply the selected payload scheme to identify the data type or types within the signal of interest. In this manner, the processor 214 may determine what type of data is being transported in the signal, such as voice data, video data, and/or text based data. In block 1414 the processor may store the data type or types. In block 1416 the processor 214 may display an indication of the identified data types.

Figure 15:
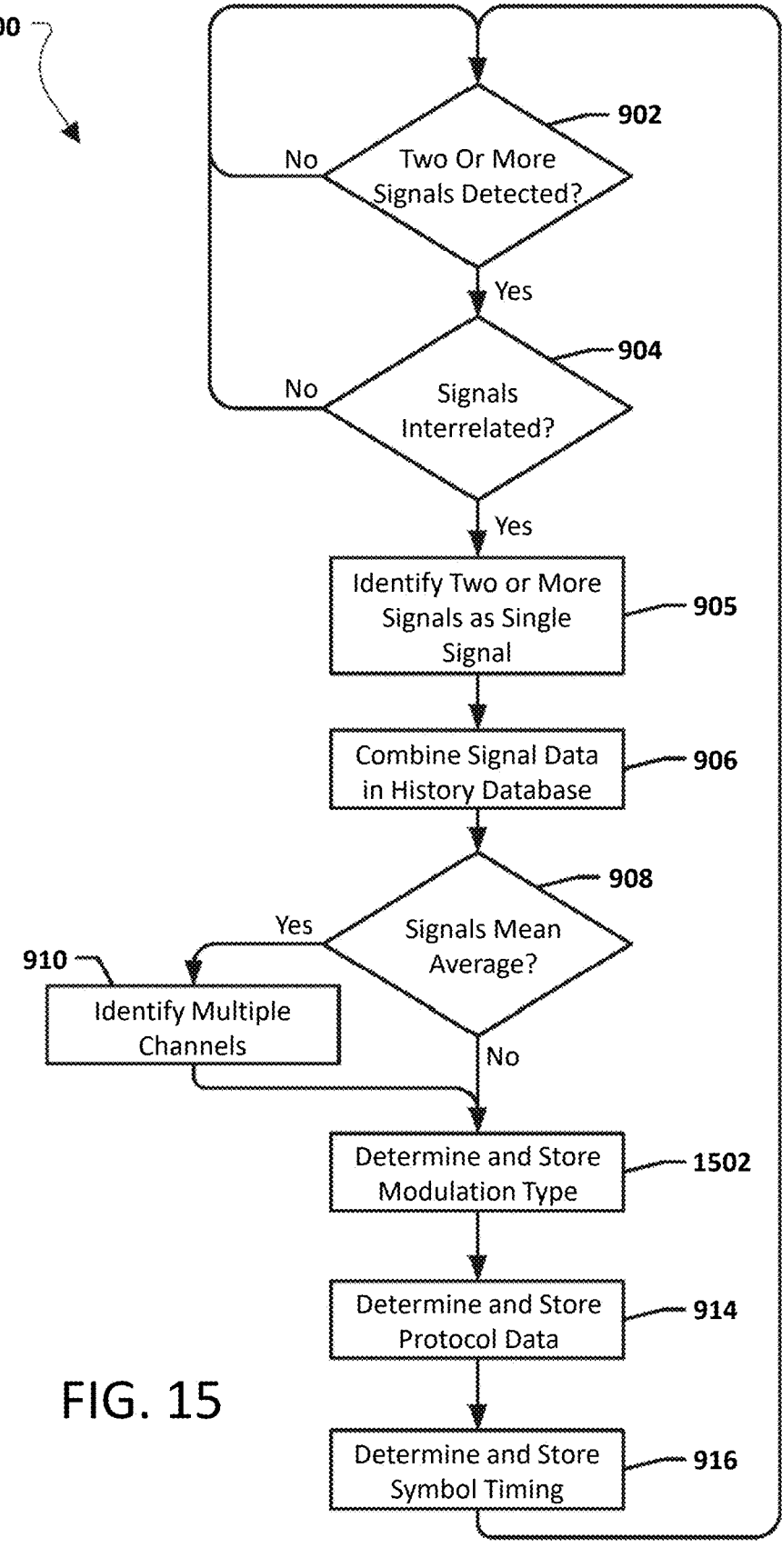
FIG. 15 is a process flow diagram illustrating an embodiment method for determining modulation type, protocol data, and symbol timing data.

FIG. 15 illustrates a process flow of an embodiment method 1500 for determining modulation type, protocol data, and symbol timing data. Method 1500 is similar to method 900 described above with reference to FIG. 9, except that modulation type may also be determined. In an embodiment, the operations of method 1500 may be performed by a processor 214 of a spectrum management device 1202. In blocks 902, 904, 905, 906, 908, and 910 the processor 214 may perform operations of like numbered blocks of method 900 described above with reference to FIG. 9. In block 1502 the processor may determine and store a modulation type. As an example, a modulation type may be an indication that the signal is frequency modulated (e.g., FSK, MSK, etc.) or phase modulated (e.g., BPSK, QPSK, QAM, etc.). As discussed above, in block 914 the processor may determine and store protocol data and in block 916 the processor may determine and store timing data.

In an embodiment, based on signal detection, a time tracking module, such as a TDOA/FDOA module 1204, may track the frequency repetition interval at which the signal is changing. The frequency repetition interval may also be tracked for a burst signal. In an embodiment, the spectrum management device may measure the signal environment and set anchors based on information stored in the historic or static database about known transmitter sources and locations. In an embodiment, the phase information about a signal be extracted using a spectral decomposition correlation equation to measure the angle of arrival ("AOA") of the signal. In an embodiment, the processor of the spectrum management device may determine the received power as the Received Signal Strength ("RSS") and based on the AOA and RSS may measure the frequency difference of arrival. In an embodiment, the frequency shift of the received signal may be measured and aggregated over time. In an embodiment, after an initial sample of a signal, known transmitted signals may be measured and compared to the RSS to determine frequency shift error. In an embodiment, the processor of the spectrum management device may compute a cross ambiguity function of aggregated changes in arrival time and frequency of arrival. In an additional embodiment, the processor of the spectrum management device may retrieve FFT data for a measured signal and aggregate the data to determine changes in time of arrival and frequency of arrival. In an embodiment, the signal components of change in frequency of arrival may be averaged through a Kalman filter with a weighted tap filter from 2 to 256 weights to remove measurement error such as noise, multipath interference, etc. In an embodiment, frequency difference of arrival techniques may be applied when either the emitter of the signal or the spectrum management device are moving or when then emitter of the signal and the spectrum management device are both stationary. When the emitter of the signal and the spectrum management device are both stationary the determination of the position of the emitter may be made when at least four known other known signal emitters positions are known and signal characteristics may be available. In an embodiment, a user may provide the four other known emitters and/or may use already in place known emitters, and may use the frequency, bandwidth, power, and distance values of the known emitters and their respective signals. In an embodiment, where the emitter of the signal or spectrum management device may be moving, frequency deference of arrival techniques may be performed using two known emitters.

Figure 16:
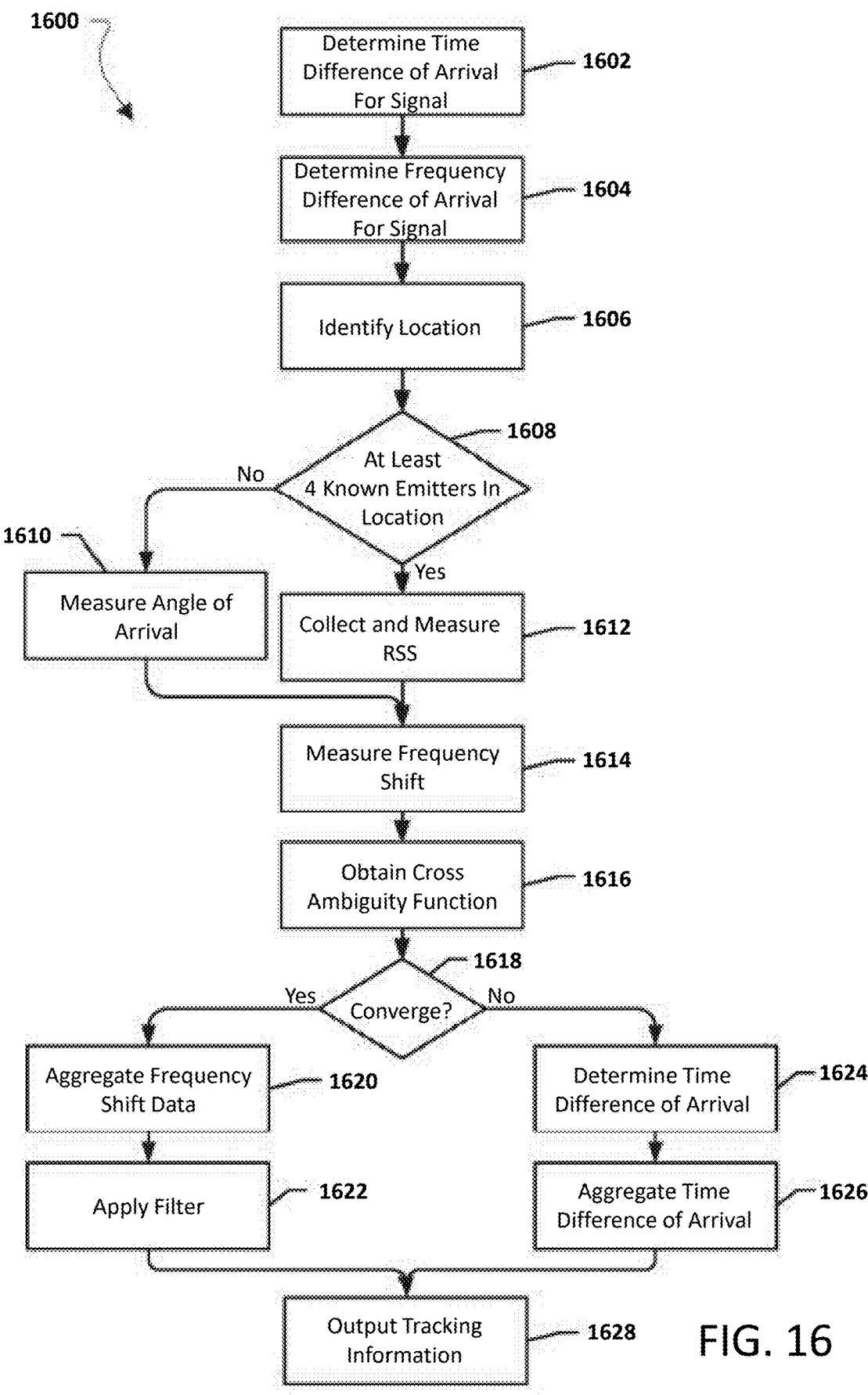
FIG. 16 is a process flow diagram illustrating an embodiment method for tracking a signal origin.

FIG. 16 illustrates an embodiment method for tracking a signal origin. In an embodiment, the operations of method 1600 may be performed by a processor 214 of a spectrum management device 1202. In block 1602 the processor 214 may determine a time difference of arrival for a signal of interest. In block 1604 the processor 214 may determine a frequency difference of arrival for the signal interest. As an example, the processor 214 may take the inverse of the time difference of arrival to determine the frequency difference of arrival of the signal of interest. In block 1606 the processor 214 may identify the location. As an example, the processor 214 may determine the location based on coordinates provided from a GPS receiver. In determination block 1608 the processor 214 may determine whether there are at least four known emitters present in the identified location. As an example, the processor 214 may compare the geographic coordinates for the identified location to a static database and/or historical database to determine whether at least four known signals are within an area associated with the geographic coordinates. If at least four known emitters are present (i.e., determination block 1608="Yes"), in block 1612 the processor 214 may collect and measure the RSS of the known emitters and the signal of interest. As an example, the processor 214 may use the frequency, bandwidth, power, and distance values of the known emitters and their respective signals and the signal of interest. If less than four known emitters are present (i.e., determination block 1608="No"), in block 1610 the processor 214 may measure the angle of arrival for the signal of interest and the known emitter. Using the RSS or angle or arrival, in block 1614 the processor 214 may measure the frequency shift and in block 1616 the processor 214 may obtain the cross ambiguity function. In determination block 1618 the processor 214 may determine whether the cross ambiguity function converges to a solution. If the cross ambiguity function does converge to a solution (i.e., determination block 1618="Yes"), in block 1620 the processor 214 may aggregate the frequency shift data. In block 1622 the processor 214 may apply one or more filter to the aggregated data, such as a Kalman filter. Additionally, the processor 214 may apply equations, such as weighted least squares equations and maximum likelihood equations, and additional filters, such as a non-line-of-sight ("NLOS") filters to the aggregated data. In an embodiment, the cross ambiguity function may resolve the position of the emitter of the signal of interest to within 3 meters. If the cross ambiguity function does not converge to a solution (i.e., determination block 1618="No"), in block 1624 the processor 214 may determine the time difference of arrival for the signal and in block 1626 the processor 214 may aggregate the time shift data. Additionally, the processor may filter the data to reduce interference. Whether based on frequency difference of arrival or time difference of arrival, the aggregated and filtered data may indicate a position of the emitter of the signal of interest, and in block 1628 the processor 214 may output the tracking information for the position of the emitter of the signal of interest to a display of the spectrum management device and/or the historical database. In an additional embodiment, location of emitters, time and duration of transmission at a location may be stored in the history database such that historical information may be used to perform and predict movement of signal transmission. In a further embodiment, the environmental factors may be considered to further reduce the measured error and generate a more accurate measurement of the location of the emitter of the signal of interest.

The processor 214 of spectrum management devices 202, 802 and 1202 may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory 226 or 230 before they are accessed and loaded into the processor 214. The processor 214 may include internal memory sufficient to store the application software instructions. In many devices the internal memory may be a volatile or nonvolatile memory, such as flash memory, or a mixture of both. For the purposes of this description, a general reference to memory refers to memory accessible by the processor 214 including internal memory or removable memory plugged into the device and memory within the processor 214 itself.

Identifying Devices in White Space.

The present invention provides for systems, methods, and apparatus solutions for device sensing in white space, which improves upon the prior art by identifying sources of signal emission by automatically detecting signals and creating unique signal profiles. Device sensing has an important function and applications in military and other intelligence sectors, where identifying the emitter device is crucial for monitoring and surveillance, including specific emitter identification (SEI).

At least two key functions are provided by the present invention: signal isolation and device sensing. Signal Isolation according to the present invention is a process whereby a signal is detected, isolated through filtering and amplification, amongst other methods, and key characteristics extracted. Device Sensing according to the present invention is a process whereby the detected signals are matched to a device through comparison to device signal profiles and may include applying a confidence level and/or rating to the signal-profile matching. Further, device sensing covers technologies that permit storage of profile comparisons such that future matching can be done with increased efficiency and/or accuracy. The present invention systems, methods, and apparatus are constructed and configured functionally to identify any signal emitting device, including by way of example and not limitation, a radio, a cell phone, etc.

Regarding signal isolation, the following functions are included in the present invention: amplifying, filtering, detecting signals through energy detection, waveform-based, spectral correlation-based, radio identification-based, or matched filter method, identifying interference, identifying environmental baseline(s), and/or identify signal characteristics.

Regarding device sensing, the following functions are included in the present invention: using signal profiling and/or comparison with known database(s) and previously recorded profile(s), identifying the expected device or emitter, stating the level of confidence for the identification, and/or storing profiling and sensing information for improved algorithms and matching. In preferred embodiments of the present invention, the identification of the at least one signal emitting device is accurate to a predetermined degree of confidence between about 80 and about 95 percent, and more preferably between about 80 and about 100 percent. The confidence level or degree of confidence is based upon the amount of matching measured data compared with historical data and/or reference data for predetermined frequency and other characteristics.

The present invention provides for wireless signal-emitting device sensing in the white space based upon a measured signal, and considers the basis of license(s) provided in at least one reference database, preferably the federal communication commission (FCC) and/or other defined database including license listings. The methods include the steps of providing a device for measuring characteristics of signals from signal emitting devices in a spectrum associated with wireless communications, the characteristics of the measured data from the signal emitting devices including frequency, power, bandwidth, duration, modulation, and combinations thereof; making an assessment or categorization on analog and/or digital signal(s); determining the best fit based on frequency if the measured power spectrum is designated in historical and/or reference data, including but not limited to the FCC or other database(s) for select frequency ranges; determining analog or digital, based on power and sideband combined with frequency allocation; determining a TDM/FDM/CDM signal, based on duration and bandwidth; determining best modulation fit for the desired signal, if the bandwidth and duration match the signal database(s); adding modulation identification to the database; listing possible modulations with best percentage fit, based on the power, bandwidth, frequency, duration, database allocation, and combinations thereof; and identifying at least one signal emitting device from the composite results of the foregoing steps. Additionally, the present invention provides that the phase measurement of the signal is calculated between the difference of the end frequency of the bandwidth and the peak center frequency and the start frequency of the bandwidth and the peak center frequency to get a better measurement of the sideband drop off rate of the signal to help determine the modulation of the signal.

In embodiments of the present invention, an apparatus is provided for automatically identifying devices in a spectrum, the apparatus including a housing, at least one processor and memory, and sensors constructed and configured for sensing and measuring wireless communications signals from signal emitting devices in a spectrum associated with wireless communications; and wherein the apparatus is operable to automatically analyze the measured data to identify at least one signal emitting device in near real time from attempted detection and identification of the at least one signal emitting device. The characteristics of signals and measured data from the signal emitting devices include frequency, power, bandwidth, duration, modulation, and combinations thereof.

The present invention systems including at least one apparatus, wherein the at least one apparatus is operable for network-based communication with at least one server computer including a database, and/or with at least one other apparatus, but does not require a connection to the at least one server computer to be operable for identifying signal emitting devices; wherein each of the apparatus is operable for identifying signal emitting devices including: a housing, at least one processor and memory, and sensors constructed and configured for sensing and measuring wireless communications signals from signal emitting devices in a spectrum associated with wireless communications; and wherein the apparatus is operable to automatically analyze the measured data to identify at least one signal emitting device in near real time from attempted detection and identification of the at least one signal emitting device.

Identifying Open Space in a Wireless Communication Spectrum.

The present invention provides for systems, methods, and apparatus solutions for automatically identifying open space, including open space in the white space of a wireless communication spectrum. Importantly, the present invention identifies the open space as the space that is unused and/or seldomly used (and identifies the owner of the licenses for the seldomly used space, if applicable), including unlicensed spectrum, white space, guard bands, and combinations thereof. Method steps of the present invention include: automatically obtaining a listing or report of all frequencies in the frequency range; plotting a line and/or graph chart showing power and bandwidth activity; setting frequencies based on a frequency step and/or resolution so that only user-defined frequencies are plotted; generating files, such as by way of example and not limitation, .csv or .pdf files, showing average and/or aggregated values of power, bandwidth and frequency for each derived frequency step; and showing an activity report over time, over day vs. night, over frequency bands if more than one, in white space if requested, in Industrial, Scientific, and Medical (ISM) band or space if requested; and if frequency space is seldomly in that area, then identify and list frequencies and license holders.

Additional steps include: automatically scanning the frequency span, wherein a default scan includes a frequency span between about 54 MHz and about 804 MHz; an ISM scan between about 900 MHz and about 2.5 GHz; an ISM scan between about 5 GHz and about 5.8 GHz; and/or a frequency range based upon inputs provided by a user. Also, method steps include scanning for an allotted amount of time between a minimum of about 15 minutes up to about 30 days; preferably scanning for allotted times selected from the following: a minimum of about 15 minutes; about 30 minutes; about 1 hour increments; about 5 hour increments; about 10 hour increments; about 24 hours; about 1 day; and about up to 30 days; and combinations thereof. In preferred embodiments, if the apparatus is configured for automatically scanning for more than about 15 minutes, then the apparatus is preferably set for updating results, including updating graphs and/or reports for an approximately equal amount of time (e.g., every 15 minutes).

The systems, methods, and apparatus also provide for automatically calculating a percent activity associated with the identified open space on predetermined frequencies and/or ISM bands.

Signal Database.

Preferred embodiments of the present invention provide for sensed and/or measured data received by the at least one apparatus of the present invention, analyzed data, historical data, and/or reference data, change-in-state data, and any updates thereto, are storable on each of the at least one apparatus. In systems of the present invention, each apparatus further includes transmitters for sending the sensed and/or measured data received by the at least one apparatus of the present invention, analyzed data, historical data, and/or reference data, change-in-state data, and any updates thereto, are communicated via the network to the at least one remote server computer and its corresponding database(s). Preferably, the server(s) aggregate the data received from the multiplicity of apparatus or devices to produce a composite database for each of the types of data indicated. Thus, while each of the apparatus or devices is fully functional and self-contained within the housing for performing all method steps and operations without network-based communication connectivity with the remote server(s), when connected, as illustrated in FIG. 29, the distributed devices provide the composite database, which allows for additional analytics not possible for individual, isolated apparatus or device units (when not connected in network-based communication), which solves a longstanding, unmet need.

In particular, the aggregation of data from distributed, different apparatus or device units allow for comparison of sample sets of data to compare signal data or information for similar factors, including time(s), day(s), venues, geographic locations or regions, situations, activities, etc., as well as for comparing various signal characteristics with the factors, wherein the signal characteristics and their corresponding sensed and/or measured data, including raw data and change-in-state data, and/or analyzed data from the signal emitting devices include frequency, power, bandwidth, duration, modulation, and combinations thereof. Preferably, the comparisons are conducted in near real time. The aggregation of data may provide for information about the same or similar mode from apparatus to apparatus, scanning the same or different frequency ranges, with different factors and/or signal characteristics received and stored in the database(s), both on each apparatus or device unit, and when they are connected in network-based communication for transmission of the data to the at least one remote server.

The aggregation of data from a multiplicity of units also advantageously provides for continuous, 24 hours/7 days per week scanning, and allows the system to identify sections that exist as well as possibly omitted information or lost data, which may still be considered for comparisons, even if it is incomplete. From a time standpoint, there may not be a linearity with respect to when data is collected or received by the units; rather, the systems and methods of the present invention provide for automated matching of time, i.e., matching time frames and relative times, even where the environment, activities, and/or context may be different for different units. By way of example and not limitation, different units may sense and/or measure the same signal from the same signal emitting device in the spectrum, but interference, power, environmental factors, and other factors may present identification issues that preclude one of the at last one apparatus or device units from determining the identity of the signal emitting device with the same degree of certainty or confidence. The variation in this data from a multiplicity of units measuring the same signals provides for aggregation and comparison at the remote server using the distributed databases from each unit to generate a variance report in near real time. Thus, the database(s) provide repository database in memory on the apparatus or device units, and/or data from a multiplicity of units are aggregated on at least one remote server to provide an active network with distributed nodes over a region that produce an active or dynamic database of signals, identified devices, identified open space, and combinations thereof, and the nodes may report to or transmit data via network-based communication to a central hub or server. This provides for automatically comparing signal emitting devices or their profiles and corresponding sensed or measured data, situations, activities, geographies, times, days, and/or environments, which provides unique composite and comparison data that may be continuously updated.

Figure 29:
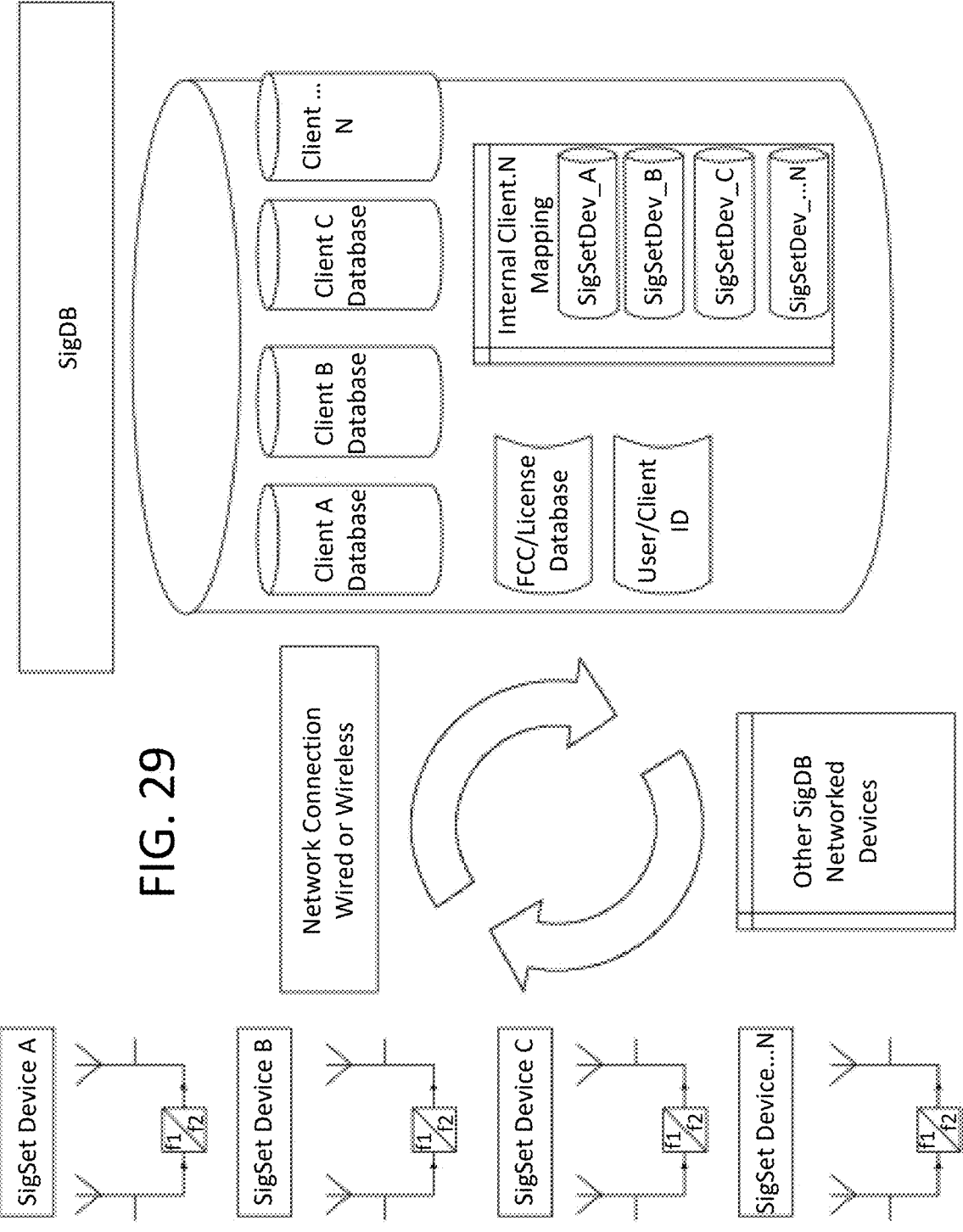
FIG. 29 is a schematic diagram of an embodiment of the present invention.

FIG. 29 shows a schematic diagram illustrating aspects of the systems, methods and apparatus according to the present invention. Each node includes an apparatus or device unit, referenced in the FIG. 29 as "SigSet Device A", "SigSet Device B", "SigSet Device C", and through "SigSet Device N" that are constructed and configured for selective exchange, both transmitting and receiving information over a network connection, either wired or wireless communications, with the master SigDB or database at a remote server location from the units.

Furthermore, the database aggregating nodes of the apparatus or device units provide a baseline compared with new data, which provide for near real time analysis and results within each of the at least one apparatus or device unit, which calculates and generates results such as signal emitting device identification, identification of open space, signal optimization, and combinations thereof, based upon the particular settings of each of the at least one apparatus or device unit. The settings include frequency ranges, location and distance from other units, difference in propagation from one unit to another unit, and combinations thereof, which factor into the final results.

The present invention systems, methods, and apparatus embodiments provide for leveraging the use of deltas or differentials from the baseline, as well as actual data, to provide onsite sensing, measurement, and analysis for a given environment and spectrum, for each of the at least one apparatus or device unit. Because the present invention provides the at least one processor on each unit to compare signals and signal characteristic differences using compressed data for deltas to provide near real time results, the database storage may further be optimized by storing compressed data and/or deltas, and then decompressing and/or reconstructing the actual signals using the deltas and the baseline. Analytics are also provided using this approach. So then the signals database(s) provide for reduced data storage to the smallest sample set that still provides at least the baseline and the deltas to enable signal reconstruction and analysis to produce the results described according to the present invention.

Preferably, the modeling and virtualization analytics enabled by the databases on each of the at least one apparatus or device units independently of the remote server computer, and also provided on the remote server computer from aggregated data, provide for "gap filling" for omitted or absent data, and or for reconstruction from deltas. A multiplicity of deltas may provide for signal identification, interference identification, neighboring band identification, device identification, signal optimization, and combinations, all in near real time. Significantly, the deltas approach of the present invention which provide for minimization of data sets or sample data sets required for comparisons and/or analytics, i.e., the smallest range of time, frequency, etc. that captures all representative signals and/or deltas associated with the signals, environment conditions, noise, etc.

The signal database(s) may be represented with visual indications including diagrams, graphs, plots, tables, and combinations thereof, which may be presented directly by the apparatus or device unit to its corresponding display contained within the housing. Also, the signals database(s) provide each apparatus or device unit to receive a first sample data set in a first time period, and receive a second sample data set in a second time period, and receive a N sample data set in a corresponding N time period; to save or store each of the at least two distinct sample data sets; to automatically compare the at least two sample data sets to determine a change-in-state or "delta". Preferably, the database receives and stores at least the first of the at least two data sets and also stores the delta. The stored delta values provide for quick analytics and regeneration of the actual values of the sample sets from the delta values, which advantageously contributes to the near real time results of the present invention.

In preferred embodiments of the present invention, the at least one apparatus is continuously scanning the environment for signals, deltas from prior at least one sample data set, and combinations, which are categorized, classified, and stored in memory.

The systems, methods and apparatus embodiments of the present invention include hardware and software components and requirements to provide for each of the apparatus units to connect and communicate different data they sense, measure, analyze, and/or store on local database(s) in memory on each of the units with the remote server computer and database. Thus the master database or "SigDB" is operable to be applied and connect to the units, and may include hardware and software commercially available, for example SQL Server 2012, and to be applied to provide a user the criteria to upgrade/update their current sever network to the correct configuration that is required to operate and access the SigDB. Also, the SigDB is preferably designed, constructed and as a full hardware and software system configuration for the user, including load testing and network security and configuration. Other exemplary requirements include that the SigDB will include a database structure that can sustain a multiplicity of apparatus units' information; provide a method to update the FCC database and/or historical database according a set time (every month/quarter/week, etc.), and in accordance with changes to the FCC.gov databases that are integrated into the database; operable to receive and to download unit data from a remote location through a network connection; be operable to query apparatus unit data stored within the SigDB database server and to query apparatus unit data in 'present' time to a particular apparatus unit device for a given 'present' time not available in the current SigDB server database; update this information into its own database structure; to keep track of Device Identifications and the information each apparatus unit is collecting including its location; to query the apparatus units based on Device ID or location of device or apparatus unit; to connect to several devices and/or apparatus units on a distributed communications network; to partition data from each apparatus unit or device and differentiate the data from each based on its location and Device ID; to join queries from several devices if a user wants to know information acquired from several remote apparatus units at a given time; to provide ability for several users (currently up to 5 per apparatus unit or device) to query information from the SigDB database or apparatus unit or device; to grant access permissions to records for each user based on device ID, pertinent information or tables/location; to connect to a user GUI from a remote device such as a workstation or tablet PC from a Web App application; to retrieve data queries based on user information and/or jobs; to integrate database external database information from the apparatus units; and combinations thereof.

Also, in preferred embodiments, a GUI interface based on a Web Application software is provided; in one embodiment, the SigDB GUI is provided in any appropriate software, such as by way of example, in Visual Studio using .Net/Asp.Net technology or JavaScript. In any case, the SigDB GUI preferably operates across cross platform systems with correct browser and operating system (OS) configuration; provides the initial requirements of a History screen in each apparatus unit to access sever information or query a remote apparatus unit containing the desired user information; and, generates .csv and .pdf reports that are useful to the user. Automated Reports and Visualization of Analytics.

Various reports for describing and illustrating with visualization the data and analysis of the device, system and method results from spectrum management activities include at least reports on power usage, RF survey, and/or variance, as well as interference detection, intermodulation detection, uncorrelated licenses, and/or open space identification.

The systems, methods, and devices of the various embodiments enable spectrum management by identifying, classifying, and cataloging signals of interest based on radio frequency measurements. In an embodiment, signals and the parameters of the signals may be identified and indications of available frequencies may be presented to a user. In another embodiment, the protocols of signals may also be identified. In a further embodiment, the modulation of signals, devices or device types emitting signals, data types carried by the signals, and estimated signal origins may be identified.

Figure 17:
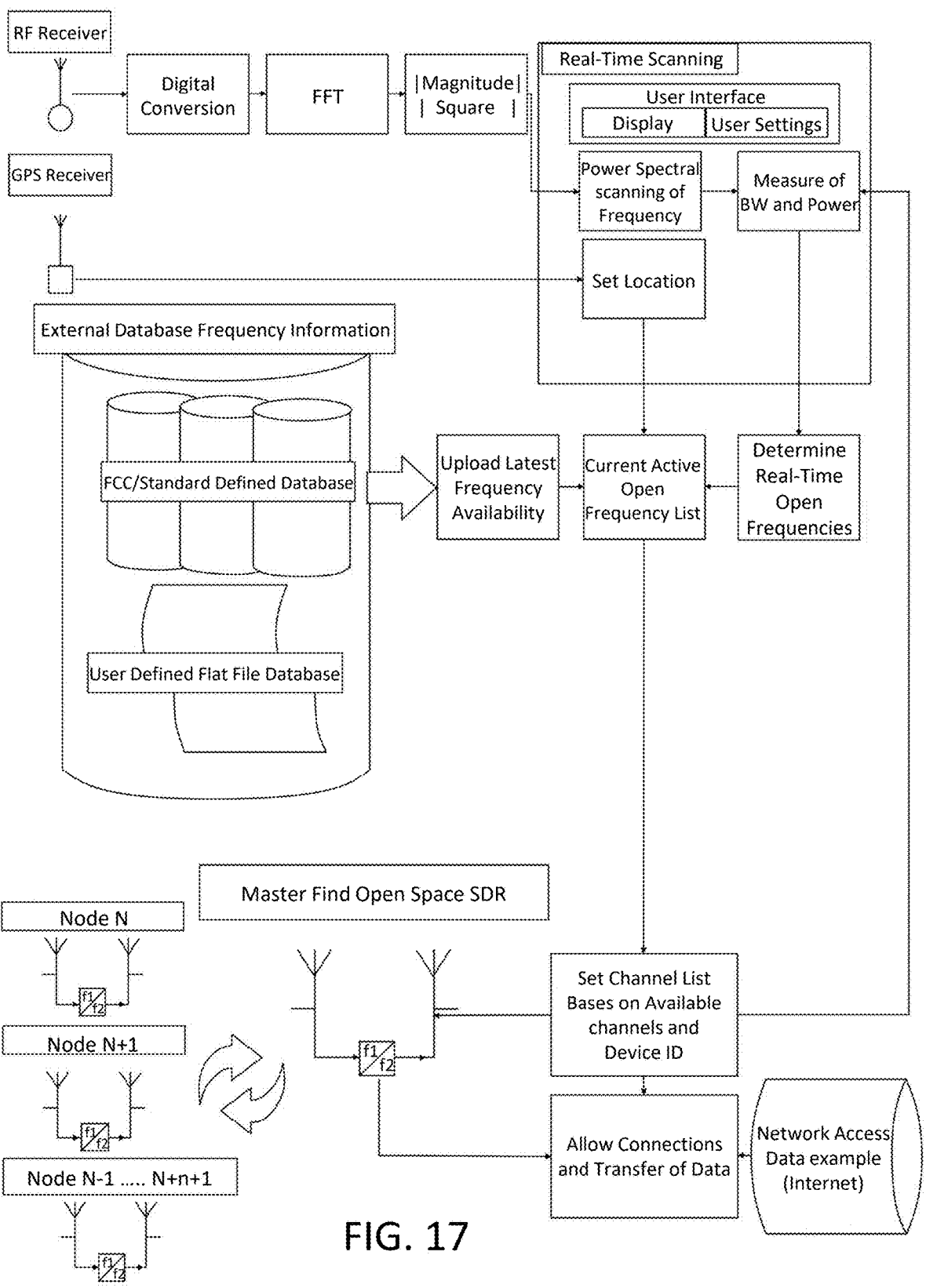
FIG. 17 is a schematic diagram illustrating an embodiment for scanning and finding open space.

Referring again to the drawings, FIG. 17 is a schematic diagram illustrating an embodiment for scanning and finding open space. A plurality of nodes are in wireless or wired communication with a software defined radio, which receives information concerning open channels following real-time scanning and access to external database frequency information.

Figure 18:
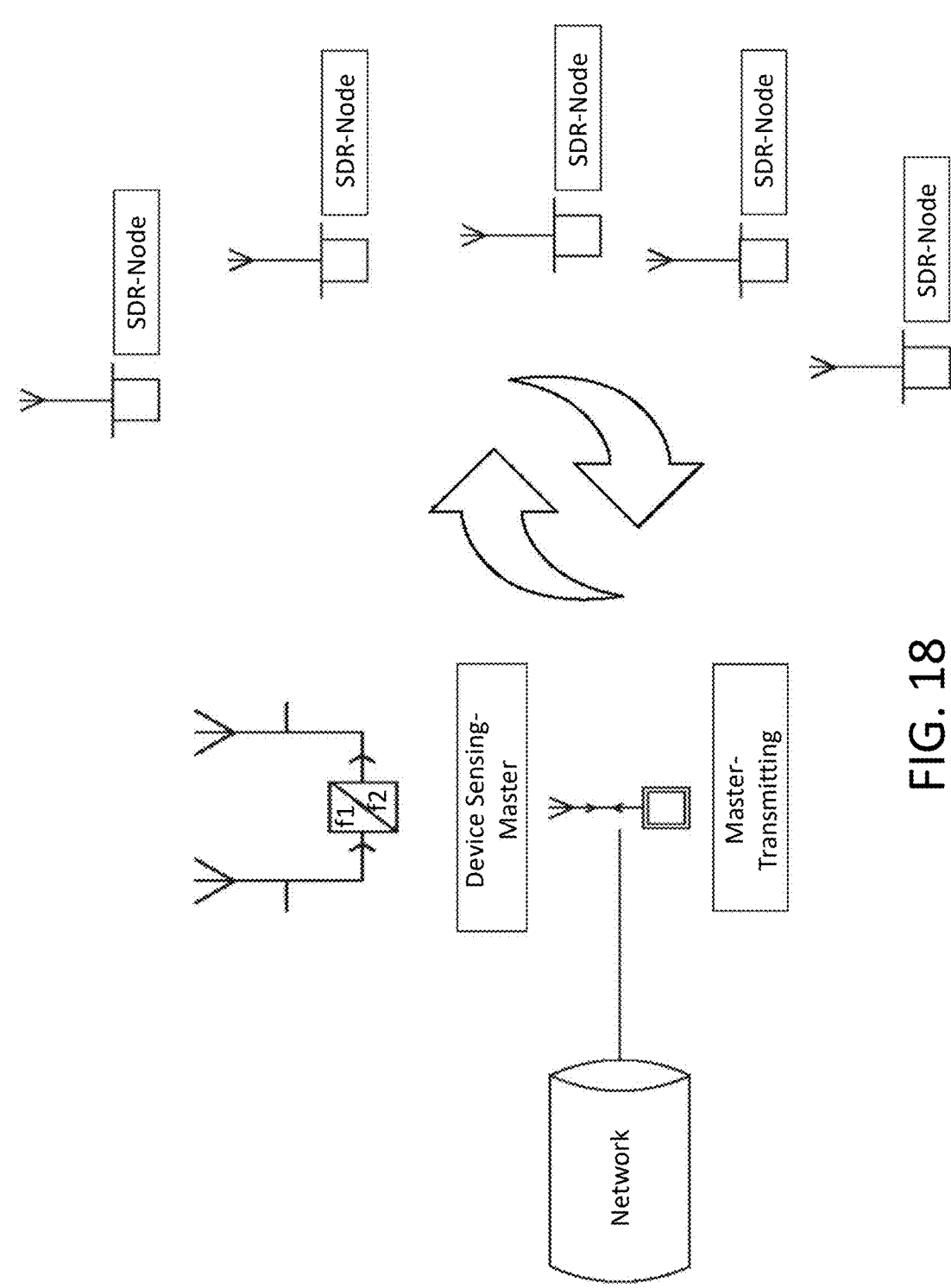
FIG. 18 is a diagram of an embodiment wherein software defined radio nodes are in communication with a master transmitter and device sensing master.

FIG. 18 is a diagram of an embodiment of the invention wherein software defined radio nodes are in wireless or wired communication with a master transmitter and device sensing master.

Figure 19:
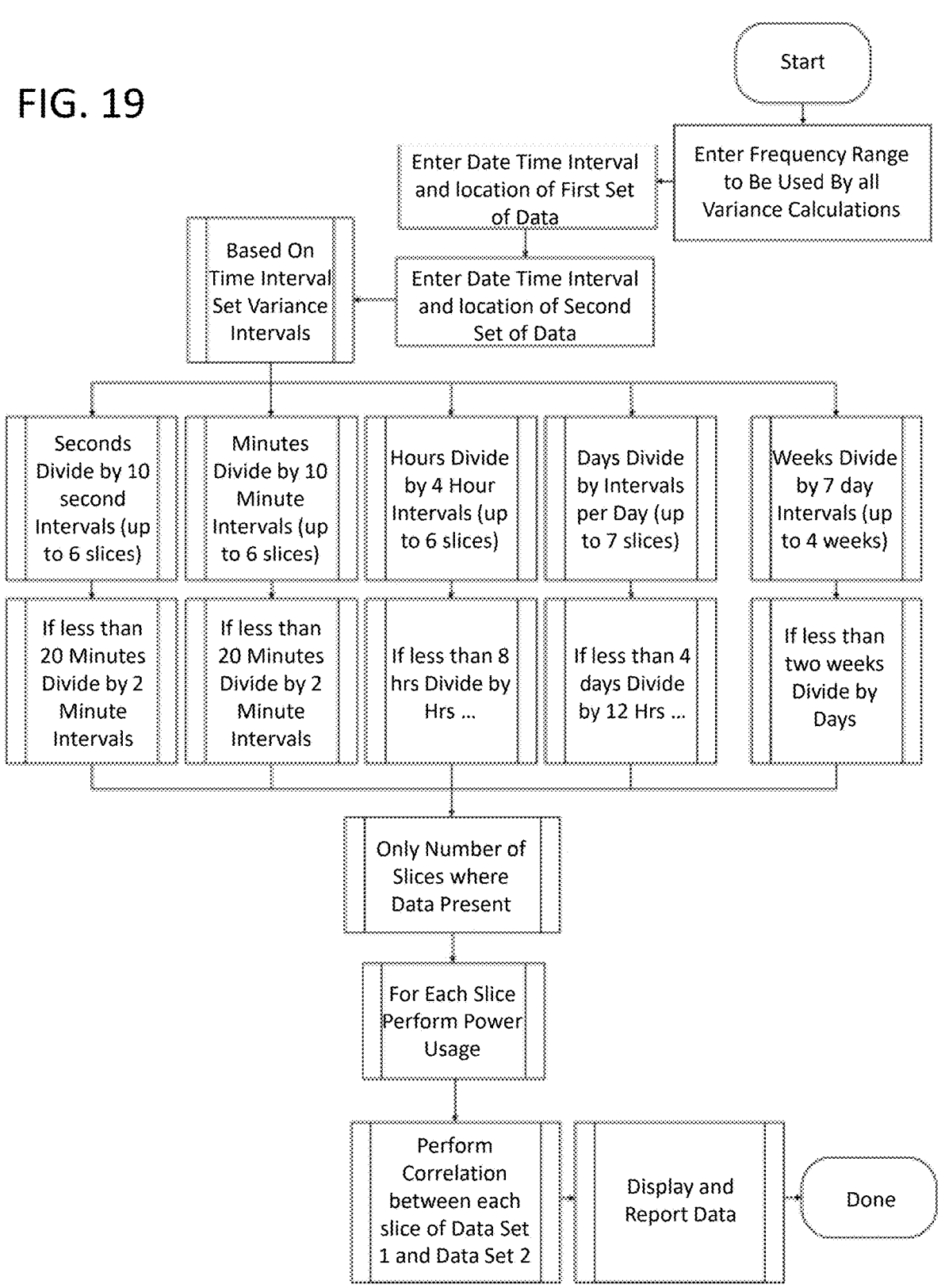
FIG. 19 is a process flow diagram of an embodiment method of temporally dividing up data into intervals for power usage analysis.

FIG. 19 is a process flow diagram of an embodiment method of temporally dividing up data into intervals for power usage analysis and comparison. The data intervals are initially set to seconds, minutes, hours, days and weeks, but can be adjusted to account for varying time periods (e.g., if an overall interval of data is only a week, the data interval divisions would not be weeks). In one embodiment, the interval slicing of data is used to produce power variance information and reports.

Figure 20:
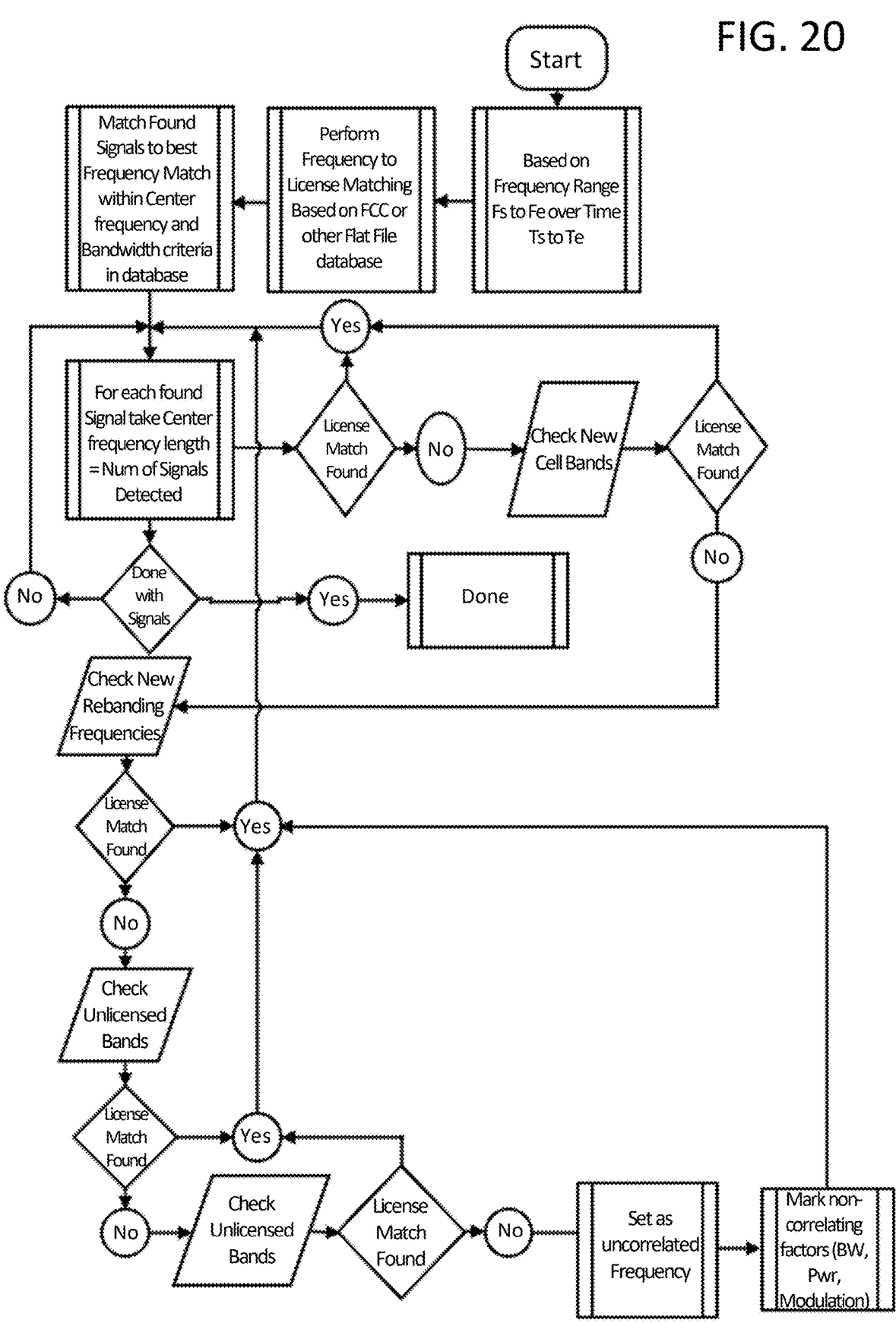
FIG. 20 is a flow diagram illustrating an embodiment wherein frequency to license matching occurs.

FIG. 20 is a flow diagram illustrating an embodiment wherein frequency to license matching occurs. In such an embodiment the center frequency and bandwidth criteria can be checked against a database to check for a license match. Both licensed and unlicensed bands can be checked against the frequencies, and, if necessary, non-correlating factors can be marked when a frequency is uncorrelated.

Figure 21:
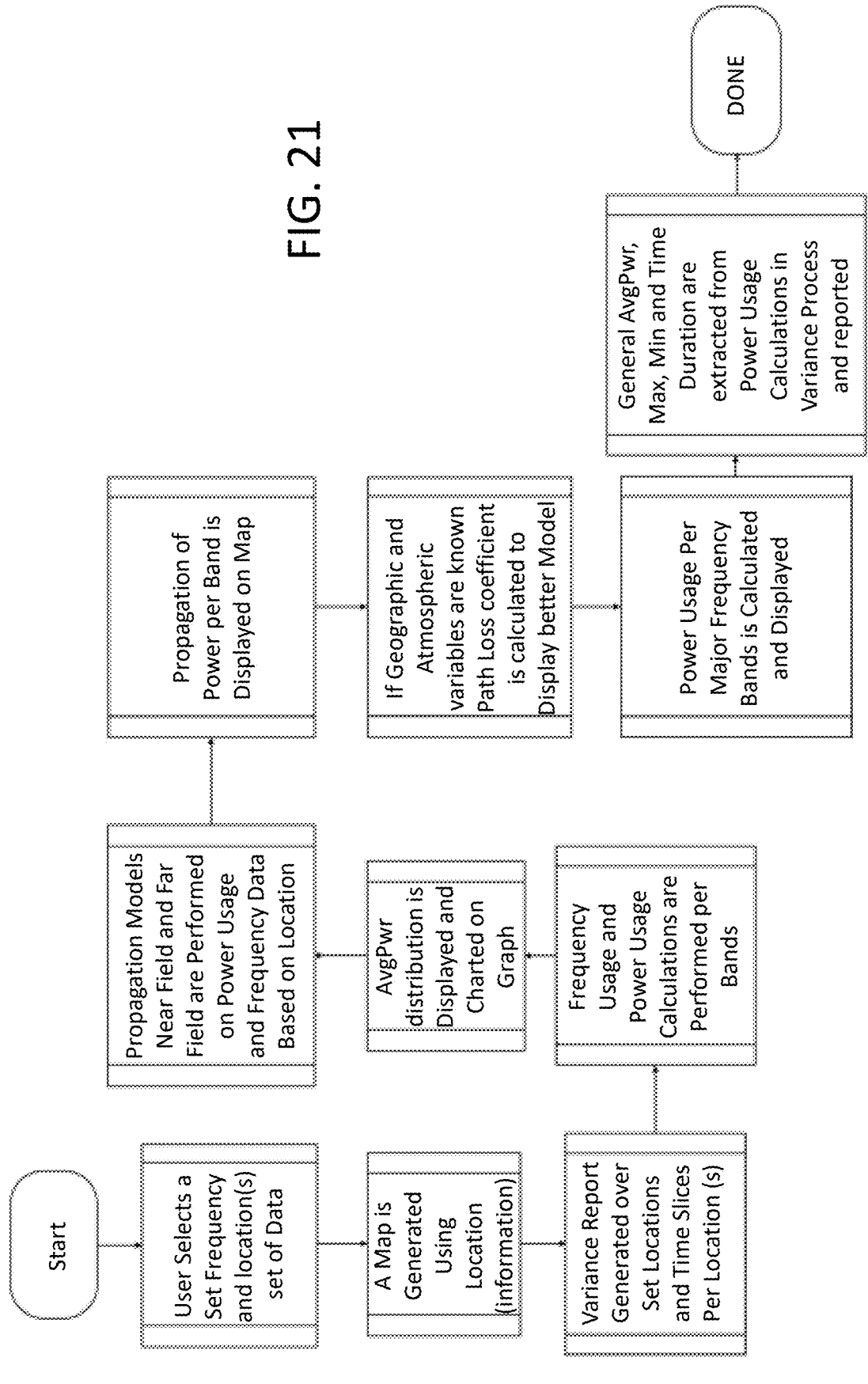
FIG. 21 is a flow diagram illustrating an embodiment method for reporting power usage information.

FIG. 21 is a flow diagram illustrating an embodiment method for reporting power usage information, including locational data, data broken down by time intervals, frequency and power usage information per band, average power distribution, propagation models, atmospheric factors, which is capable of being represented graphical, quantitatively, qualitatively, and overlaid onto a geographic or topographic map.

Figure 22:
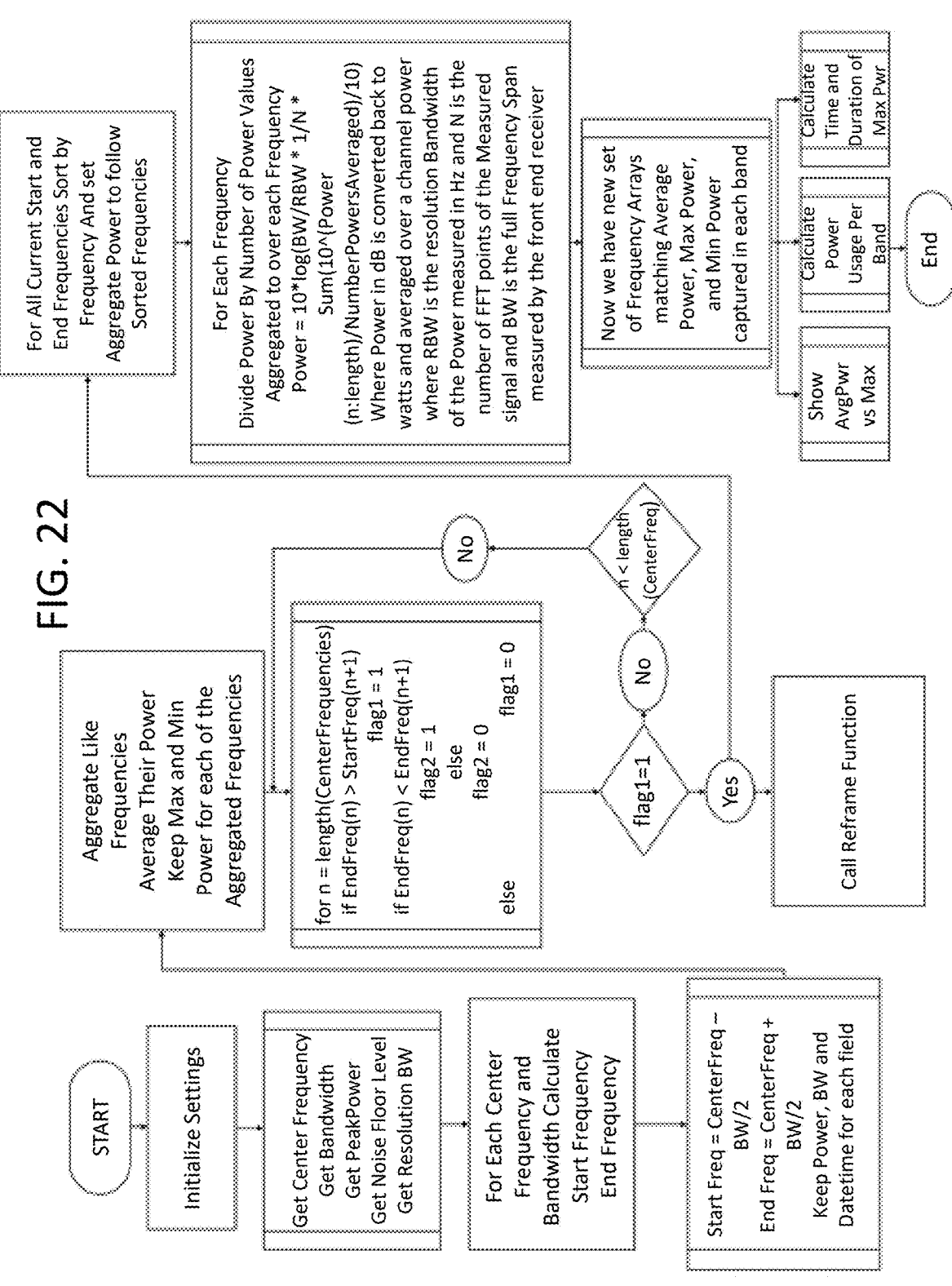
FIG. 22 is a flow diagram illustrating an embodiment method for creating frequency arrays.

FIG. 22 is a flow diagram illustrating an embodiment method for creating frequency arrays. For each initialization, an embodiment of the invention will determine a center frequency, bandwidth, peak power, noise floor level, resolution bandwidth, power and date/time. Start and end frequencies are calculated using the bandwidth and center frequency and like frequencies are aggregated and sorted in order to produce a set of frequency arrays matching power measurements captured in each band.

Figure 23:
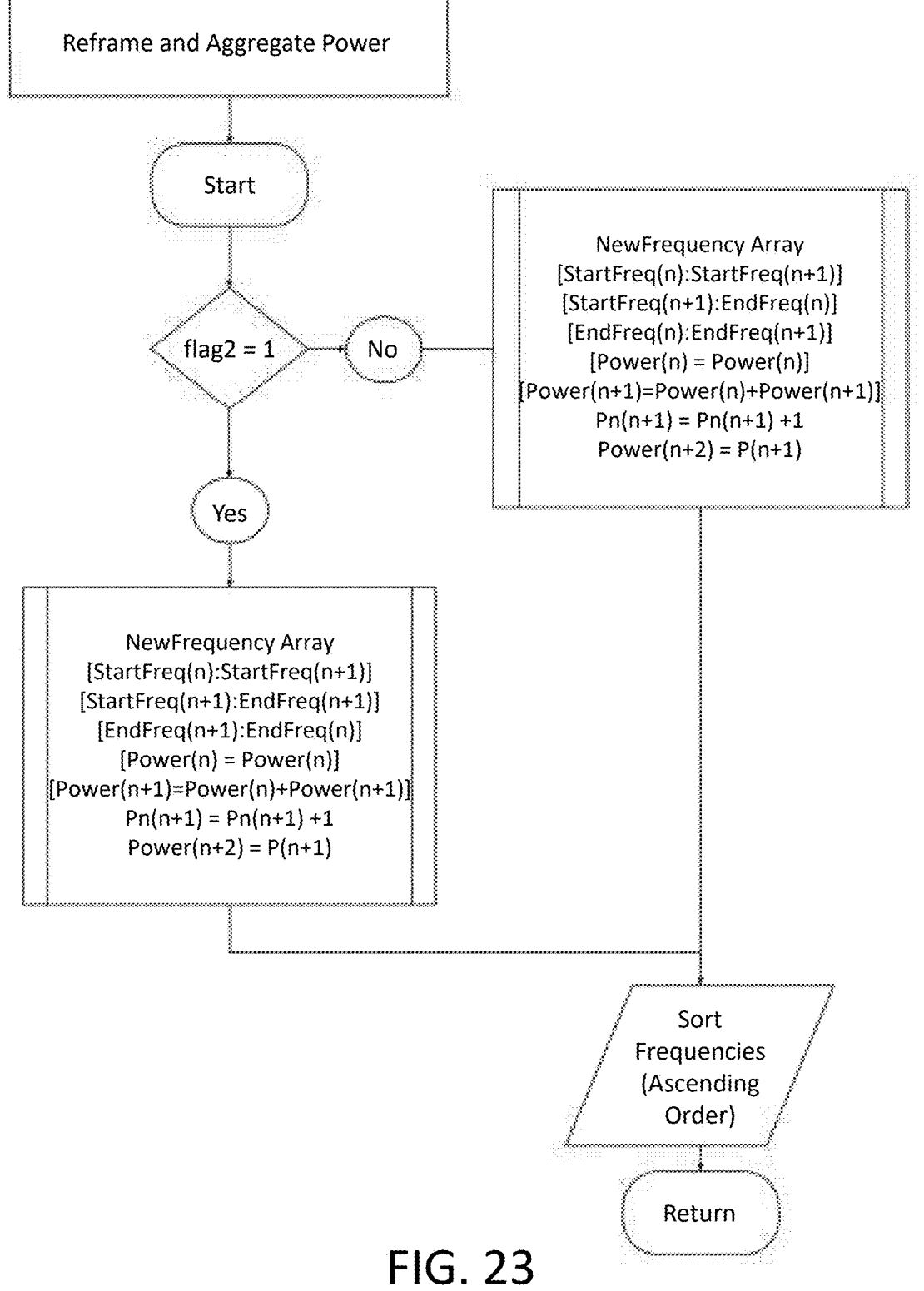
FIG. 23 is a flow diagram illustrating an embodiment method for reframe and aggregating power when producing frequency arrays.

FIG. 23 is a flow diagram illustrating an embodiment method for reframe and aggregating power when producing frequency arrays.

Figure 24:
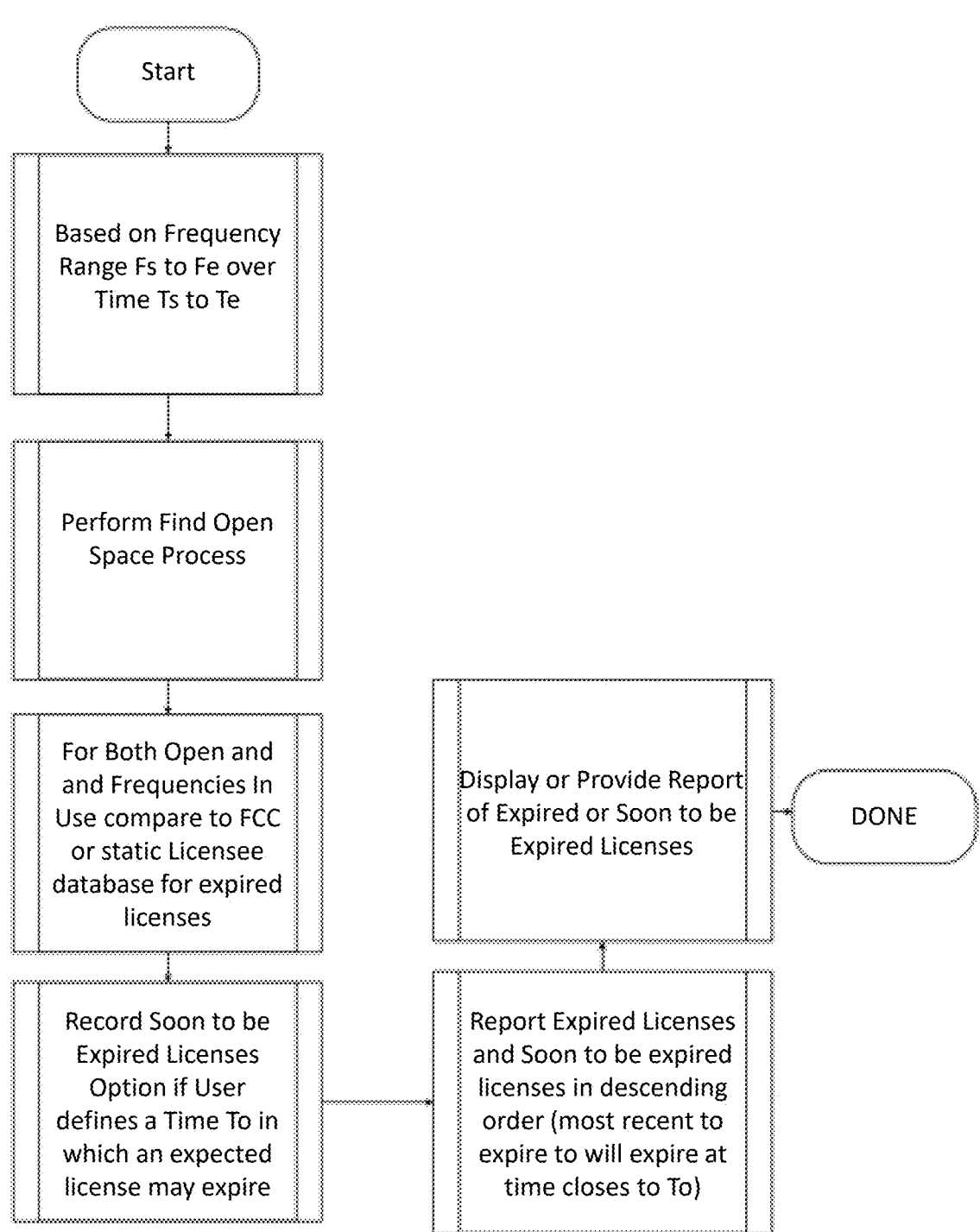
FIG. 24 is a flow diagram illustrating an embodiment method of reporting license expirations.

FIG. 24 is a flow diagram illustrating an embodiment method of reporting license expirations by accessing static or FCC databases.

Figure 25:
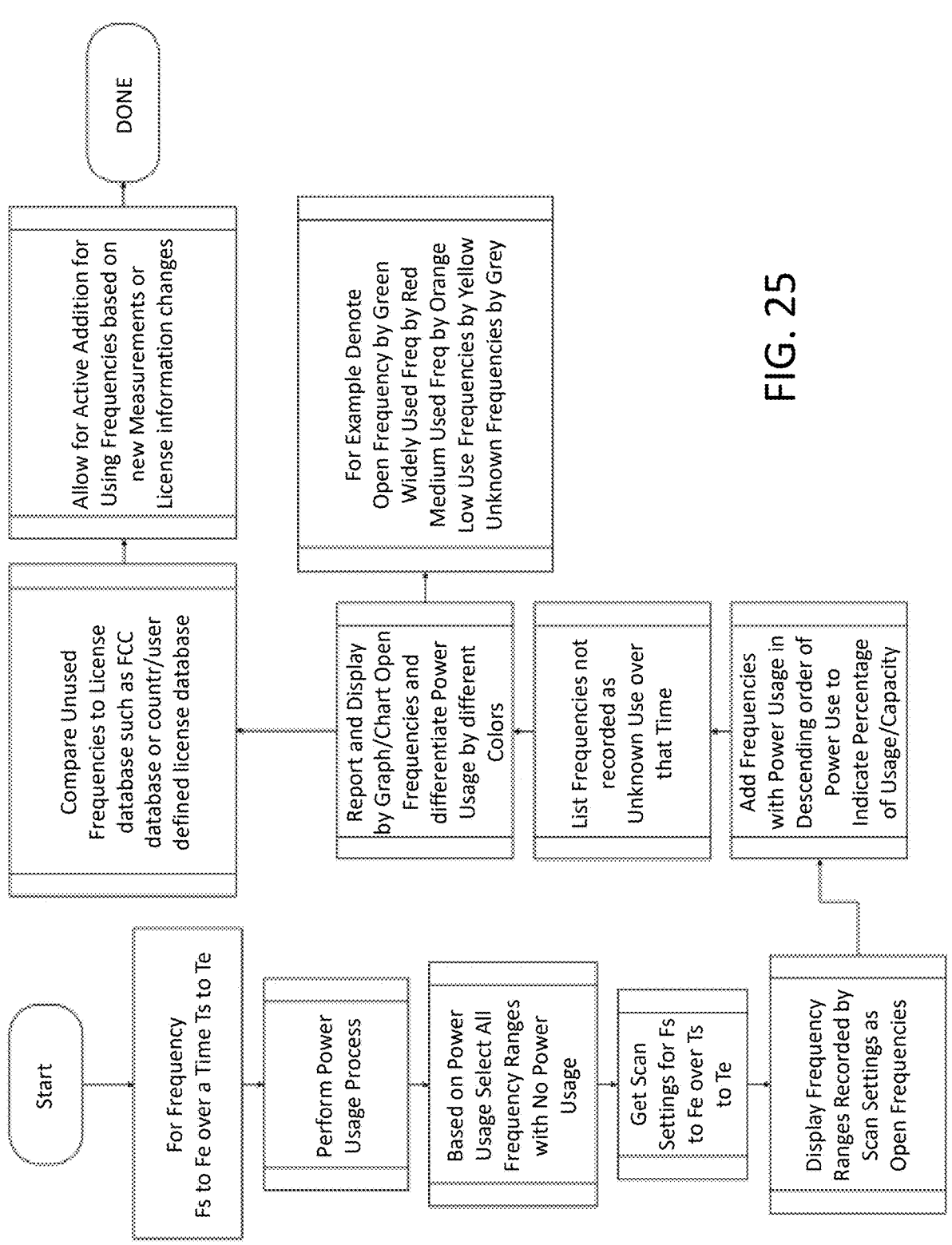
FIG. 25 is a flow diagram illustrating an embodiment method of reporting frequency power use.

FIG. 25 is a flow diagram illustrating an embodiment method of reporting frequency power use in graphical, chart, or report format, with the option of adding frequencies from FCC or other databases.

Figure 26:
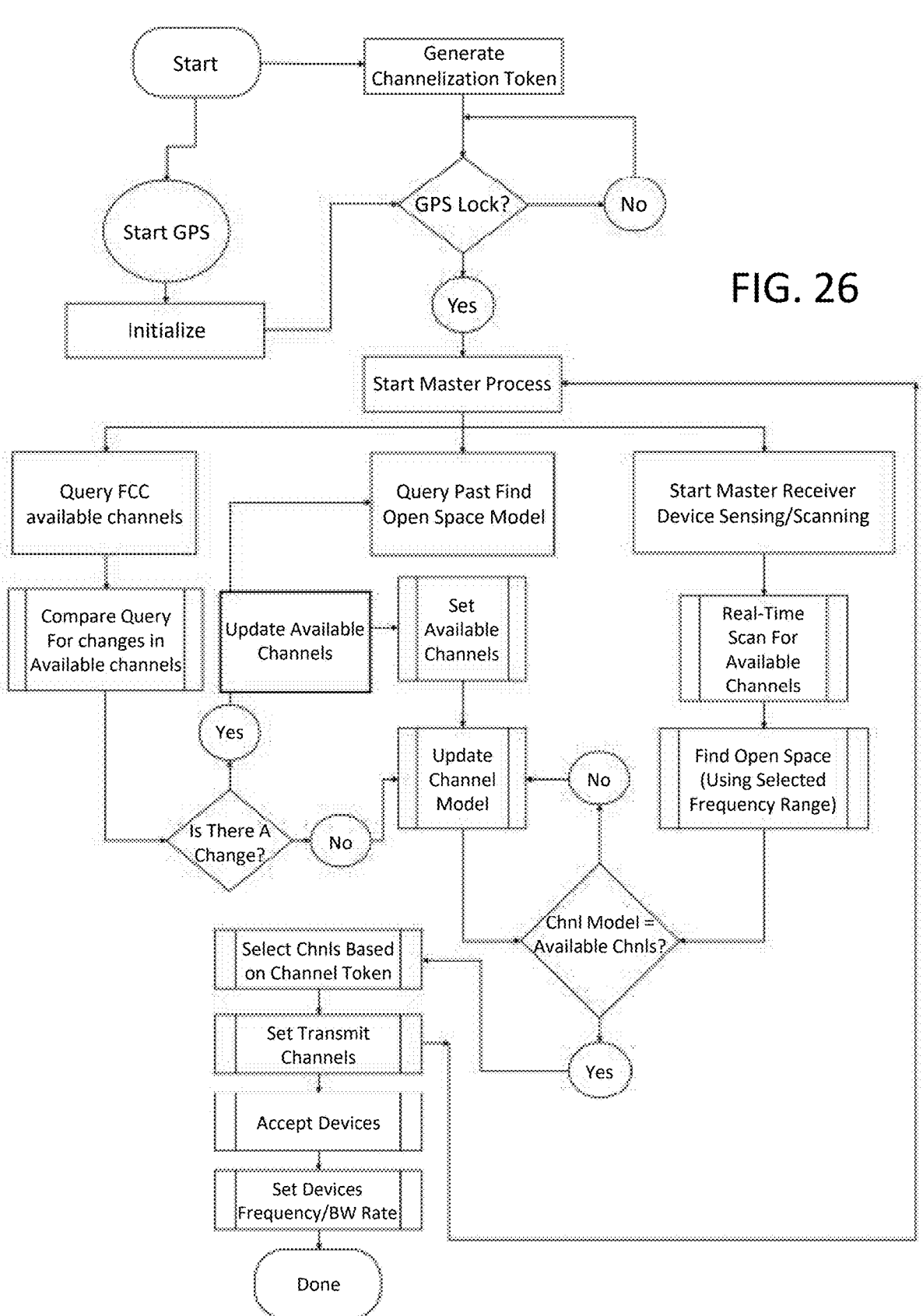
FIG. 26 is a flow diagram illustrating an embodiment method of connecting devices.

FIG. 26 is a flow diagram illustrating an embodiment method of connecting devices. After acquiring a GPS location, static and FCC databases are accessed to update license information, if available. A frequency scan will find open spaces and detect interferences and/or collisions. Based on the master device ID, set a random generated token to select channel form available channel model and continually transmit ID channel token. If node device reads ID, it will set itself to channel based on token and device will connect to master device. Master device will then set frequency and bandwidth channel. For each device connected to master, a frequency, bandwidth, and time slot in which to transmit is set. In one embodiment, these steps can be repeated until the max number of devices is connected. As new devices are connected, the device list is updated with channel model and the device is set as active. Disconnected devices are set as inactive. If collision occurs, update channel model and get new token channel. Active scans will search for new or lost devices and update devices list, channel model, and status accordingly. Channel model IDs are actively sent out for new or lost devices.

Figure 27:
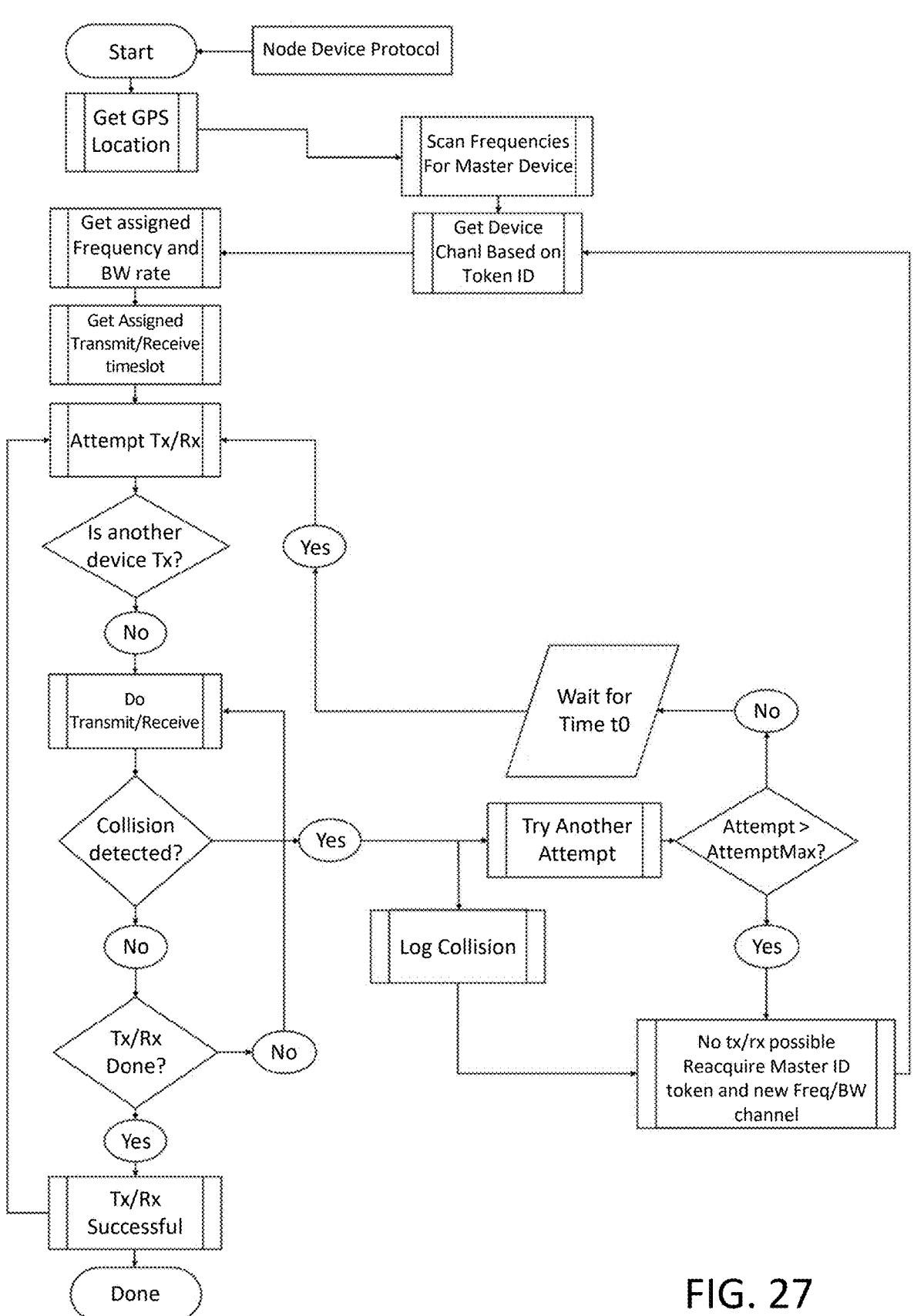
FIG. 27 is a flow diagram illustrating an embodiment method of addressing collisions.

FIG. 27 is a flow diagram illustrating an embodiment method of addressing collisions.

Figure 28:
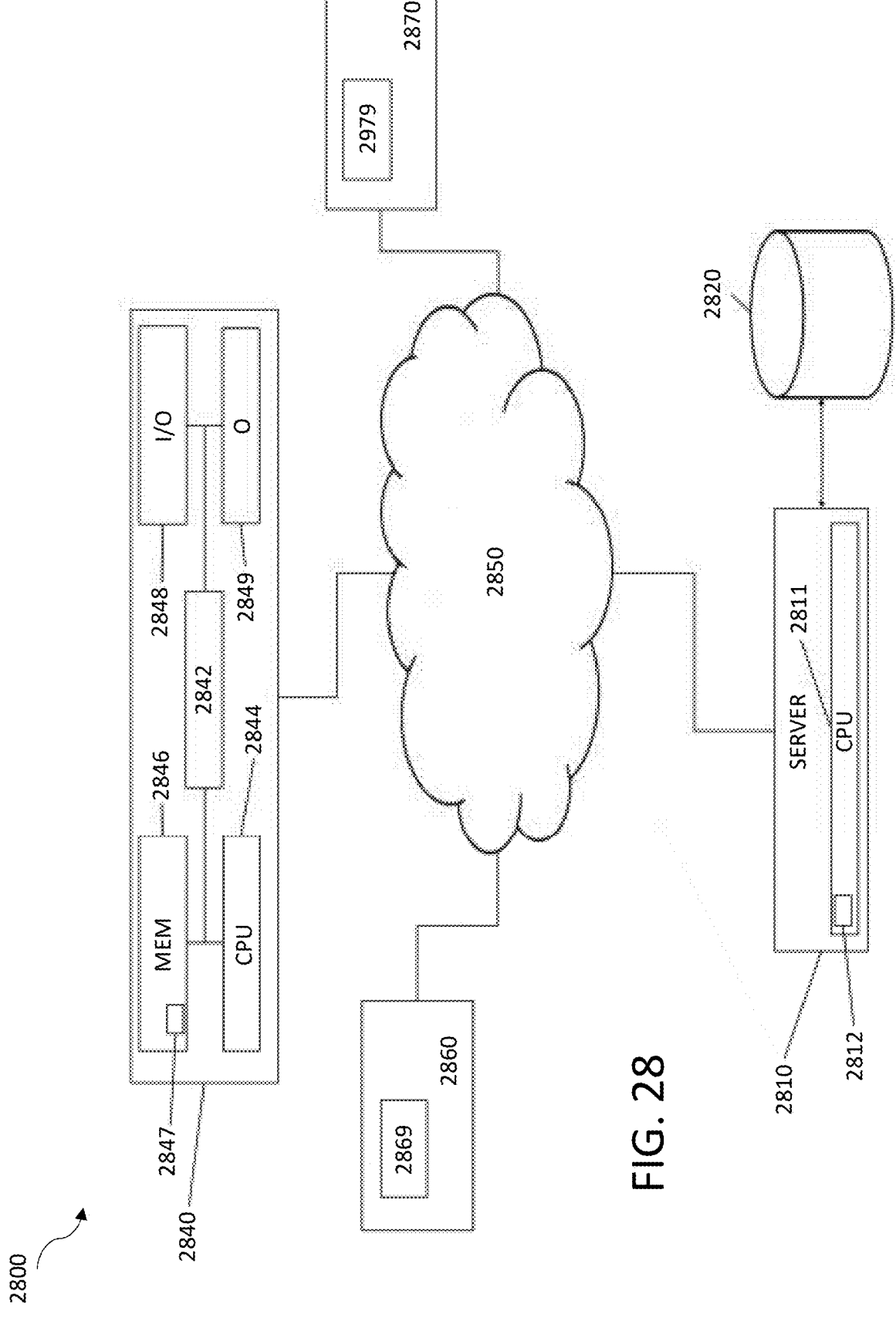
FIG. 28 is a schematic diagram of an embodiment of the invention illustrating a virtualized computing network and a plurality of distributed devices.

FIG. 28 is a schematic diagram of an embodiment of the invention illustrating a virtualized computing network and a plurality of distributed devices. FIG. 28 is a schematic diagram of one embodiment of the present invention, illustrating components of a cloud-based computing system and network for distributed communication therewith by mobile communication devices. FIG. 28 illustrates an exemplary virtualized computing system for embodiments of the present invention loyalty and rewards platform. As illustrated in FIG. 28, a basic schematic of some of the key components of a virtualized computing (or cloud-based) system according to the present invention are shown. The system 2800 comprises at least one remote server computer 2810 with a processing unit 2811 and memory. The server 2810 is constructed, configured and coupled to enable communication over a network 2850. The server provides for user interconnection with the server over the network with the at least one apparatus as described herein above 2840 positioned remotely from the server. Apparatus 2840 includes a memory 2846, a CPU 2844, an operating system 2847, a bus 2842, a input/output module 2848, and an output or display 2849. Furthermore, the system is operable for a multiplicity of devices or apparatus embodiments 2860, 2870 for example, in a client/server architecture, as shown, each having outputs or displays 2869 and 2979, respectively. Alternatively, interconnection through the network 2850 using the at least one device or apparatus for measuring signal emitting devices, each of the at least one apparatus is operable for network-based communication. Also, alternative architectures may be used instead of the client/server architecture. For example, a computer communications network, or other suitable architecture may be used. The network 2850 may be the Internet, an intranet, or any other network suitable for searching, obtaining, and/or using information and/or communications. The system of the present invention further includes an operating system 2812 installed and running on the at least one remote server 2810, enabling the server 2810 to communicate through network 2850 with the remote, distributed devices or apparatus embodiments as described herein above, the server 2810 having a memory 2820. The operating system may be any operating system known in the art that is suitable for network communication.

FIG. 29 shows a schematic diagram of aspects of the present invention.

Figure 30:
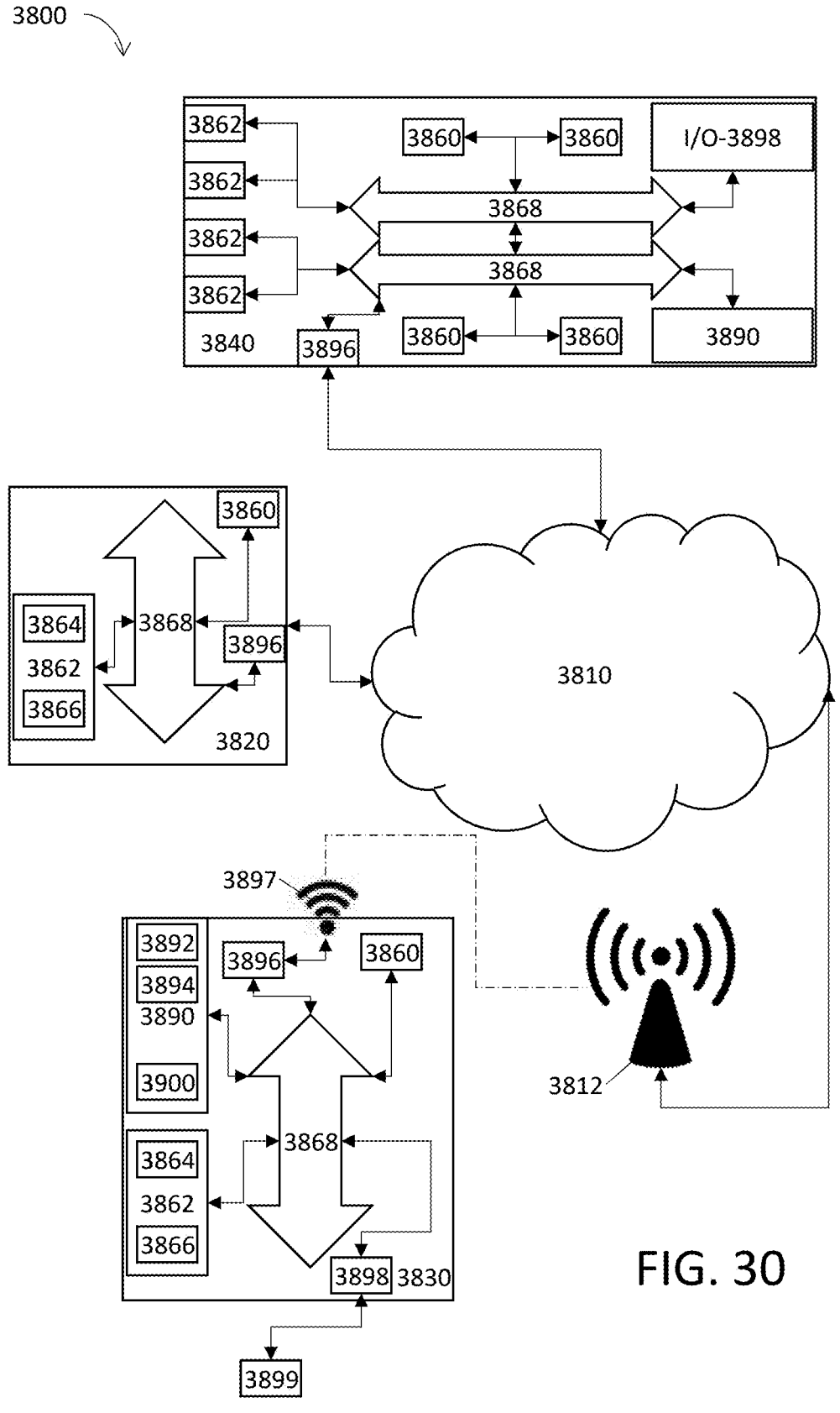
FIG. 30 is a schematic diagram illustrating the present invention in a virtualized or cloud computing system with a network and a mobile computer or mobile communications device.

FIG. 30 is a schematic diagram of an embodiment of the invention illustrating a computer system, generally described as 3800, having a network 3810 and a plurality of computing devices 3820, 3830, 3840. In one embodiment of the invention, the computer system 3800 includes a cloud-based network 3810 for distributed communication via the network's wireless communication antenna 3812 and processing by a plurality of mobile communication computing devices 3830. In another embodiment of the invention, the computer system 3800 is a virtualized computing system capable of executing any or all aspects of software and/or application components presented herein on the computing devices 3820, 3830, 3840. In certain aspects, the computer system 3800 may be implemented using hardware or a combination of software and hardware, either in a dedicated computing device, or integrated into another entity, or distributed across multiple entities or computing devices.

By way of example, and not limitation, the computing devices 3820, 3830, 3840 are intended to represent various forms of digital devices 3820, 3840 and mobile devices 3830, such as a server, blade server, mainframe, mobile phone, a personal digital assistant (PDA), a smart phone, a desktop computer, a netbook computer, a tablet computer, a workstation, a laptop, and other similar computing devices. The components shown here, their connections and relationships, and their functions, are meant to be exemplary only, and are not meant to limit implementations of the invention described and/or claimed in this document.

In one embodiment, the computing device 3820 includes components such as a processor 3860, a system memory 3862 having a random access memory (RAM) 3864 and a read-only memory (ROM) 3866, and a system bus 3868 that couples the memory 3862 to the processor 3860. In another embodiment, the computing device 3830 may additionally include components such as a storage device 3890 for storing the operating system 3892 and one or more application programs 3894, a network interface unit 3896, and/or an input/output controller 3898. Each of the components may be coupled to each other through at least one bus 3868. The input/output controller 3898 may receive and process input from, or provide output to, a number of other devices 3899, including, but not limited to, alphanumeric input devices, mice, electronic styluses, display units, touch screens, signal generation devices (e.g., speakers) or printers.

By way of example, and not limitation, the processor 3860 may be a general-purpose microprocessor (e.g., a central processing unit (CPU)), a graphics processing unit (GPU), a microcontroller, a Digital Signal Processor (DSP), an Application Specific Integrated Circuit (ASIC), a Field Programmable Gate Array (FPGA), a Programmable Logic Device (PLD), a controller, a state machine, gated or transistor logic, discrete hardware components, or any other suitable entity or combinations thereof that can perform calculations, process instructions for execution, and/or other manipulations of information.

In another implementation, shown in FIG. 30, a computing device 3840 may use multiple processors 3860 and/or multiple buses 3868, as appropriate, along with multiple memories 3862 of multiple types (e.g., a combination of a DSP and a microprocessor, a plurality of microprocessors, one or more microprocessors in conjunction with a DSP core).

Also, multiple computing devices may be connected, with each device providing portions of the necessary operations (e.g., a server bank, a group of blade servers, or a multi-processor system). Alternatively, some steps or methods may be performed by circuitry that is specific to a given function.

According to various embodiments, the computer system 3800 may operate in a networked environment using logical connections to local and/or remote computing devices 3820, 3830, 3840 through a network 3810. A computing device 3830 may connect to a network 3810 through a network interface unit 3896 connected to the bus 3868. Computing devices may communicate communication media through wired networks, direct-wired connections or wirelessly such as acoustic, RF or infrared through a wireless communication antenna 3897 in communication with the network's wireless communication antenna 3812 and the network interface unit 3896, which may include digital signal processing circuitry when necessary. The network interface unit 3896 may provide for communications under various modes or protocols.

In one or more exemplary aspects, the instructions may be implemented in hardware, software, firmware, or any combinations thereof. A computer readable medium may provide volatile or non-volatile storage for one or more sets of instructions, such as operating systems, data structures, program modules, applications or other data embodying any one or more of the methodologies or functions described herein. The computer readable medium may include the memory 3862, the processor 3860, and/or the storage device 3890 and may be a single medium or multiple media (e.g., a centralized or distributed computer system) that store the one or more sets of instructions 3900. Non-transitory computer readable media includes all computer readable media, with the sole exception being a transitory, propagating signal per se. The instructions 3900 may further be transmitted or received over the network 3810 via the network interface unit 3896 as communication media, which may include a modulated data signal such as a carrier wave or other transport mechanism and includes any delivery media. The term "modulated data signal" means a signal that has one or more of its characteristics changed or set in a manner as to encode information in the signal.

Storage devices 3890 and memory 3862 include, but are not limited to, volatile and non-volatile media such as cache, RAM, ROM, EPROM, EEPROM, FLASH memory or other solid state memory technology, disks or discs (e.g., digital versatile disks (DVD), HD-DVD, BLU-RAY, compact disc (CD), CD-ROM, floppy disc) or other optical storage, magnetic cassettes, magnetic tape, magnetic disk storage or other magnetic storage devices, or any other medium that can be used to store the computer readable instructions and which can be accessed by the computer system 3800.

It is also contemplated that the computer system 3800 may not include all of the components shown in FIG. 30, may include other components that are not explicitly shown in FIG. 30, or may utilize an architecture completely different than that shown in FIG. 30. The various illustrative logical blocks, modules, elements, circuits, and algorithms described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application (e.g., arranged in a different order or partitioned in a different way), but such implementation decisions should not be interpreted as causing a departure from the scope of the present invention.

The present invention further provides for aggregating data from at least two apparatus units by at least one server computer and storing the aggregated data in a database and/or in at least one database in a cloud-based computing environment or virtualized computing environment, as illustrated in FIG. 28 or FIG. 30. The present invention further provides for remote access to the aggregated data and/or data from any of the at least one apparatus unit, by distributed remote user(s) from corresponding distributed remote device(s), such as by way of example and not limitation, desktop computers, laptop computers, tablet computers, mobile computers with wireless communication operations, smartphones, mobile communications devices, and combinations thereof. The remote access to data is provided by software applications operable on computers directly (as a "desktop" application) and/or as a web service that allows user interface to the data through a secure, network-based website access.

In other embodiments of the present invention, which include the base invention described hereinabove, and further including the functions of machine "learning", modulation detection, automatic signal detection (ASD), FFT replay, and combinations thereof.

Automatic modulation detection and machine "learning" includes automatic signal variance determination by at least one of the following methods: date and time from location set, and remote access to the apparatus unit to determine variance from different locations and times, in addition to the descriptions of automatic signal detection and threshold determination and setting. Environments vary, especially where there are many signals, noise, interference, variance, etc., so tracking signals automatically is difficult, and a longstanding, unmet need in the prior art. The present invention provides for automatic signal detection using a sample of measured and sensed data associated with signals over time using the at least one apparatus unit of the present invention to provide an automatically adjustable and adaptable system. For each spectrum scan, the data is automatically subdivided into "windows", which are sections or groups of data within a frequency space. Real-time processing of the measured and sensed data on the apparatus unit(s) or devices combined with the windowing effect provides for automatic comparison of signal versus noise within the window to provide for noise approximation, wherein both signals and noise are measured and sensed, recorded, analyzed compared with historical data to identify and output signals in a high noise environment. It is adaptive and iterative to include focused windows and changes in the window or frequency ranges grouped. The resulting values for all data are squared in the analysis, which results in signals identified easily by the apparatus unit as having significantly larger power values compared with noise; additional analytics provide for selection of the highest power value signals and review of the original data corresponding thereto. Thus, the at least one apparatus automatically determines and identifies signals compared to noise in the RF spectrum.

Figure 31:
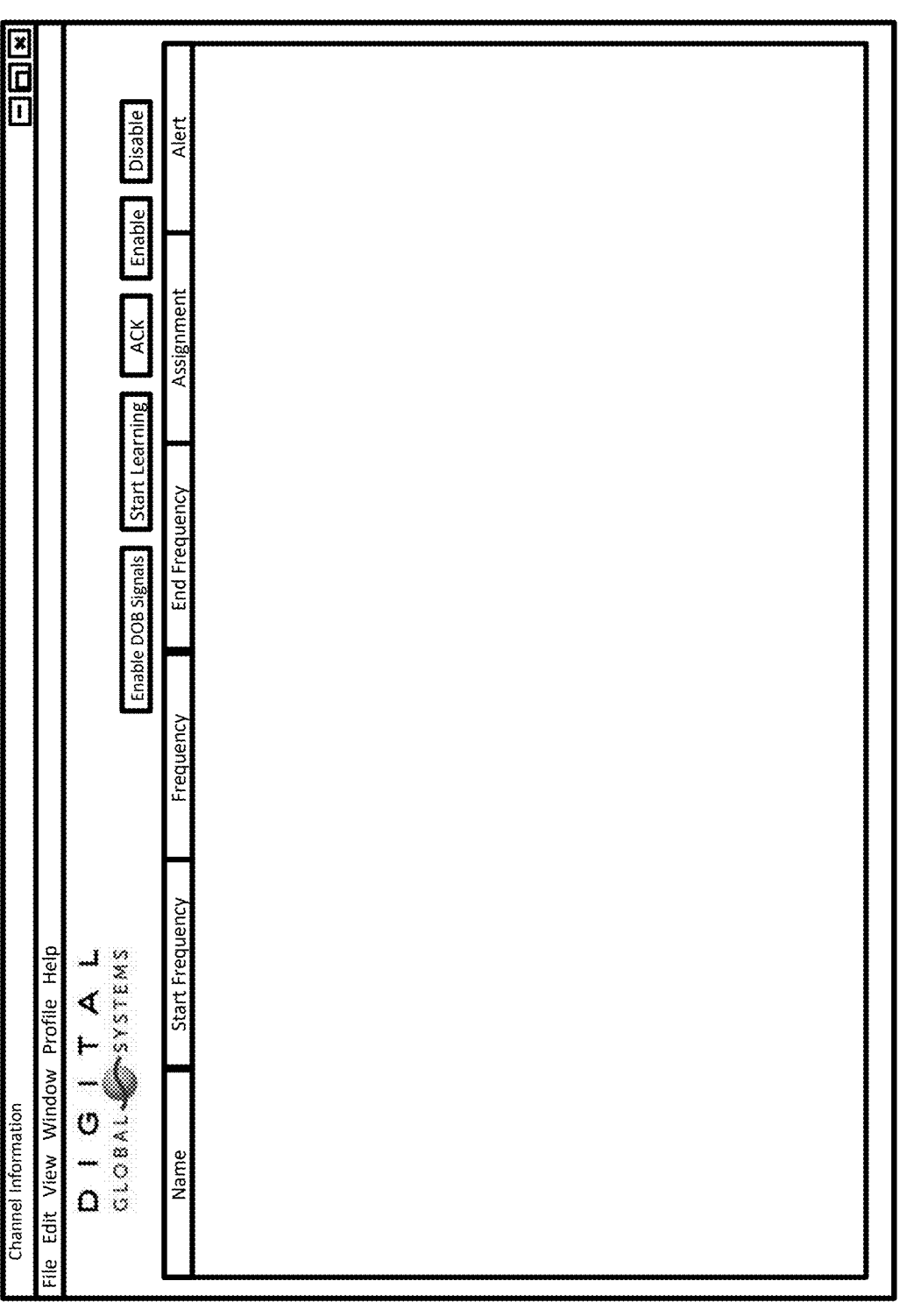
FIG. 31 shows a screen shot illustration for automatic signal detection indications on displays associated with the present invention.

The apparatus unit or device of the present invention further includes a temporal anomaly detector (or "learning channel"). The first screen shot illustrated in FIG. 31 shows the blank screen, the second screen shot illustrated in FIG. 32 shows several channels that the system has "learned". This table can be saved to disk as a spreadsheet and reused on subsequent surveys at the same location. The third screen shot shown in FIG. 33 displays the results when run with the "Enable OOB Signals" button enabled. In this context OOB means "Out Of Band" or rogue or previously unidentified signals. Once a baseline set of signals has been learned by the system, it can be used with automatic signal detection to clearly show new, unknown signals that were not present when the initial learning was done as shown in FIG. 34.

In a similar capacity, the user can load a spreadsheet that they have constructed on their own to describe the channels that they expect to see in a given environment, as illustrated in FIG. 34. When run with OOB detection, the screen shot shows the detection of signals that were not in the user configuration. These rogue signals could be a possible source of interference, and automatic detection of them can greatly assist the job of an RF Manager.

FIGS. 31-34 illustrate the functions and features of the present invention for automatic or machine "learning" as described hereinabove.

Automatic signal detection of the present invention eliminates the need for a manual setting of a power threshold line or bar, as with the prior art. The present invention does not require a manual setting of power threshold bar or flat line to identify signals instead of noise, instead it uses information learned directly from the changing RF environment to identify signals. Thus, the apparatus unit or device may be activated and left unattended to collect data continuously without the need for manual interaction with the device directly. Furthermore, the present invention allows remote viewing of live data in real time on a display of a computer or communications device in network-based connection but remotely positioned from the apparatus unit or device, and/or remote access to device settings, controls, data, and combinations thereof. The network-based communication may be selected from mobile, satellite, Ethernet, and functional equivalents or improvements with security including firewalls, encryption of data, and combinations thereof.

Regarding FFT replay, the present invention apparatus units are operable to replay data and to review and/or replay data saved based upon an unknown event, such as for example and not limitation, reported alarms and/or unique events, wherein the FFT replay is operable to replay stored sensed and measured data to the section of data nearest the reported alarm and/or unique event. By contrast, prior art provides for recording signals on RF spectrum measurement devices, which transmit or send the raw data to an external computer for analysis, so then it is impossible to replay or review specific sections of data, as they are not searchable, tagged, or otherwise sectioned into subgroups of data or stored on the device.

Automatic Signal Detection

Figure 35:
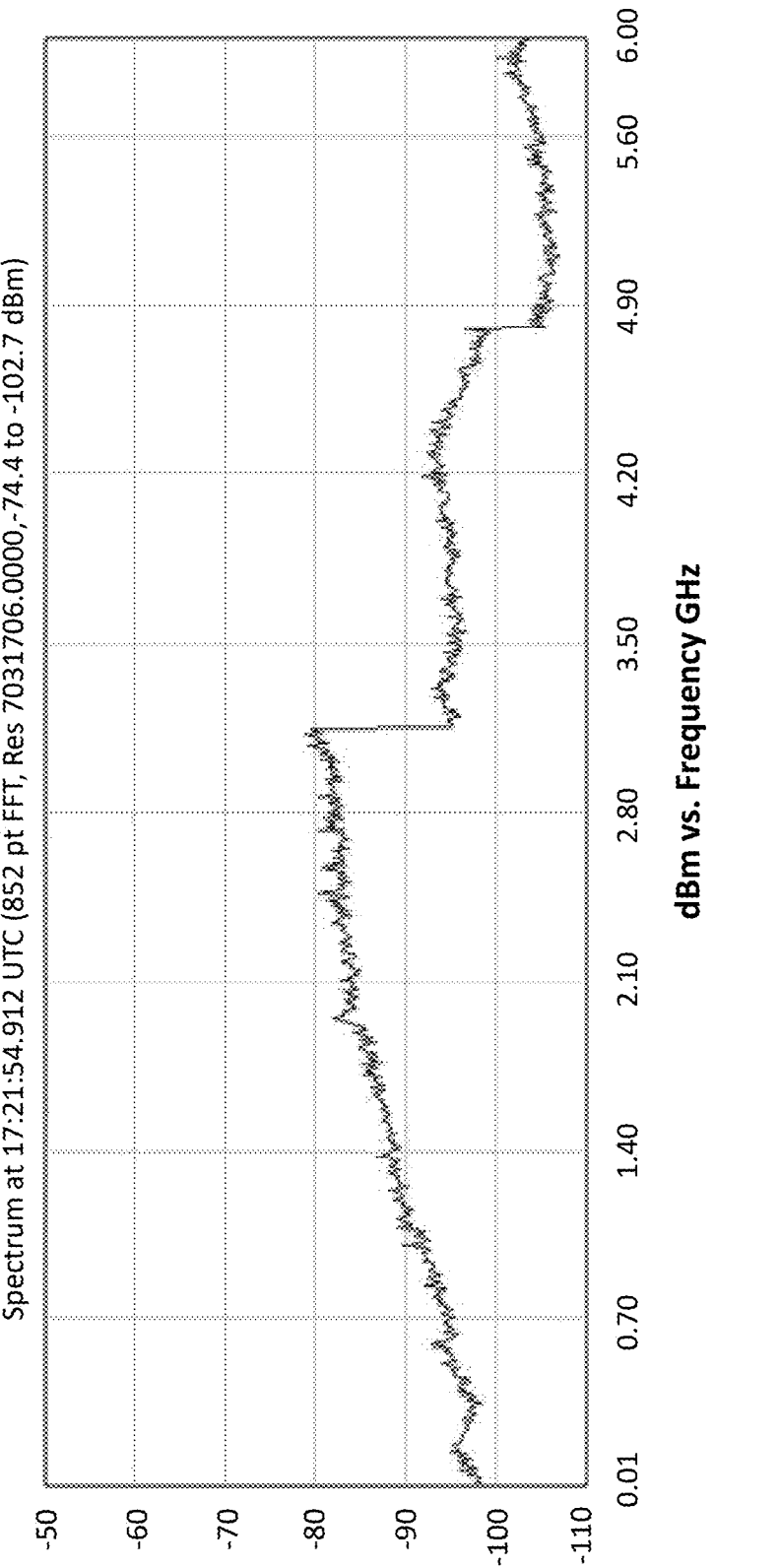
FIG. 35 is an example of a receiver that has marked variations on baseline behavior across a wide spectrum (9 MHz-6 GHz).

The previous approach to ASD was to subtract a calibration vector from each FFT sample set (de-bias), then square each resulting value and look for concentrations of energy that would differentiate a signal from random baseline noise. The advantages of this approach are that, by the use of the calibration vector (which was created using the receiver itself with no antenna), variations in the baseline noise that are due to the characteristics of the receiver, front end filtering, attenuation and A/D converter hardware can be closed tracked. On most modern equipment, the designers take steps to keep the overall response flat, but there are those that do not. FIG. 35 is an example of a receiver that has marked variations on baseline behavior across a wide spectrum (9 MHz-6 GHz).

Figure 36:
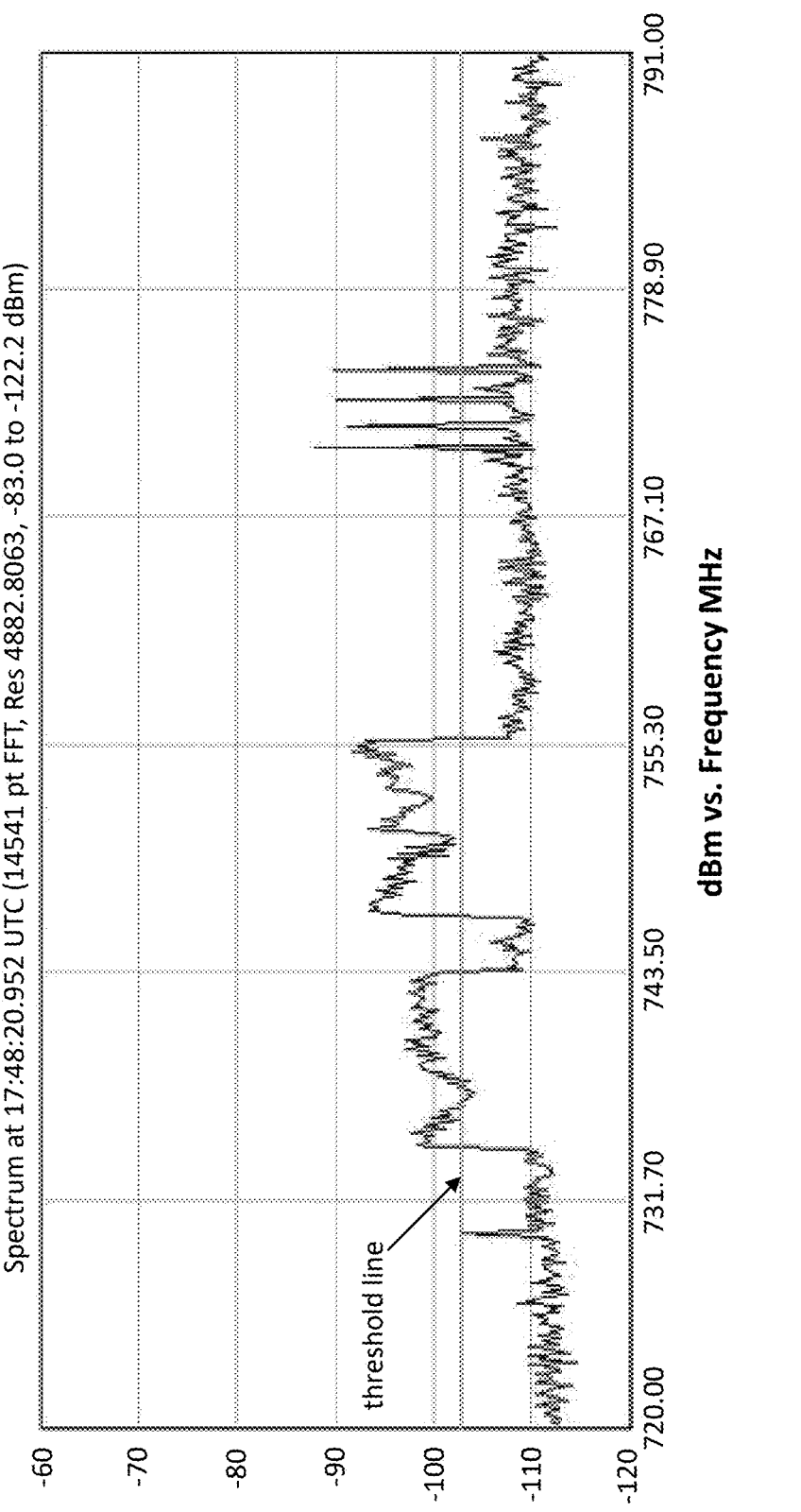
FIG. 36 shows a normal spectrum from 700 MHz to 790 MHz in one embodiment.
Figure 37:
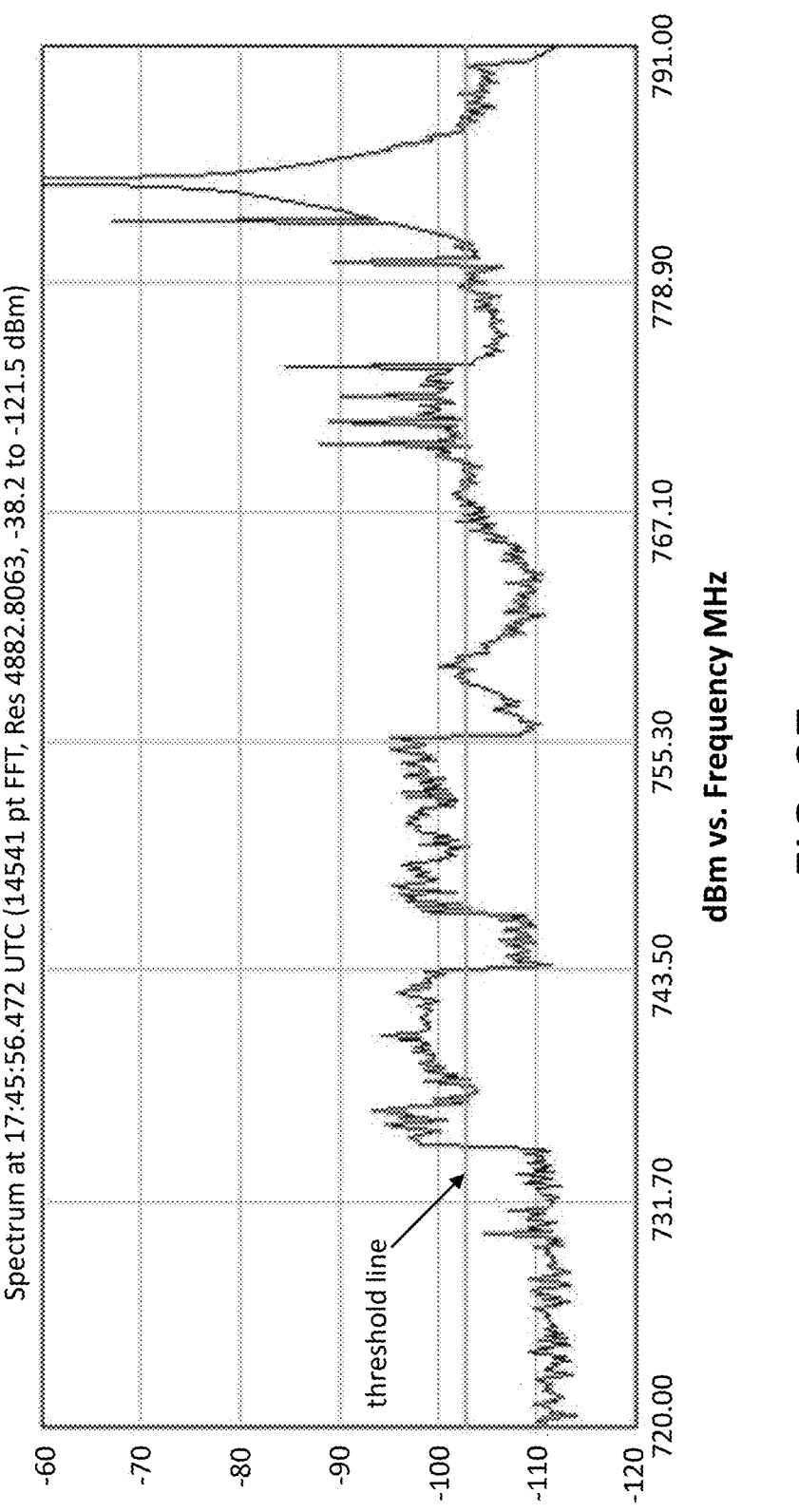
FIG. 37 shows the same spectrum as in FIG. 36 at a different time.

The drawbacks to this approach are: 1) It requires the use of several "tuning" variables which often require the user to adjust and fiddle with in order to achieve good signal recognition. A fully automatic signal detection system should be able to choose values for these parameters without the intervention of an operator. 2) It does not take into account variations in the baseline noise floor that are introduced by RF energy in a live environment. Since these variations were not present during calibration, they are not part of the calibration vector and cannot be "canceled out" during the de-bias phase. Instead they remain during the square and detect phase, often being mistakenly classified as signal. An example of this is FIG. 36, a normal spectrum from 700 MHz to 790 MHz. The threshold line (baby blue) indicates the level where signal can be differentiated from noise. FIG. 37 illustrates the same spectrum at a different time where an immensely powerful signal at about 785 MHz has caused undulations in the noise floor all the way down to 755 MHz. It is clear to see by the placement of the threshold line large blocks of the noise are now going to be recognized as signal. Not only are the 4 narrow band signals now going to be mistakenly seen as one large signal, there is an additional lump of noise around 760 MHz that represents no signal at all, but will be classified as such.

In order to solve these two problems, and provide a fully automatic signal detection system, a new approach has been taken to prepare the calibration vector. The existing square and detect algorithm works well if the data are de-biased properly with a cleverly chosen calibration vector, it's just that the way the calibration vector was created was not sufficient.

Figure 38:
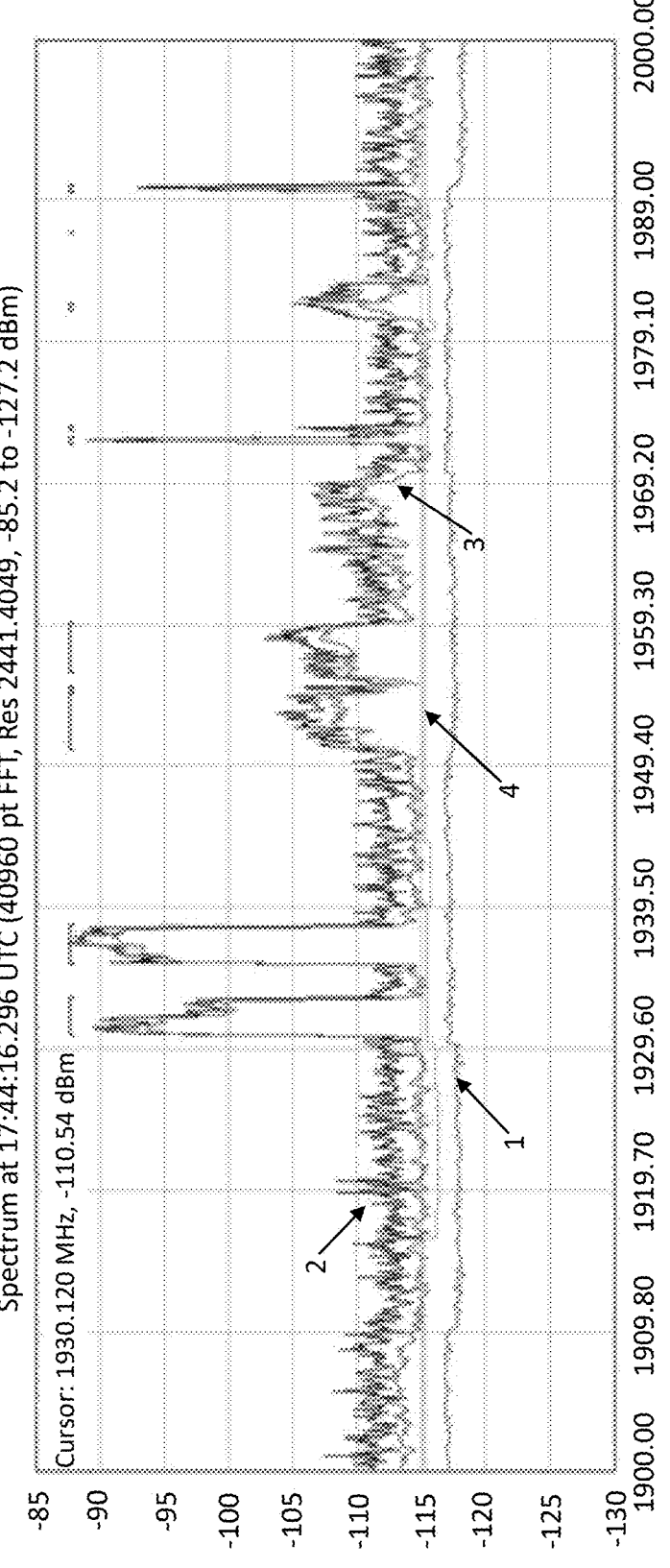
FIG. 38 illustrates a spectrum from 1.9 GHz to 2.0 GHz, along with some additional lines that indicate the functions of the new algorithm.

FIG. 38 illustrates a spectrum from 1.9 GHz to 2.0 GHz, along with some additional lines that indicate the functions of the new algorithm. The brown line at the bottom displays the existing calibration vector created by running the receiver with no antenna. It is clear to see that, if used as is, it is too low to be used to de-bias the data (the dark blue plot). Also, much of the elevations in noise floor will wind up being part of the signals that are detected. In order to compensate for this, the user was given a control (called "Bias") that allowed them to raise or lower the calibration vector to hopefully achieve a more reasonable result. But, as illustrated in FIG. 37, no adjustment will suffice when the noise floor has been distorted due to the injection of large amounts of energy.

Figure 39:
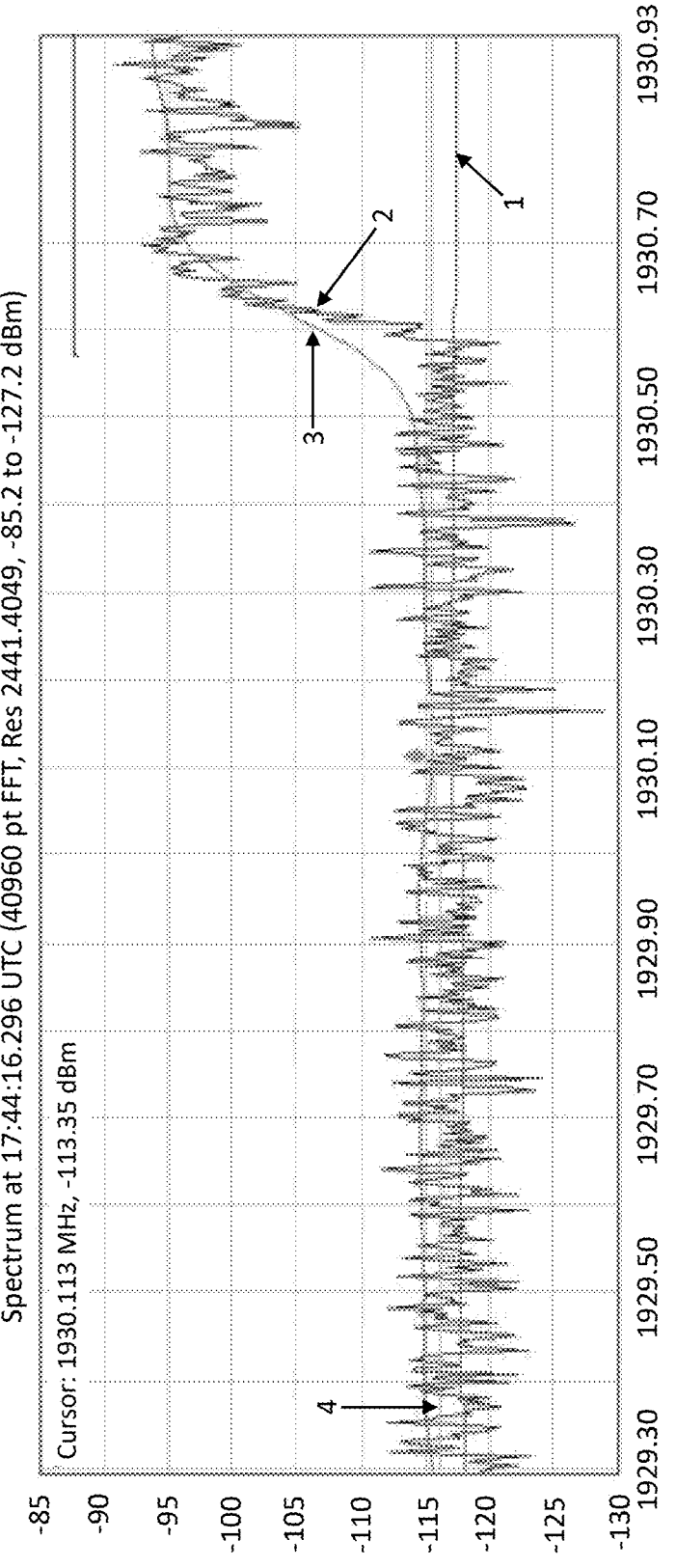
FIG. 39 is a close up view of the first part of the overall spectrum in FIG. 38.

So, rather than attempt to make the calibration vector fit the data, the new approach examines the data itself in an attempt to use parts of it as the correction vector. This is illustrated by the light purple and baby blue lines in the FIG. 38. The light purple line is the result of using a 60 sample smoothing filter to average the raw data. It clearly follows the data, but it removes the "jumpiness". This can be better seen in FIG. 39 which is a close up view of the first part of the overall spectrum, showing the difference between smoothed data (light purple) and the original data (dark blue).

The new Gradient Detection algorithm is applied to the smoothed data to detect locations where the slope of the line changes quickly. In places where the slope changes quickly in a positive direction, the algorithm marks the start of a signal. On the other side of the signal the gradient again changes quickly to become more horizontal. At that point the algorithm determines it is the end of a signal. A second smoothing pass is performed on the smoothed data, but this time, those values that fall between the proposed start and end of signal are left out of the average. The result of this is the baby blue line, which is then used as the new calibration vector. This new calibration vector (baby blue line) is then used to de-bias the raw data which is then passed to the existing square and detect ASD algorithm.

One of the other user-tunable parameters in the existing ASD system was called "Sensitivity". This was a parameter that essentially set a threshold of energy, above which each FFT bin in a block of bins averaged together must exceed in order for that block of bins to be considered a signal. In this way, rather than a single horizontal line to divide signal from noise, each signal can be evaluated individually, based on its average power. The effect of setting this value too low was that tiny fluctuations of energy that are actually noise would sometimes appear to be signals. Setting the value too high would result in the algorithm missing a signal. In order to automatically choose a value for this parameter, the new system uses a "Quality of Service" feedback from the Event Compositor, a module that processes the real-time events from the ASD system and writes signal observations into a database. When the sensitivity value is too low, the random bits of energy that ASD mistakenly sees as signal are very transient. This is due to the random nature of noise. The Event Compositor has a parameter called a "Pre-Recognition Delay" that sets the minimum number of consecutive scans that it must see a signal in order for it to be considered a candidate for a signal observation database entry (in order to catch large fast signals, an exception is made for large transients that are either high in peak power, or in bandwidth). Since the random fluctuations seldom persist for more than 1 or 2 sweeps, the Event Compositor ignores them, essentially filtering them out. If there are a large number of these transients, the Event Compositor provides feedback to the ASD module to inform it that its sensitivity is too low. Likewise, if there are no transients at all, the feedback indicates the sensitivity is too high. Eventually, the system arrives at an optimal setting for the sensitivity parameter.

The result is a fully automated signal detection system that requires no user intervention or adjustment. The black brackets at the top of FIG. 38 illustrate the signals recognized by the system, clearly indicating its accuracy.

Because the system relies heavily upon averaging, a new algorithm was created that performs an N sample average in fixed time; i.e. regardless of the width of the average, N, each bin requires 1 addition, 1 subtraction, and 1 division. A simpler algorithm would require N additions and 1 division per bin of data. A snippet of the code is probably the best description:

```
public double [ ] smoothingFilter( double [ ] dataSet, int
filterSize ) {
     double [ ] resultSet = new double[ dataSet.length ];
     double temp = 0.0;
     int i=0;
     int halfSize = filterSize/2;
     for( i=0 ; i < filterSize ; i++ ) {
         temp += dataSet[i];              // load accumulator with
the first N/2 values.
         if( i < halfSize )
             resultSet[i] = dataSet[i];
     }
for( i=halfSize ; i < (dataSet.length – halfSize) ; i++ ) {
         resultSet[i] = temp / filterSize;      // Compute the
average and store it
         temp –= dataSet[ i-halfSize ];          // take out the
oldest value
         temp += dataSet[ i+halfSize ];          // add in the
newest value
     }
     while( i < dataSet.length ) {
         resultSet[i] = dataSet[i];
         i++;
     }
     return( resultSet );
}
```

Automatic Signal Detection (ASD) with Temporal Feature Extraction (TFE)

The system in the present invention uses statistical learning techniques to observe and learn an RF environment over time and identify temporal features of the RF environment (e.g., signals) during a learning period.

A knowledge map is formed based on learning data from a learning period. Real-time signal events are detected by an ASD system and scrubbed against the knowledge map to determine if the real-time signal events are typical and expected for the environment, or if there is any event not typical nor expected.

The knowledge map consists of an array of normal distributions, where each distribution column is for each frequency bin of the FFT result set provided by a software defined radio (SDR). Each vertical column corresponds to a bell-shaped curve for that frequency. Each pixel represents a count of how many times that frequency was seen at that power level.

A learning routine takes power levels of each frequency bin, uses the power levels as an index into each distribution column corresponding to each frequency bin, and increments the counter in a location corresponding to a power level.

Figure 40:
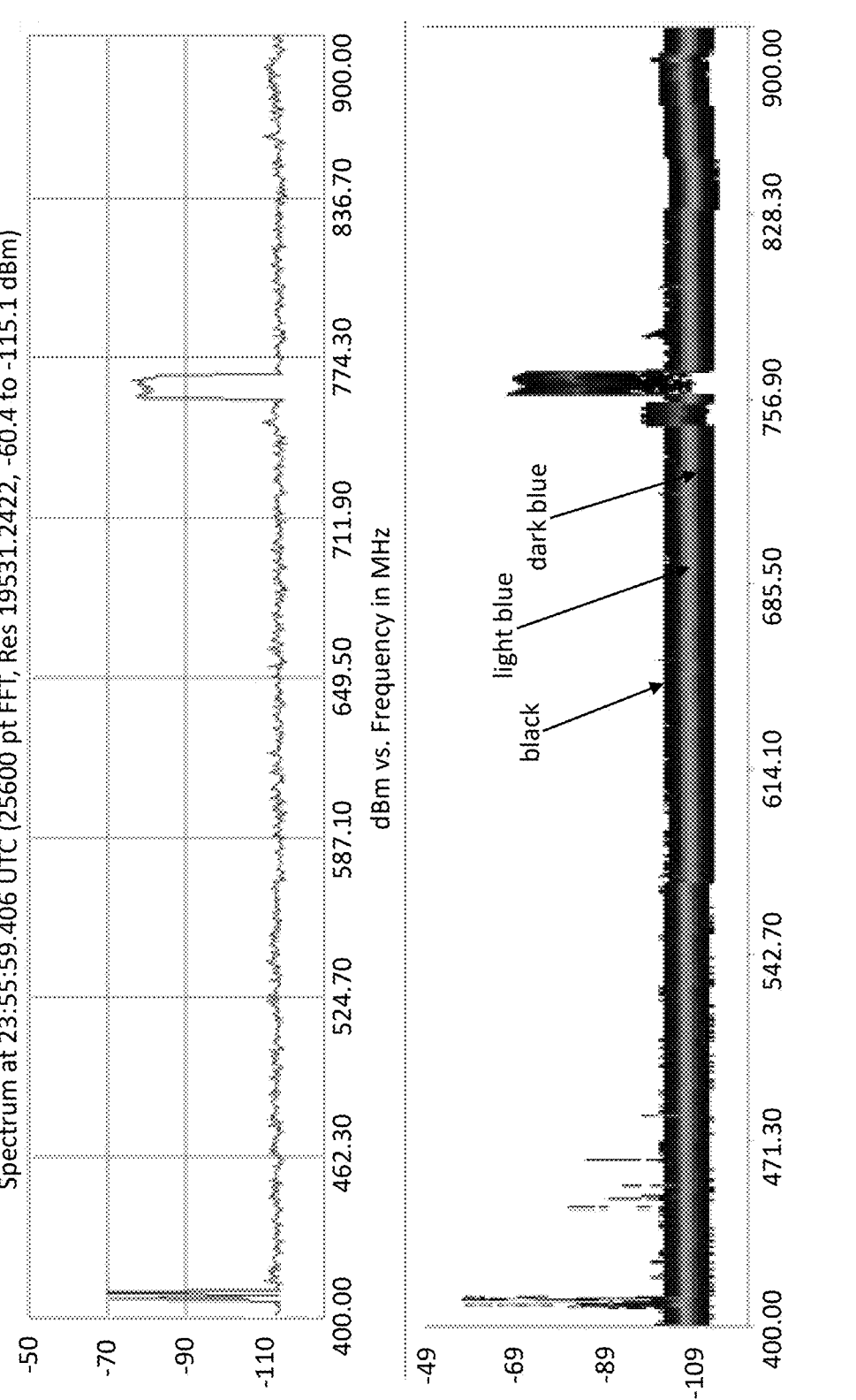
FIG. 40 illustrates a knowledge map obtained by a TFE process.

FIG. 40 illustrates a knowledge map obtained by a TFE process. The top window shows the result of real-time spectrum sweep of an environment. The bottom window shows a knowledge map, which color codes the values in each column (normal distribution) based on how often the power level of that frequency (column) has been at a particular level.

The TFE function monitors its operation and produces a "settled percent." The settled percent is the percentage of the values of the incoming FFT result set that the system has seen before. In this way, the system can know if it is ready to interpret the statistical data that it has obtained. Once it reaches a point where most of the FFT values have been seen before (99.95% or better), it can then perform an interpretation operation.

Figure 41:
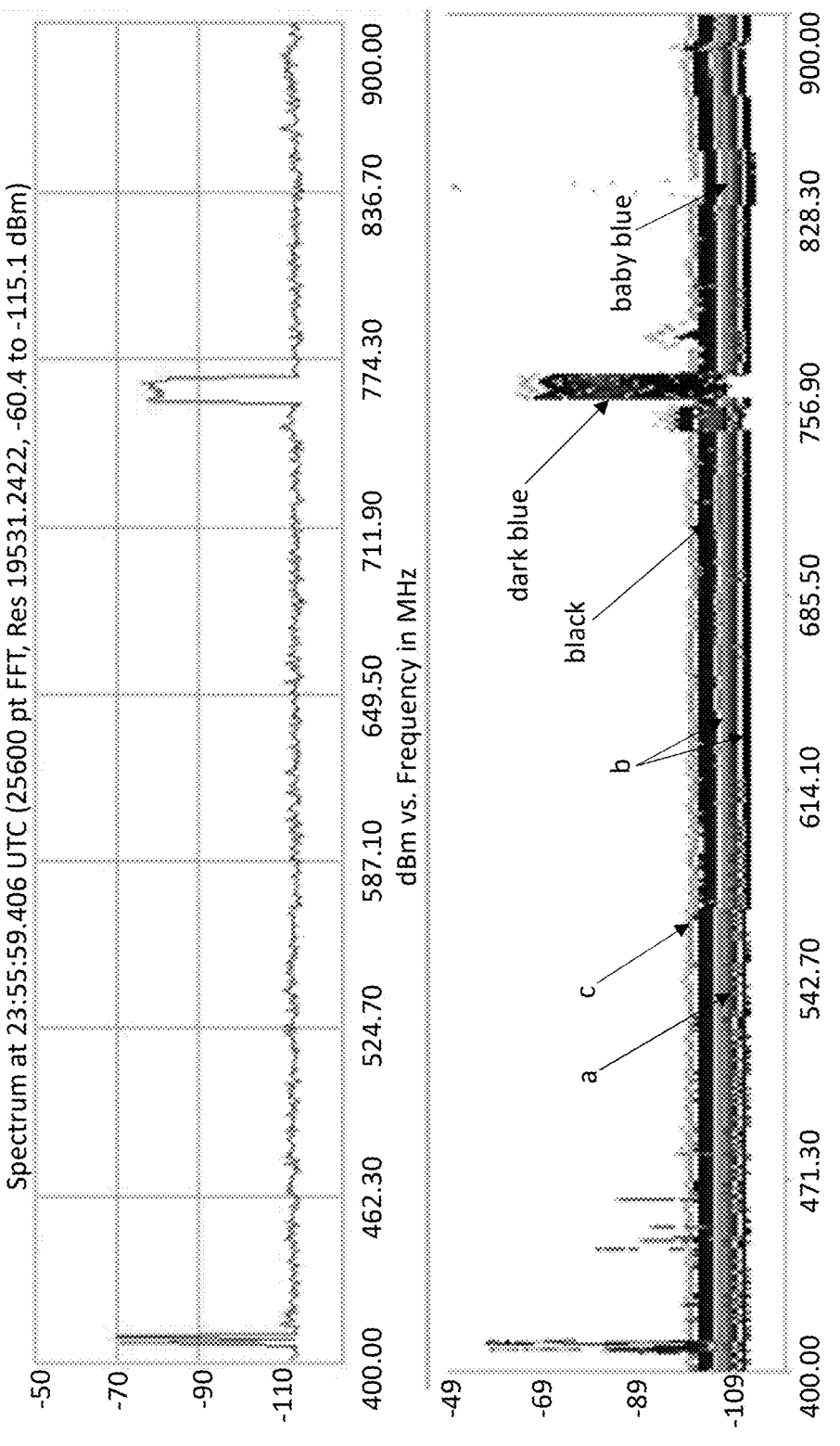
FIG. 41 illustrates an interpretation operation based on a knowledge map.

FIG. 41 illustrates an interpretation operation based on a knowledge map. During the interpretation operation, the system extracts valuable signal identification from the knowledge map. Some statistical quantities are identified. For each column, the power level at which a frequency is seen the most is determined (peak of the distribution curve), which is represented by the red line in FIG. 41. A desired percentage of power level values is located between the high and low boundaries of the power levels (shoulders of the curve), which are represented by white lines in FIG. 41. The desired percentage is adjustable. In FIG. 41, the desired percentage is set at 42% based on the learning data. In one embodiment, a statistical method is used to obtain a desirable percentage that provides the highest degree of "smoothness"—lowest deviation from column to column. Then, a profile is drawn based on the learning data, which represents the highest power level at which each frequency has been seen during learning. In FIG. 41, the profile is represented by the green line.

Figure 42:
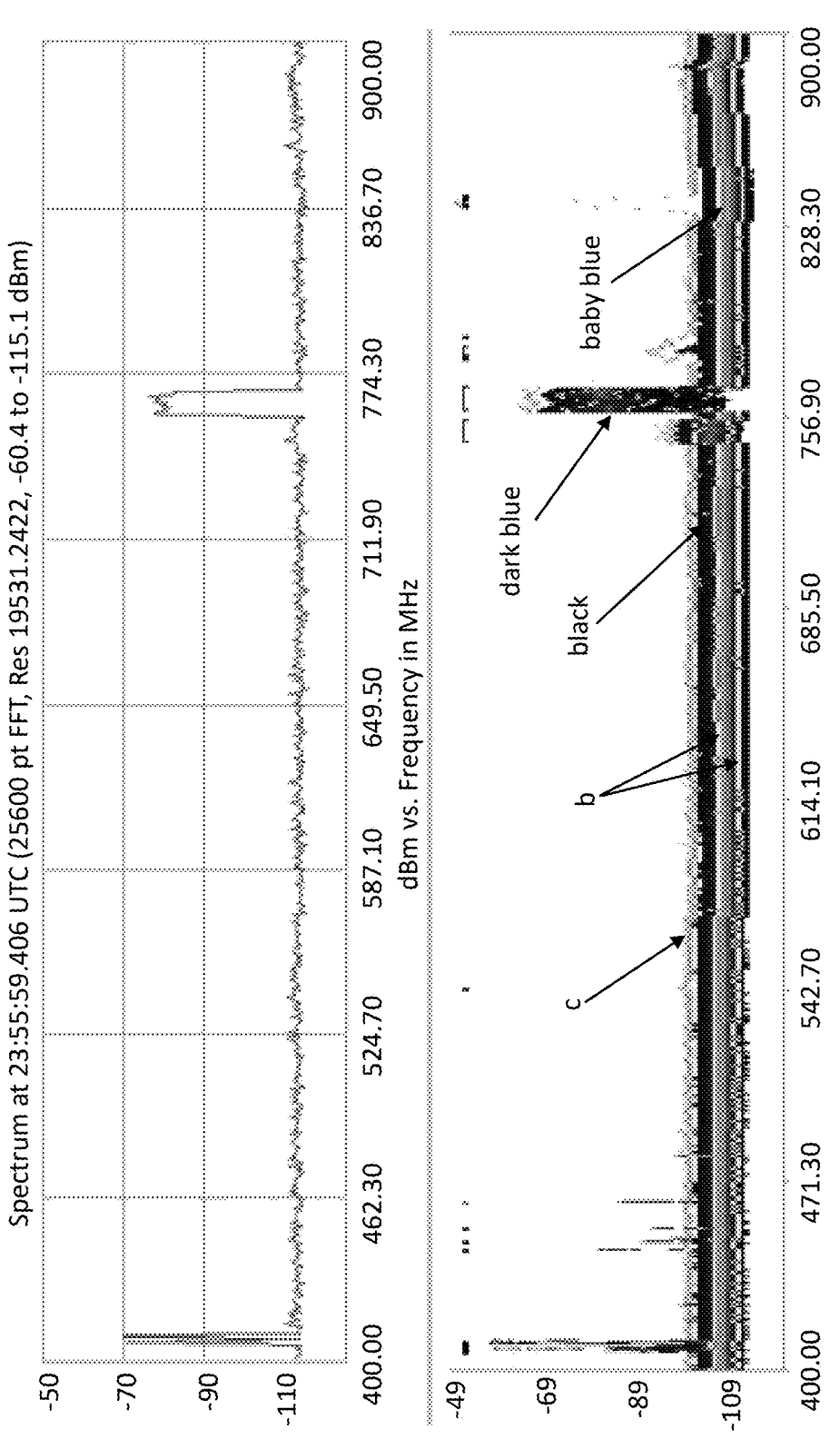
FIG. 42 shows the identification of signals, which are represented by the black brackets above the knowledge display.

Gradient detection is then applied to the profile to identify areas of transition. An algorithm continues to accumulate a gradient value as long as the "step" from the previous cell to this cell is always non-zero and the same direction. When it arrives at a zero or different direction step, it evaluates the accumulated difference to see if it is significant, and if so, considers it a gradient. A transition is identified by a continuous change (from left to right) that exceeds the average range between the high and low boundaries of power levels (the white lines). Positive and negative gradients are matched, and the resulting interval is identified as a signal. FIG. 42 shows the identification of signals, which are represented by the black brackets above the knowledge display.

Figure 43:
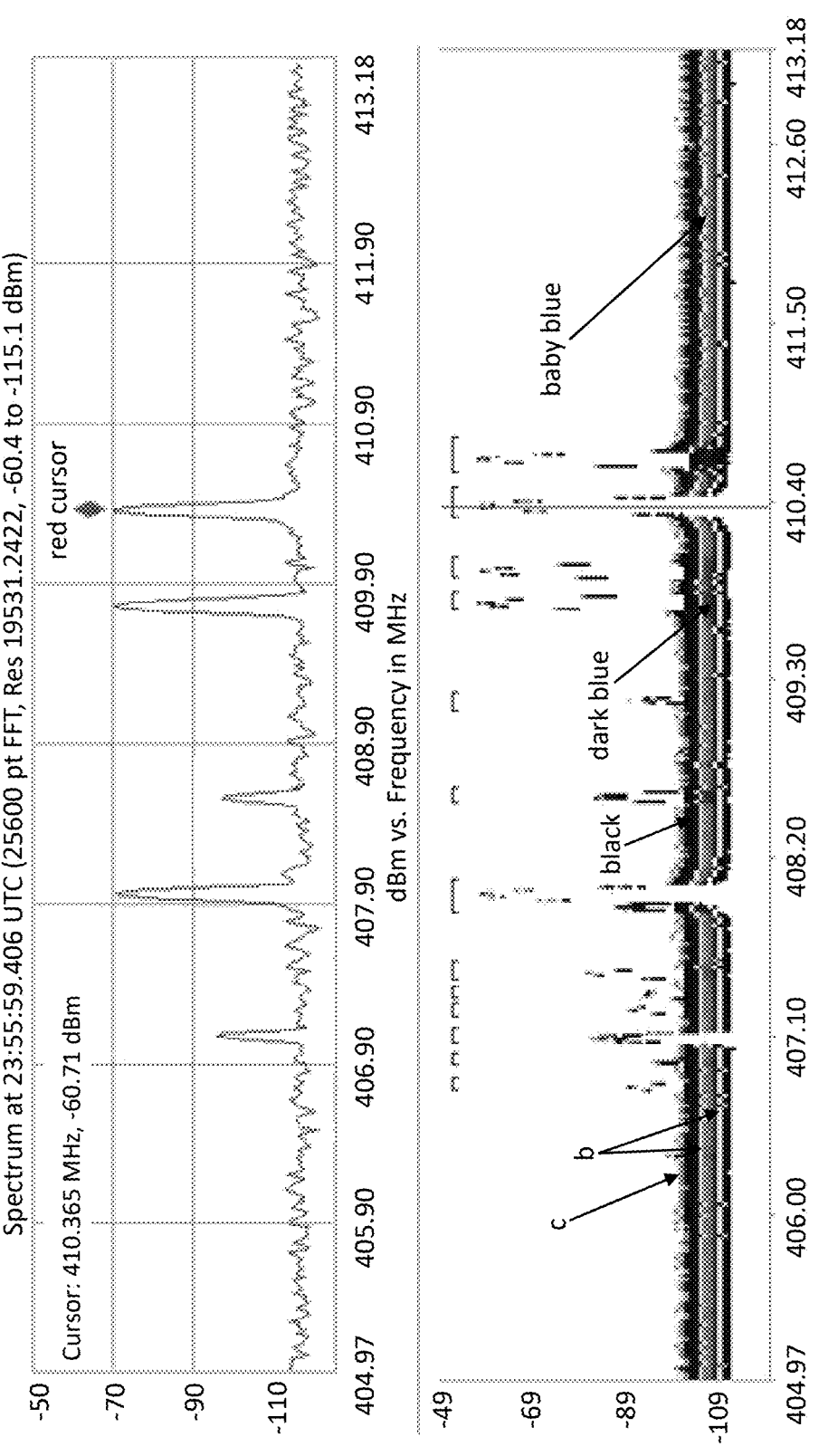
FIG. 43 shows more details of the narrow band signals at the left of the spectrum around 400 MHz in FIG. 42.

FIG. 43 shows more details of the narrow band signals at the left of the spectrum around 400 MHz in FIG. 42. The red cursor at 410.365 MHz in FIG. 43 points to a narrow band signal. The real-time spectrum sweep on the top window shows the narrow band signal, and the TFE process identifies the narrow band signal as well.

To a prior art receiver, the narrow band signal hidden within a wideband signal is not distinguishable or detectable. The systems and methods and devices of the present invention are operable to scan a wideband with high resolution or high definition to identify channel divisions within a wideband, and identify narrowband signals hidden within the wideband signal, which are not a part of the wideband signal itself, i.e., the narrow band signals are not part of the bundled channels within the wideband signal.

Figure 44:
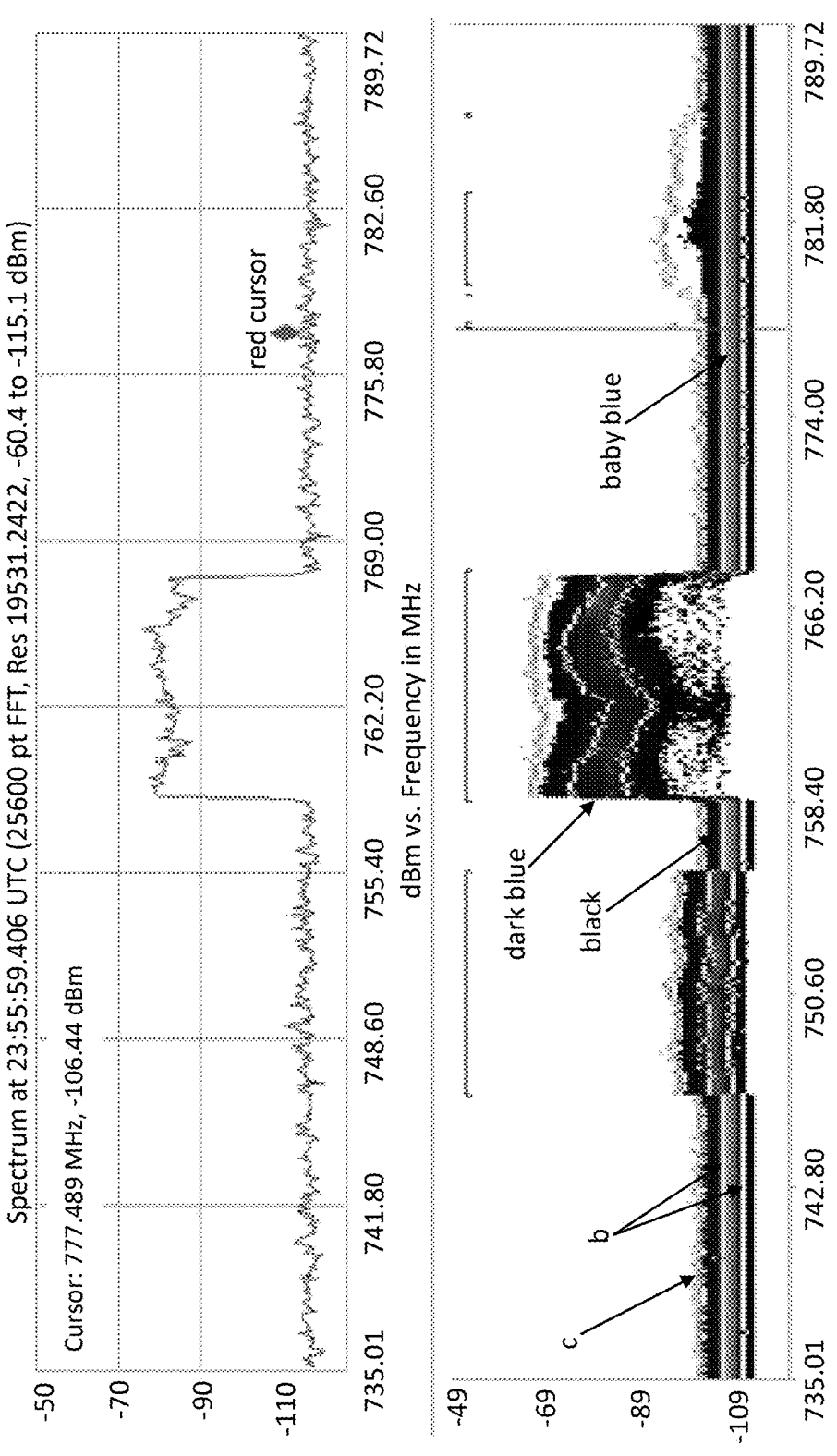
FIG. 44 shows more details of the wide band signals and narrow band signals between 735 MHz and 790 MHz in FIG. 42.

FIG. 44 shows more details of the two wide band signals around 750 MHz and a similar signal starting at 779 MHz. The present invention detects the most prominent parts of the signal starting at 779 MHz. The transmitters of these two wide band signals are actually in the distance, and normal signal detectors, which usually have a fixed threshold, are not able to pick up these two wide band signals but only see them as static noises. Because the TFE system in the present invention uses an aggregation of signal data over time, it can identify these signals and fine tune the ASD sensitivity of individual segments. Thus, the system in the present invention is able to detect signals that normal radio gear cannot. ASD in the present invention, is enhanced by the knowledge obtained by TFE and is now able to detect and record these signals where gradient detection alone would not have seen them. The threshold bar in the present invention is not fixed, but changeable.

Also, at the red cursor in FIG. 44 is a narrow band signal in the distance that normally would not be detected because of its low power at the point of observation. But, the present invention interprets knowledge gained over time and is able to identify that signal.

Figure 45:
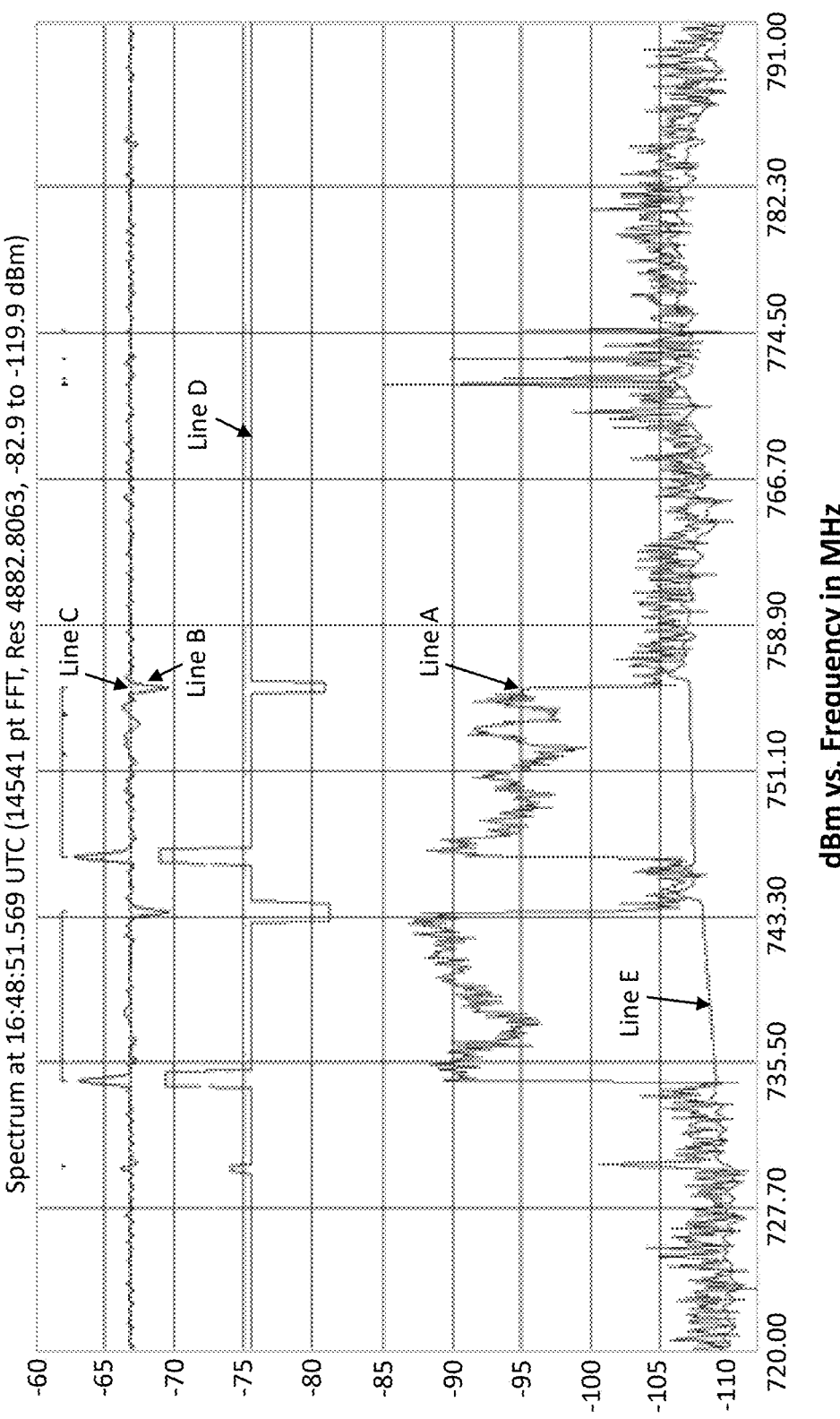
FIG. 45 illustrates an operation of the ASD in the present invention.

FIG. 45 illustrates the operation of the ASD in the present invention. The green line shows the spectrum data between 720 MHz and 791 MHz. $1^{st}$ and $2^{nd}$ derivatives of the power levels are calculated inside spectrum on a cell by cell basis, displayed as the overlapping blue and red lines at the top. The algorithm then picks the most prominent derivatives and performs a squaring function on them as displayed by the next red trace. The software then matches positive and negative gradients, to identify the edges of the signals, which are represented by the brackets on the top. Two wideband signals are identified, which may be CDMA, LTE, or other communication protocol used by mobile phones. The red line at the bottom is a baseline established by averaging the spectrum and removing areas identified by the gradients. At the two wideband signals, the red line is flat. By subtracting the baseline from the real spectrum data, groups of cells with average power above baseline are identified, and the averaging algorithm is run against those areas to apply the sensitivity measurement.

The ASD system has the ability to distinguish between large eruptions of energy that increase the baseline noise and the narrow band signals that could normally be swamped by the additional energy because it generates its baseline from the spectrum itself and looks for relative gradients rather than absolute power levels. This baseline is then subtracted from the original spectrum data, revealing the signals, as displayed by the brackets at the top of the screen. Note that the narrow-band signals are still being detected (tiny brackets at the top that look more like dots) even though there is a hump of noise super-imposed on them.

TFE is a learning process that augments the ASD feature in the present invention. The ASD system enhanced with TFE function in the present invention can automatically tune parameters based on a segmented basis, the sensitivity within an area is changeable. The TFE process accumulates small differences over time and signals become more and more apparent. In one embodiment, the TFE takes 40 samples per second over a 5-minute interval. The ASD system in the present invention is capable of distinguishing signals based on gradients from a complex and moving noise floor without a fixed threshold bar when collecting data from an environment.

The ASD system with TFE function in the present invention is unmanned and water resistant. It runs automatically 24/7, even submerged in water.

The TFE is also capable of detecting interferences and intrusions. In the normal environment, the TFE settles, interprets and identifies signals. Because it has a statistical knowledge of the RF landscape, it can tell the difference between a low power, wide band signal that it normally sees and a new higher power narrow band signal that may be an intruder. This is because it "scrubs" each of the FFT bins of each event that the ASD system detects against its knowledge base. When it detects that a particular group of bins in a signal from ASD falls outside the statistical range that those frequencies normally are observed, the system can raise an anomaly report. The TFE is capable of learning new knowledge, which is never seen before, from the signals identified by a normal detector. In one embodiment, a narrow band signal (e.g., a pit crew to car wireless signal) impinges on an LTE wideband signal, the narrow band signal may be right beside the wideband signal, or drift in and out of the wideband signal. On display, it just looks like an LTE wideband signal. For example, a narrow band signal with a bandwidth of 12 kHz or 25-30 kHz in a wideband signal with a bandwidth of 5 MHz over a 6 GHz spectrum just looks like a spike buried in the middle. But, because signals are characterized in real time against learned knowledge, the proposed ASD system with TFE function is able to pick out narrow band intruder immediately.

The present invention is able to detect a narrow band signal with a bandwidth from 1-2 kHz to 60 kHz inside a wideband signal (e.g., with a bandwidth of 5 MHz) across a 6 GHz spectrum. In FIGS. 40-45, the frequency resolution is 19.5 kHz, and a narrow band signal with a bandwidth of 2-3 kHz can be detected. The frequency resolution is based on the setting of the FFT result bin size.

Statistical learning techniques are used for extracting temporal feature, creating a statistical knowledge map of what each frequency is and determining variations and thresholds and etc. The ASD system with TFE function in the present invention is capable of identifying, demodulating and decoding signals, both wideband and narrowband with high energy.

If a narrowband signal is close to the end of wideband LTE signal, the wideband LTE signal is distorted at the edge. If multiple narrowband signals are within a wideband signal, the top edge of the wideband signal is ragged as the narrow band signal is hidden within the wide band signal. If one narrow band signal is in the middle of a wideband signal, the narrow band signal is usually interpreted as a cell within the wideband signal. However, the ASD system with TFE function in the present invention learns power levels in a spectrum section over time, and is able to recognize the narrow band signal immediately.

The present invention is operable to log the result, display on a channel screen, notify operator and send alarms, etc. The present invention auto records spectrum, but does not record all the time. When a problem is identified, relevant information is auto recorded in high definition.

The ASD system with TFE in the present invention is used for spectrum management. The system in the present invention is set up in a normal environment and starts learning and stores at least one learning map in it. The learning function of the ASD system in the present invention can be enabled and disabled. When the ASD system is exposed to a stable environment and has learned what is normal in the environment, it will stop its learning process. The environment is periodically reevaluated. The learning map is updated at a predetermined timeframe. After a problem is detected, the learning map will also be updated.

The ASD system in the present invention can be deployed in stadiums, ports, airports, or on borders. In one embodiment, the ASD system learns and stores the knowledge in that environment. In another embodiment, the ASD system downloads prior knowledge and immediately displays it. In another embodiment, an ASD device can learn from other ASD devices globally.

In operation, the ASD system then collects real time data and compares to the learning map stored for signal identification. Signals identified by the ASD system with TFE function may be determined to be an error by an operator. In that situation, an operator can manually edit or erase the error, essentially "coaching" the learning system.

The systems and devices in the present invention create a channel plan based on user input, or external databases, and look for signals that are not there. Temporal Feature Extraction not only can define a channel plan based on what it learns from the environment, but it also "scrubs" each spectrum pass against the knowledge it has learned. This allows it to not only identify signals that violate a prescribed channel plan, but it can also discern the difference between a current signal, and the signal that it has previously seen in that frequency location. If there is a narrow band interference signal where there typically is a wide band signal, the system will identify it as an anomaly because it does not match the pattern of what is usually in that space.

The device in the present invention is designed to be autonomous. It learns from the environment, and, without operator intervention, can detect anomalous signals that either were not there before, or have changed in power or bandwidth. Once detected, the device can send alerts by text or email and begin high resolution spectrum capture, or IQ capture of the signal of interest.

FIG. 40 illustrates an environment in which the device is learning. There are some obvious signals, but there is also a very low level wide band signal between 746 MHz and 755 MHz. Typical threshold-oriented systems would not catch this. But, the TFE system takes a broader view over time. The signal does not have to be there all the time or be pronounced to be detected by the system. Each time it appears in the spectrum serves to reinforce the impression on the learning fabric. These impressions are then interpreted and characterized as signals.

FIG. 43 shows the knowledge map that the device has acquired during its learning system, and shows brackets above what it has determined are signals. Note that the device has determined these signals on its own without any user intervention, or any input from any databases. It is a simple thing to then further categorize the signals by matching against databases, but what sets the device in the present invention apart is that, like its human counterpart, it has the ability to draw its own conclusions based on what it has seen.

FIG. 44 shows a signal identified by the device in the present invention between 746 MHz and 755 MHz with low power levels. It is clear to see that, although the signal is barely distinguishable from the background noise, TFE clearly has identified its edges. Over to the far right is a similar signal that is further away so that it only presents traces of itself. But again, because the device in the present invention is trained to distinguish random and coherent energy patterns over time, it can clearly pick out the pattern of a signal. Just to the left of that faint signal was a transient narrow band signal at 777.653 MHz. This signal is only present for a brief period of time during the training, typically 0.5-0.7 seconds each instance, separated by minutes of silence, yet the device does not miss it, remembers those instances and categorizes them as a narrow band signal.

The identification and classification algorithms that the system uses to identify Temporal Features are optimized to be used in real time. Notice that, even though only fragments of the low level wide band signal are detected on each sweep, the system still matches them with the signal that it had identified during its learning phase.

Also as the system is running, it is scrubbing each spectral sweep against its knowledge map. When it finds coherent bundles of energy that are either in places that are usually quiet, or have higher power or bandwidth than it has seen before, it can automatically send up a red flag. Since the system is doing this in Real Time, it has critical relevance to those in harm's way—the first responder, or the war fighter who absolutely must have clear channels of communication or instant situational awareness of eminent threats. It's one thing to geolocate a signal that the user has identified. It's an entirely different dimension when the system can identify the signal on its own before the user even realizes it's there. Because the device in the present invention can pick out these signals with a sensitivity that is far superior to a simple threshold system, the threat does not have to present an obvious presence to be detected and alerted.

Devices in prior art merely make it easy for a person to analyze spectral data, both in real time and historically, locally or remotely. But the device in the present invention operates as an extension of the person, performing the learning and analysis on its own, and even finding things that a human typically may miss.

The device in the present invention can easily capture signal identifications, match them to databases, store and upload historical data. Moreover, the device has intelligence and the ability to be more than a simple data storage and retrieval device. The device is a watchful eye in an RF environment, and a partner to an operator who is trying to manage, analyze, understand and operate in the RF environment.

Geolocation

The prior art is dependent upon a synchronized receiver for power, phase, frequency, angle, and time of arrival, and an accurate clock for timing, and significantly, requires three devices to be used, wherein all are synchronized and include directional antennae to identify a signal with the highest power. Advantageously, the present invention does not require synchronization of receivers in a multiplicity of devices to provide geolocation of at least one apparatus unit or device or at least one signal, thereby reducing cost and improving functionality of each of the at least one apparatus in the systems described hereinabove for the present invention. Also, the present invention provides for larger frequency range analysis, and provides database(s) for capturing events, patterns, times, power, phase, frequency, angle, and combinations for the at least one signal of interest in the RF spectrum. The present invention provides for better measurements and data of signal(s) with respect to time, frequency with respect to time, power with respect to time, geolocation, and combinations thereof. In preferred embodiments of the at least one apparatus unit of the present invention, geolocation is provided automatically by the apparatus unit using at least one anchor point embedded within the system, by power measurements and transmission that provide for "known" environments of data. The known environments of data include measurements from the at least one anchorpoint that characterize the RF receiver of the apparatus unit or device. The known environments of data include a database including information from the FCC database and/or user-defined database, wherein the information from the FCC database includes at least maximum power based upon frequency, protocol, device type, and combinations thereof. With the geolocation function of the present invention, there is no requirement to synchronize receivers as with the prior art; the at least one anchorpoint and location of an apparatus unit provide the required information to automatically adjust to a first anchorpoint or to a second anchorpoint in the case of at least two anchorpoints, if the second anchorpoint is easier to adopt. The known environment data provide for expected spectrum and signal behavior as the reference point for the geolocation. Each apparatus unit or device includes at least one receiver for receiving RF spectrum and location information as described hereinabove. In the case of one receiver, it is operable with and switchable between antennae for receiving RF spectrum data and location data; in the case of two receivers, preferably each of the two receivers are housed within the apparatus unit or device. A frequency lock loop is used to determine if a signal is moving, by determining if there is a Doppler change for signals detected.

Location determination for geolocation is provided by determining a point (x, y) or Lat Lon from the at least three anchor locations (x1, y1); (x2, y2); (x3, y3) and signal measurements at either of the node or anchors. Signal measurements provide a system of non-linear equations that must be solved for (x, y) mathematically; and the measurements provide a set of geometric shapes which intersect at the node location for providing determination of the node.

For trilateration methods for providing observations to distances the following methods are used:

$$RSS = d = d_0 10^{\left(\frac{P_0 - P_r}{10n}\right)}$$

wherein $d_o$ is the reference distance derived from the reference transmitter and signal characteristics (e.g., frequency, power, duration, bandwidth, etc.); $P_o$ is the power received at the reference distance; $P_r$ is the observed received power; and n is the path loss exponent; and Distance from observations is related to the positions by the following equations:

$$d_1 = \left(\sqrt{(x - x_1)^2 + (y - y_1)^2}\right)$$

$$d_2 = \left(\sqrt{(x - x_2)^2 + (y - y_2)^2}\right)$$

$$d_3 = \left(\sqrt{(x - x_3)^2 + (y - y_3)^2}\right)$$

Also, in another embodiment of the present invention, a geolocation application software operable on a computer device or on a mobile communications device, such as by way of example and not limitation, a smartphone, is provided. Method steps are illustrated in the flow diagram shown in FIG. 46, including starting a geolocation app; calling active devices via a connection broker; opening spectrum display application; selecting at least one signal to geolocate; selecting at least three devices (or apparatus unit of the present invention) within a location or region, verifying that the devices or apparatus units are synchronized to a receiver to be geolocated; perform signal detection (as described hereinabove) and include center frequency, bandwidth, peak power, channel power, and duration; identify modulation of protocol type, obtain maximum, median, minimum and expected power; calculating distance based on selected propagation model; calculating distance based on one (1) meter path loss; calculating distance based on one (1) meter path loss model; calculating distance based on one (1) meter path loss model; perform circle transformations for each location; checking if RF propagation distances form circles that are fully enclosed; checking if RF propagation form circles that do not intersect; performing trilateration of devices; deriving z component to convert back to known GPS Lat Lon (latitude and longitude) coordinate; and making coordinates and set point as emitter location on mapping software to indicate the geolocation.

Figure 46:
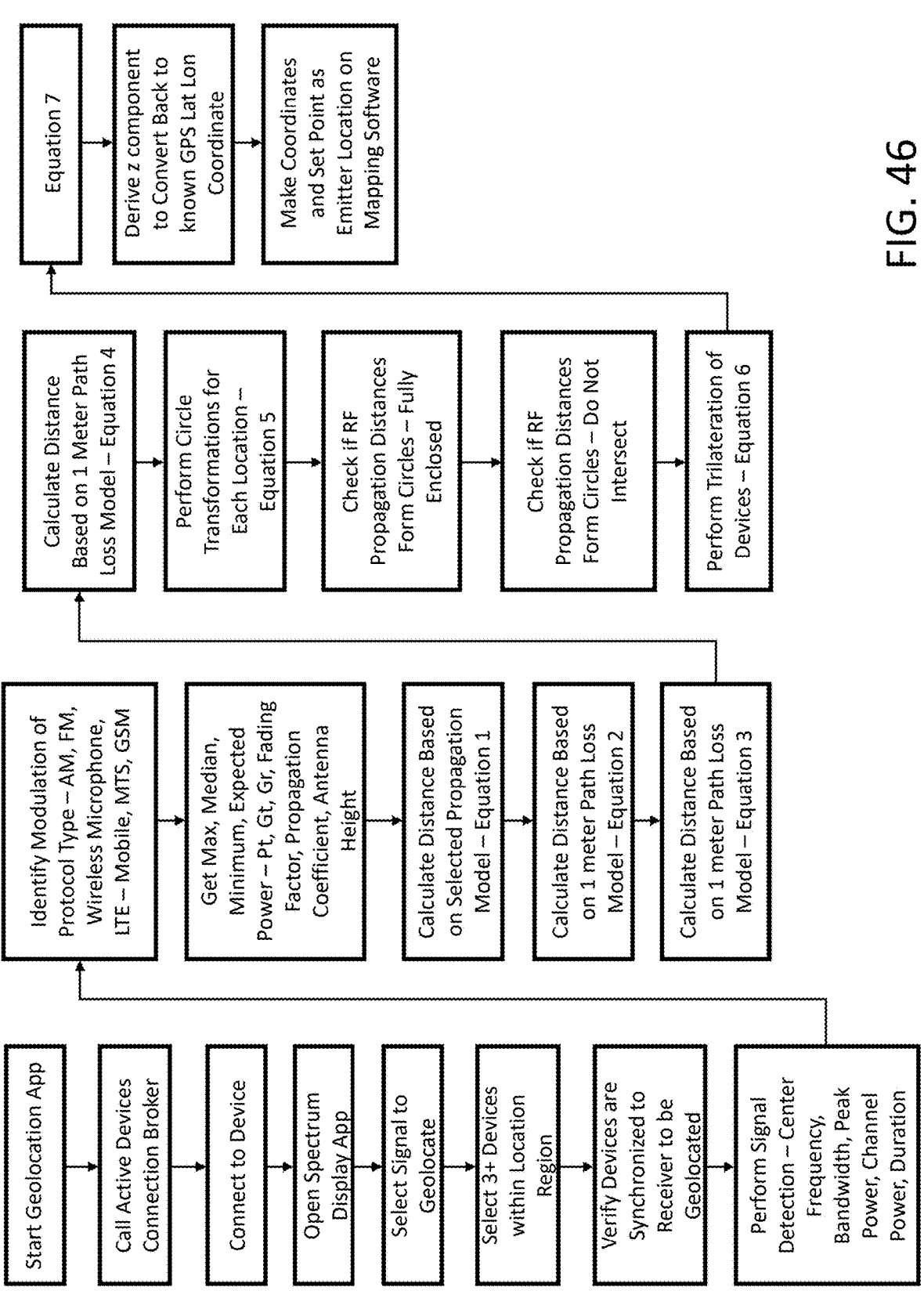
FIG. 46 provides a flow diagram for geolocation in the present invention.

The equations referenced in FIG. 46 are provided hereinbelow:

Equation 1 for calculating distance based on selected propagation model:

$$PLossExponent = (\text{Parameter C} - 6.55 * \log10(\text{BS\_AntHeight}))/10$$

$$MS\_AntGainFunc = 3.2 * (\log10(11.75 * MS\_AntHeight))^2 - 4.97$$

$$\text{Constant (C)} = ParameterA + ParameterB * \log10(\text{Frequency}) -$$

$$13.82 * \log10(\text{BS\_AntHeight}) - MS\_AntGainFunc$$

$$DistanceRange = 10^{((PLoss - PLossConstant)/10 * PLossExponent))}$$

Equation 2 for calculating distance based on 1 meter Path Loss Model (first device):

$$d_0 = 1; k = PLossExponent; PL\_d = Pt + Gt - RSSI - TotalMargin$$

$$PL\_0 = 32.44 + 10 * k * \log10(d_0) + 10 * k * \log10(\text{Frequency})$$

$$D = d_0 * \left(10^{((PL\_d - PL\_0)/(10k))}\right)$$

Equation 3: (same as equation 2) for second device
Equation 4: (same as equation 2) for third device
Equation 5: Perform circle transformations for each location (x, y, z) Distance d; Verify $A^T A = 0$; where A={matrix of locations 1–N} in relation to distance; if not, then perform circle transformation check
Equation 6: Perform trilateration of devices if more than three (3) devices aggregation and trilaterate by device; set circles to zero origin and solve from y=Ax where y=[x, y] locations $$\begin{bmatrix} x \\ y \end{bmatrix} = \begin{bmatrix} 2(x_a - x_c) & 2(y_a - y_c) \\ 2(x_b - x_c) & 2(y_b - y_c) \end{bmatrix}^{-1} \begin{bmatrix} x_a^2 - x_c^2 + y_a^2 - y_c^2 + d_c^2 - d_a^2 \\ x_b^2 - x_c^2 + y_b^2 - y_c^2 + d_c^2 - d_b^2 \end{bmatrix} \quad \text{Equation 7}$$

Note that check if RF propagation distances form circles where one or more circles are Fully Enclosed if it is based upon Mod Type and Power Measured, then Set Distance 1 of enclosed circle to Distance 2 minus the distance between the two points. Also, next, check to see if some of the RF Propagation Distances Form Circles, if they do not intersect, then if so based on Mod type and Max RF power Set Distance to each circle to Distance of Circle+(Distance between circle points–Sum of the Distances)/2 is used. Note that deriving z component to convert back to known GPS lat lon coordinate is provided by: $z = \text{sqrt}(\text{Dist}^2 - x^2 - y^2)$.

Accounting for unknowns using Differential Received Signal Strength (DRSS) is provided by the following equation when reference or transmit power is unknown:

$$\frac{d_i}{d_j} = 10^{\left(\frac{P_{r_j} - P_{r_i}}{10n}\right)}$$

And where signal strength measurements in dBm are provided by the following:

$$P_{r_2}(dBm) - P_{r_1}(dBm) =$$

$$10n\log_{10}\left(\sqrt{(x-x_1)^2 + (y-y_1)^2}\right) - 10n\log_{10}\left(\sqrt{(x-x_2)^2 + (y-y_2)^2}\right)$$

$$P_{r_3}(dBm) - P_{r_1}(dBm) =$$

$$10n\log_{10}\left(\sqrt{(x-x_1)^2 + (y-y_1)^2}\right) - 10n\log_{10}\left(\sqrt{(x-x_3)^2 + (y-y_3)^2}\right)$$

$$P_{r_2}(dBm) - P_{r_3}(dBm) =$$

$$10n\log_{10}\left(\sqrt{(x-x_3)^2 + (y-y_3)^2}\right) - 10n\log_{10}\left(\sqrt{(x-x_2)^2 + (y-y_2)^2}\right)$$

For geolocation systems and methods of the present invention, preferably two or more devices or units are used to provide nodes. More preferably, three devices or units are used together or "joined" to achieve the geolocation results. Also preferably, at least three devices or units are provided. Software is provided and operable to enable a network-based method for transferring data between or among the at least two device or units, or more preferably at least three nodes, a database is provided having a database structure to receive input from the nodes (transferred data), and at least one processor coupled with memory to act on the database for performing calculations, transforming measured data and storing the measured data and statistical data associated with it; the database structure is further designed, constructed and configured to derive the geolocation of nodes from saved data and/or from real-time data that is measured by the units; also, the database and application of systems and methods of the present invention provide for geolocation of more than one node at a time. Additionally, software is operable to generate a visual representation of the geolocation of the nodes as a point on a map location.

Errors in measurements due to imperfect knowledge of the transmit power or antenna gain, measurement error due to signal fading (multipath), interference, thermal noise, no line of sight (NLOS) propagation error (shadowing effect), and/or unknown propagation model, are overcome using differential RSS measurements, which eliminate the need for transmit power knowledge, and can incorporate TDOA and FDOA techniques to help improve measurements. The systems and methods of the present invention are further operable to use statistical approximations to remove error causes from noise, timing and power measurements, multipath, and NLOS measurements. By way of example, the following methods are used for geolocation statistical approximations and variances: maximum likelihood (nearest neighbor or Kalman filter); least squares approximation; Bayesian filter if prior knowledge data is included; and the like. Also, TDOA and FDOA equations are derived to help solve inconsistencies in distance calculations. Several methods or combinations of these methods may be used with the present invention, since geolocation will be performed in different environments, including but not limited to indoor environments, outdoor environments, hybrid (stadium) environments, inner city environments, etc.

In recent years, demand for real-time information has increased exponentially. Consumers have embraced social media applications and there are now more mobile subscriptions than people on the planet. Studies show that a typical mobile device experiences an average of 10 network interactions per minute (e.g., Facebook push, Twitter download). For example, Facebook on its own is driving 1 billion updates per minute. Rabid consumer demand, combined with the growing needs of government and industry (e.g., 2-way, trunked, IoT), translates into more wireless activities over wider frequency ranges. The activities are often intermittent with short durations of only a few hundred milliseconds. Social media applications and other cellular activities (e.g., background refresh) are even shorter in duration. Until now, the magnitude of activity has been impossible to keep track of and even harder to gain intelligence from.

The present invention provides systems and methods for unmanned vehicle recognition. The present invention relates to automatic signal detection, temporal feature extraction, geolocation, and edge processing disclosed in U.S. patent application Ser. No. 15/412,982 filed Jan. 23, 2017, U.S. patent application Ser. No. 15/681,521 filed Aug. 21, 2017, U.S. patent application Ser. No. 15/681,540 filed Aug. 21, 2017, U.S. patent application Ser. No. 15/681,558 filed Aug. 21, 2017, each of which is incorporated herein by reference in their entirety.

In one embodiment of the present invention, automatic signal detection in an RF environment is based on power distribution by frequency over time (PDFT), including the first derivative and the second derivative values. A PDFT processor is provided for automatic signal detection.

In one embodiment, the PDFT processor increments power values in a 2-Dimensional (2D) array from a frequency spectrum over a set length of time. The length of time is user-settable. For example, the length of time can be set at 5 minutes, 1 hour, or 1 day. The length of time can be set as low as 1 second. Typically, the smallest time interval for setting the environment is 5 seconds. A histogram with frequency as the horizontal axis and power as the vertical axis can be used to describe power values across a spectrum during a certain period of time, which is called the Power Bin Occurrence (PBO).

In one embodiment, power levels are collected for a specified length of time, and statistical calculations are performed on the PBO to obtain the power distribution by frequency for a certain time segment (PDFT). The statistical calculations create baseline signals and identify what is normal in an RF environment, and what are changes to the RF environment. PBO data is constantly updated and compared to baseline to detect anything unique in the RF environment.

The PDFT collects power values and describes the RF environment with collected power values by frequency collected over the time range of the collection. For example, the PDFT processor learns what should be present in the RF environment in a certain area during the time segment from 3 pm to 5 pm. If there is a deviation from historical information, the PDFT processor is configured to send an alarm to operators.

In one embodiment, PBO is used to populate a 3-Dimensional (3D) array and create the Second Order Power Bin Occurrence (SOPBO). The time segment of the PBO is a factor of the length of the SOPBO time segment. The first two dimensions are the same as in PBO, but the third dimension in SOPBO describes how often the corresponding frequency bin and power bin is populated over the SOPBO time segment. The result can be described as a collection of several 2D histograms across a percent of occurrence bins such that each histogram represents a different frequency bin and power bin combination. This provides a percentage of utilization of the frequency for non-constant signals such as RADAR, asynchronous data on demand links or push-to-talk voice.

In one embodiment, the PBO, PDFT, and SOPBO data sets are used for signal detection. For example, statistical calculations of PBOs during a certain time segment are used along with a set of detection parameters to identify possible signals. A frequency-dependent noise floor is calculated by taking the spectral mean from the PDFT data and applying a type of median filter over subsets of frequency. For example, but not for limitation, detection parameters include known signals, basic characteristics, databases of telecom signals, and etc. For example, but not for limitation, median filter types include Standard Median Filter (MF), Weighted Median Filter (WMF), Adaptive Median Filter (AMF) and Decision Based Median Filter (DBMF). The noise floor is then assessed for large changes in power, which indicates the noise floor values are following the curvature of possible signals. At these frequencies, the noise floor is adjusted to adjacent values. Power values below the noise floor are ignored in the rest of the signal detection process. To detect signals, the first derivative is calculated from a smoothed PDFT frequency spectrum. Derivative values exceeding a threshold set based on the detection parameters are matched to nearby values along the frequency spectrum that are equal and opposite within a small uncertainty level. Once frequency edges are found, power values are used to further classify signals. The whole process including the noise floor calculation is repeated for different time segments. The detection parameters are adjusted over time based on signals found or not found, allowing the signal detection process to develop as the PDFT processor runs.

The first derivative of the FFT data is used to detect signals, measure power, frequency and bandwidths of detected signals, determine noise floor and variations, and classify detected signals (e.g., wideband signals, narrowband signals). The second derivative of the FFT data is used to calculate velocity (i.e., change of power) and acceleration (i.e., rate of change of power), and identify movements based on changes and/or doppler effect. For example, the second derivative of the FFT data in an RF environment can be used to determine if a signal emitting device is near road or moving with a car. A SOPBO is the second derivative (i.e., a rate of change of power). The second derivative shows if a signal varies over time. In one embodiment, the power level of the signal varies over time. For example, a simplex network has base station signals transmitting at certain time segments and mobile signals in a different time segment. The SOPBO can catch the mobile signals while the first order PBO cannot. For signals that vary in time such as Time Division Duplex (TDD) LTE or a Radar, SOPBO is important.

Figure 47:
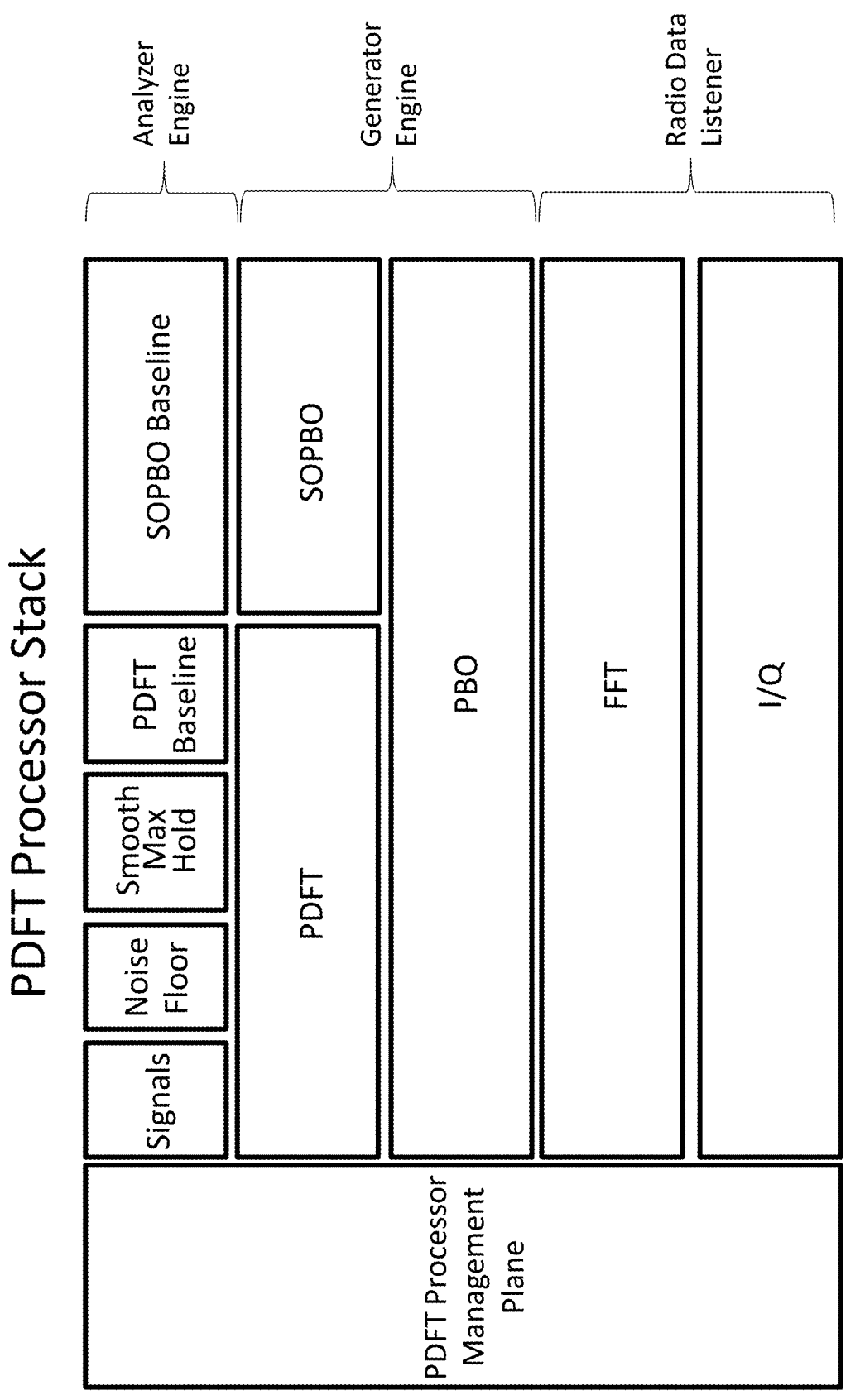
FIG. 47 illustrates a configuration of a PDFT processor according to one embodiment of the present invention.

FIG. 47 illustrates a configuration of a PDFT processor according to one embodiment of the present invention. In one embodiment, a PDFT processor for automatic signal detection comprises a management plane, at least one RF receiver, a generator engine, and an analyzer engine. The management plane is operable to configure, monitor and manage job functions of the PDFT processor. The at least one RF receiver is operable to receive RF data, generate I/Q data based on the received RF data, and perform FFT analysis. The generator engine is configured to perform a PBO process, and generate PDFT data and SOPBO data based on PBO data. The analyzer engine is configured to calculate noise floor, smooth max hold, generate a PDFT baseline, and identify signals. The smooth max hold function is a curve fitting process with a partial differential equation to provide a running average across adjacent points to reject impulse noise that can be present in the FFT data. The analyzer engine is further configured to calculate a SOPBO baseline based on the SOPBO data.

Figure 48:
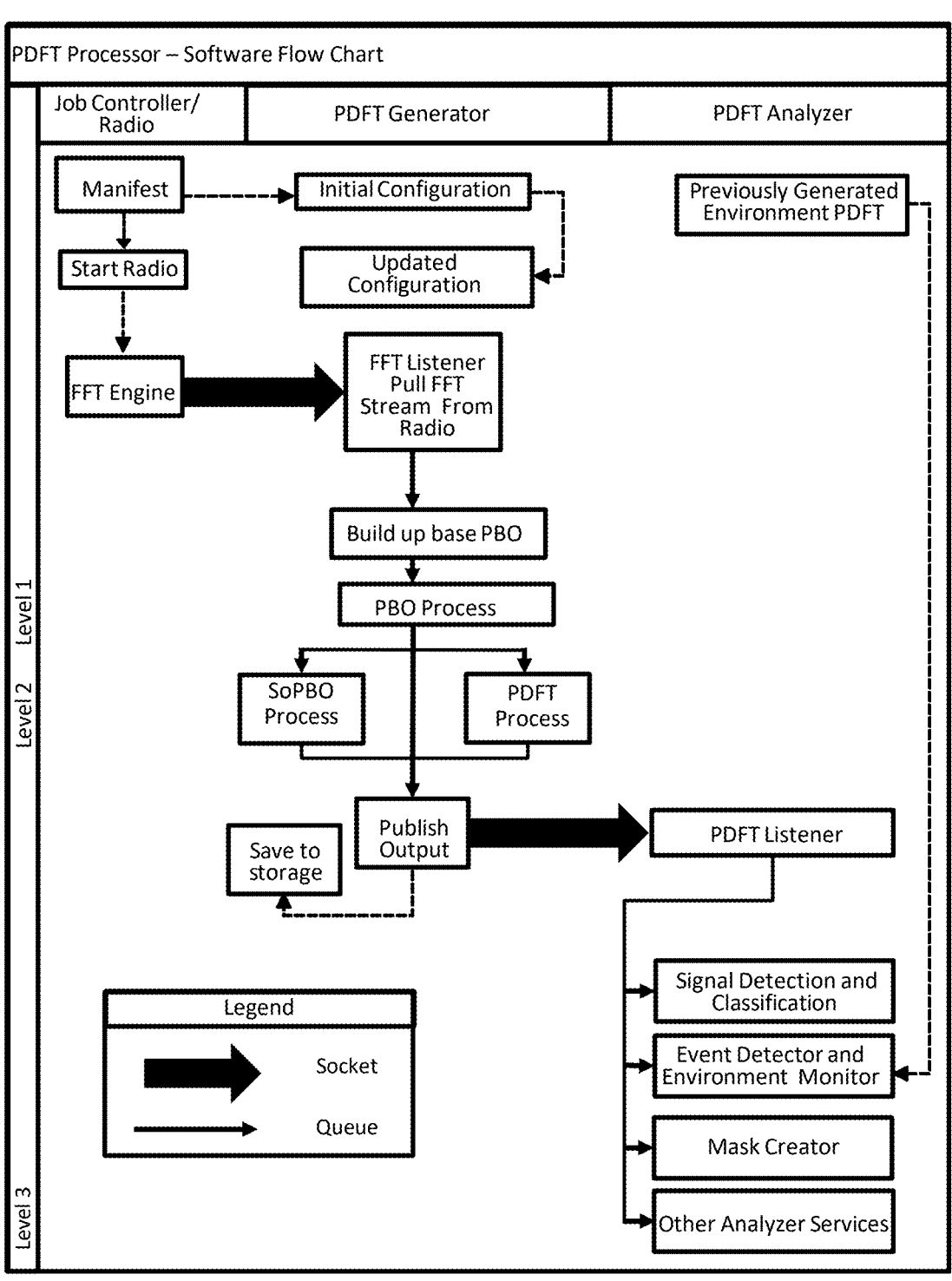
FIG. 48 is a flow chart for data processing in a PDFT processor according to one embodiment of the present invention.

FIG. 48 is a flow chart for data processing in a PDFT processor according to one embodiment of the present invention. A job manifest is created for initial configuration of a PDFT generator engine or updating the configuration of the PDFT generator engine. The job manifest also starts an RF receiver to receive radio data from an RF environment. The received radio data is transmitted to an FFT engine for FFT analysis. The PDFT generator engine pulls FFT data stream from the FFT engine to build up a based PBO and run a PBO process continuously. An SOPBO process and a PDFT process are performed based on PBO data. SOPBO data from the SOPBO process and PDFT data from the PDFT process is published and saved to storage. The data from the PDFT generator engine is transmitted to an PDFT analyzer engine for analytics including signal detection and classification, event detection and environment monitoring, mask creation, and other analyzer services.

Figure 49:
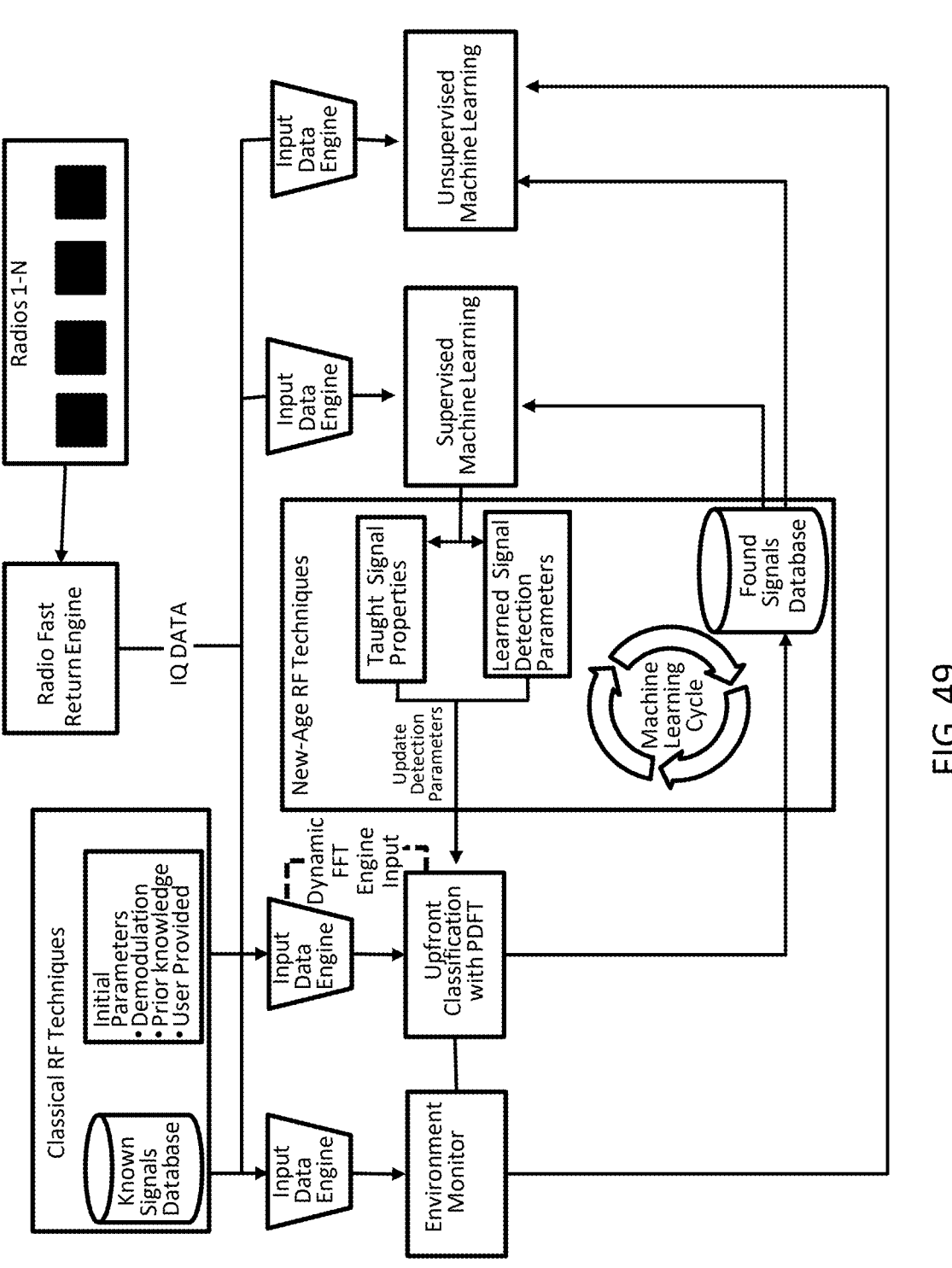
FIG. 49 illustrates data analytics in an analyzer engine according to one embodiment of the present invention.

FIG. 49 illustrates data analytics in an analyzer engine according to one embodiment of the present invention. Classical RF techniques and new RF techniques are combined to perform data analytics including environment monitoring and signal classification. Classical RF techniques are based on known signals and initial parameters including demodulation parameters, prior knowledge parameters, and user provided parameters. New RF techniques use machine learning to learn signal detection parameters and signal properties to update detection parameters for signal classification. New signals are found and used to update learned signal detection parameters and taught signal properties based on supervised and unsupervised machine learning.

Figure 50:
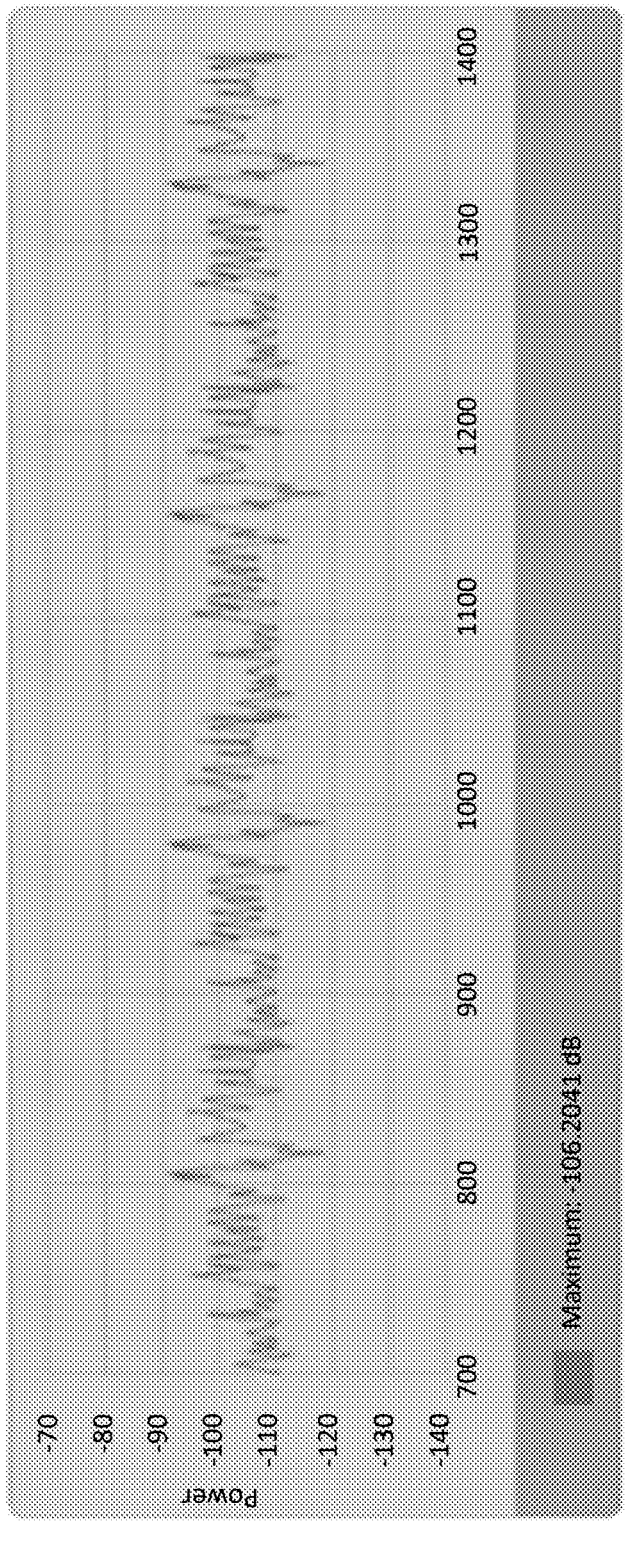
FIG. 50 illustrates a mask according to one embodiment of the present invention.

In one embodiment, the automatic signal detection process includes mask creation and environment analysis using masks. Mask creation is a process of elaborating a representation of an RF environment by analyzing a spectrum of signals over a certain period of time. A desired frequency range is entered by a user to create a mask, and FFT streaming data is also used in the mask creation process. A first derivative is calculated and used for identifying maximum power values. A moving average value is created as FFT data is received during a time period selected by the user for mask creation. For example, the time period is 10 seconds. The result is an FFT array with an average of maximum power values, which is called a mask. FIG. 50 illustrates a mask according to one embodiment of the present invention.

In one embodiment, the mask is used for environment analysis. In one embodiment, the mask is used for identifying potential unwanted signals in an RF environment.

Each mask has an analysis time. During its analysis time, a mask is scanned and live FFT streaming data is compared against the mask before next mask arrives. If a value is detected over the mask range, a trigger analysis is performed. Each mask has a set of trigger conditions, and an alarm is triggered into the system if the trigger conditions are met. In one embodiment, there are three main trigger conditions including alarm duration, dB offset, and count. The alarm duration is a time window an alarm needs to appear to be considered as one. For example, the time window is 2 seconds. If a signal is seen for 2 seconds, it passes to the next condition. The dB offset is the dB value a signal needs to be above the mask to be considered as a potential alarm. The count is the number of times the first two conditions need to happen before an alarm is triggered into the system.

Figure 51:
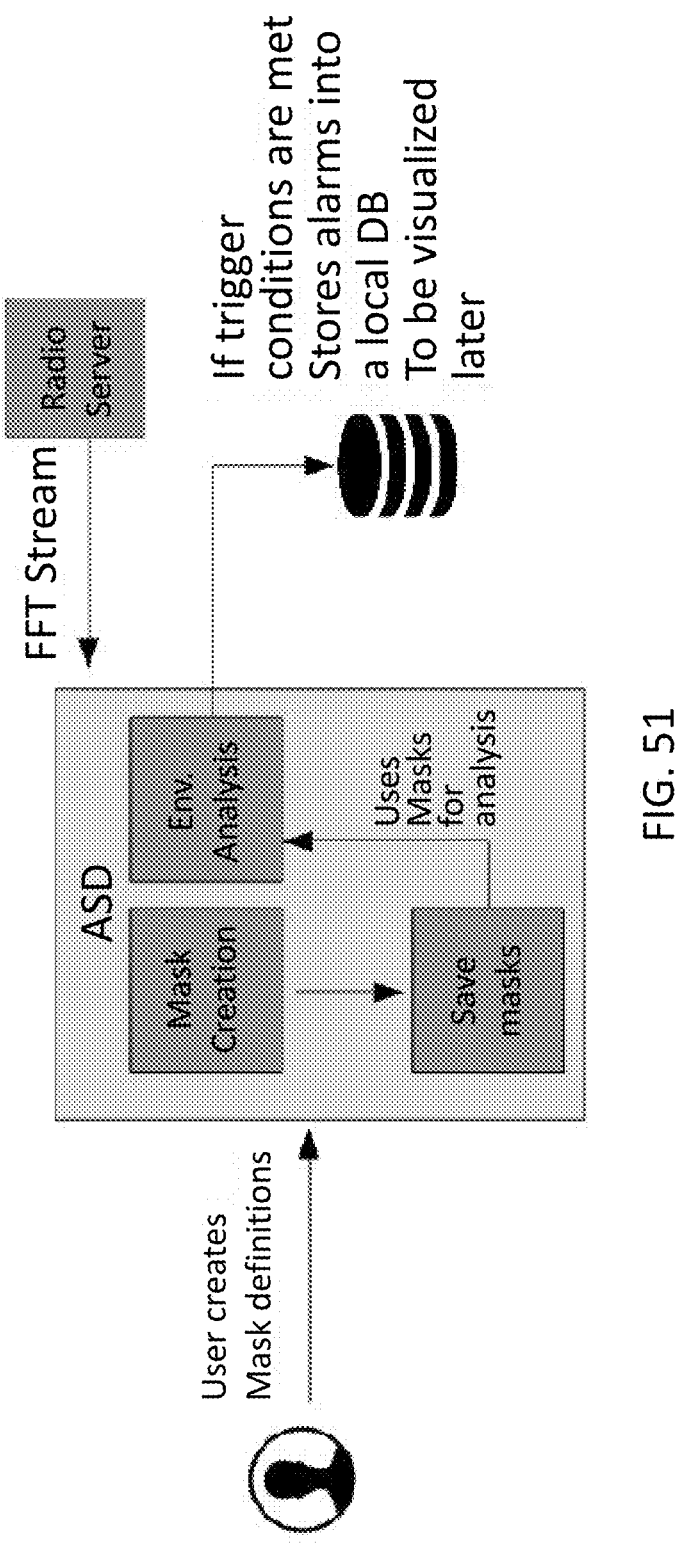
FIG. 51 illustrates a workflow of automatic signal detection according to one embodiment of the present invention.

FIG. 51 illustrates a workflow of automatic signal detection according to one embodiment of the present invention. A mask definition is specified by a user for an automatic signal detection process including creating masks, saving masks, and performing environment analysis based on the masks created and FFT data stream from a radio server. If trigger conditions are met, alarms are triggered and stored to a local database for visualization.

Figure 52:
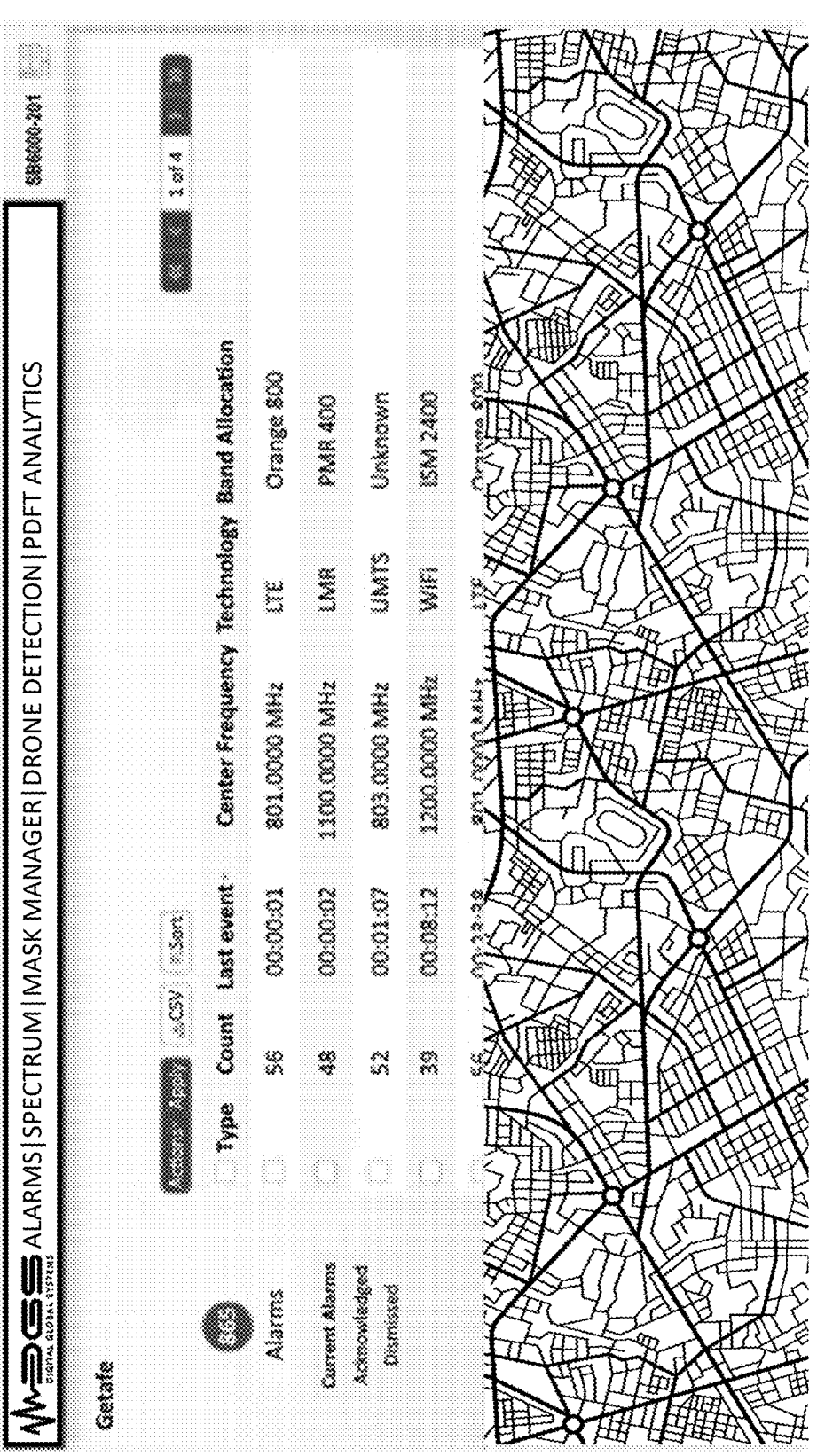
FIG. 52 is a screenshot illustrating alarm visualization via a graphical user interface according to one embodiment of the present invention.

FIG. 52 is a screenshot illustrating alarm visualization via a graphical user interface (GUI) according to one embodiment of the present invention. In the GUI, current alarms, acknowledged alarms, and dismissed alarms in a certain RF environment are listed with information including types, counts, durations, carrier frequencies, technologies, and band allocations.

Figure 53:
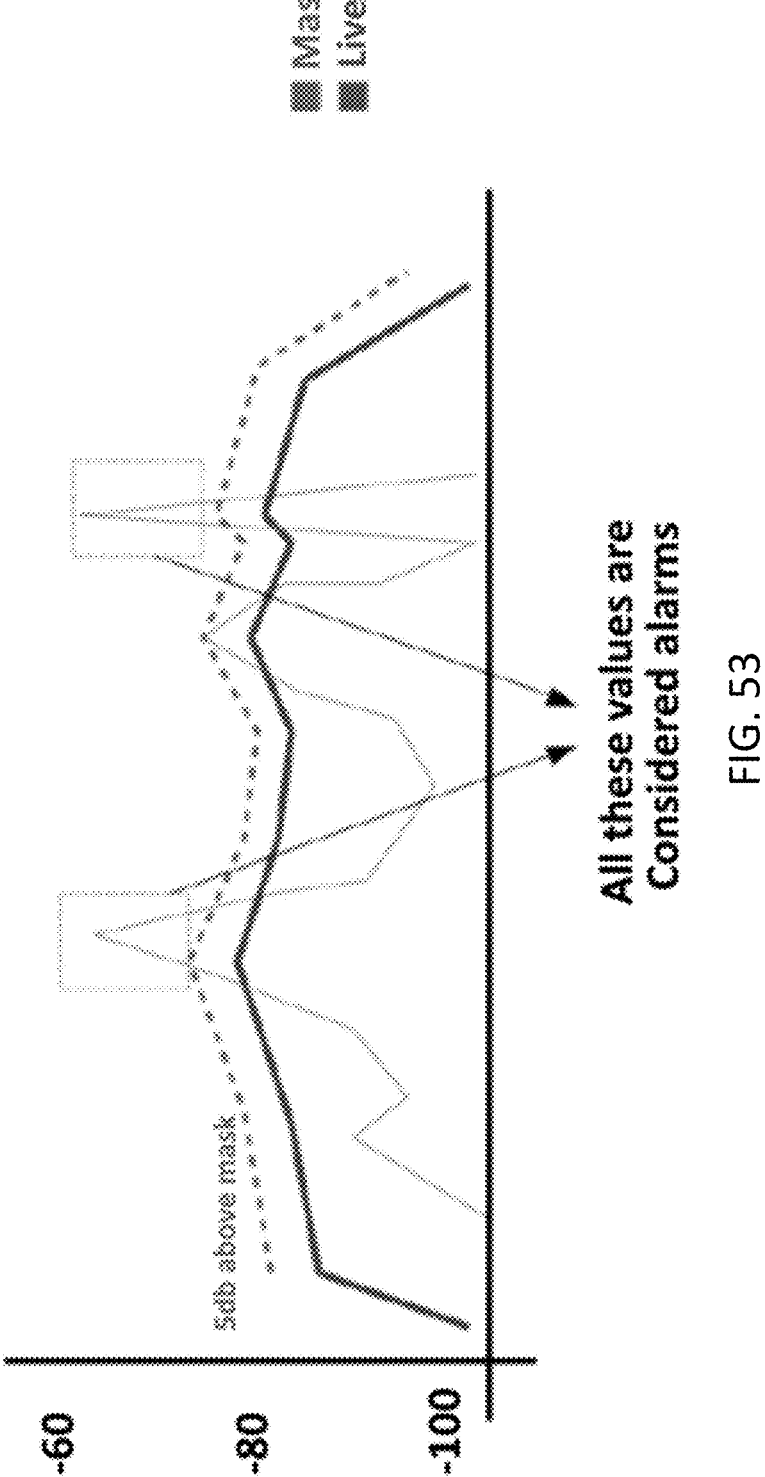
FIG. 53 illustrates a comparison of live FFT stream data and a mask considering a dB offset according to one embodiment of the present invention.

In one embodiment, a detection algorithm is used for alarm triggering. The detection algorithm detects power values over the mask considering the dB offset condition, but does not trigger an alarm yet. FIG. 53 illustrates a comparison of live FFT stream data and a mask considering a dB offset according to one embodiment of the present invention. The dB offset is 5 dB, so the detection algorithm only identifies power values that are at least 5 dB higher than the mask.

The detection algorithm then identifies peaks for power values above the mask after considering the dB offset. In embodiment of the present invention, a flag is used for identifying peak values. A flag is a Boolean value used for indicating a binary choice. FIG. 54 is a snippet of the code of the detection algorithm defining a flag according to one embodiment of the embodiment. If the flag is TRUE, the detection algorithm keeps looking for peak values. A for Each function analyzes each value to find the next peak. Once reaching a peak value, it goes down to the value nearest to the mask, and the flag is set to FALSE. FIG. 55 is a snippet of the code of the detection algorithm identifying peak values according to one embodiment of the present invention.

Figure 56:
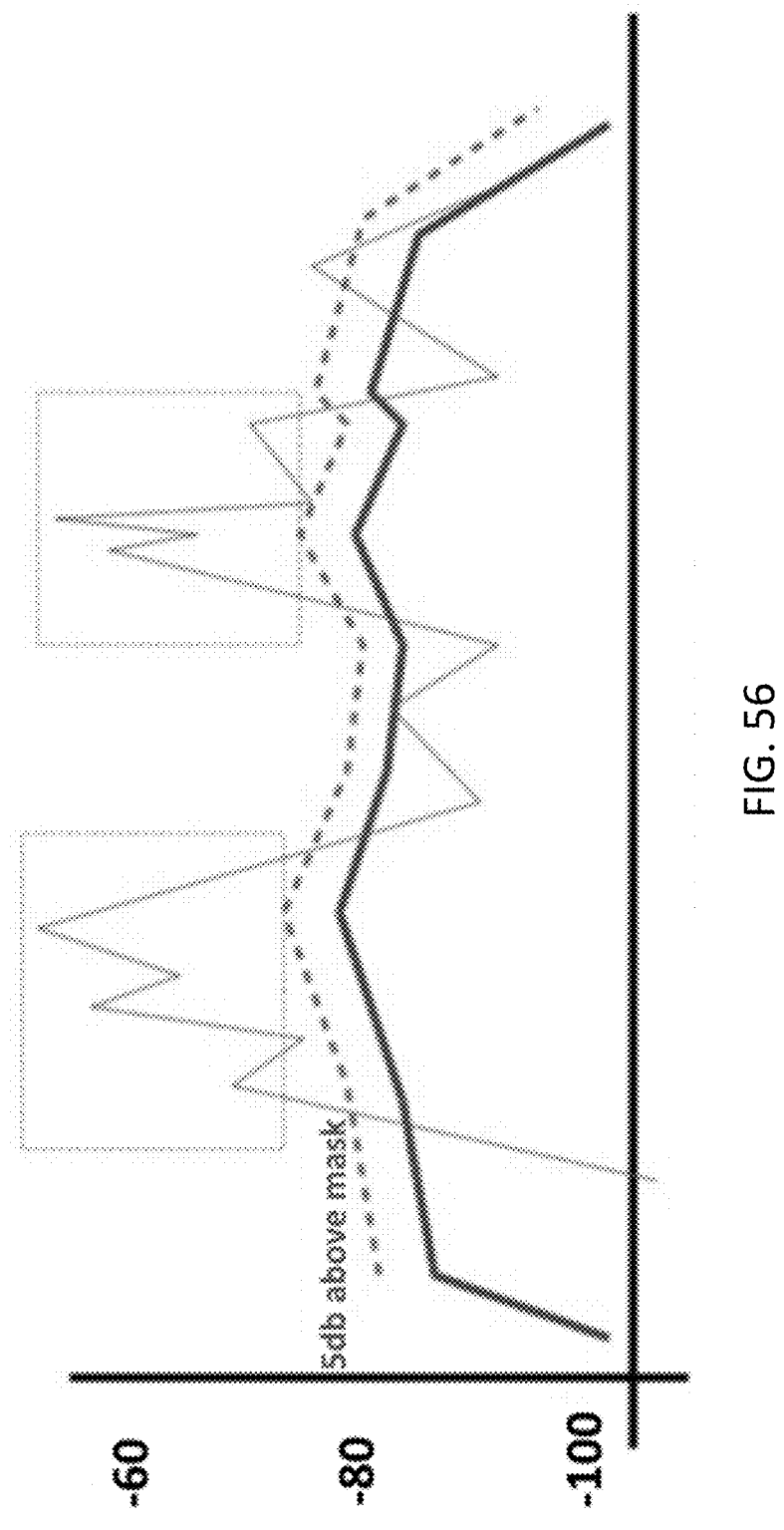
FIG. 56 illustrates a complex spectrum situation according to one embodiment of the present invention.
Figure 57:
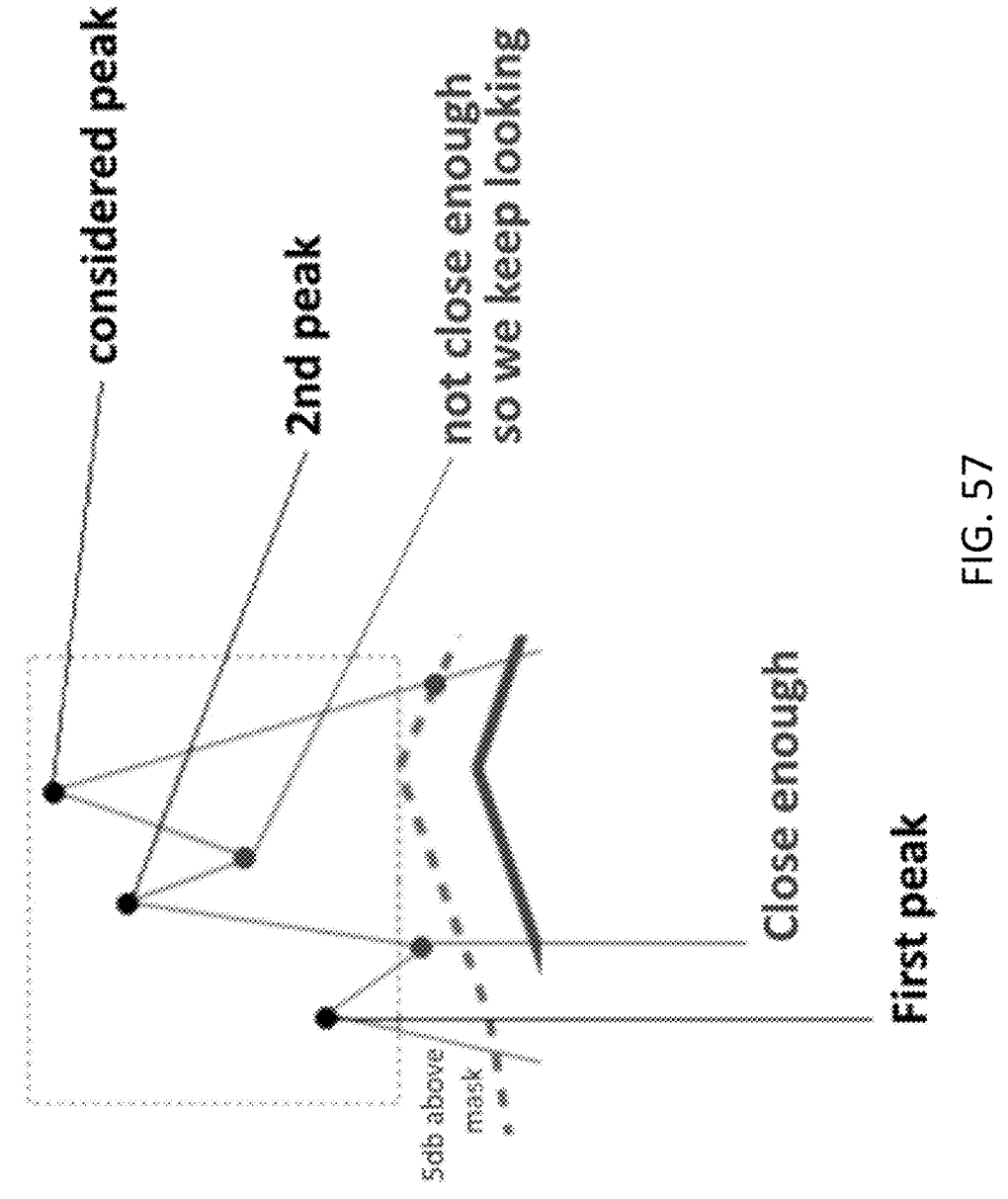
FIG. 57 is an analysis of the live stream data above the mask in the first alarm duration in FIG. 56.

In one embodiment, live FFT stream data has multiple peaks before falling under the mask. FIG. 56 illustrates a complex spectrum situation according to one embodiment of the present invention. Live FFT stream data in two alarm durations have multiple peaks before falling under the mask. FIG. 57 is an analysis of the live FFT stream data above the mask in the first alarm duration in FIG. 56 according to one embodiment of the present invention. A first peak is identified, and the power value starts to decrease. A first value nearest to the mask after the first peak is identified, the flag is still TRUE after comparing the first value nearest to the mask and mask, so the detection algorithm keeps looking for peaks. Then, a second peak is identified, and the power value starts to decrease. A second value nearest to the mask after the second peak is identified. The second value is greater than the first value, the flag is still TRUE, so the detection algorithm keeps looking for peak values. Then a third peak value is identified and a third value nearest to the mask is also identified. The third value is on the mask considering the offset value, and the flag is set to FALSE. By comparison, the third peak value is considered as the real peak value for the power values above the mask in the first alarm duration of FIG. 56. Once all the peaks are found, the detection algorithm checks the alarm duration, which is a time window where a signal needs to be seen in order to be considered for alarm triggering. The first time that the detection algorithm sees the peak, it saves the time in memory. If the signal is still present during the time window, or appears and disappears during that time, the detection algorithm is to consider triggering an alarm. If the condition is not met, a real-time alarm is not sent to a user, however the detected sequence is recorded for future analysis. FIG. 58 is a snippet of the code of the detection algorithm checking the alarm duration according to one embodiment of the present invention.

If both the dB offset condition and the alarm duration condition are met, the detection algorithm analyzes the count condition. If the amount of times specified in the count condition is met, the detection algorithm triggers the alarm. In one embodiment, all alarms are returned as a JSON array, and a for Each function creates the structure and triggers the alarm. FIG. 59 is a snippet of the code of the detection algorithm triggering an alarm according to one embodiment of the present invention.

The present invention provides spectrum monitoring and management, spectrum utilization improvements, critical asset protection/physical security, interference detection and identification, real time situational awareness, drone threat management, and signal intelligence (SigINT). Advantageously, the automatic signal detection in the present invention provides automated and real-time processing, environmental learning, autonomous alarming and operations (e.g., direction finding, demodulation), wideband detection, etc. The automatic signal detection in the present invention is of high speed and high resolution with low backhaul requirements, and can work in both portal and fixed modes with cell and land mobile radio (LMR) demodulation capability. The automatic signal detection system in the present invention is operable to integrate with third party architecture, and can be configured with distributed architecture and remote management. In one embodiment, the automatic signal detection of the present invention is integrable with any radio server including any radio and software defined radio, for example, Ettus SDR radio products.

Specifically, spectrum solutions provided by the automatic signal detection technology in the present invention have the following advantages: task automation, edge processing, high-level modular architecture, and wideband analysis.

Figure 60:
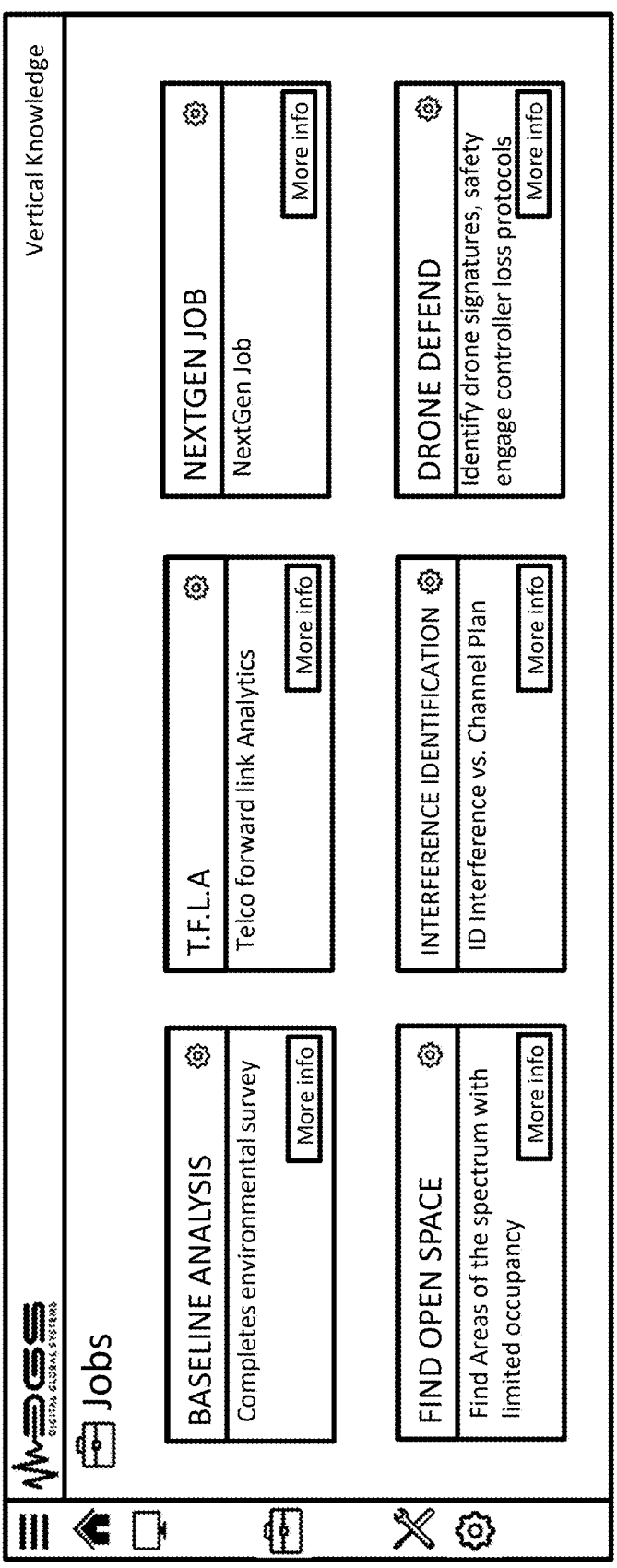
FIG. 60 is a screenshot illustrating a job manager screen according to one embodiment of the present invention.
Figure 61:
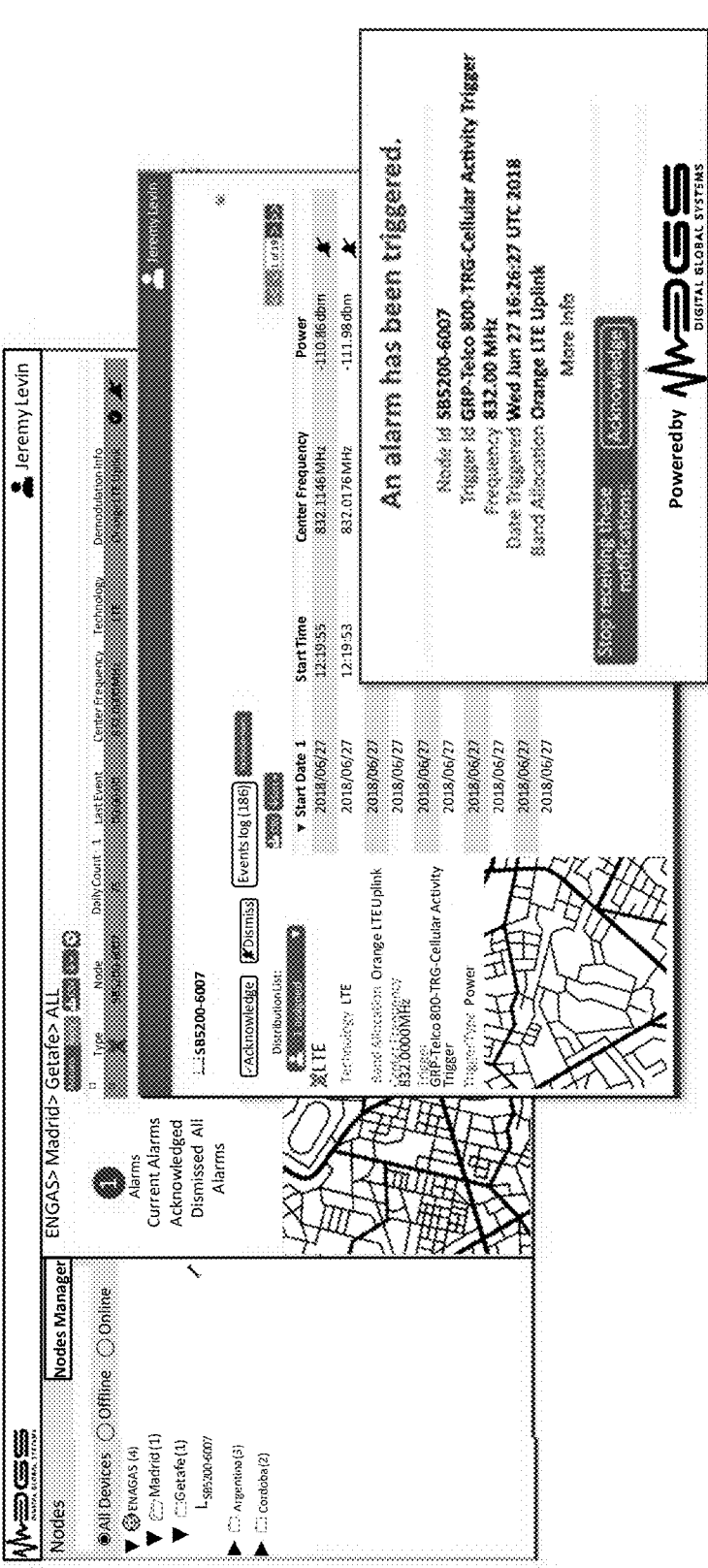
FIG. 61 illustrates trigger and alarm management according to one embodiment of the present invention.

Task automation simplifies the work effort required to perform the following tasks, including receiver configuration, process flow and orchestration, trigger and alarm management, autonomous identification of conflicts and anomalous signal detection, automated analytics and reporting, system health management (e.g., system issues/recovery, software update, etc.). FIG. 60 is a screenshot illustrating a job manager screen according to one embodiment of the present invention. FIG. 61 illustrates trigger and alarm management according to one embodiment of the present invention.

Task automation enables an operator to send a job to one or multiple systems distributed across a geography. Each job contains a pre-built, editable manifest, which can configure receivers and outline alarm conditions with appropriate actions to execute. As an example, for a baseline analysis task, the system automatically scans multiple blocks of spectrum in UHF, VHF, Telco bands and ISM bands such as 2.4 GHz and 5.8 GHz, stores multiple derivatives regarding signal and noise floor activity, produces an automated report showing activity and occupancy over a specified time, analyzes signal activity to correctly channelize activity by center frequency and bandwidth, and combines customer supplied or nationally available databases with data collected to add context (e.g., license, utilization, etc.). The baseline analysis task provides an operator with a view into a spectral environment regarding utilization and occupancy. This can be of assistance when multiple entities (local, state and federal agencies) have coverage during a critical event and need to coordinate frequencies. Multiple radios along with multiple systems across a geography can be commanded to begin gathering data in the appropriate frequency bands. Resolution bandwidth and attenuation levels are adjustable, coordination is made simple, and actionable information is returned without significant manual effort.

The systems provided in the present invention is operable to process RF data and perform data manipulation directly at the sensor level. All data can be pushed to a server, but by processing the data first at the sensor, much like in IoT applications, more can be done with less. Overall, edge processing makes information more actionable and reduces cost. The systems of the present invention also leverage machine learning to drive automation at the edge to a higher level, which makes solutions provided by the present invention more intuitive, with greater capability than other remote spectrum monitoring solutions. Edge processing also reduces the bandwidth requirements for the network by distilling data prior to transfer. A reduction in storage requirements, both on the physical system and for a data pipe, enables more deployment options and strategies. For example, different deployment options and strategies include vehicle mounted (e.g., bus or UPS trucks mapping a geography with cellular backhaul), transportable (e.g., placed in a tower on a limited basis) where ethernet is not available, and man-portable (e.g., interactive unit connected to other mobile or fixed units for comparative analysis).

Core capabilities processed on the node at the edge of the network include spectrum reconnaissance, spectrum surveillance with tip and cue, and signal characterization. Spectrum reconnaissance includes automatic capture and production of detail regarding spectrum usage over frequency, geography and time. More actionable information is provided with edge processing, distributed architecture and intelligent data storage. Spectrum surveillance includes automated deconfliction over widebands by comparing real-time data to user supplied, regional and learned data sets and producing alarms. Nodes can also work with third party systems, such as cameras, making them smarter. Signal characterization provides actionable information. signals of interest are decoded and demodulated by the system, with location approximation or direction, to improve situational intelligence.

Figure 62:
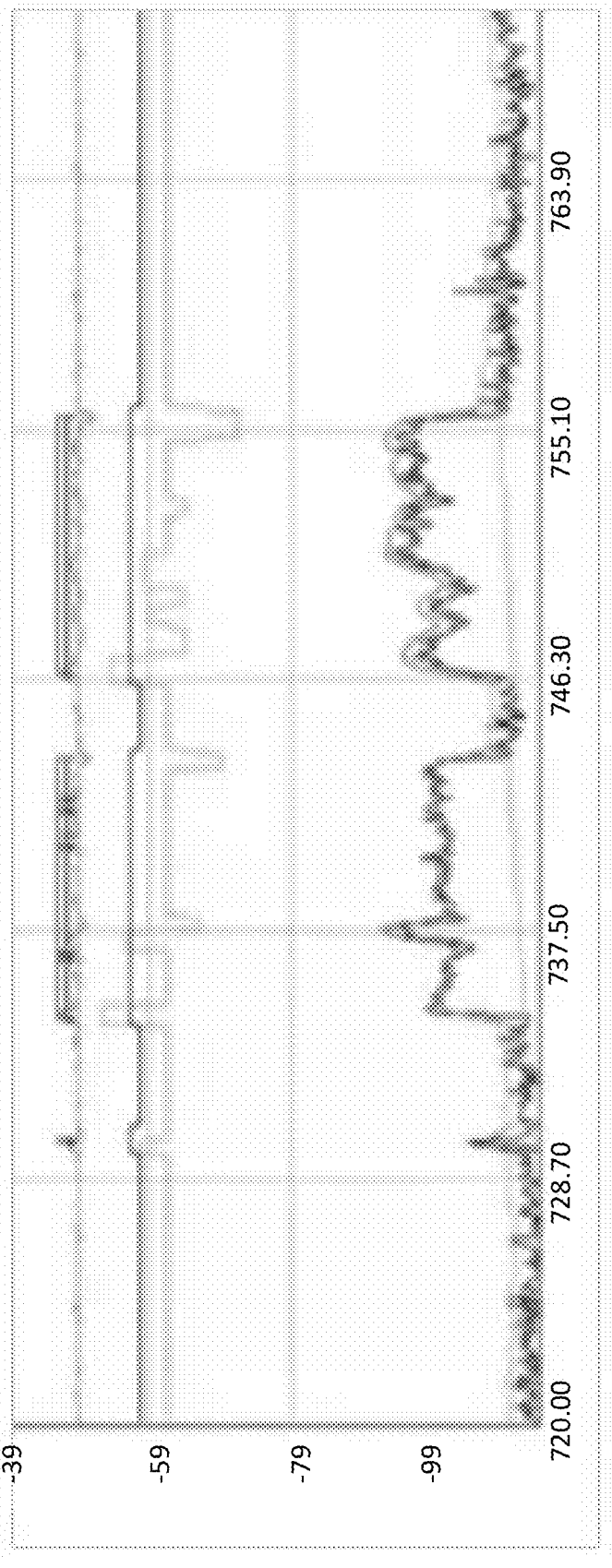
FIG. 62 is a screenshot illustrating a spectrum with RF signals and related analysis.
Figure 63:
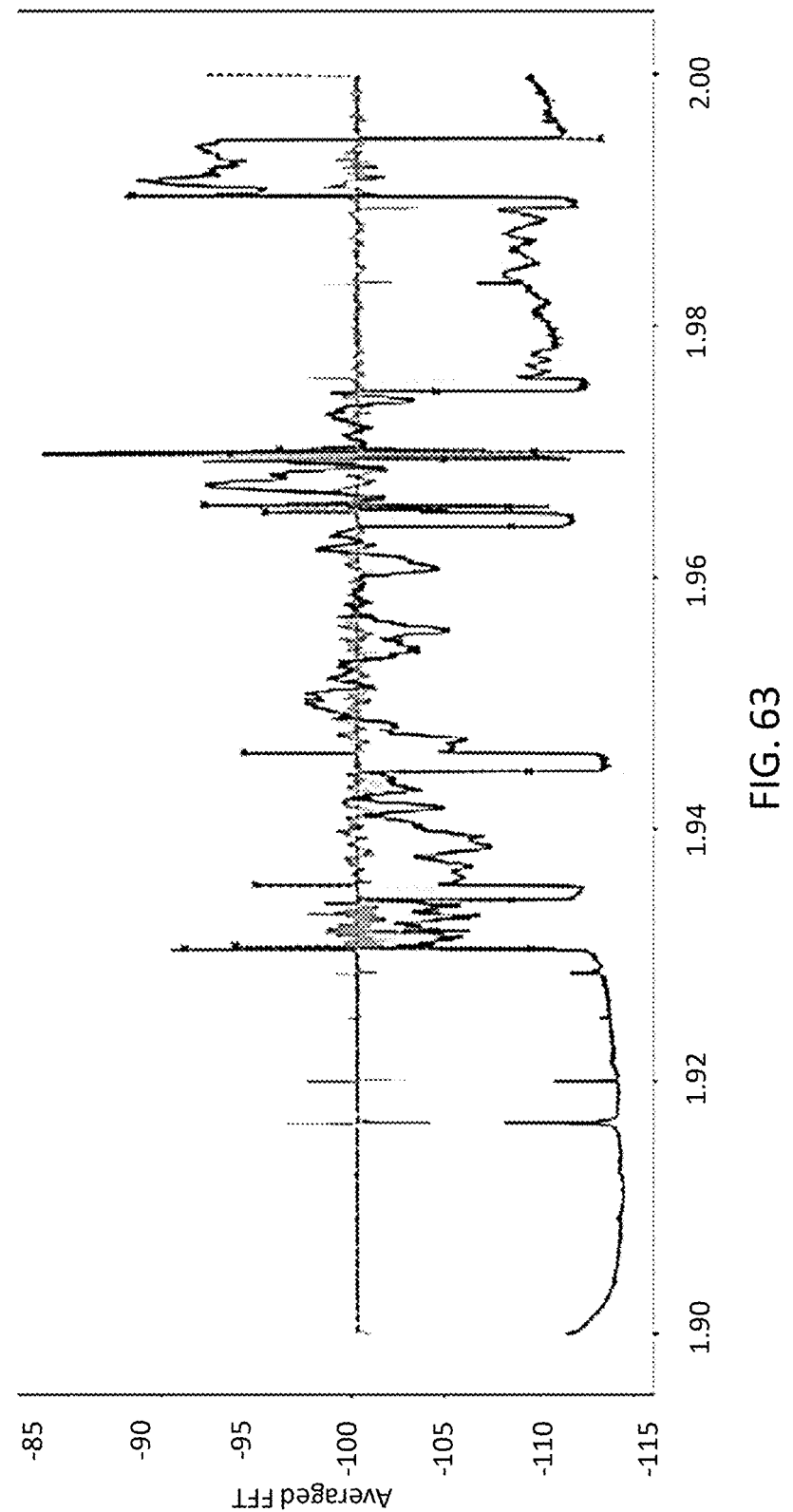
FIG. 63 is a screenshot illustrating identified signals based on the analysis in FIG. 16.

In one embodiment, edge processing of the present invention includes four steps. At step one, first and second derivative FFT analysis is performed in near real time, providing noise floor estimates and signal activity tracking. FIG. 62 is a screenshot illustrating a spectrum with RF signals and related analysis. FIG. 63 is a screenshot illustrating identified signals based on the analysis in FIG. 62. Spectrum in the shaded areas in FIG. 63 are identified as signals. At step two, analysis is aggregated, signal bandwidths and overall structure are defined, and data is stored to create baselines and be used in reporting. At step three, incoming FFT is compared to existing baselines to find potential conflicts to the baseline. When conflicts are detected, parameters are sent to an event manager (e.g., a logic engine). At step four, the event manager utilizes user supplied knowledge, publicly available data, job manifests and learned information to decide appropriate actions. Action requests such as creating an alarm, sending an e-mail, storing I/Q data, or performing DF are sent to a controller.

Figure 64:
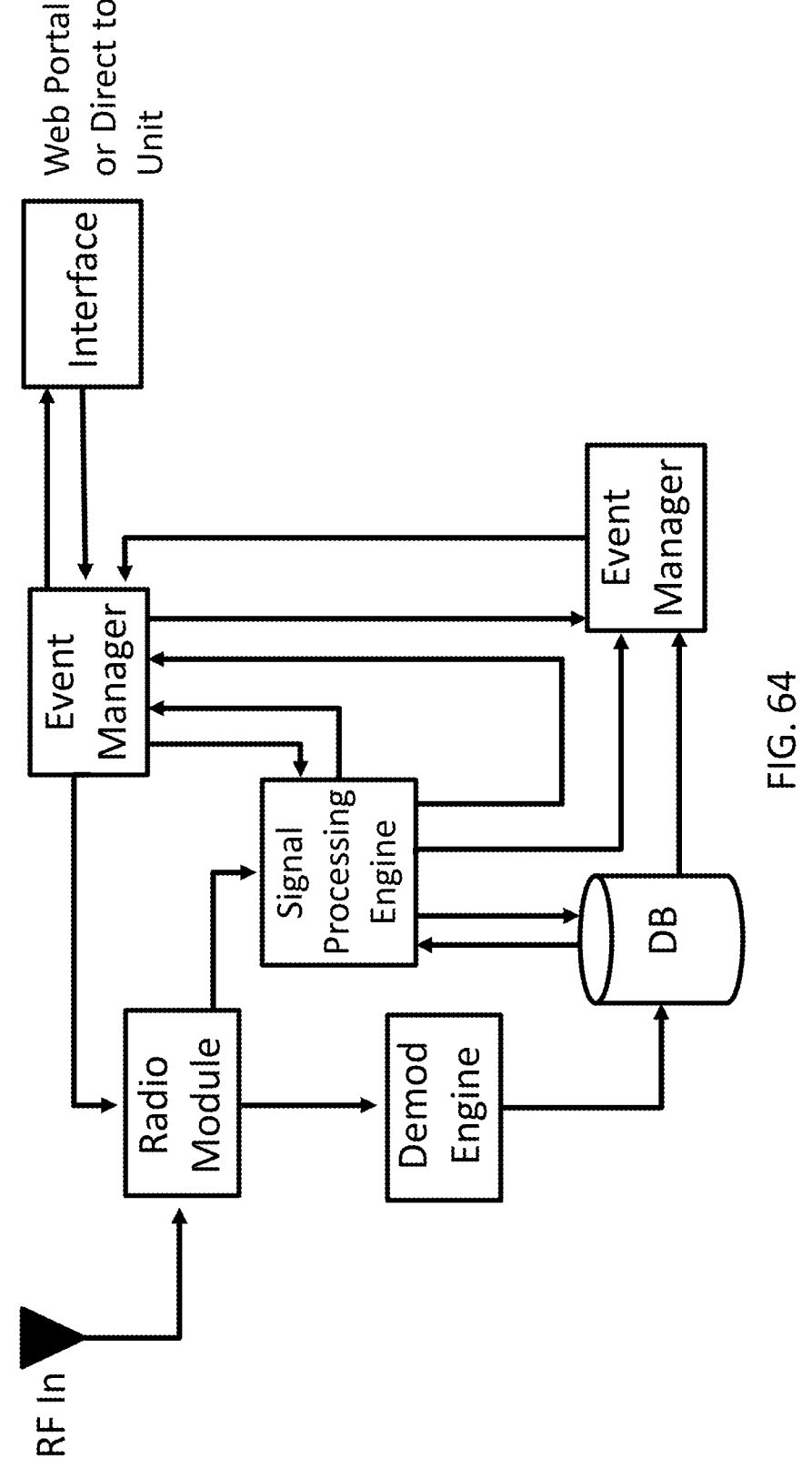
FIG. 64 is a diagram of a modular architecture according to one embodiment of the present invention.

A modular approach to system design and distributed computing allows for proper resource management and control when enabled by the right system control solution, which maximizes performance while keeping per-unit cost down. A loosely coupled solution architecture also allows for less costly improvements to the overall network. Parallel processing also enables multiple loosely coupled systems to operate simultaneously without inhibiting each other's independent activities. FIG. 64 is a diagram of a modular architecture according to one embodiment of the present invention. A modular design enables different components to be integrated and updated easily, without the need for costly customization or the never-ending purchase of new equipment, and makes it easier to add in additional hardware/software modules.

Compared to the industry standard tightly coupled architectures increasing complexity and reducing scalability, reliability and security over time, the loosely coupled modular approach provides standardization, consolidation, scalability and governance while reducing cost of operation.

The spectrum monitoring solutions provided in the present invention significantly enhance situational intelligence and physical security, reduces utility complexity and project risk.

The spectrum management systems provided in the present invention are operable to detect and report on incidents in near real time. Remote sensors are placed at site with the capability of capturing and processing RF activity from 40 MHz to 6 GHz. Highly accurate baselines are constructed for automated comparison and conflict detection. Systems are connected to a centralized monitoring and management system, providing alarms with details to a network operations center. On-site systems can also provide messages to additional security systems on-site, such as cameras, to turn them to the appropriate azimuths.

In one embodiment, information such as the presence of a transmission system can be used in an unmanned vehicle recognition system (UVRS) to detect the presence of an unmanned vehicle. The unmanned vehicle can be air-borne, land-based, water-borne, and/or submerged. The detection of certain modulation schemes can be used to identify the presence of mobile phones or mobile radios. This information, coupled with direction finding, provides situational intelligence for informed decision making and rapid response. Measurements and signal intelligence regarding an RF spectrum assist in reducing the risk of financial losses due to theft, vandalism, and power disruptions, providing additional safety for employees and visitors, making other security technologies, such as thermal cameras and IP videos smarter by working in tandem to identify and locate the presence of threats, and capturing and storing I/Q data, which can be utilized as evidence for legal proceedings.

Figure 65:
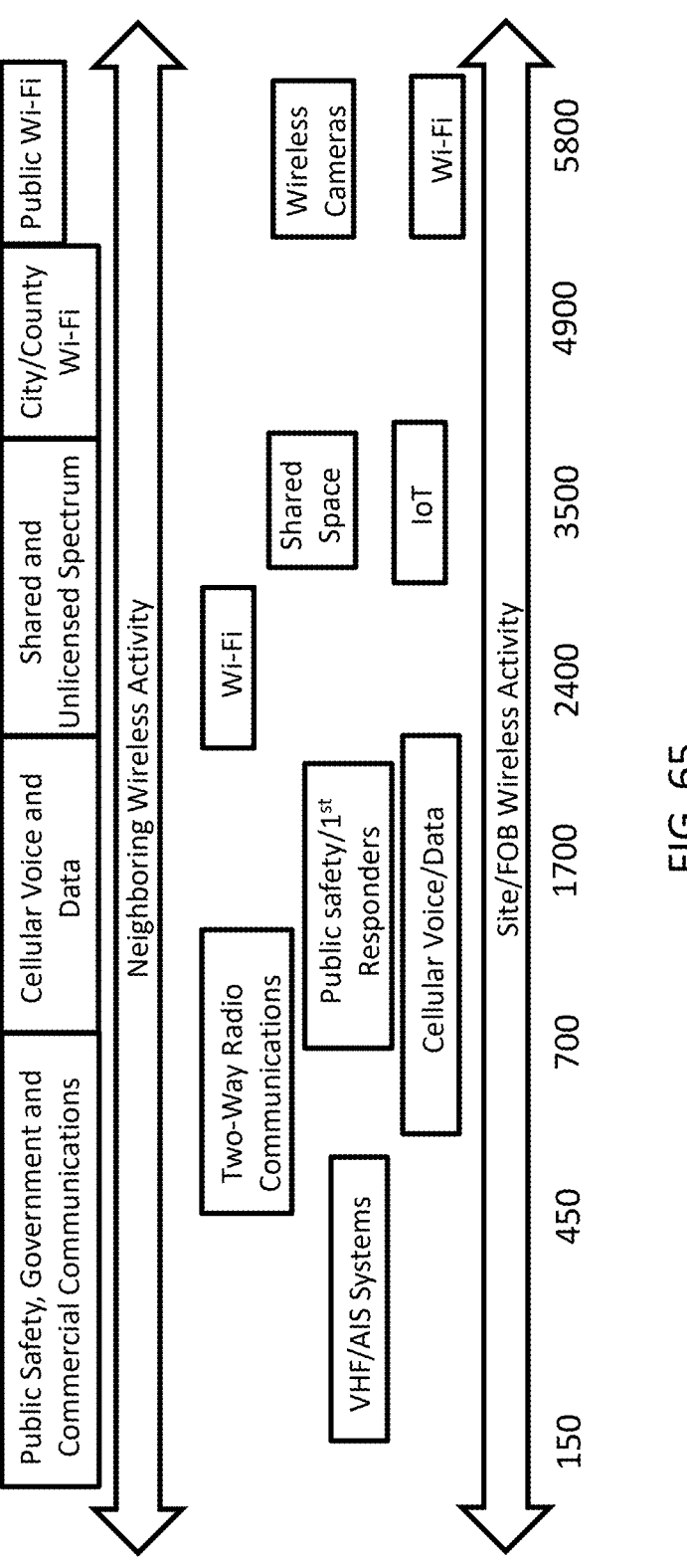
FIG. 65 illustrates a communications environment according to one embodiment of the present invention.

Wireless devices can be utilized across multiple bands. While other monitoring systems are limited on bandwidth (i.e., limited focus) or resolution (making it difficult to see narrowband signals), the systems in the present invention are designed to be more flexible and adaptable and capable of surveying the entire communications environments looking for illicit activity. FIG. 65 illustrates a communications environment according to one embodiment of the present invention.

Figure 66:
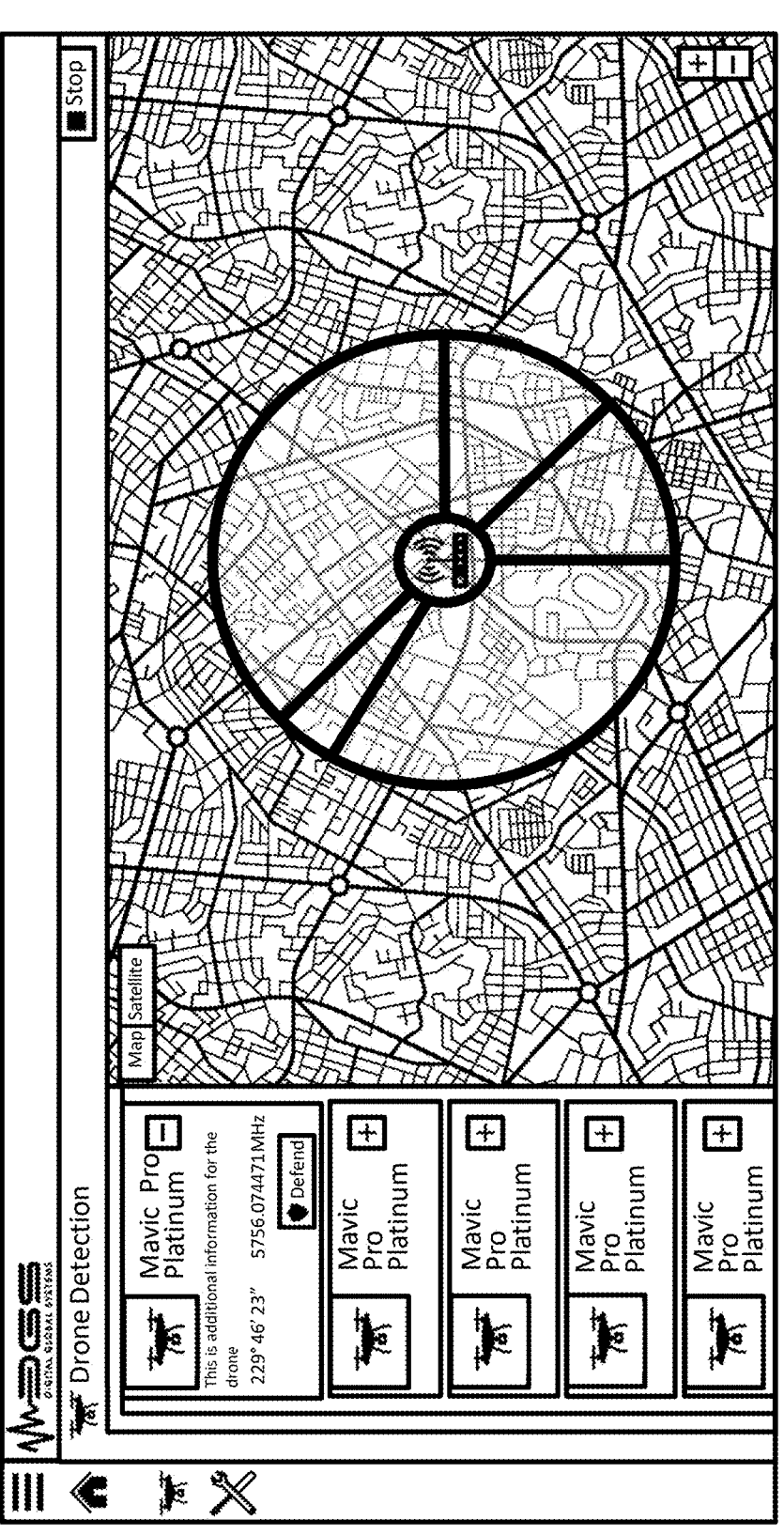
FIG. 66 illustrates an UAS interface according to one embodiment of the present invention.
Figure 67:
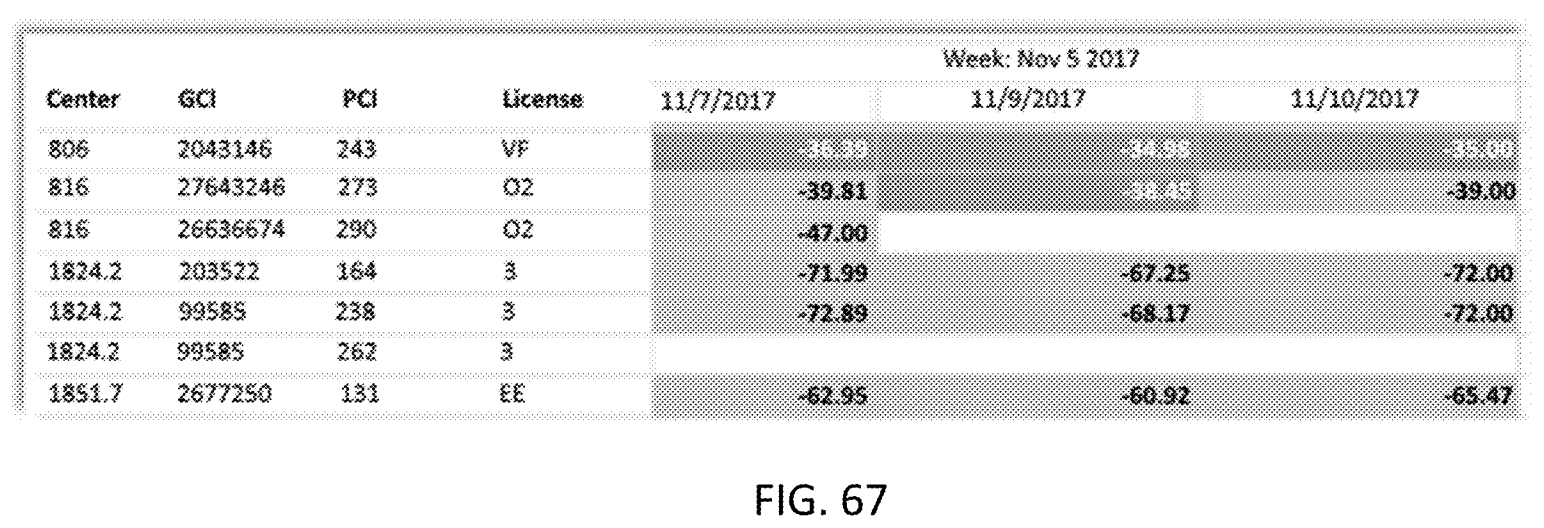

In one embodiment, a signal characterization engine is configured to provide information including location information and direction, operator name, drone transmission type, and MAC address. All these are actionable information enabling swift resolution. FIG. 66 illustrates an UVRS interface with positive detections, according to one embodiment of the present invention. FIG. 67 lists signal strength measurements according to one embodiment of the present invention.

In one embodiment, the systems of the present invention can be used for mitigating drone threats, identifying and locating jammers, and ensuring communications. The systems of the present invention are designed to identify illicit activity involving use of the electromagnetic spectrum such as drone threats, directed energy/anti-radiation weapons aimed at degrading combat capability (e.g., jammers). The systems of the present invention also bring structure to largely unstructured spectral data enabling clearer communications (interference reduction) and efficient communication mission planning.

Figure 68:
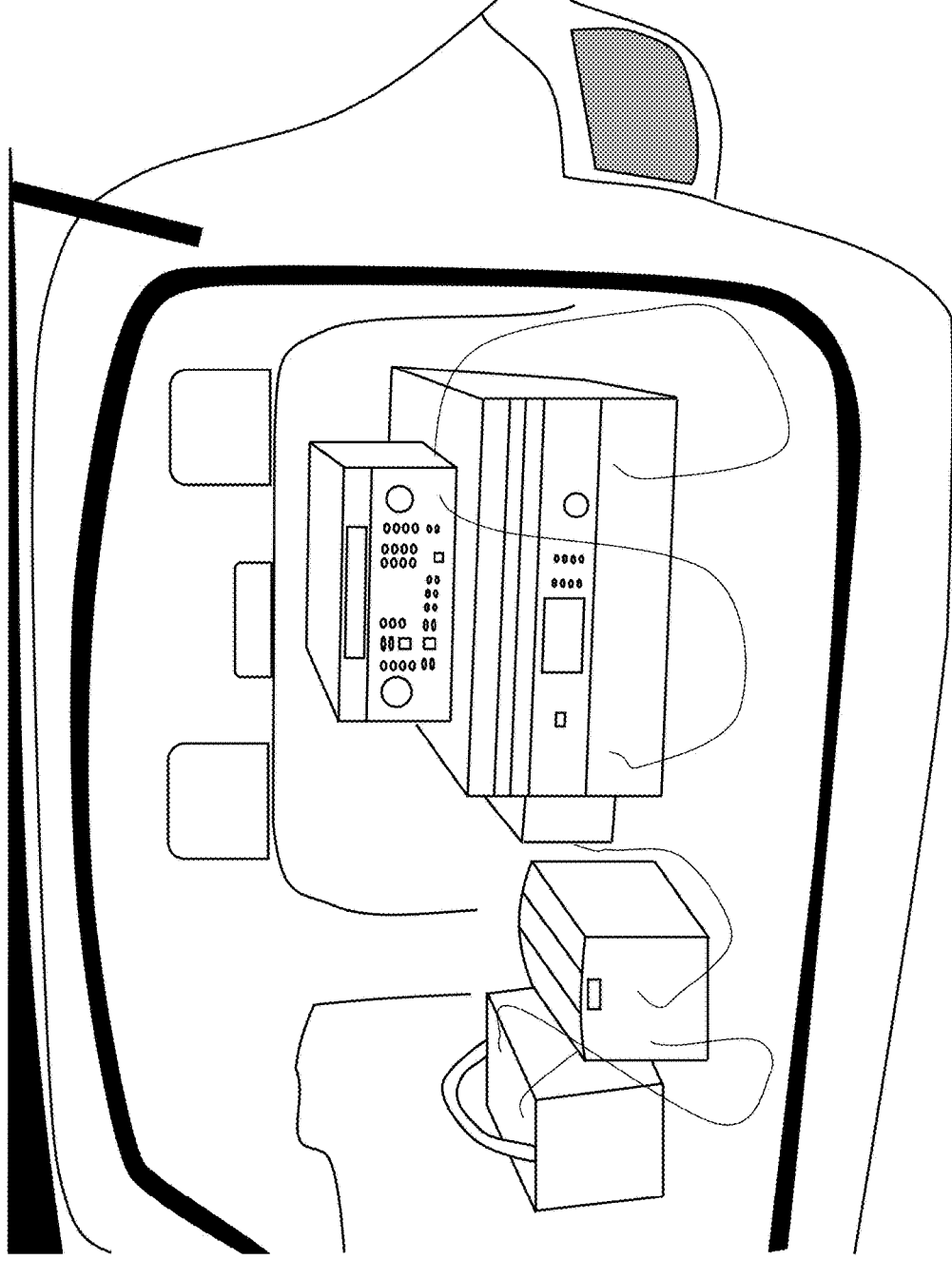
FIG. 68 illustrates a focused jammer in a mobile application according to one embodiment of the present invention.
Figure 69:
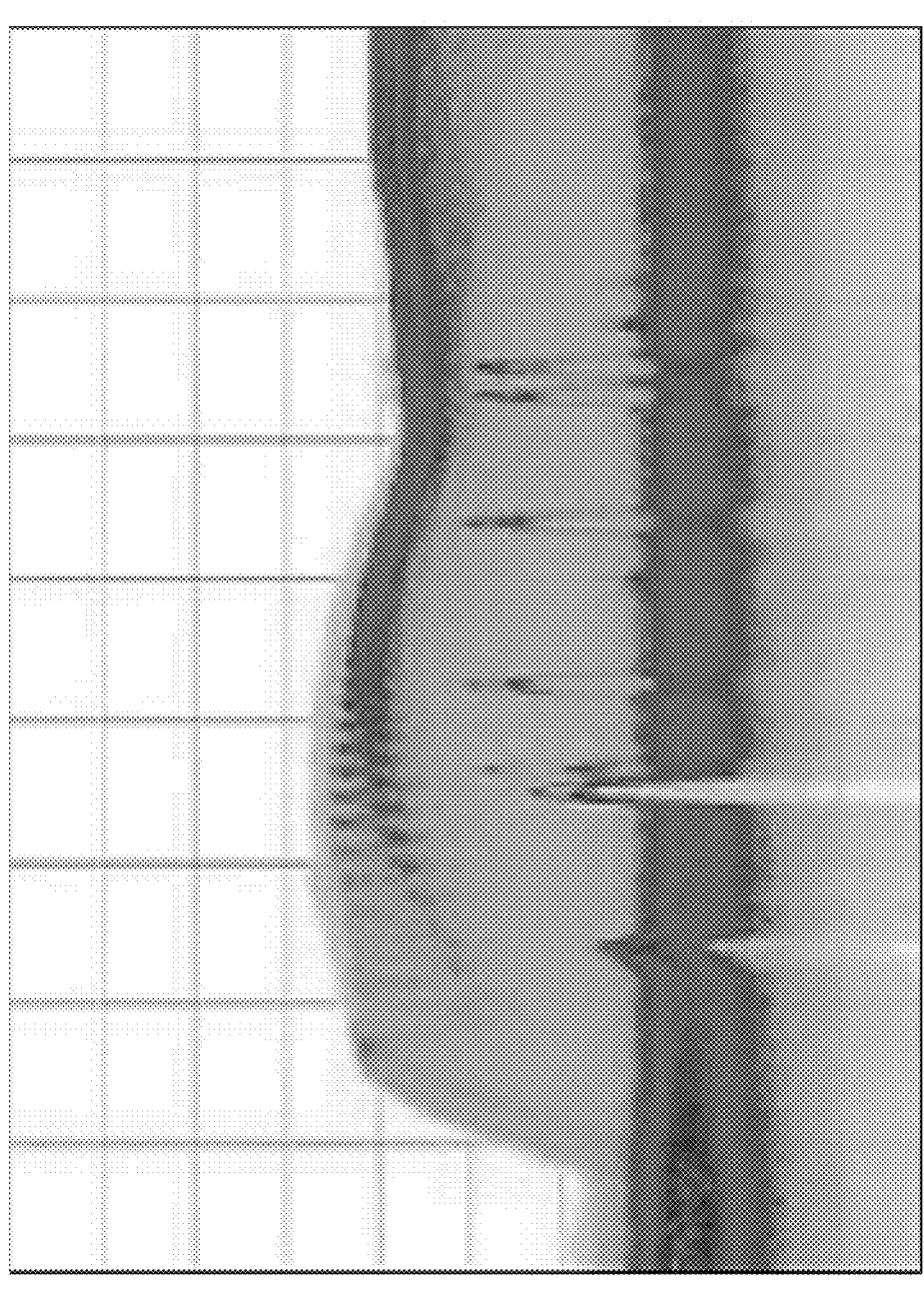
FIG. 69 illustrates a swept RF interference by a jammer according to one embodiment of the present invention.

Jammers are becoming more prevalent and can be deployed on-site or off premises, making them very difficult to locate. The solutions provided by the present invention automatically send alerts as to the presence of wideband jammers interfering with critical parts of the communications spectrum, and assist in the location of focused jammers which can be very difficult to find. The ability to proactively and rapidly locate jamming devices reduces disruptions in communications, and improves overall security and limits the potential for financial loss. FIG. 68 illustrates a focused jammer in a mobile application according to one embodiment of the present invention. FIG. 69 illustrates a swept RF interference by a jammer according to one embodiment of the present invention.

Figure 70:
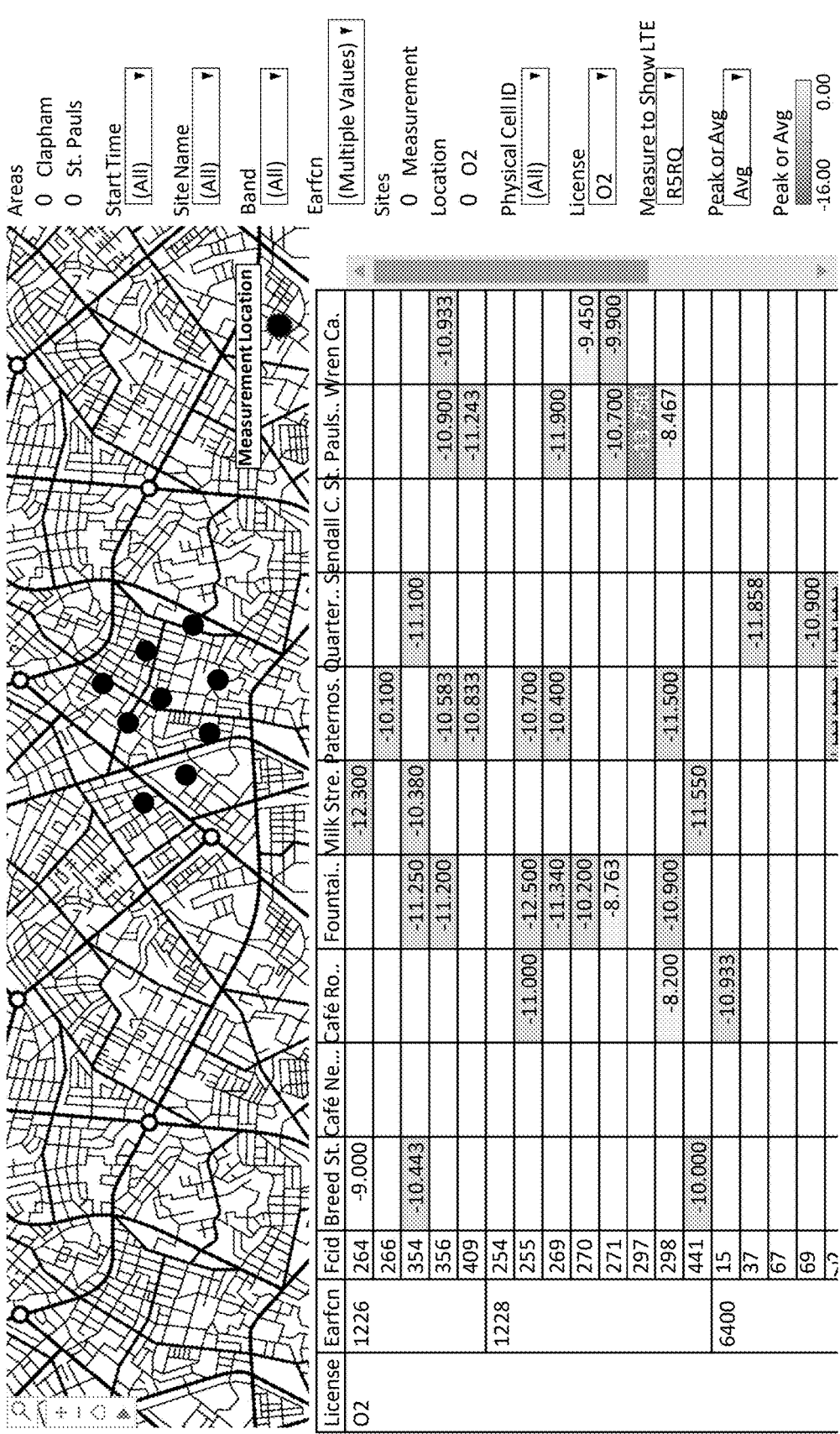
FIG. 70 illustrates data collection, distillation and reporting according to one embodiment of the present invention.

To maintain security and coordinate operations, consistent and quality communications are imperative. The systems provided in the present invention have multiple deployment strategies and data can be collected and distilled into strength and quality metrics. The data is easy to access in reports. FIG. 70 illustrates data collection, distillation and reporting according to one embodiment of the present invention.

The systems provided in the present invention have the capability of building baselines, detecting when signals exist which are not common for the environment, and creating alerts and automatically starting processes such as direction finding.

The systems provided in the present invention can be used for countering unmanned vehicles, including but not limited to unmanned aerial systems (UASs), land-based vehicles, water-borne vehicles, and submerged vehicles. FIG. 71 is a comparison of multiple methodologies for detecting and classifying UAS. Of the methods listed in FIG. 72, RF detection provides the highest level of accuracy in classifying an object as a UAS.

An RF-based counter-UAS system comprises multiple receivers in a single platform. In one embodiment, there are four receivers. Each receiver is operable to scan multiple bands of spectrum looking for UAS signatures. For example, the multiple bands of spectrum include 433 MHz, 900 MHZ, 2.4 GHz, 3.5 GHZ, and 5.8 GHz Base. Each receiver has the capability of scanning a spectrum from 40 MHz to 6 GHz. The receivers are capable of working in tandem for DF applications. Multiple RF-based counter-UAS systems can communicate with each other to extend range of detection and enhance location finding accuracy. The RF-based counter-UAS systems of the present invention comprise proprietary intelligence algorithm on one or multiple GPUs with execution time less than 10 ms. FIG. 72 lists capabilities of an RF-based counter-UAS system according to one embodiment of the present invention. The capabilities of an RF-based counter-UAS system include detection, classification, direction finding, and message creation.

Figure 73:
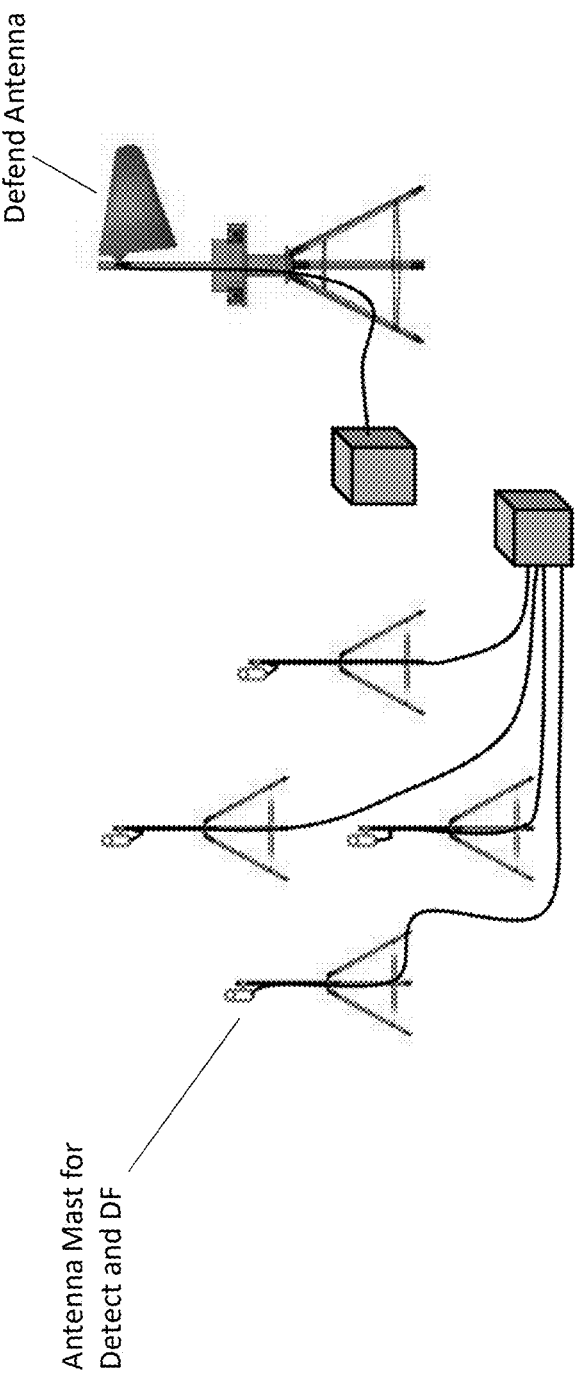
FIG. 73 illustrates an RF-based counter-UAS system deployed as a long-distance detection model according to one embodiment of the present invention.

In one embodiment, an RF-based counter-UAS systems can be deployed as a long-distance detection model as illustrated in FIG. 73. Four omni-directional antennas are used to create an array for detection and direction finding. In one embodiment, Gimbal-mounted (rotating) defeat antenna can be added. The long-distance detection model is simple to install. In one embodiment, extremely long-distance detection can be obtained with arrays utilizing masts with a height of 8 to 10 meters.

FIG. 74 illustrates features of drones in the OcuSync family. FIG. 75 illustrates features of drones in the Lightbridge family. The long ranges, adaptability, and ubiquity of OcuSync and Lightbridge systems make them potentially very dangerous. The RF-based counter-UAS systems in the present invention are operable to detect and defeat UASs using these systems.

The RF-based counter-UAS systems in the present invention are operable to detect UASs over a distance of 1.5 kilometers with direction. UASs can be detected and categorized faster than other systems. The RF-based counter-UAS systems can easily be integrated into third party systems (e.g., RADAR and camera systems), or act as the common operating platform for other systems for command and control. The RF-based counter-UAS systems are capable for wideband detection from 70 MHz to 6 GHZ, enabling detection of UASs at 433 MHZ, 900 MHZ, 2.4 GHZ, 3.5 GHZ, and 5.8 GHz. The RF-based counter-UAS systems are capable of detecting and direction finding UAS controllers. In one embodiment, unknown and anomalous signals can be categorized as UAS.

In one embodiment, the RF-based counter-UAS systems in the present invention can be used for detecting other unmanned vehicles such as land-based, water-borne, or submerged unmanned vehicles in addition to detecting unmanned aerial vehicles.

In one embodiment, the present invention provides an autonomous and intelligent spectrum monitoring system capable of detecting the presence of wireless activity across extremely wide bands, capturing and performing analysis on highly intermittent signals with short durations automatically, and converting RF data from diverse wireless mobile communication services (e.g., cellular, 2-way, trunked) into knowledge. The autonomous and intelligent spectrum monitoring system of the present invention are advantageous with edge processing, modular architecture, job automation, and distributed sensor network.

Edge processing enables the delivery of a truly autonomous sensor for automated signal recognition and classification and near real-time alarming 24/7, equipped with machine learning algorithms.

A modular architecture increases speed and efficiency, enables more bandwidth to be analyzed (with superior resolution), reduces latency and network traffic (i.e., low backhaul requirements). Logic engines produce relevant alarms, thus limiting false positives.

Job automation allows hardware solutions to be customized to meet operational needs with inclusion of additional receivers and GPUs, cloud or client hosted backend, and third-party integration.

A distributed sensor network supports feature specific applications such as direction finding and drone threat management, capable of LMR and cellular demodulation and assisting prosecution efforts with data storage.

The spectrum monitoring system of the present invention represents a paradigm shift in spectrum management. Edge processing migrates away from the inefficiencies of manual analysis, or the time delays of backhauling large data sets. The spectrum monitoring system of the present invention performs real-time, automated processing at the device level, providing knowledge faster, reducing network traffic and improving application performance with less latency. Modular architecture makes additional development, integration of new features and the incorporation of third party systems easy, and also future-proof capital expenditure. Job automation simplifies operations (e.g., data collection, setting triggers) by enabling the execution of multiple complex tasks, with one click on a user interface. Distributed sensors provide security to critical assets spread across large geographies, linked to a network operations center. Data can be shared to perform location finding and motion tracking.

Figure 76:
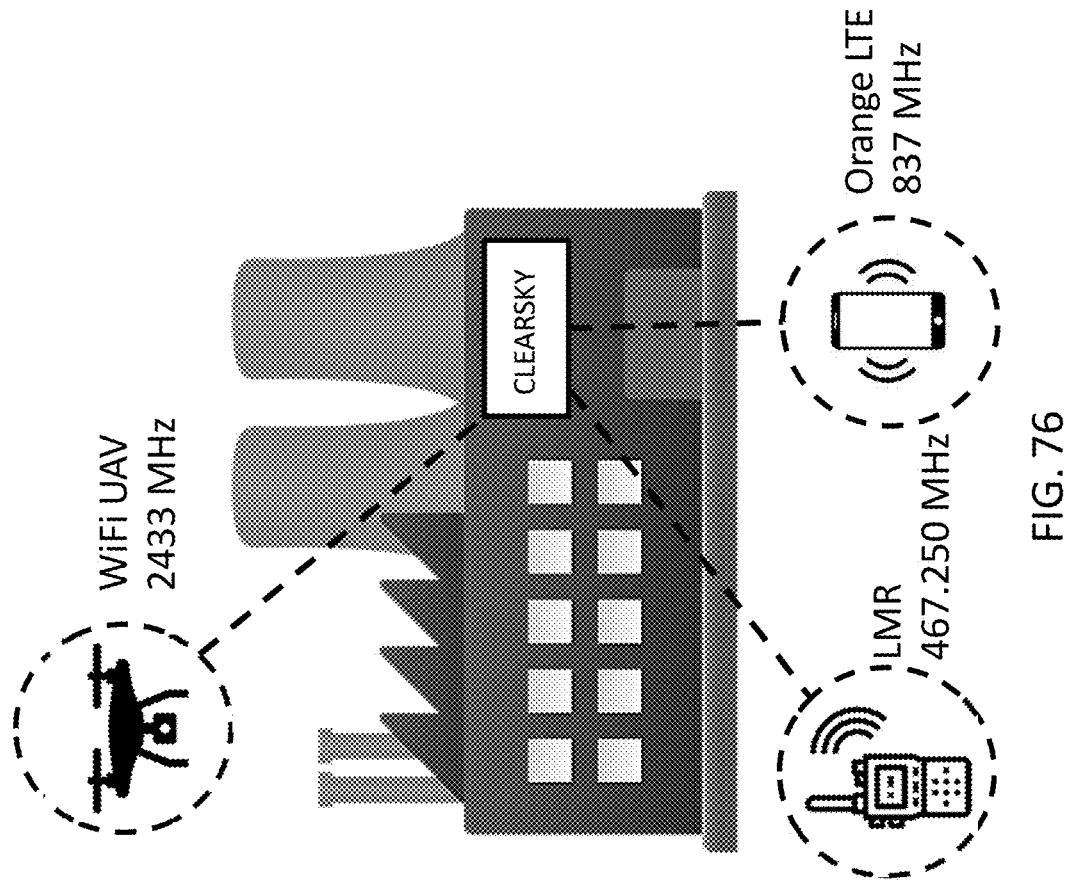
FIG. 76 illustrates a spectrum monitoring system detecting an anomalous signal in close proximity of critical infrastructure.

For critical assets, only certain types of transmitting devices (e.g., radios, phones, sensors) should be present on specified frequencies. The spectrum monitoring system of the present invention learns what is common for a communications environment and creates alarms when an anomalous signal is detected in close proximity. Alerts, along with details such as signal type (e.g., LMR, Mobile, Wi-Fi) and unique characteristics (e.g., radio ID) are posted to a remote interface for further investigation. The spectrum monitoring system of the present invention which is capable of learning, analyzing and creating alarms autonomously provides a heightened level of security for critical assets and infrastructure. FIG. 76 illustrates a spectrum monitoring system detecting an anomalous signal in close proximity of critical infrastructure.

The spectrum monitoring system derives intelligence by collecting, processing, and analyzing spectral environments in near real time. The unique characteristics and signatures of each transmitter are compared automatically to either user supplied or historical data sets. Potential threats are identified quickly and proactively, reducing acts of vandalism, theft and destruction. Advantageously, the spectrum monitoring system of the present invention reduces the risk of financial losses due to theft, vandalism, and power disruptions, provides additional safety for employees and visitors, makes other security technologies including thermal cameras and IP video smarter by working in tandem to identify and locate the presence of threats (with DF functionality), and captures and stores data, which can be utilized as evidence for legal proceedings.

Figure 77:
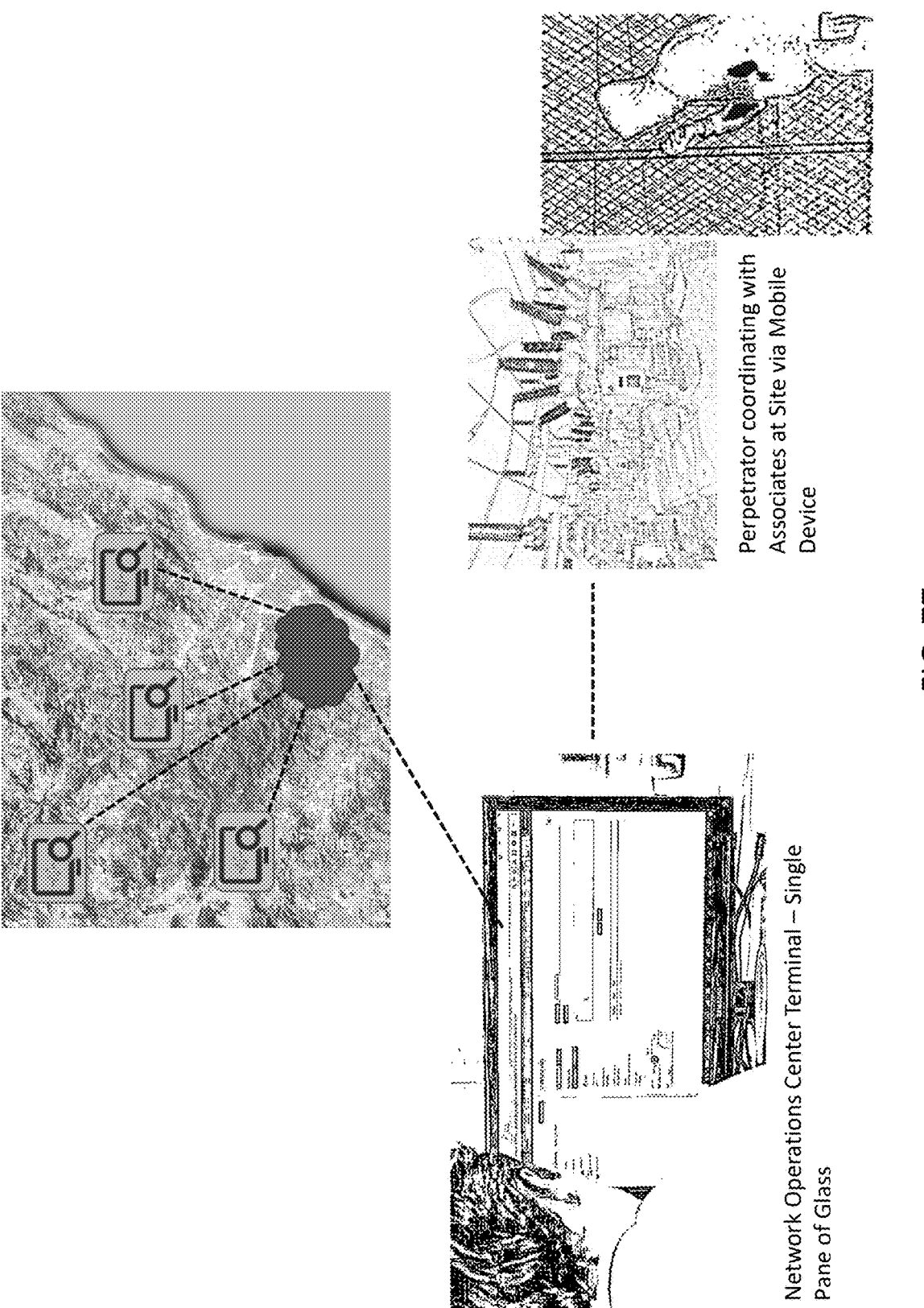
FIG. 77 illustrates a system configuration and interface according to one embodiment of the present invention.

Node devices in the spectrum monitoring system of the present invention can be deployed across large geographies. The spectrum monitoring system is built to interact with third party systems including cameras and big data platforms, providing additional intelligence. All these systems send pre-processed data to a cloud platform and are visualized efficiently on a single interface. FIG. 77 illustrates a system configuration and interface according to one embodiment of the present invention.

Alarms generated at the site are sent to a remote interface, enabling perimeters to be monitored 24/7 from anywhere. Alarm details including transmitter type (e.g., mobile phone), unique identifiers (e.g., radio ID), UAV type, and directions are presented on the interface.

Job automation restructures work flow and the need for configuration management, greatly reducing manual efforts regarding receiver configuration, trigger and alarm management, analytics and reporting, system health management, and conflict and anomalous signal detection.

Not all activity observed in a spectral environment represents a threat. Even in remote locations, LMR radios can be observed. Pedestrians may also be in the area utilizing mobile devices. The spectrum monitoring system of the present invention is equipped with logic to determine the typical makeup of an environment (e.g., common signals based on time of day), proximity, and duration (e.g., time on site). The logic limits false positives to produce alarms that are meaningful. Parameters can be adjusted as required.

Figure 78:
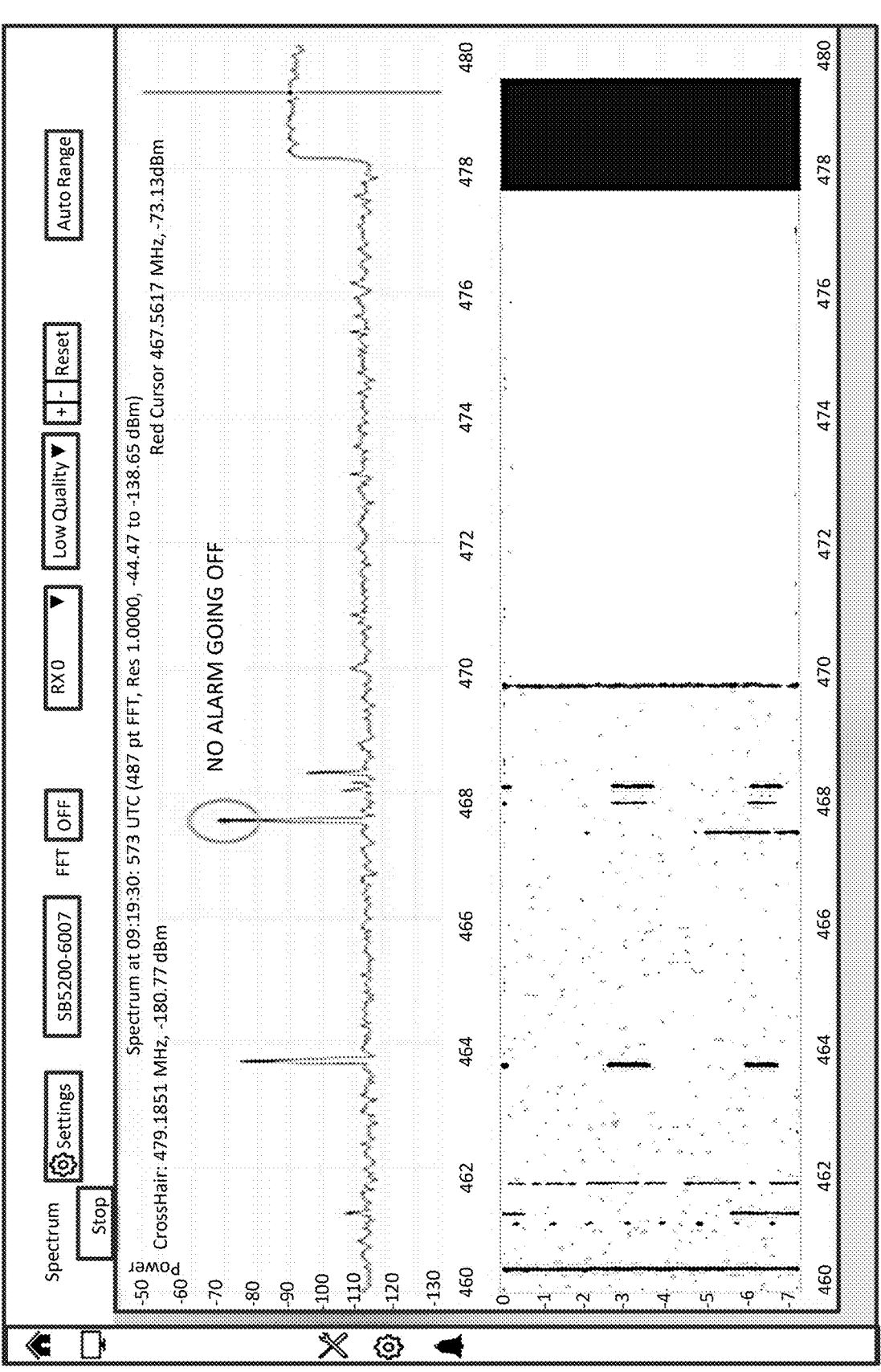
FIG. 78 is a screenshot illustrating no alarm going off for an anomalous signal from LMR traffic not in proximity of the site according to one embodiment of the present invention.

FIG. 78 is a screenshot illustrating no alarm going off for an anomalous signal from LMR traffic not in proximity of the site according to one embodiment of the present invention. The signal at 467.5617 MHz and −73.13 dBm does not cause an alarm to go off.

In one embodiment, the spectrum monitoring system of the present invention enables 24/7 scanning of a local environment, identification of new activities (e.g., LMR, cellular, Wi-Fi), threat assessment capability (e.g., proximity and duration analysis), and alarm creation with details sent via email and posted to a user interface.

In one embodiment, the spectrum monitoring system of the present invention supports a powerful user interface simplifying remote monitoring, greatly improves receiver sensitivity and processing enabling identification of intermittent signals with millisecond durations (e.g., registration events, WhatsApp messaging, background applications), and provides an enhanced logic engine which is operable to identify both signals with long durations (e.g., voice calls, video streaming, data sessions) and repetitive short bursts (e.g., Facebook updates).

In one embodiment, the spectrum monitoring system of the present invention is capable of mobile phone identification from 800-2600 MHZ (covering all mobile activity at site), recognition of intermittent and bursting signals associated with cellular applications, identification of LMR, Wi-Fi, and UAV activity, and determining proximity and limiting false alarms with logic engines.

Node devices in a spectrum monitoring system of the present invention are operable to produce data sets tagged with geographical node location and time. The data sets can be stored on the node devices, or fed to a cloud-based analytics system for historical trend analysis, prediction models, and customer driven deep learning analytics.

Analytics provided by the spectrum monitoring system of the present invention can be used to identify the presence of constant or periodic signals. For example, recognition of the presence of wireless cameras can indicate potential surveillance of a critical asset site. Also for example, the presence of constant or periodic signals can indicate existence of organized groups, attempting to determine normal access patterns for the purpose of espionage or theft.

Analytics provided by the spectrum monitoring system of the present invention can also be used to review patterns before and during an intrusion at several sites and predict next targeted sites.

Analytics provided by the spectrum monitoring system of the present invention can also be used to track contractor and employee visits, both planned and unplanned to the site, to augment data for work flow improvements.

Figure 79:
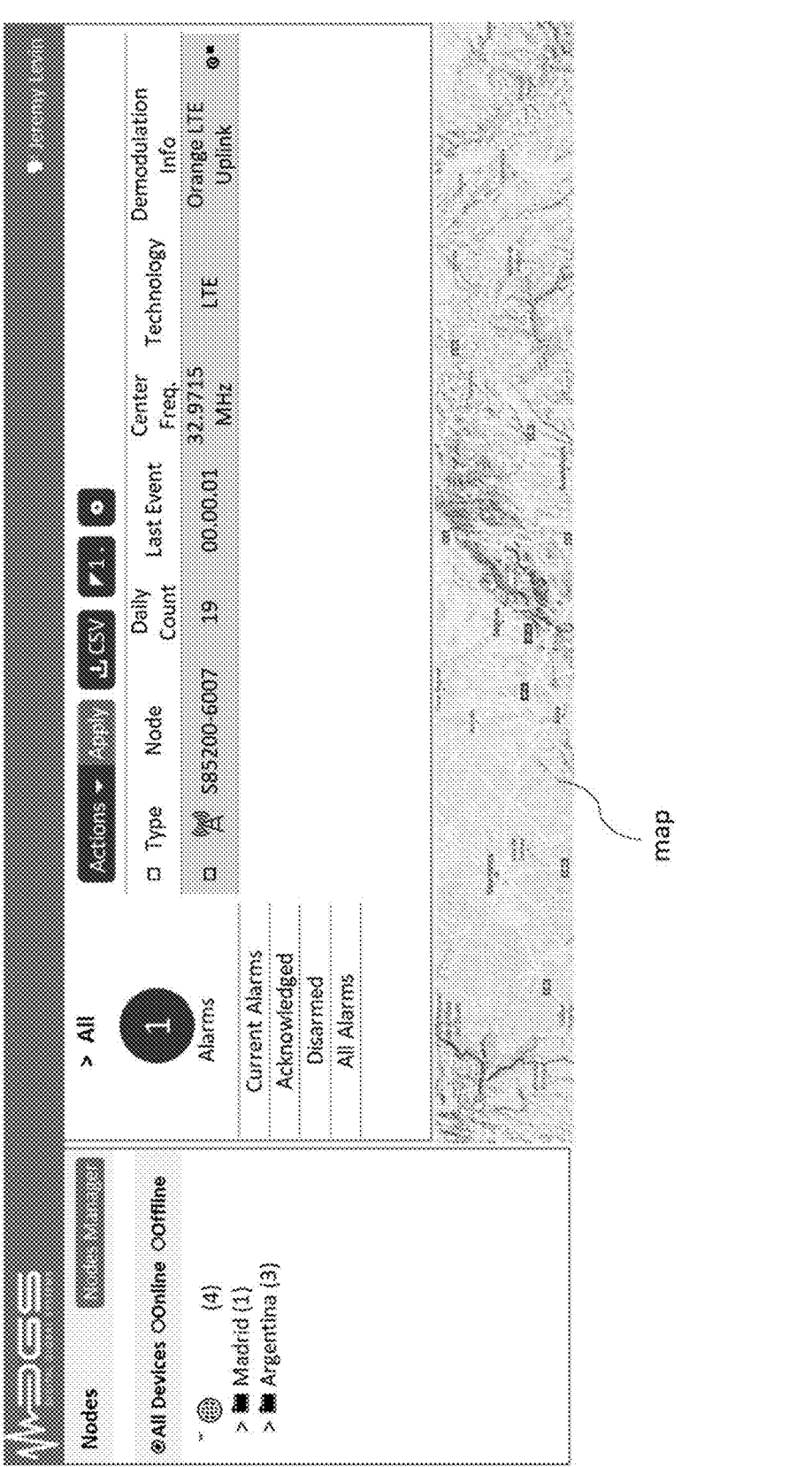
FIG. 79 illustrates a GUI of a remote alarm manager according to one embodiment of the present invention.

FIG. 79 illustrates a GUI of a remote alarm manager according to one embodiment of the present invention.

Figure 80:
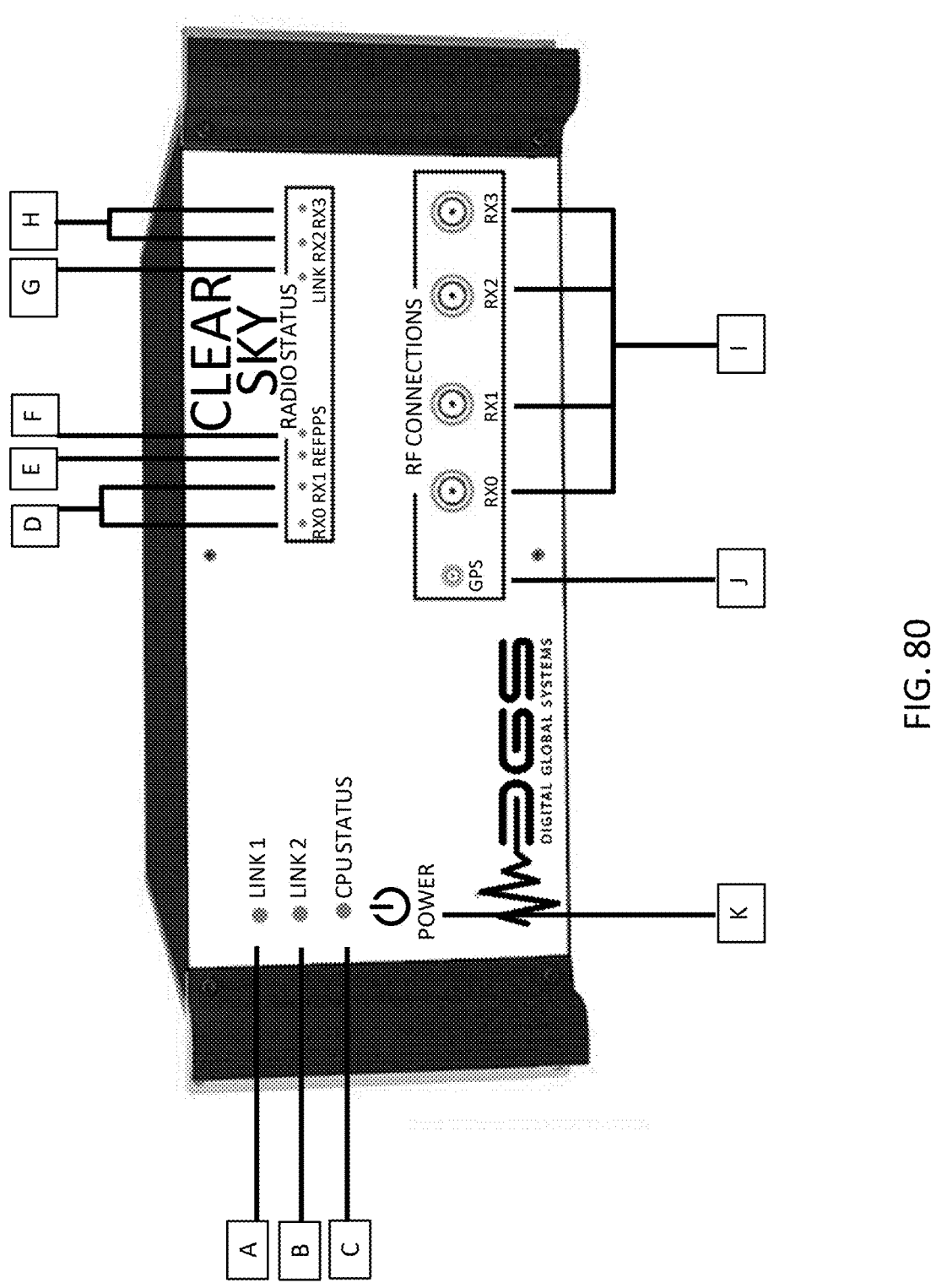
FIG. 80 labels different parts of a front panel of a spectrum monitoring device according to one embodiment of the present invention.

FIG. 80 labels different parts of a front panel of a spectrum monitoring device according to one embodiment of the present invention.

FIG. 81 lists all the labels in FIG. 79 representing different part of the front panel of the spectrum monitoring device according to one embodiment of the present invention.

Figure 82:
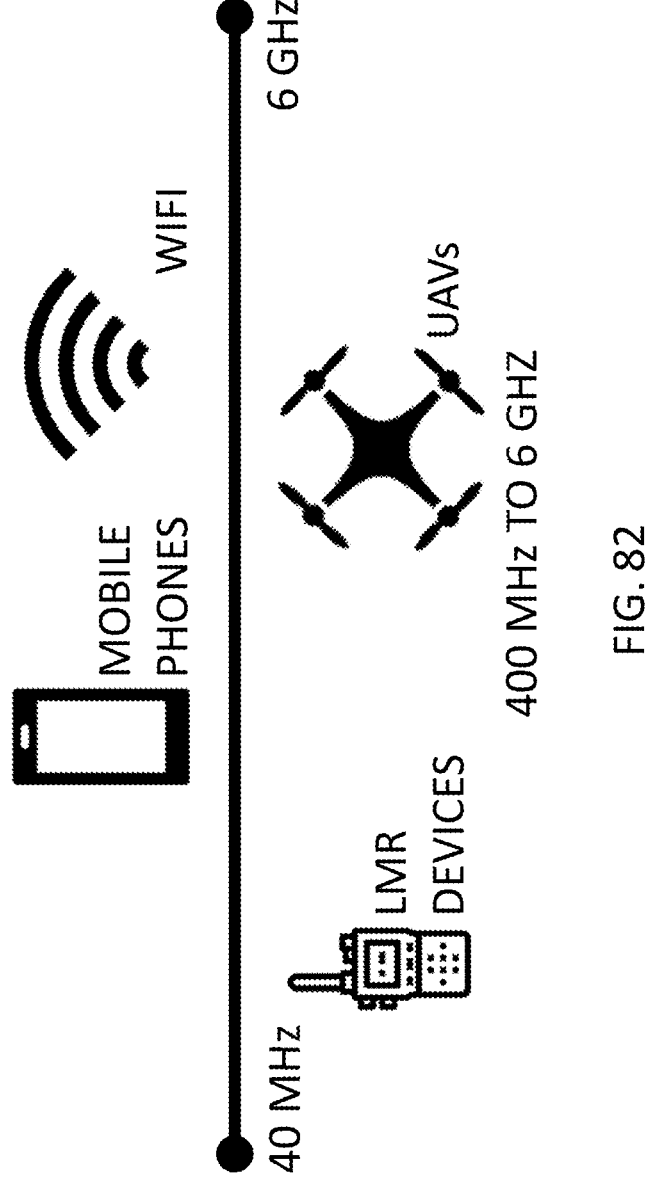
FIG. 82 illustrates a spectrum monitoring device scanning a spectrum from 40 MHz to 6 GHz according to one embodiment of the present invention.

FIG. 82 illustrates a spectrum monitoring device scanning a spectrum from 40 MHz to 6 GHz according to one embodiment of the present invention.

FIG. 83 lists the capabilities of a spectrum monitoring system according to 5 main on-network mobile phone states plus 1 no-network mobile phone state.

A mobile phone in the first main state is active on network, and activities also include short-duration (e.g., milliseconds) activities (e.g., text messages, WhatsApp messages and registration events) besides completing a voice call, engaging in a data session, and streaming video. The first main state lasts 6 to 8 hours typically. Receiver sensitivity for speed and bandwidth and processing are enhanced to enable the capability of intercepting these activities and producing an alarm by the spectrum monitoring system of the present invention.

In the second main state, there are background applications running. To conserve battery life, a mobile phone does not constantly monitor the network, but does "wake up" and check for messages (e.g., every 10 seconds). The mobile phone checks applications including Facebook, SMS, voicemail, email, Twitter, and game challenge notifications. A typical phone sends an update notice (e.g., a request to pull down emails, Facebook messages, etc.) every 90 seconds on average. Background applications such as social media updates are extremely short in duration. To capture these events, receivers in the spectrum monitoring system are doubled (e.g., 2 to 4), the bandwidth of each receiver is doubled (e.g., 40 MHz to 80 MHz), and software is developed to enhance the system to process the increase in sample (e.g., 10×).

Figure 84:
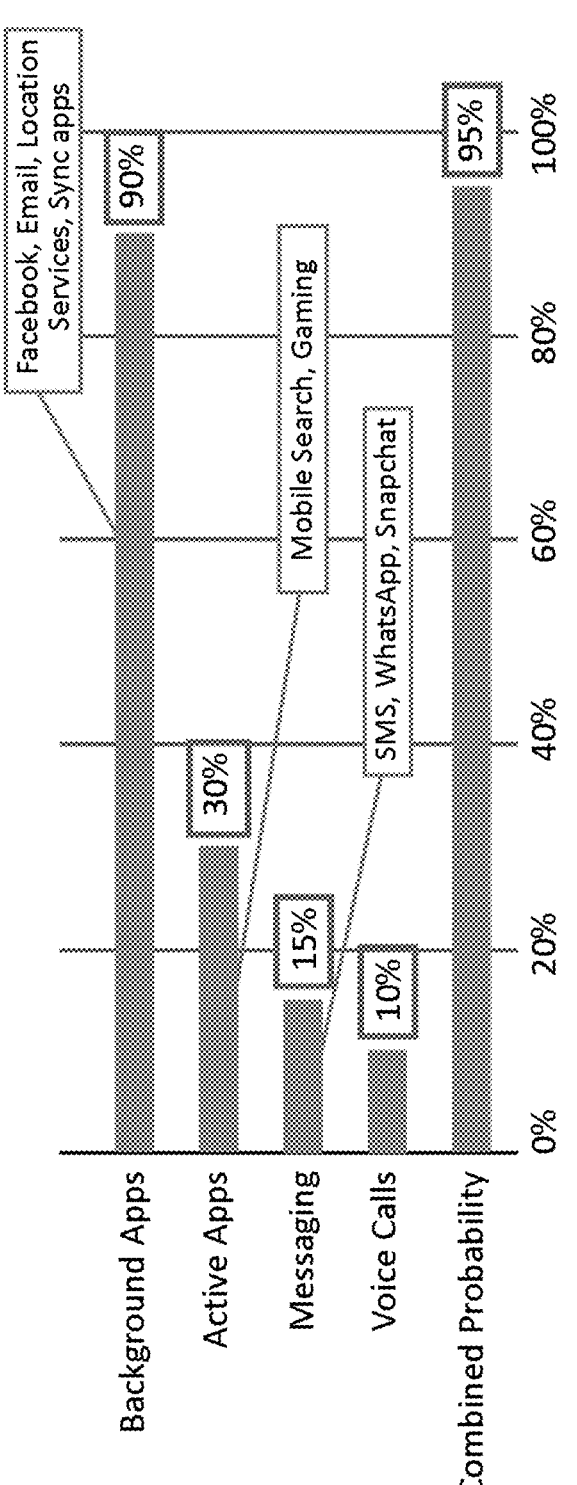
FIG. 84 illustrates a mobile event analysis per one minute intervals according to one embodiment of the present invention.

FIG. 84 illustrates a mobile event analysis per one minute intervals according to one embodiment of the present invention.

Events on a mobile phone include background apps (e.g., Facebook, Email, location services, sync apps) with a probability of 90%, active apps (e.g., mobile search, gaming) with a probability of 30%, messaging (e.g., SMS, WhatsApp, Snapchat) with a probability of 15%, voice calls with a probability of 10%. The combined probability gets to 95%.

FIG. 85 is a site cellular survey result according to one embodiment of the present invention. The site cellular survey result reveals there is not active GSM network on site, which means the vast majority of the mobile phones need to be UMTS and LTE capable to have service.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

Certain modifications and improvements will occur to those skilled in the art upon a reading of the foregoing description. The above-mentioned examples are provided to serve the purpose of clarifying the aspects of the invention and it will be apparent to one skilled in the art that they do not serve to limit the scope of the invention. All modifications and improvements have been deleted herein for the sake of conciseness and readability but are properly within the scope of the present invention.

The invention claimed is:

1. A method for automatically detecting at least one signal, comprising: calculating a power distribution by frequency of an electromagnetic environment; and automatically detecting the at least one signal based on comparing the power distribution to a baseline of the electromagnetic environment;

wherein calculating the power distribution by frequency of the electromagnetic environment includes calculating a first derivative and a second derivative of fast Fourier transform (FFT) data of the electromagnetic environment, identifying movements of the at least one signal based on changes in the second derivative of the FFT data; and further comprising performing direction finding (DF) for the at least one signal.

2. The method of claim 1, further comprising storing data relating to the at least one signal in a signal database, wherein the data includes a date the at least one signal was identified, a power of the at least one signal, and a bandwidth associated with the at least one signal.

3. The method of claim 1, further comprising learning the electromagnetic environment.

4. The method of claim 3, wherein learning the electromagnetic environment occurs during normal operating conditions for the electromagnetic environment when the electromagnetic environment is stable.

5. The method of claim 1, wherein the at least one signal includes an anomalous signal.

6. The method of claim 1, wherein the at least one signal is from at least one jammer.

7. The method of claim 1, wherein the DF uses Time Difference of Arrival (TDOA) to locate an aircraft, vehicle, or stationary emitter of the at least one signal.

\* \* \* \* \*